United States Patent
Bertin et al.

(10) Patent No.: US 9,601,498 B2
(45) Date of Patent: Mar. 21, 2017

(54) TWO-TERMINAL NANOTUBE DEVICES AND SYSTEMS AND METHODS OF MAKING SAME

(75) Inventors: Claude L. Bertin, Venice, FL (US);
Mitchell Meinhold, Arlington, MA (US); Steven L. Konsek, Boston, MA (US); Thomas Rueckes, Rockport, MA (US); Max Strasburg, Gresham, OR (US); Frank Guo, Danville, CA (US); X. M. Henry Huang, Cupertino, CA (US); Ramesh Sivarajan, Shrewsbury, MA (US)

(73) Assignee: Nantero Inc., Woburn, MA (US)

( * ) Notice: Subject to any disclaimer, the term of this patent is extended or adjusted under 35 U.S.C. 154(b) by 0 days.

(21) Appl. No.: 13/113,398

(22) Filed: May 23, 2011

(65) Prior Publication Data
US 2011/0220859 A1 Sep. 15, 2011

Related U.S. Application Data

(63) Continuation of application No. 12/861,046, filed on Aug. 23, 2010, now Pat. No. 7,948,054, which is a
(Continued)

(51) Int. Cl.
*H01L 23/52* (2006.01)
*H01L 27/112* (2006.01)
(Continued)

(52) U.S. Cl.
CPC ............ *H01L 27/112* (2013.01); *B82Y 10/00* (2013.01); *G11C 13/0002* (2013.01);
(Continued)

(58) Field of Classification Search
USPC ......... 257/209, 529–530, E21.147, E23.149; 313/504
See application file for complete search history.

(56) References Cited

U.S. PATENT DOCUMENTS

| | | |
|---|---|---|
| 4,979,149 A | 12/1990 | Popovic |
| 5,818,748 A | 10/1998 | Bertin et al. |
| (Continued) | | |

FOREIGN PATENT DOCUMENTS

| | | |
|---|---|---|
| GB | 2364933 | 2/2002 |
| WO | WO-00/48195 | 8/2000 |
| (Continued) | | |

OTHER PUBLICATIONS

Avouris, P., "Carbon nanotube electronics," Chemical Physics, vol. 281, 2002, pp. 429-445.
(Continued)

*Primary Examiner* — Mark Tornow
(74) *Attorney, Agent, or Firm* — Nantero Inc.

(57) ABSTRACT

A two terminal memory device includes first and second conductive terminals and a nanotube article. The article has at least one nanotube, and overlaps at least a portion of each of the first and second terminals. The device also includes stimulus circuitry in electrical communication with at least one of the first and second terminals. The circuit is capable of applying first and second electrical stimuli to at least one of the first and second terminal(s) to change the relative resistance of the device between the first and second terminals between a relatively high resistance and a relatively low resistance. The relatively high resistance between the first and second terminals corresponds to a first state of the device, and the relatively low resistance between the first and second terminals corresponds to a second state of the device.

24 Claims, 96 Drawing Sheets

Related U.S. Application Data continuation of application No. 11/280,786, filed on Nov. 15, 2005, now Pat. No. 7,781,862.

(60) Provisional application No. 60/679,029, filed on May 9, 2005, provisional application No. 60/692,765, filed on Jun. 22, 2005, provisional application No. 60/692,918, filed on Jun. 22, 2005, provisional application No. 60/692,891, filed on Jun. 22, 2005.

(51) Int. Cl.
| | |
|---|---|
| *B82Y 10/00* | (2011.01) |
| *G11C 13/00* | (2006.01) |
| *G11C 13/02* | (2006.01) |
| *G11C 17/16* | (2006.01) |
| *H01L 27/105* | (2006.01) |

(52) U.S. Cl.
CPC ............ *G11C 13/025* (2013.01); *G11C 17/16* (2013.01); *G11C 17/165* (2013.01); *H01L 27/1052* (2013.01); *G11C 2213/19* (2013.01); *G11C 2213/77* (2013.01); *G11C 2213/79* (2013.01); *Y10S 977/943* (2013.01)

(56) References Cited

U.S. PATENT DOCUMENTS

| | | | |
|---|---|---|---|
| 6,020,747 A | 2/2000 | Bahns et al. | |
| 6,128,214 A | 10/2000 | Kuekes et al. | |
| 6,256,767 B1 | 7/2001 | Kuekes et al. | |
| 6,314,019 B1 | 11/2001 | Kuekes et al. | |
| 6,346,846 B1 | 2/2002 | Bertin et al. | |
| 6,422,450 B1 | 7/2002 | Zhou et al. | |
| 6,423,583 B1 | 7/2002 | Avouris | |
| 6,445,006 B1 | 9/2002 | Brandes et al. | |
| 6,528,020 B1 | 3/2003 | Dai | |
| 6,548,841 B2 | 4/2003 | Frazier et al. | |
| 6,574,130 B2 | 6/2003 | Segal et al. | |
| 6,643,165 B2 | 11/2003 | Segal et al. | |
| 6,706,402 B2 | 3/2004 | Rueckes et al. | |
| 6,707,098 B2 | 3/2004 | Hofmann et al. | |
| 6,759,693 B2 | 7/2004 | Vogeli et al. | |
| 6,784,028 B2 | 8/2004 | Rueckes et al. | |
| 6,803,840 B2 | 10/2004 | Hunt et al. | |
| 6,808,746 B1 | 10/2004 | Dai | |
| 6,809,465 B2 | 10/2004 | Jin | |
| 6,835,591 B2 | 12/2004 | Rueckes et al. | |
| 6,888,773 B2 | 5/2005 | Morimoto | |
| 6,890,780 B2 | 5/2005 | Lee | |
| 6,894,359 B2 | 5/2005 | Bradley et al. | |
| 6,899,945 B2 | 5/2005 | Smalley et al. | |
| 6,905,892 B2 | 6/2005 | Esmark | |
| 6,911,682 B2 | 6/2005 | Rueckes et al. | |
| 6,918,284 B2 | 7/2005 | Snow et al. | |
| 6,919,592 B2 | 7/2005 | Segal et al. | |
| 6,919,740 B2 | 7/2005 | Snider | |
| 6,921,575 B2 | 7/2005 | Horiuchi et al. | |
| 6,924,538 B2 | 8/2005 | Jaiprakash et al. | |
| 6,924,682 B1 | 8/2005 | Smith | |
| 6,969,651 B1 | 11/2005 | Lu et al. | |
| 6,990,009 B2 | 1/2006 | Bertin et al. | |
| 7,015,500 B2 | 3/2006 | Choi et al. | |
| 7,115,901 B2 | 10/2006 | Bertin et al. | |
| 7,115,960 B2 | 10/2006 | Bertin et al. | |
| 7,161,218 B2 | 1/2007 | Bertin et al. | |
| 7,161,403 B2 | 1/2007 | Bertin et al. | |
| 7,259,410 B2 | 8/2007 | Jaiprakash et al. | |
| 7,394,687 B2 | 7/2008 | Bertin et al. | |
| 7,416,993 B2 | 8/2008 | Segal et al. | |
| 7,479,654 B2 | 1/2009 | Bertin et al. | |
| 7,667,999 B2 | 2/2010 | Herner et al. | |
| 7,781,862 B2 | 8/2010 | Bertin et al. | |
| 7,835,170 B2 | 11/2010 | Bertin et al. | |
| 7,982,209 B2 | 7/2011 | Herner et al. | |
| 8,008,745 B2 | 8/2011 | Bertin et al. | |
| 2001/0023986 A1* | 9/2001 | Mancevski | 257/741 |
| 2002/0027819 A1 | 3/2002 | Tomanek | |
| 2002/0130333 A1* | 9/2002 | Watanabe et al. | 257/200 |
| 2002/0175390 A1 | 11/2002 | Goldstein et al. | |
| 2003/0178617 A1* | 9/2003 | Appenzeller et al. | 257/20 |
| 2003/0199172 A1* | 10/2003 | Rueckes et al. | 438/754 |
| 2003/0200521 A1 | 10/2003 | DeHon et al. | |
| 2004/0031975 A1 | 2/2004 | Kern et al. | |
| 2004/0132070 A1 | 7/2004 | Star et al. | |
| 2004/0266106 A1 | 12/2004 | Lee | |
| 2005/0056877 A1 | 3/2005 | Rueckes et al. | |
| 2005/0059210 A1* | 3/2005 | Rueckes et al. | 438/257 |
| 2005/0062062 A1 | 3/2005 | Bertin et al. | |
| 2005/0212014 A1 | 9/2005 | Horibe et al. | |
| 2006/0128088 A1* | 6/2006 | Graham et al. | 438/202 |
| 2006/0237537 A1 | 10/2006 | Empedocles et al. | |
| 2006/0250843 A1 | 11/2006 | Bertin et al. | |
| 2006/0250856 A1 | 11/2006 | Bertin et al. | |
| 2006/0258122 A1 | 11/2006 | Whitefield et al. | |
| 2006/0264053 A1 | 11/2006 | Yates | |
| 2006/0281256 A1 | 12/2006 | Carter et al. | |
| 2006/0281287 A1 | 12/2006 | Yates et al. | |
| 2006/0292716 A1 | 12/2006 | Gu et al. | |
| 2008/0157126 A1 | 7/2008 | Bertin et al. | |
| 2009/0166609 A1 | 7/2009 | Schricker et al. | |
| 2009/0166610 A1 | 7/2009 | Schricker et al. | |
| 2009/0168491 A1 | 7/2009 | Schricker et al. | |

FOREIGN PATENT DOCUMENTS

| | | |
|---|---|---|
| WO | WO-01/03208 | 1/2001 |
| WO | WO-03/071015 | 8/2003 |
| WO | WO-03/079287 | 9/2003 |
| WO | WO 2004040666 A1 * | 5/2004 |

OTHER PUBLICATIONS

Awano, Y., "Graphene for VLSI: FET and Interconnect Applications," IEDM 2009 Technical Digest, pp. 10.1.1-10.1.4.

Bachtold, et al., "Logic Circuits Based on Carbon Nanotubes," Physica E 16, 2003, pp. 42-46.

Brown, K. M., "System in package "The Rebirth of SIP"," 2004 IEEE Custom Integrated Circuits, May 2004, 6 pages.

Chen, et al., "Self-Aligned Carbon Nanotube Transistors with Charge Transfer Doping," Appl. Phys. Ltrs., No. 86, 2005, pp. 123108-1-123108-3.

Chen, et al., "Self-Aligned Carbon Nanotube Transistors with Novel Chemical Doping," IEDM (2004) 04:695-698.

Collins, et al., "Engineering Carbon Nanotubes and Nanotube Circuits Using Electrical Breakdown," Science, vol. 292, Apr. 27, 2001, pp. 706-709.

Crowley, et al., "512 Mb PROM with 8 layers of antifuse/Diode cells," IEEE International Solid-State Circuits Conference, vol. XLVI, Feb. 2003, pp. 284-285.

Cui, et al., "Carbon Nanotube Memory Devices of High Charge Storage Stability," Appl. Phys. Ltrs., vol. 81, No. 17, Oct. 2002, pp. 3260-3262.

Derycke et al., "Carbon Nanotube Inter- and Intramolecular Logic Gates," Nano Letters, vol. 1, No. 9, Sep. 2001, pp. 453-456.

Derycke, et al., "Controlling Doping and Carrier Injection in Carbon Nanotube Transistors," Appl. Phys. Ltrs., vol. 80, No. 15, Apr. 15, 2002, pp. 2773-2775.

Duan, et al., "Nonvolatile Memory and Programmable Logic from Molecule-Gated Nanowires," Nano Letters, XXXX, vol. 0, No. 0, A-D, 2002, 4 pages.

European Search Report, European Application No. 6759469.7, dated Nov. 9, 2006, 9 pages.

Fuhrer, et al., "High-Mobility Nanotube Transistor Memory," Nano Letters, vol. 2, No. 7, 2002, pp. 755-759.

Heinze, et al., "Carbon Nanotubes as Schottky Barrier Transistors," Phys. Rev. Ltrs., vol. 89, No. 10, Sep. 2, 2002, pp. 106801-1-106801-4.

Hone, J., "Phonons and Thermal Properties of Carbon Nanotubes," Topics Appl. Phys., vol. 80, 2001, pp. 273-286.

(56) References Cited

OTHER PUBLICATIONS

Huai, Y., "Spin-Transfet Torque MRAM (STT-MTAM): Challenges and Prospects," AAPS Bulletin, vol. 18, No. 6, Dec. 2008, pp. 33-40.

Huang, et al., Logic Gates and Computation from Assembled Nanowire Building Blocks, Science, vol. 294, Nov. 9, 2001, pp. 1313-1317.

International Search Report, PCT/US06/18043, dated Mar. 7, 2007 (3 pages).

Javey, "Carbon Nanotube Transistor Arrays from Multistage Complementary Logic and Ring Oscillators," Nano Letters, XXXX, vol. 0, No. 0, A-D, 2002, 4 pages.

Javey, et al., High-k Dielectrics for Advanced Carbon-Nanotube Transistors and Logic Gates, Nature Materials, vol. 1, 2002, pp. 241-246.

Javey, et al., "Carbon Nanotube Field-Effect Transistors with Integrated Ohmic Contacts and High-k Dielectrics," Nano Letters, vol. 4, No. 3, 2004, pp. 447-450.

Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.

Johnson, R.C., "IBM fellow unrolls blueprint for nano," EETimes, http://www.eetimes.com/showArticle.jhtml?,Article ID=181500304, Mar. 6, 2006, 3 pages.

Kianian, et al., "A 3D Stackable Carbon Nanotube-based Nonvolatile Memory (NRAM)," ESSDERC, Nantero, Inc., Jun. 14, 2010, 4 pages.

Kong, et al., "Quantum Interference and Ballistic Transmission in Nanotube Electron Wavegrinders," The American Physical Society, vol. 87, No. 10, Sep. 3, 2001, pp. 106801-1-106801-4.

Langer, et al., "Electrical resistance of a carbon nanotube bundle," J. Mater. Res., vol. 9, No. 4, Apr. 1994, pp. 927-932.

Lin, et al., "Novel Carbon Nanotube FET Design with Tunable Polarity," IEMD 04-687, 2004, pp. 29.2.1-29.2.4.

Martel, et al., Carbon Nanotube Field-Effect Transistors and Logic Circuits, DAC 2002, Jun. 10-14, 2002, New Orleans, Louisiana, USA, 5 pages.

McCollum, J., "Programmable Elements and Their Impact on FPGA Architecture, Performance, and Radiation Hardness," 1995, Altera Corporation, San Jose, California, USA, [klabs.org/richcontent/MAOLDCon99/Presentations/BO_McCollum_S.ppt].

Novak, et al., "Nerve Agent Using Networks of Single-Walled Carbon Nanotubes," Appl. Phys. Ltrs., vol. 83, No. 19, Nov. 2003, pp. 4026-4028.

Onoa, et al., "Bulk production of singly dispersed carbon nanotube with prescribed lengths," Nanotechnology, vol. 16, 2005, pp. 2799-2803.

Peigney, et al., "A Study of the Formation of Single- and Double-Walled Carbon Nanotubes by a CVD Method," J. Phys. Chem. B, vol. 105, 2001, pp. 9699-9710.

Radosavijevic, et al., "Nonvolatile Molecular Memory Elements Based on Ambipolar Nanotube Field Effect Transistors," Nano Letters, vol. 2, No. 7, 2002, pp. 761-764.

Rueckes, et al., "Carbon Nanotube-based Nonvolatile Random Access Memory for Molecular Computing," Science, vol. 289, Jul. 7, 2000, pp. 94-97.

Snow, et al., "Random Networks of Carbon Nanotubes as an Electronic Material," Appl. Phys. Ltrs., vol. 82, No. 13, Mar. 2003, pp. 2145-2147.

Servalli, G., "A 45nm Generation Phase Change Memory Technology," IEDM 2009 Technical Digest, pp. 5.7.1-5.7.4.

Srivastava, et al., "A Comparative Scaling Analysis of Metallic and Carbon Nanotube Interconnections for Nanometer Scale VLSI Technologies," Proceedings of the $21^{st}$ International VLSI Multilevel Interconnect Conference (VMIC), Sep. 29-Oct 2, 2004, Sikoloa, HI, pp. 393-398.

Star, et al., "Nanotube Optoelectronic Memory Devices," Nano Letters, vol. 4, No. 9, 2004, pp. 1587-1591.

Star, et al., "Nanoelectronic Carbon Dioxide Sensors," Adv. Mater., vol. 16, No. 22, Nov. 2004, pp. 2049-2052.

Ward, et al., "A Non-Volatile Nanoelectromechanical Memory Element Utilizing a Fabric of Carbon Nanotubes," Non-Volatile Memory Technology Symposium, 2004, Orlando, Florida, USA, Nov. 15-17, 2004, pp. 34-38.

Wind, et al., "Fabrication and Electrical Characterization of Top Gate Single-Wall Carbon Nanotube Field-Effect Transistors," IBM T.J. Watson Research Ctr., 6A1:1-9 plus figures 105, May 2002.

Wind, et al., Vertical Scaling of Carbon Nanotube Field-Effect Transistors Using Top Gate Electrodes, Appl. Phys. Ltrs., vol. 80, No. 20, May 2002, pp. 3817-3819.

Zhou, et al., "p-Channel, n-Channel Thin Film Transistors and p—n Diodes Based on Single Wall Carbon Nanotube Networks," Nano Letters, vol. 4, No. 10, 2004, pp. 2031-2035.

Amblard, G., "Development and characterization of carbon nanotube processes for NRAM technology," Proc. of SPIE 2011, vol. 7970, pp. 797017-1-797017-7.

Brock, et al., "Carbon Nanotube Memories and Fabrics in a Radiation Hard Semiconductor Foundry," 2005 IEEE Conference, 9 pgs.

Rosendale, et al., "A 4 Megabit Carbon Nanotube-based Nonvolatile Memory (NRAM)," ESSCIRC 2010 Proceedings, pp. 478-481.

\* cited by examiner

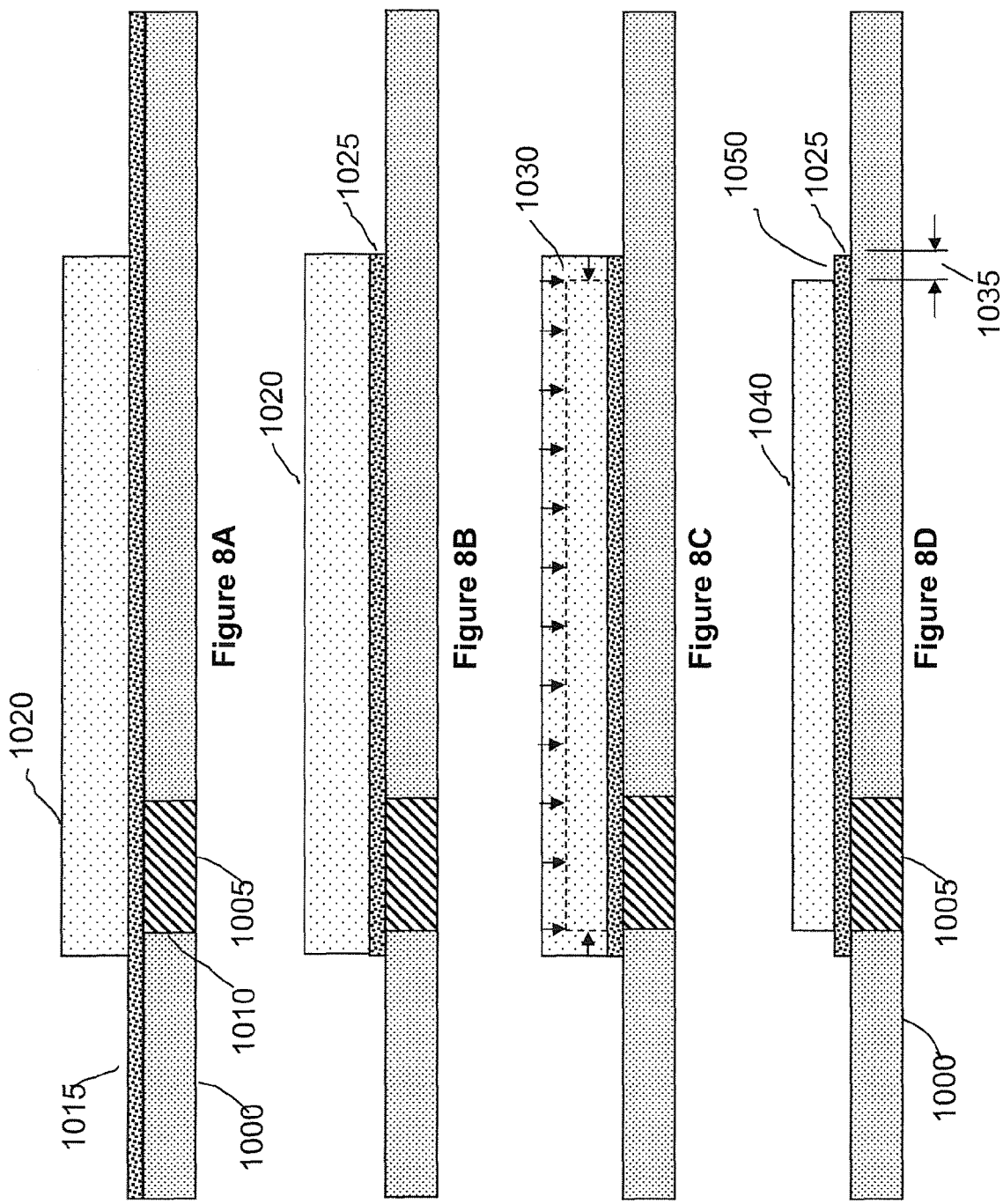

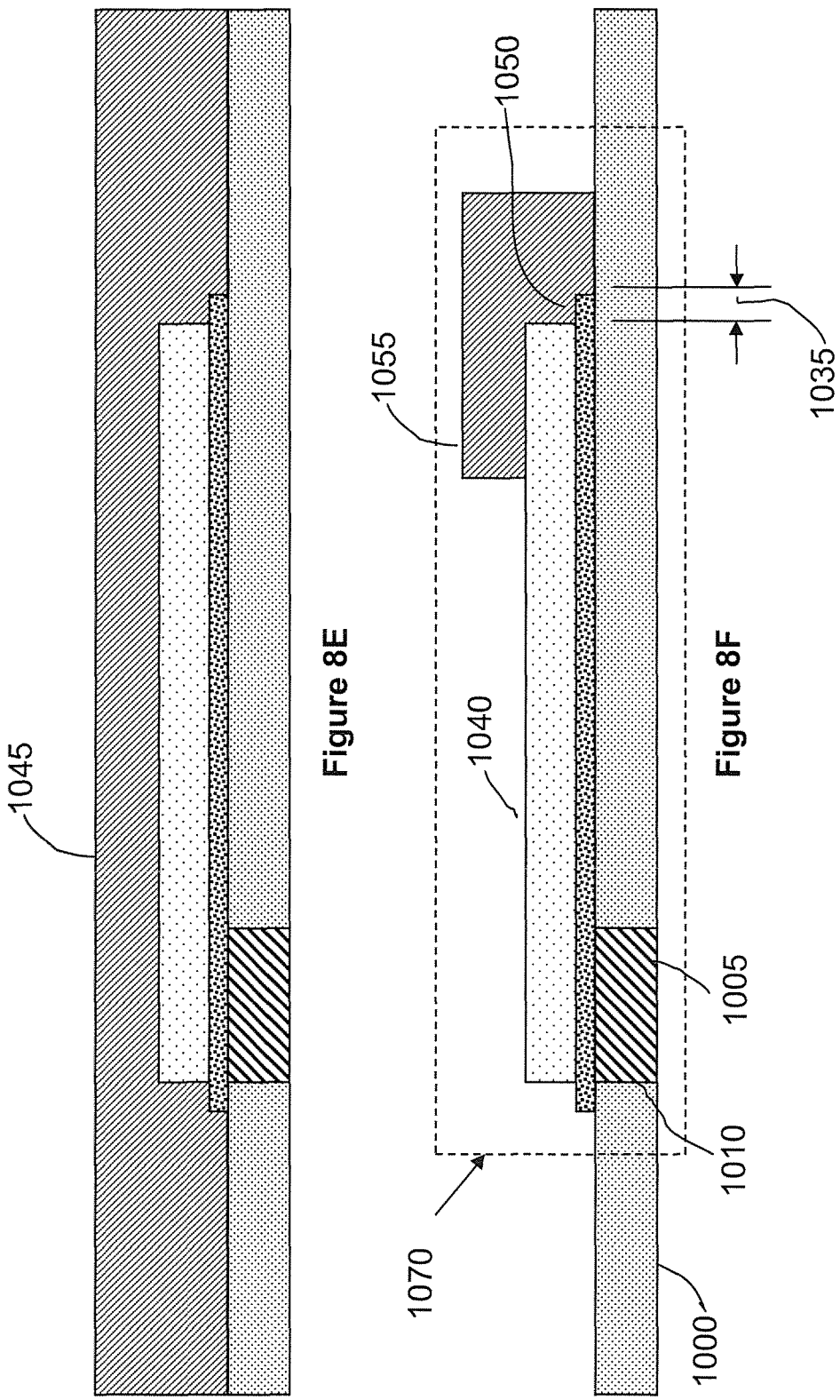

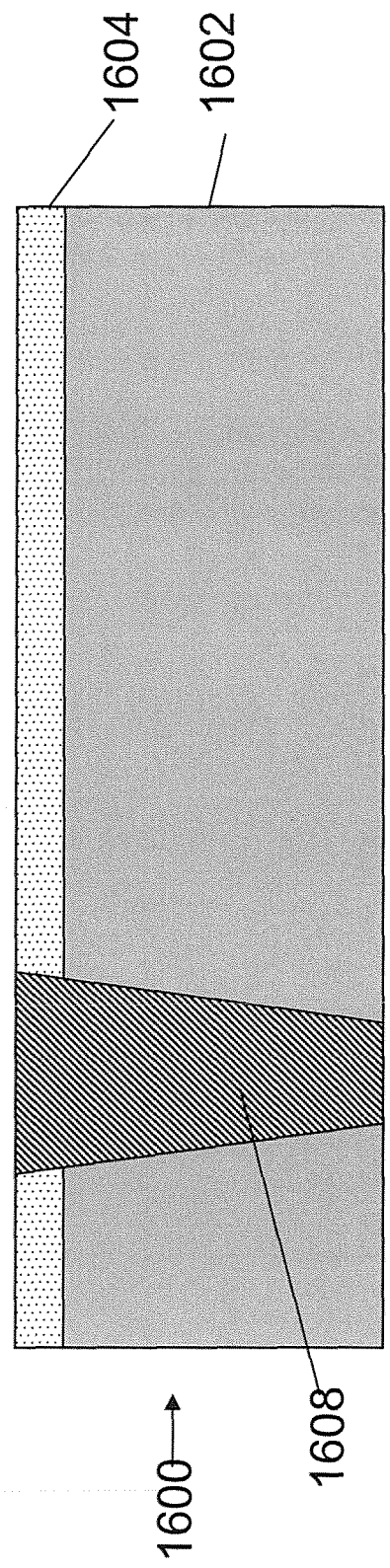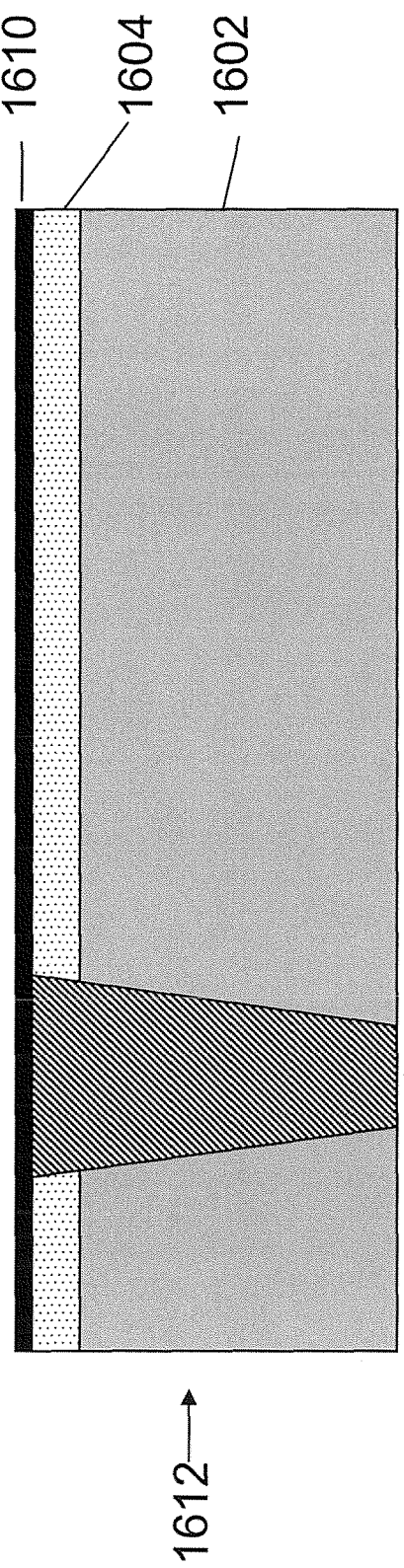
Figure 10A
Figure 10B

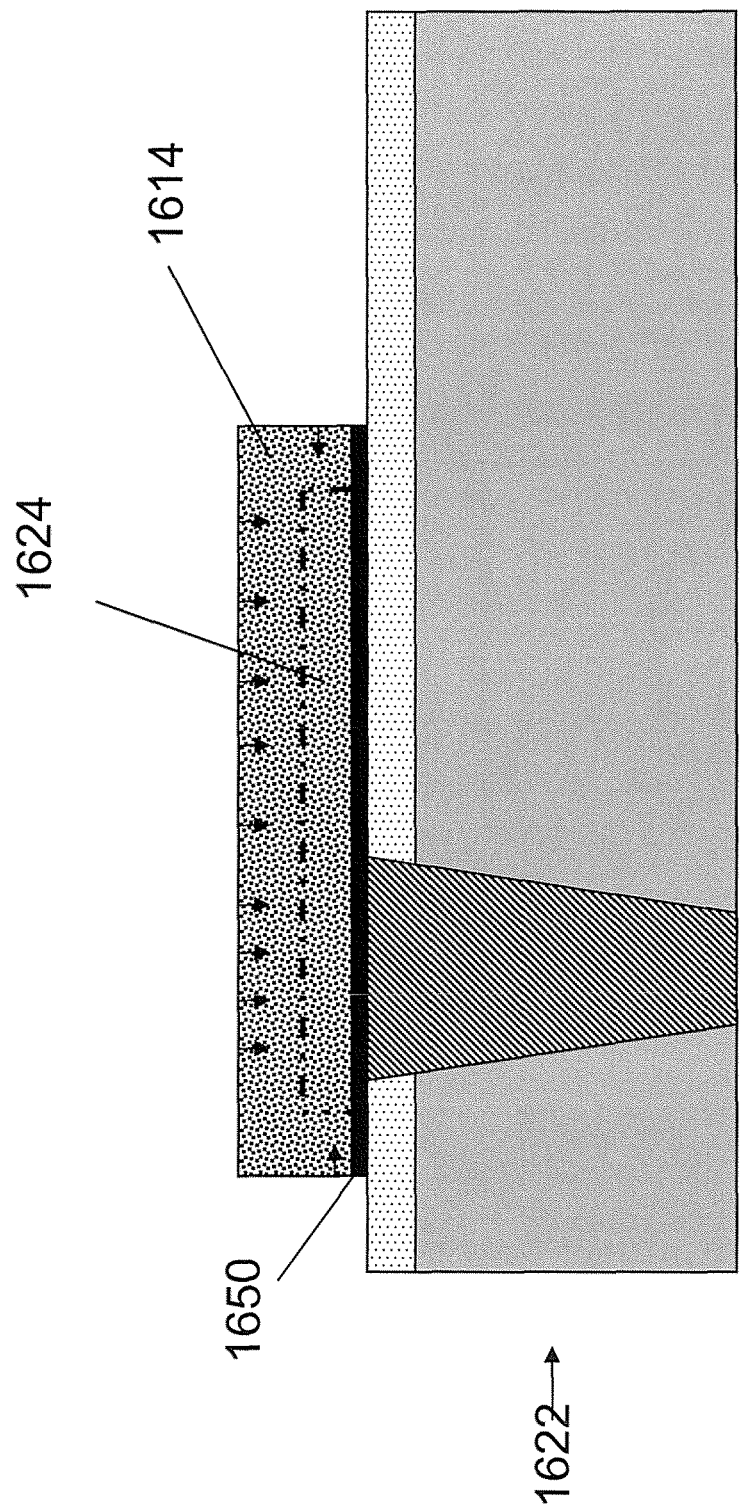

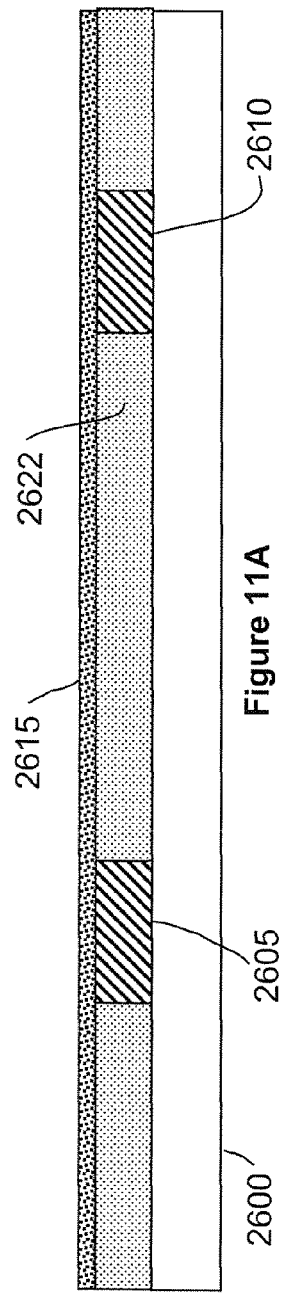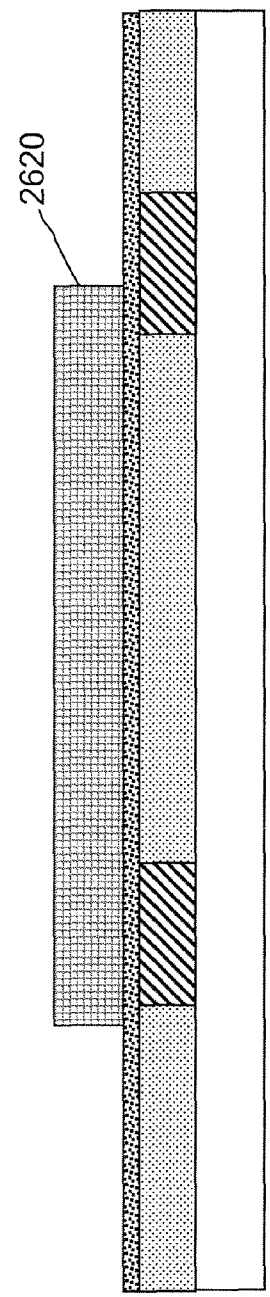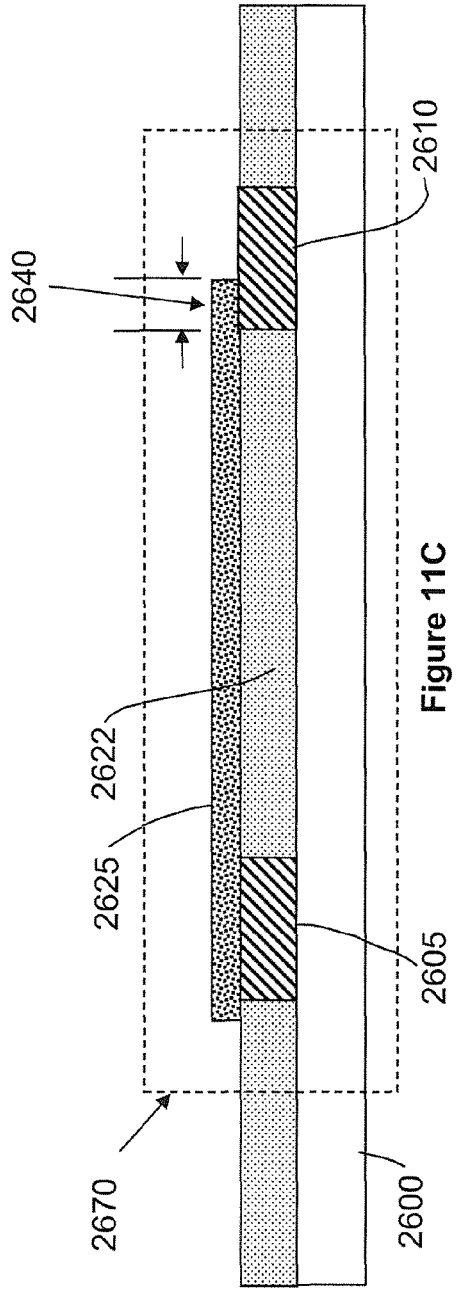
Figure 11A
Figure 11B
Figure 11C

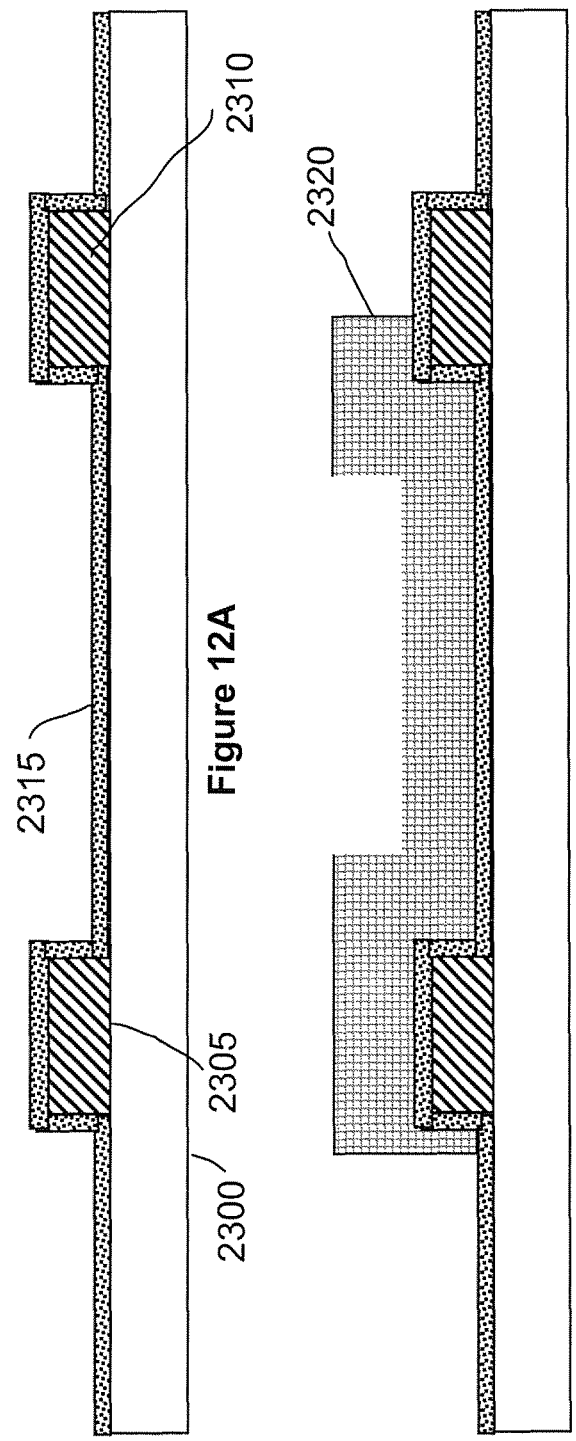

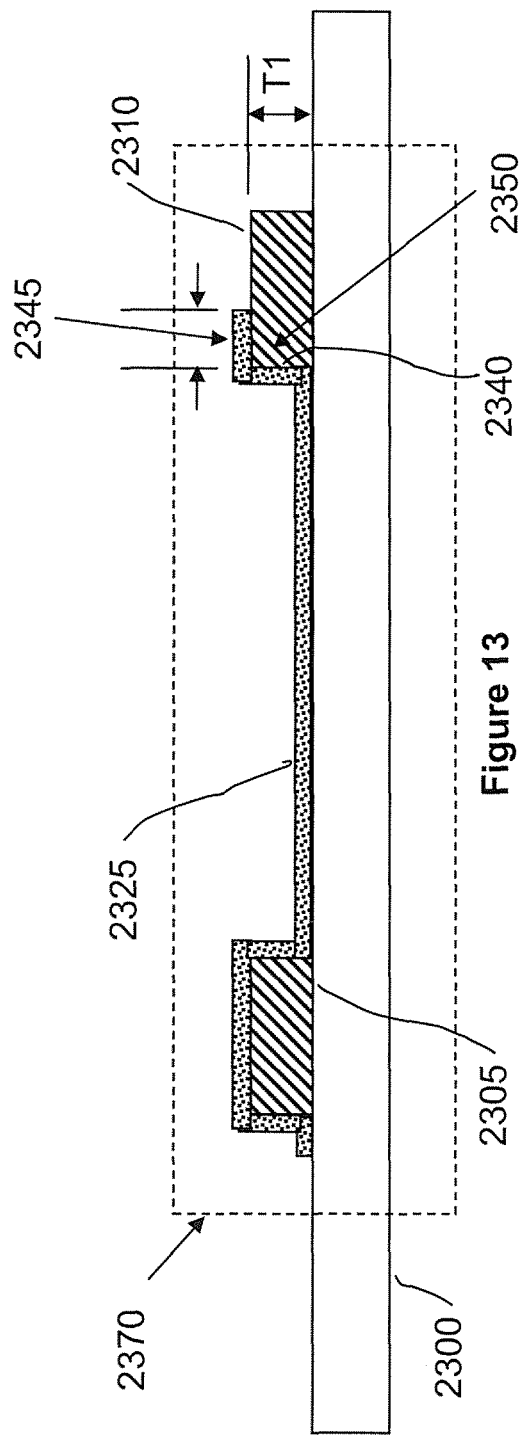

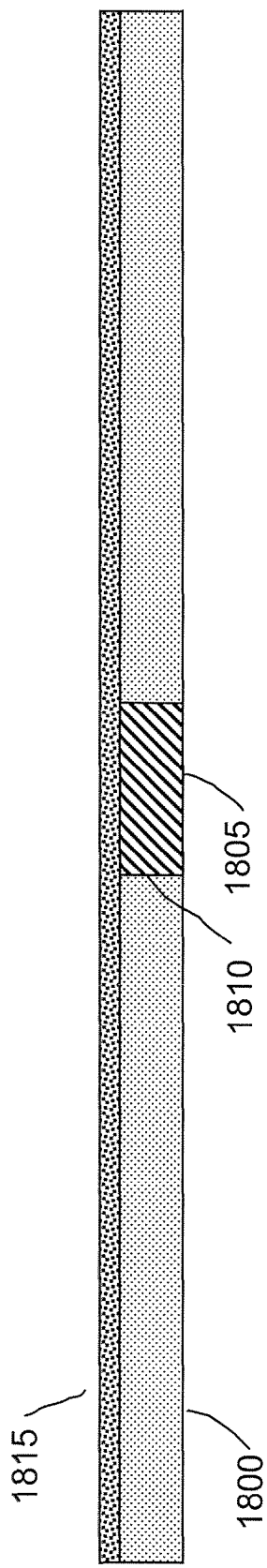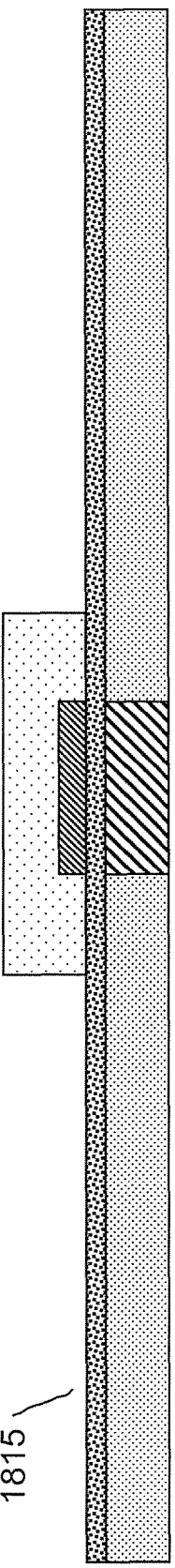

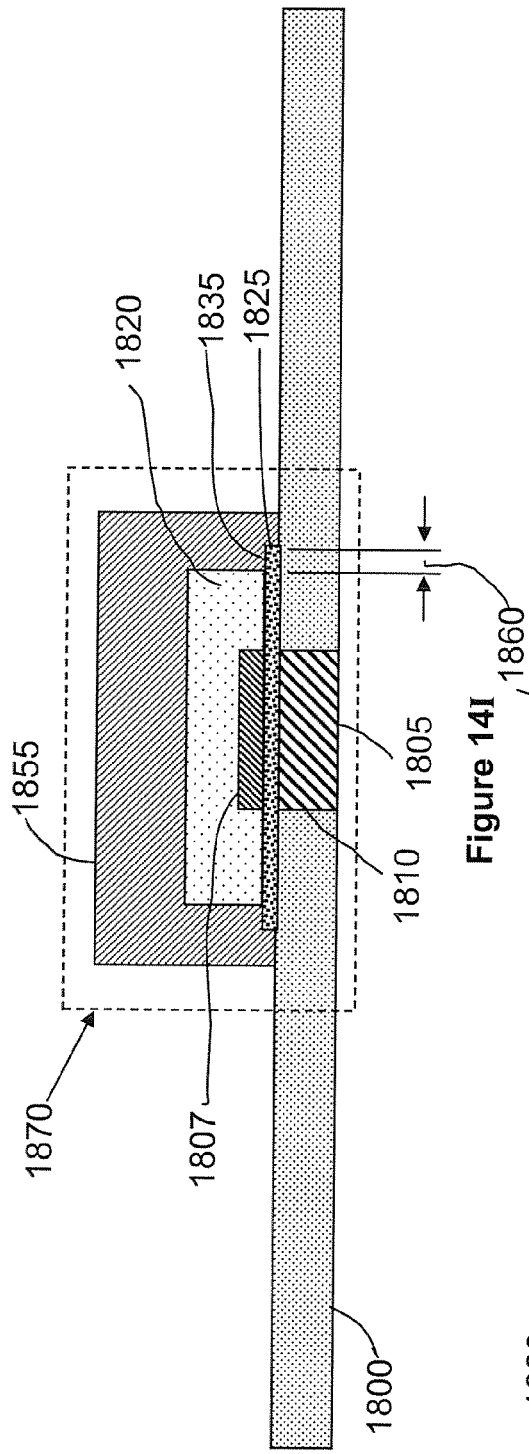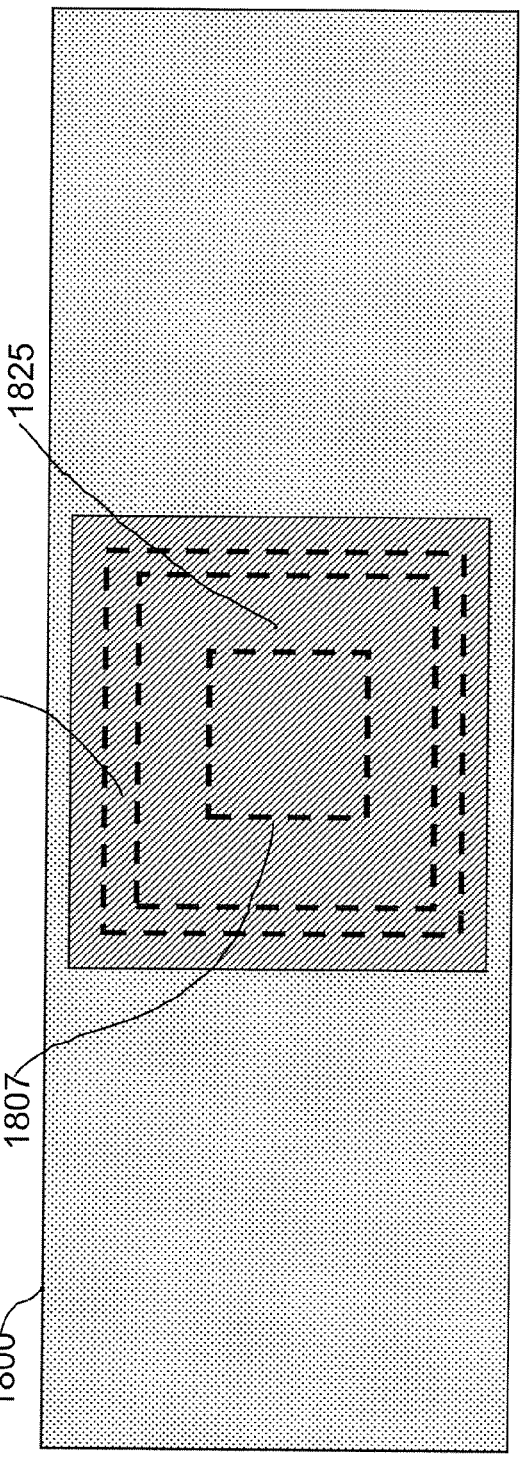

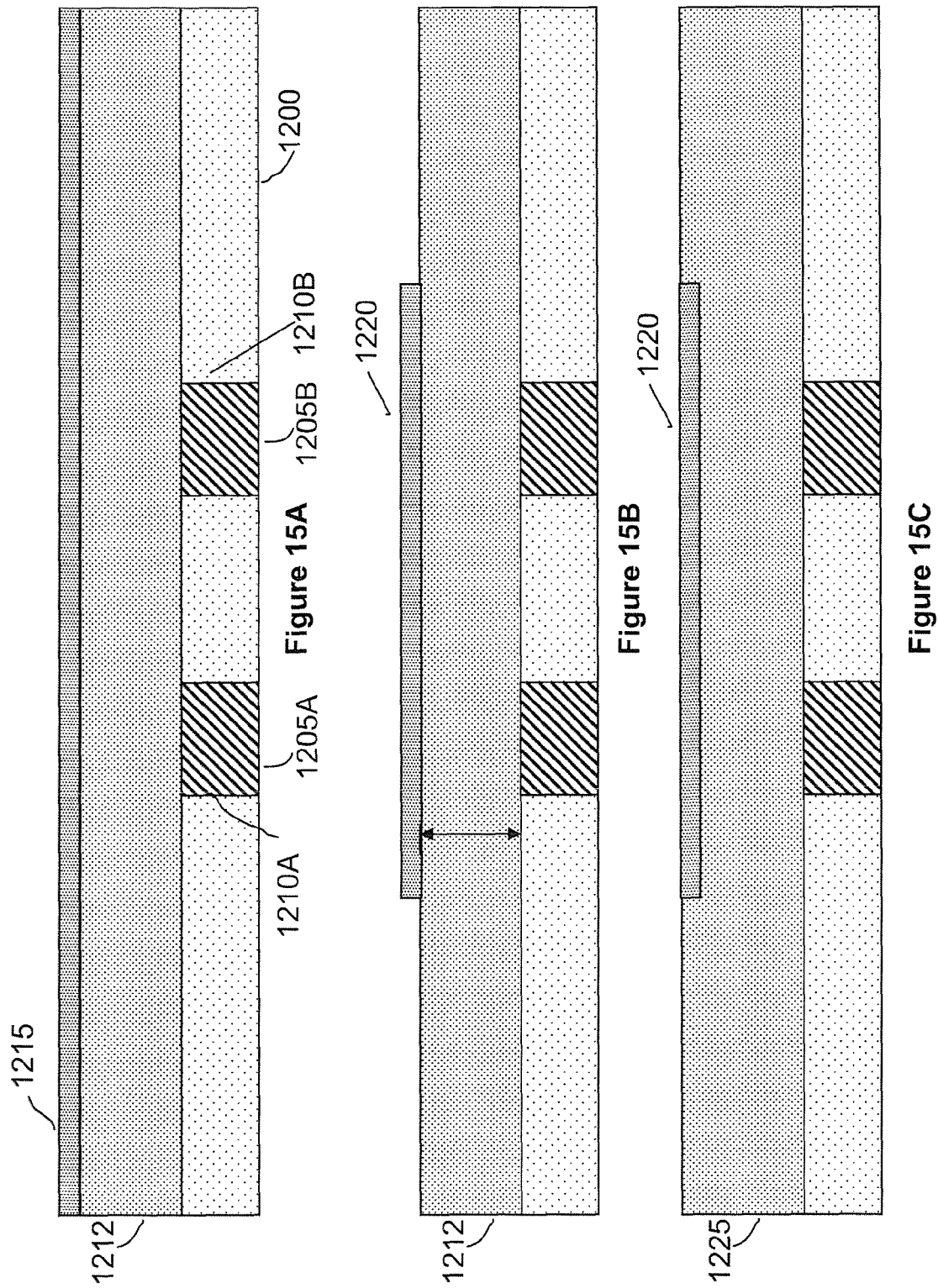

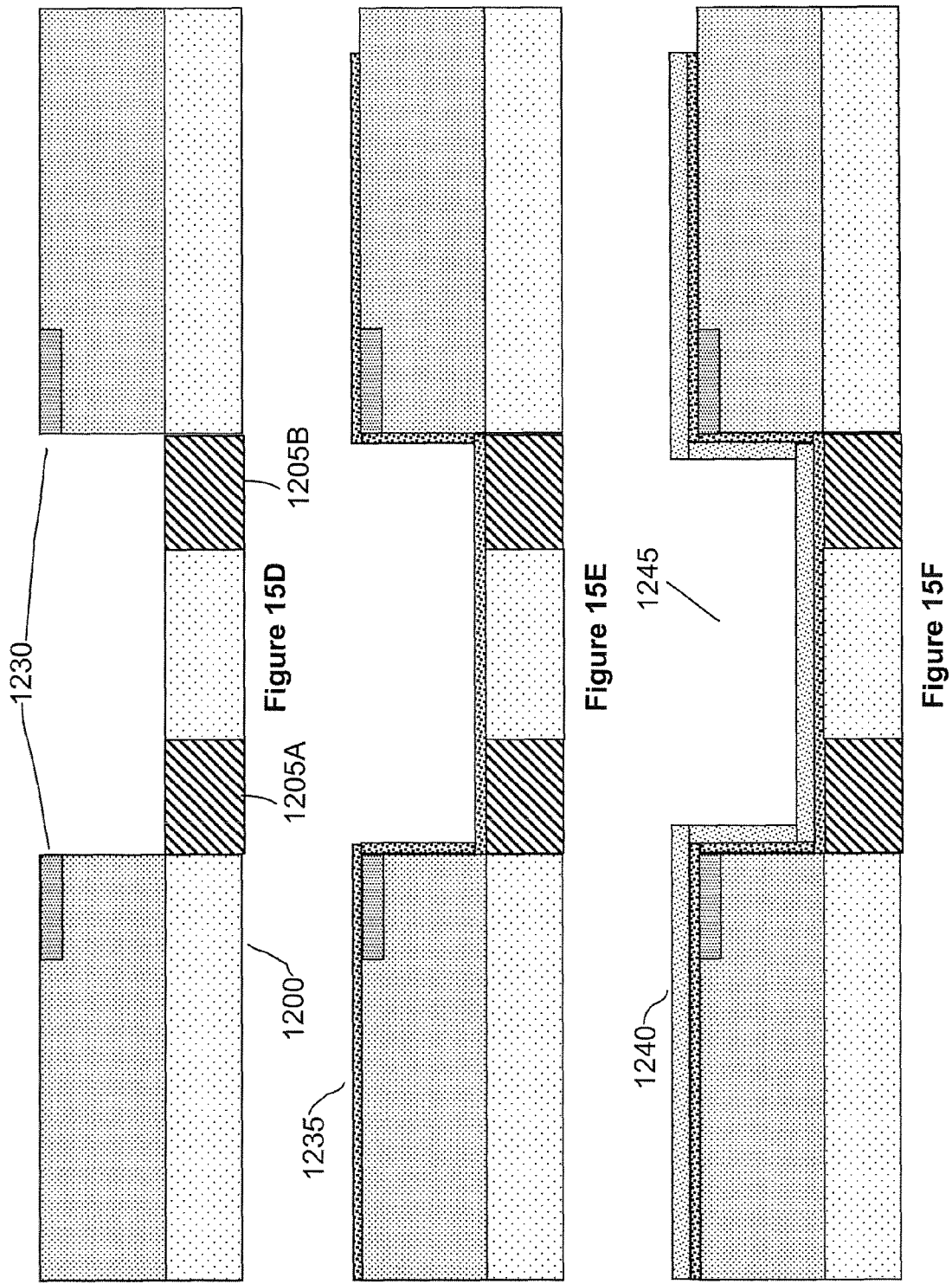

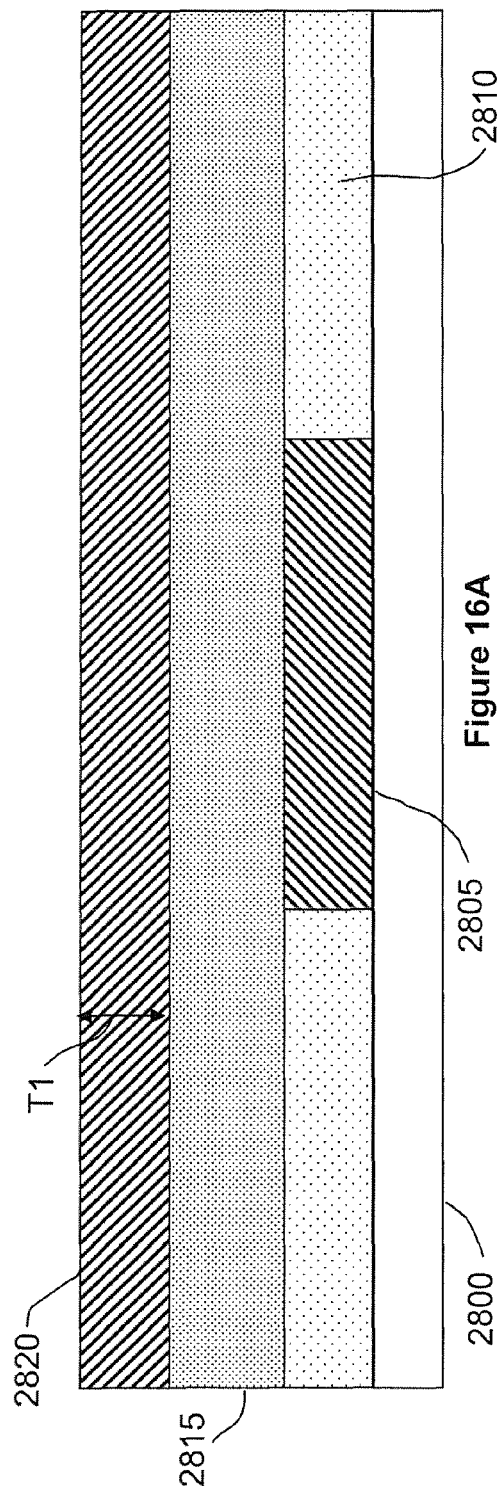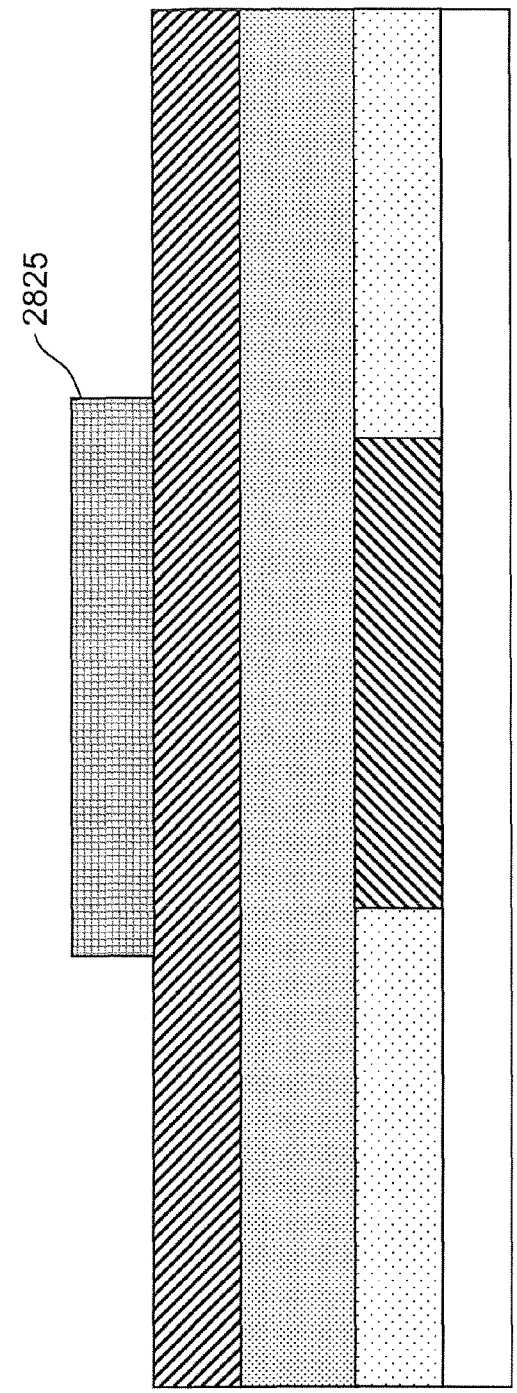
Figure 16A
Figure 16B

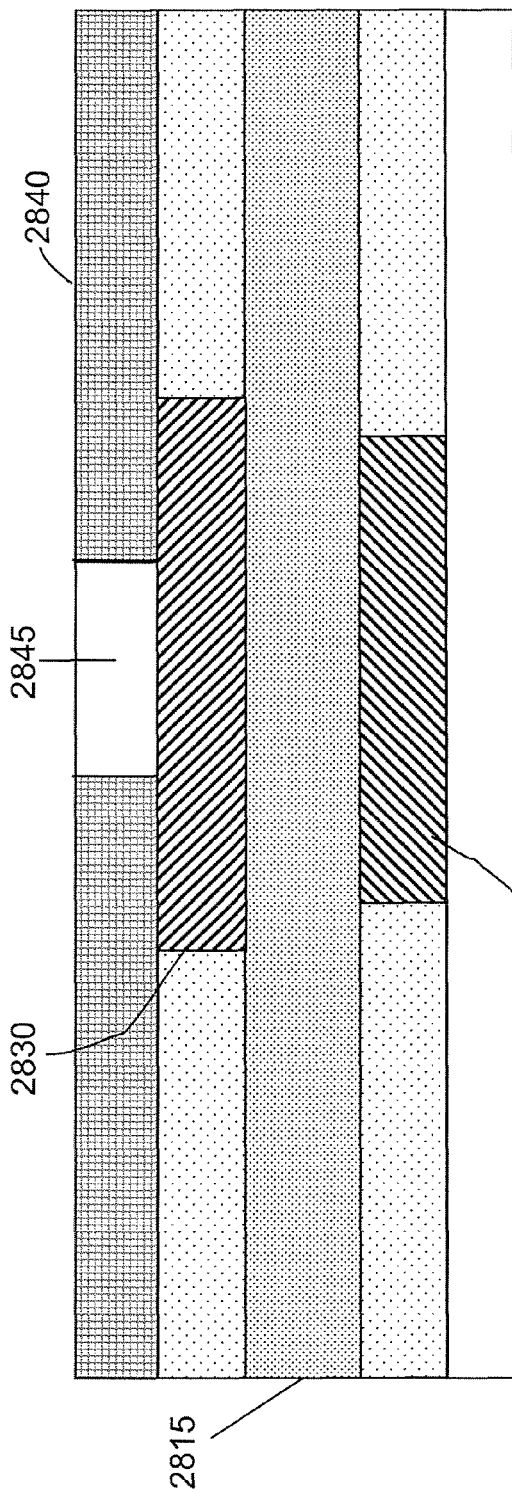
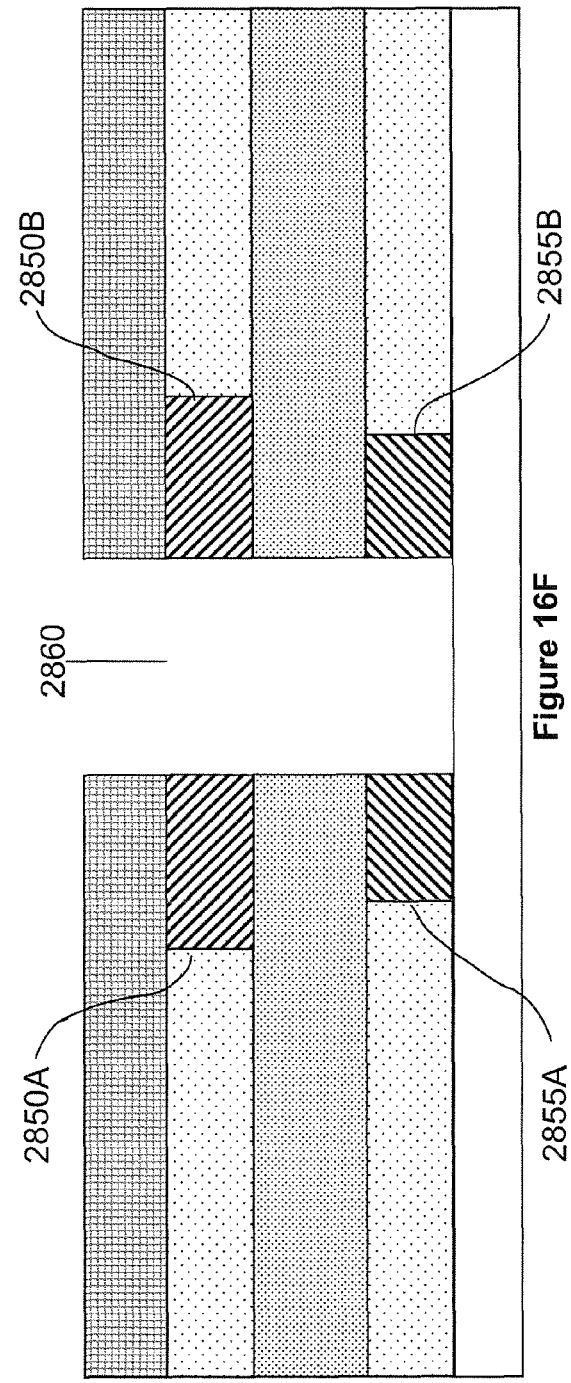
Figure 16E
Figure 16F

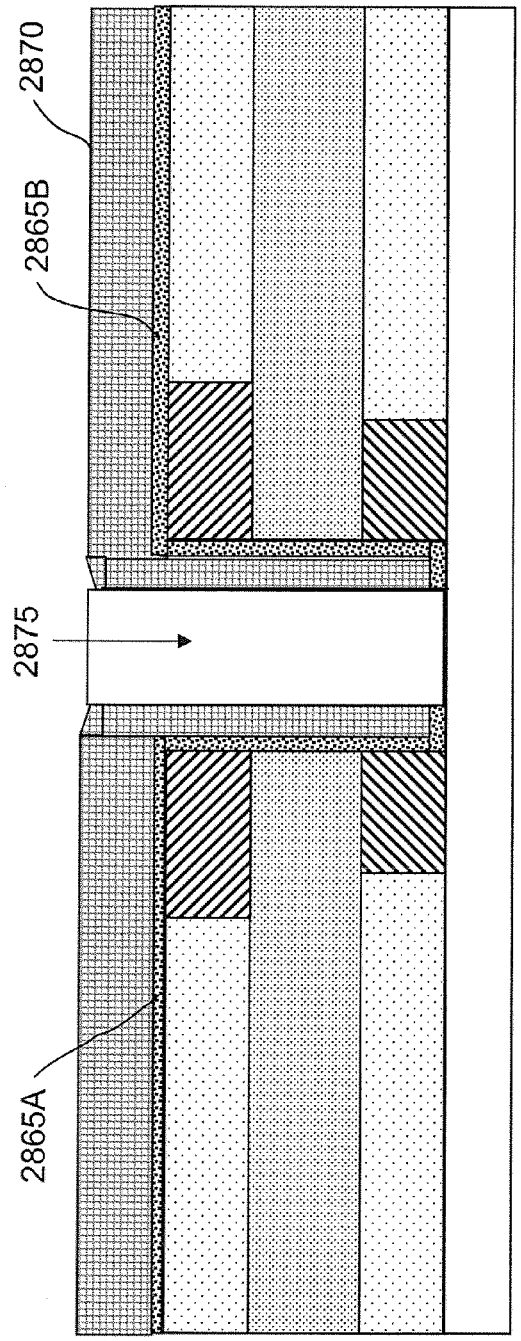
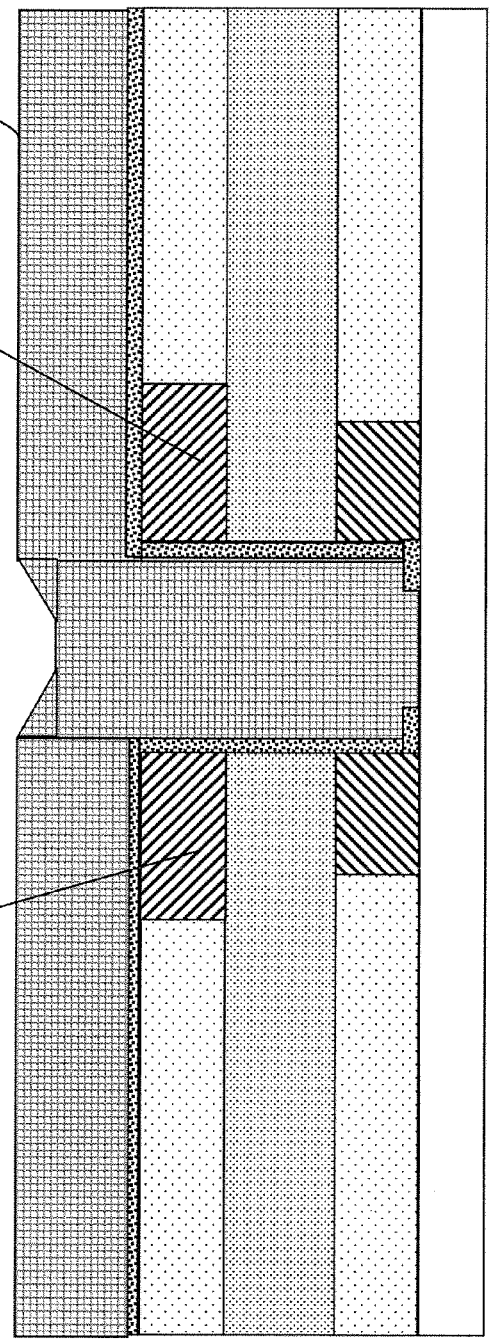
Figure 16I
Figure 16J

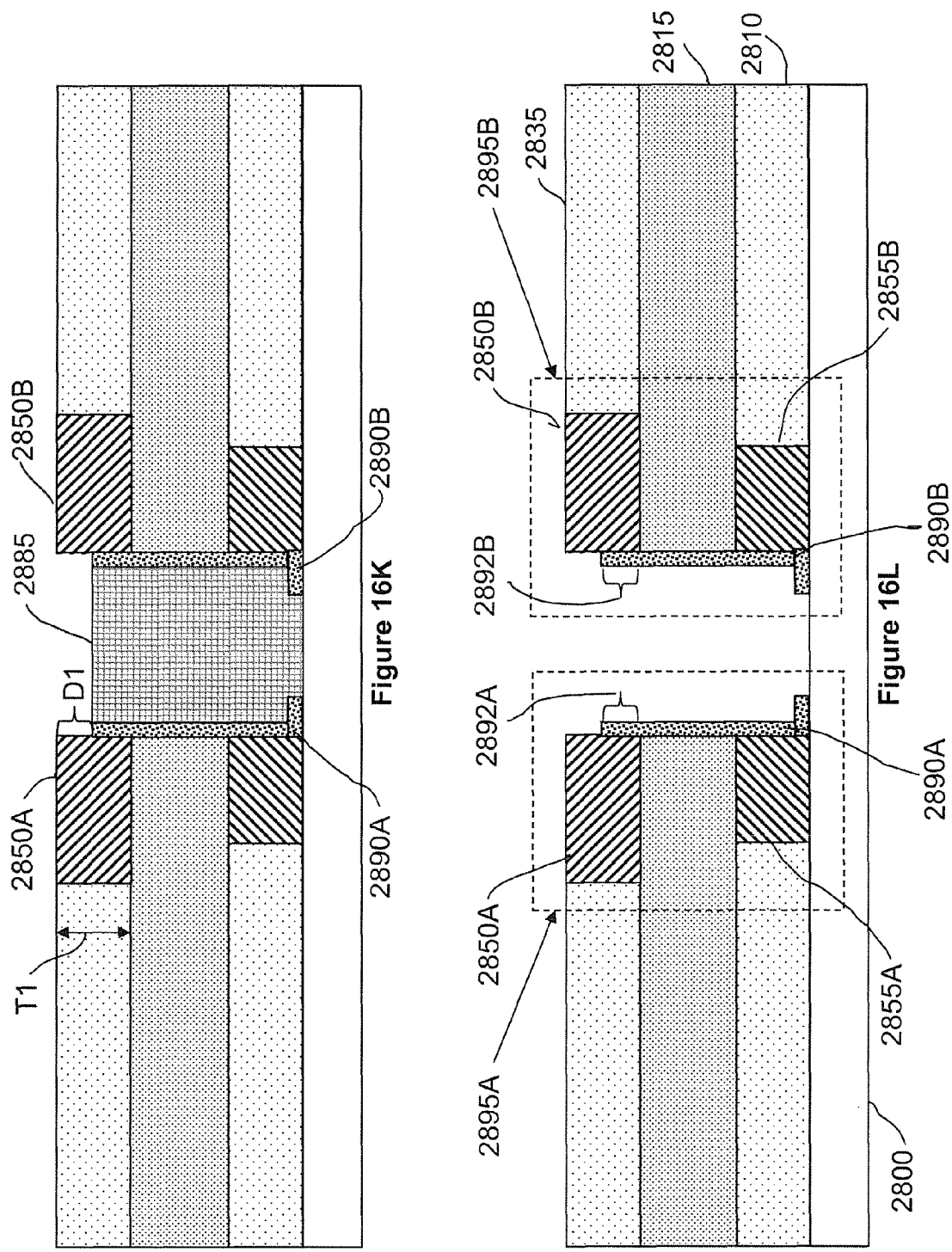

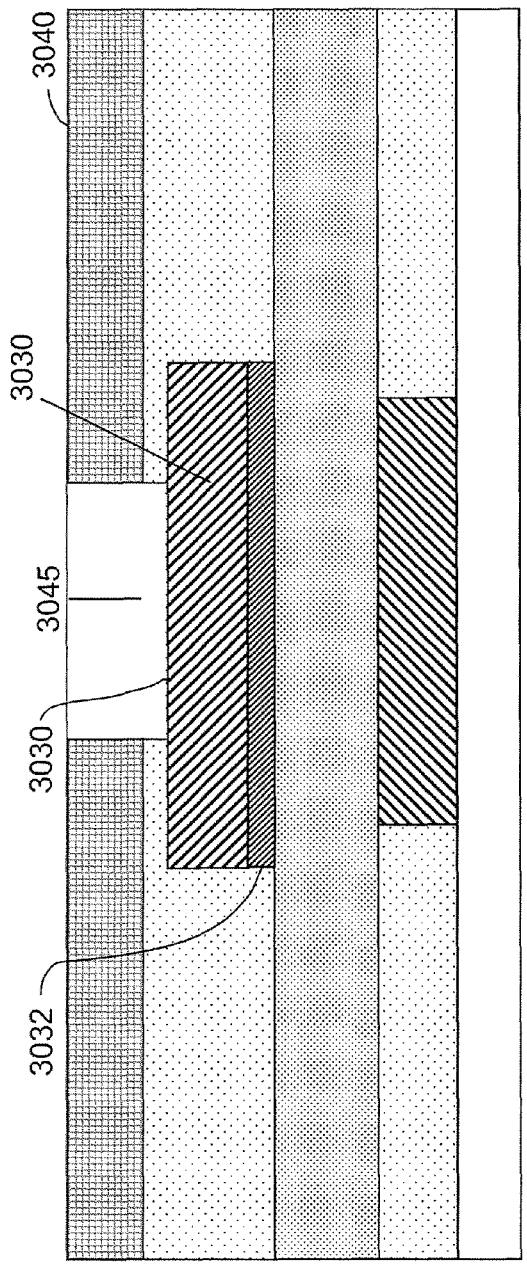
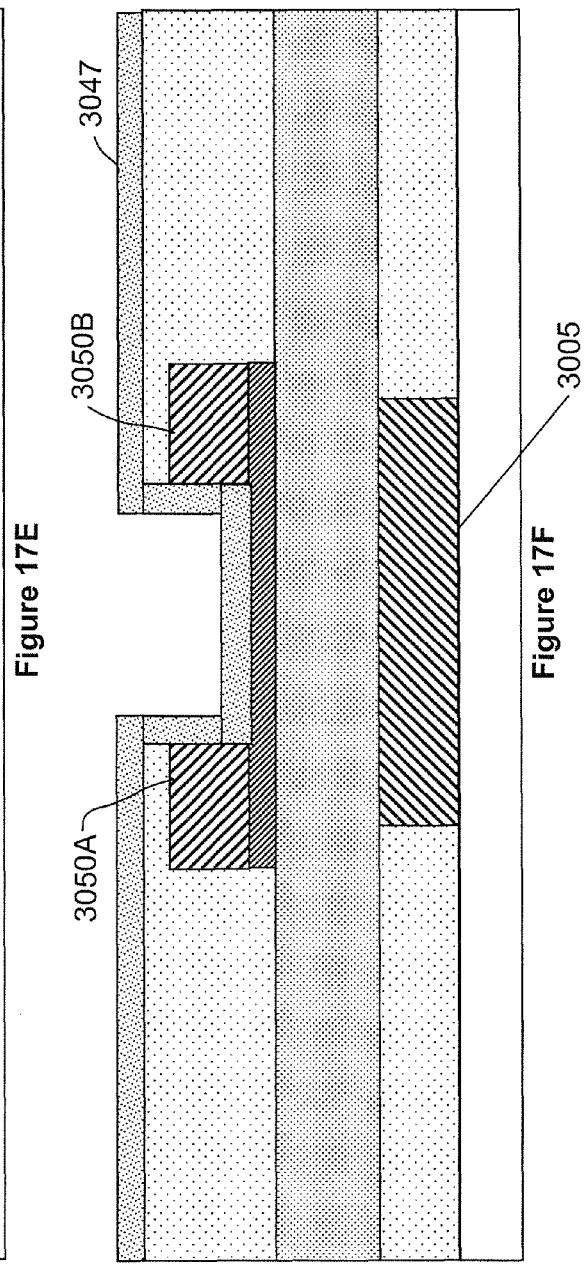
Figure 17E
Figure 17F

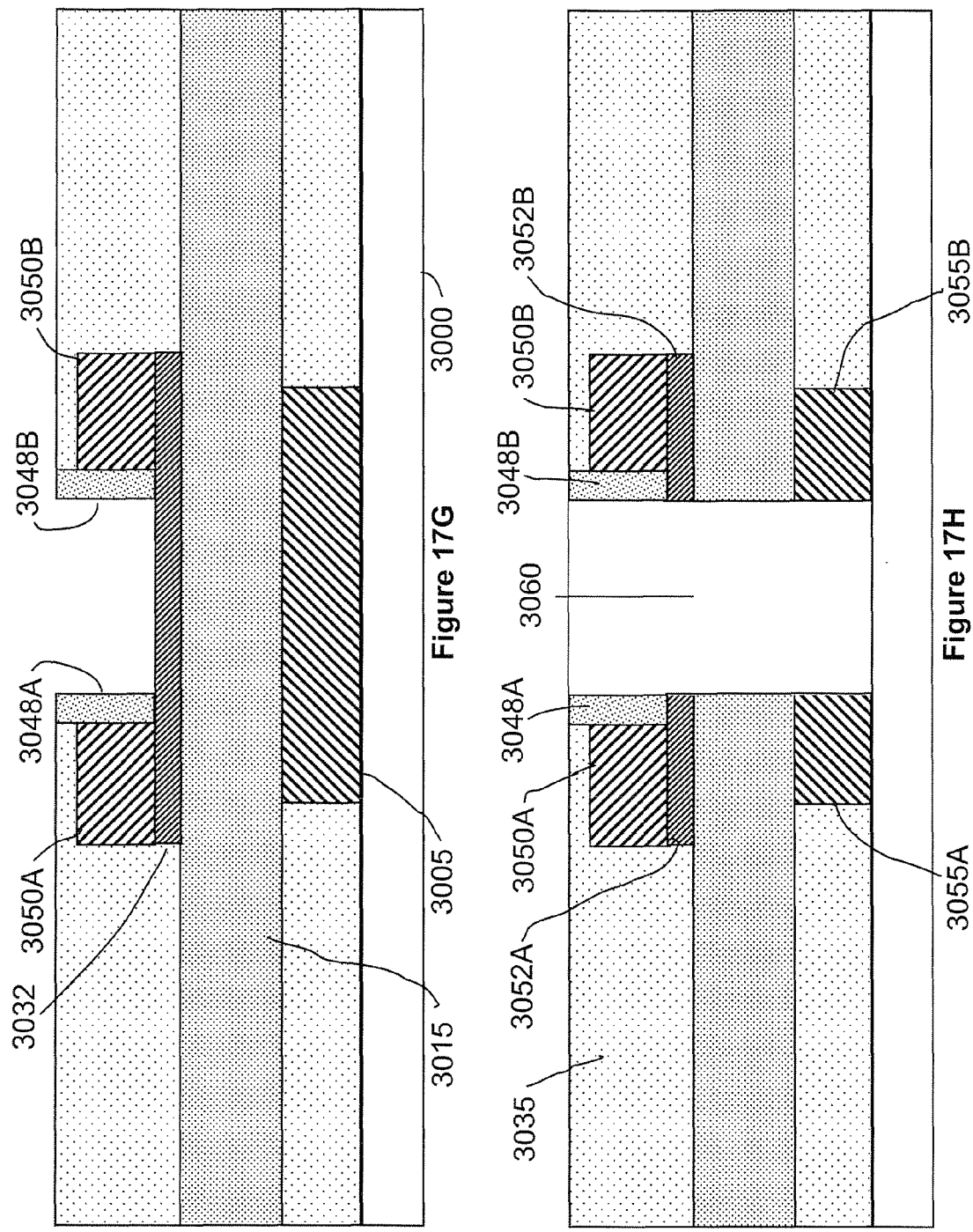

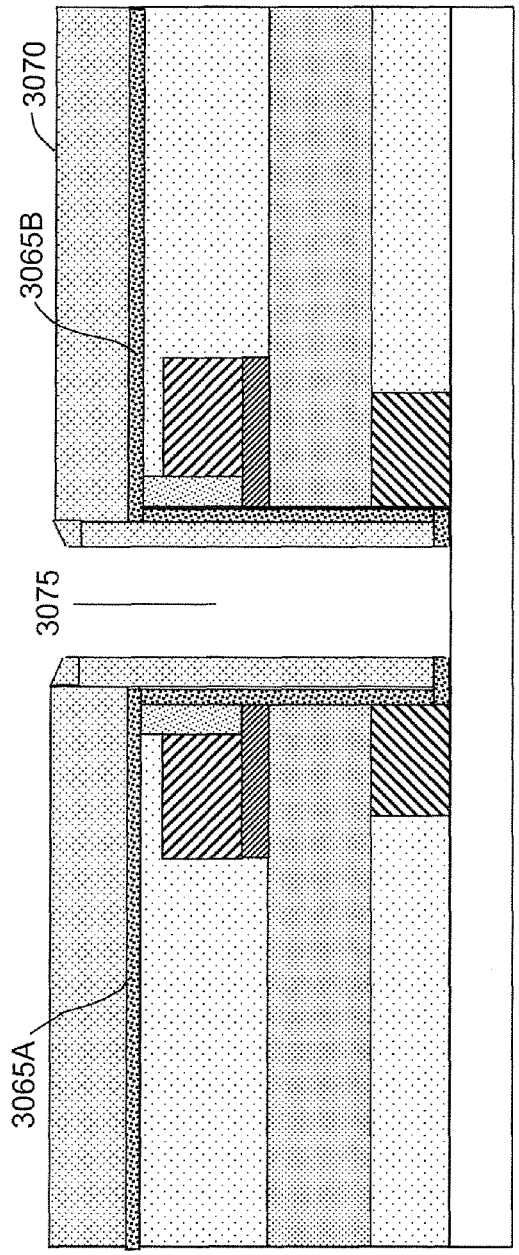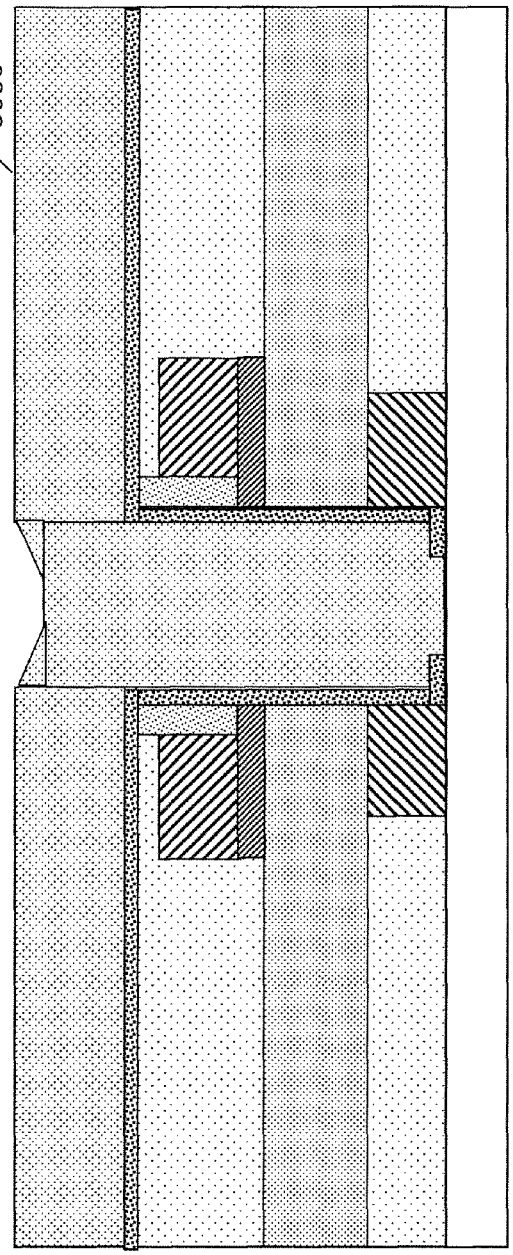

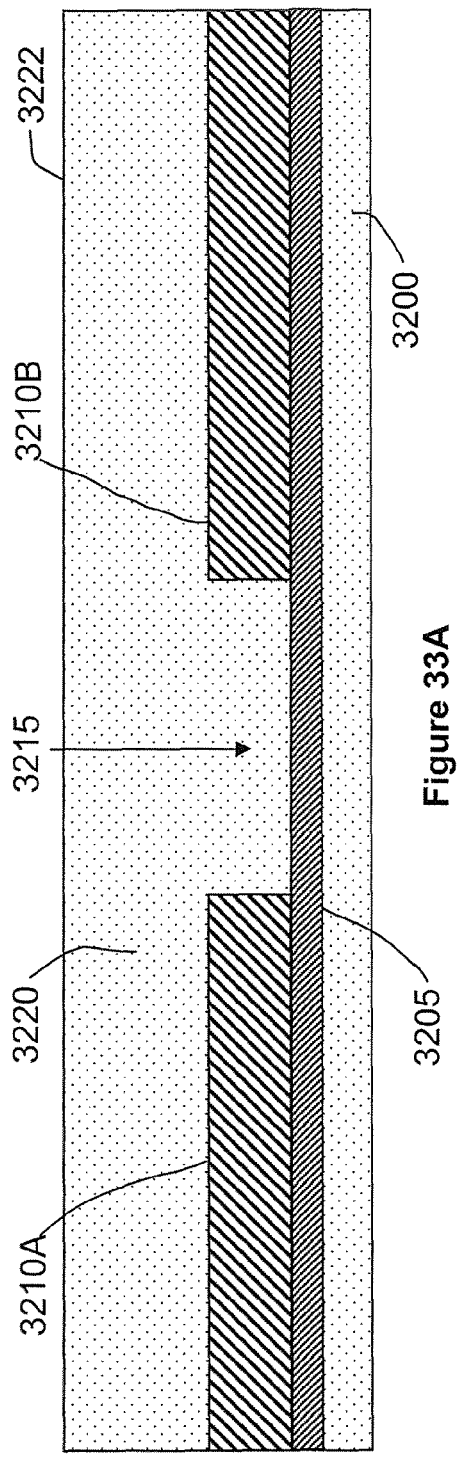
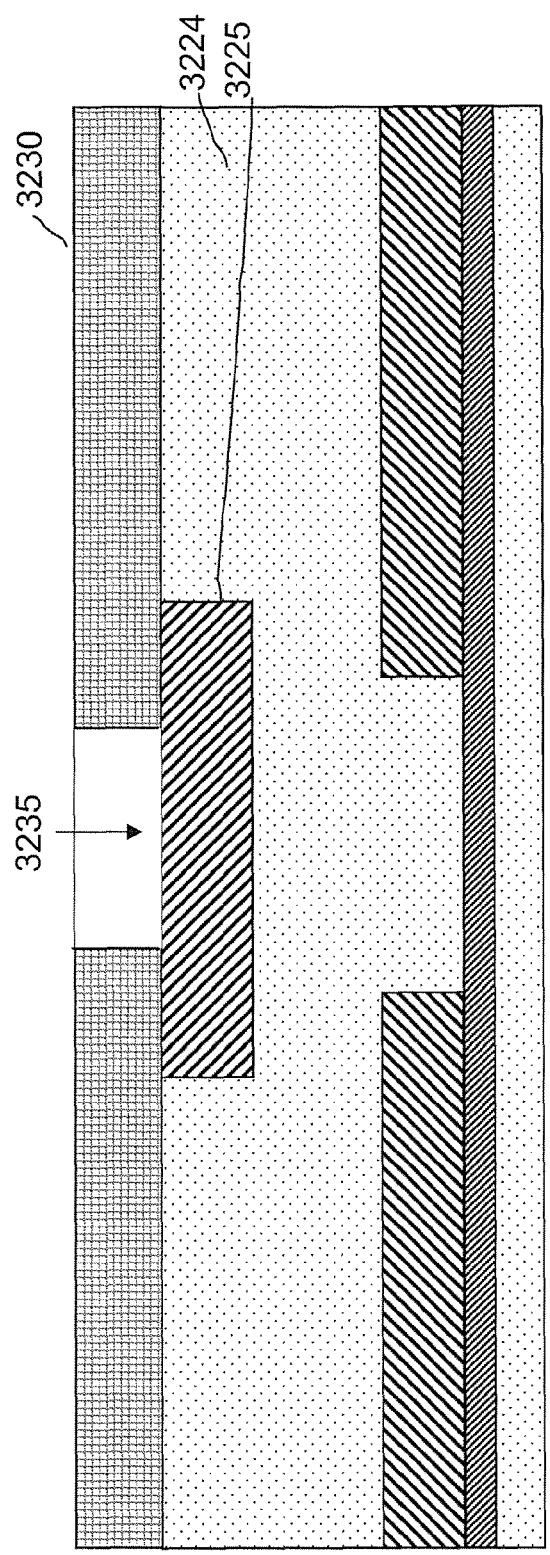

TWO-TERMINAL NANOTUBE DEVICES AND SYSTEMS AND METHODS OF MAKING SAME

CROSS-REFERENCE TO RELATED APPLICATIONS

This application claims priority under 35 U.S.C. §120 and is a continuation of U.S. patent application Ser. No. 12/861, 046, filed on Aug. 23, 2010, entitled Two-Terminal Nanotube Devices and Systems and Methods of Making Same, which is a continuation of U.S. patent application Ser. No. 11/280,786, filed on Nov. 15, 2005, entitled Two-Terminal Nanotube Devices and Systems and Methods of Making Same. U.S. patent application Ser. No. 11/280,786, claims priority under 35 U.S.C. §119(e) to the following applications, the contents of which are incorporated herein in their entirety by reference:

U.S. Provisional Patent Application No. 60/679,029, filed on May 9, 2005, entitled Reversible Nanoswitch;

U.S. Provisional Patent Application No. 60/692,891, filed on Jun. 22, 2005, entitled Reversible Nanoswitch;

U.S. Provisional Patent Application No. 60/692,918, filed on Jun. 22, 2005, entitled NRAM Nonsuspended Reversible Nanoswitch Nanotube Array; and U.S. Provisional Patent Application No. 60/692,765, filed on Jun. 22, 2005, entitled Embedded CNT Switch Applications For Logic.

This application is related to the following applications, the contents of which are incorporated herein in their entirety by reference:

U.S. Pat. No. 7,479,654 entitled Memory Arrays Using Nanotube Articles With Reprogrammable Resistance, issued Jan. 20, 2009; and U.S. Pat. No. 7,394,687, entitled Non-Volatile Shadow Latch Using A Nanotube Switch issued Jul. 1, 2008.

BACKGROUND

Technical Field

The present application is generally related to the field of switching devices and, more specifically, to two terminal nanotube devices that may be used to make non-volatile and other memory circuits.

Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or extreme environment. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to extreme environment because they may generate electrical currents inside the semiconductor material. It is possible to manufacture integrated circuits with special devices and isolation techniques so that they remain operational when exposed to extreme environment, but the high cost of these devices limits their availability and practicality. In addition, such digital circuits exhibit timing differences from their normal counterparts, requiring additional design verification to add protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Conventional logic solutions are limited to silicon substrates, but logic circuits built on other substrates would allow logic devices to be integrated directly into many manufactured products in a single step, further reducing cost.

Devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 July, 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Pat. No. 6,919,592, entitled "Electromechanical Memory Array Using Nanotube Ribbons and Method for Making Same" discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, as disclosed in U.S. Pat. No. 6,919,592, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As disclosed in U.S. Pat. No. 6,911,682, entitled "Electromechanical Three-Trace Junction Devices," three-trace architectures may be used for electromechanical memory cells, in which the two of the traces are electrodes to control the deflection of the ribbon.

The use of an electromechanical bi-stable device for digital information storage has also been suggested (See U.S. Pat. No. 4,979,149, entitled "Non-volatile Memory Device Including a Micro-Mechanical Storage Element").

The creation and operation of bi-stable, nano-electromechanical switches based on carbon nanotubes (including mono-layers constructed thereof) and metal electrodes has been detailed in earlier patent applications having a common assignee as the present application, U.S. Pat. Nos. 6,784,028, 6,835,591, 6,574,130, 6,643,165, 6,706,402, 6,919,592, 6,911,682, and 6,924,538; U.S. Patent Publication Nos. 2005-0062035, 2005-0035367, 2005-0036365, 2004-0181630; and U.S. patent application Ser. Nos. 10/341,005, 10/341,055, 10/341,054, 10/341,130, the contents of which are hereby incorporated by reference in their entireties (hereinafter and hereinbefore the "incorporated patent references").

SUMMARY

The present invention provides structures and methods of making two-terminal nanotube switches, arrays of memory cells based on these switches, fuse/antifuse devices based on these switches, and reprogrammable wiring based on these switches.

Under one aspect, a two terminal switching device includes a first conductive terminal and a second conductive terminal in spaced relation to the first terminal. The device also includes a nanotube article having at least one nanotube. The article is arranged to overlap at least a portion of each of the first and second terminals. The device also includes a stimulus circuit in electrical communication with at least one of the first and second terminals. The stimulus circuit is capable of applying a first electrical stimulus to at least one of the first and second terminals to change the resistance of the device between the first and second terminals from a relatively low resistance to a relatively high resistance, and is capable of applying a second electrical stimulus to at least one of the first and second terminals to change the resistance of the device between the first and second terminals from a relatively high resistance to a relatively low resistance. The relatively high resistance between the first and second terminals corresponds to a first state of the device, and the relatively low resistance between the first and second terminals corresponds to a second state of the device. The first and second states of the device may be nonvolatile. The resistance of the first state may be at least about ten times larger than the resistance of the second state.

Under another aspect, the nanotube article overlaps at least a portion of the first terminal with a controlled geometrical relationship. The controlled geometrical relationship may allow electrical current to flow relatively well between the first terminal to the nanotube article, and allow heat to flow relatively poorly between the first terminal and the nanotube article. The controlled geometrical relationship may be a predetermined extent of overlap. Under another aspect, at least one of the first and second terminals has a vertically oriented feature, and the nanotube article substantially conforms to at least a portion of the vertically oriented feature. Under another aspect, the nanotube article includes a region of nanotube fabric of defined orientation.

Under another aspect, the first electrical stimulus is an erase operation. Under another aspect, the second electrical stimulus is a program operation. Under another aspect, the stimulus circuit is capable of applying a third electrical stimulus to at least one of the first and second terminals to determine the state of the device. The third electrical stimulus may be a non-destructive read-out operation.

Under another aspect, a two-terminal memory device includes a first conductive terminal and a second conductive terminal in spaced relation to the first conductive terminal. The device also includes a nanotube article having at least one nanotube. The article is arranged to overlap at least a portion of each of the first and second terminals. The device also includes a stimulus circuit in electrical communication with at least one of the first and second terminals. The stimulus circuit is capable of applying a first electrical stimulus to at least one of the first and second terminals to open one or more gaps between one or more nanotubes and one or more conductors in the device. The opening of one or more gaps changes the resistance of the device between the first and second terminals from a relatively low resistance to a relatively high resistance. The stimulus circuit is also capable of applying a second electrical stimulus to at least one of the first and second terminals to close one or more gaps between one or more nanotubes and one or more conductors in the device. The closing of one or more gaps changes the resistance of the device between the first and second terminals from a relatively high resistance to a relatively low resistance. A conductor in the device comprises one or more of the first terminal, the second terminal, a nanotube, and a nanotube segment. The relatively high resistance between the first and second terminals corresponds to a first state of the device, and the relatively low resistance between the first and second terminals corresponds to a second state of the device. The first and second states of the device may be nonvolatile.

Under another aspect, the first electrical stimulus overheats at least a portion of the nanotube article to open one or more gaps. Under another aspect, one or more thermal characteristics of the device are selected to minimize a flow of heat out of the nanotube element. The flow of heat out of the nanotube element may be minimized by arranging the nanotube article and the first terminal with a controlled geometrical relationship that limits heat flow out of the nanotube article and into the first terminals. The controlled geometrical relationship may be a predetermined extent of overlap. The flow of heat out of the nanotube element may be minimized by selecting a material for the first terminal that conducts electricity relatively well and conducts heat relatively poorly. The material may have a relatively high electrical conductivity and a relatively low thermal conductivity.

Under another aspect, the first electrical stimulus opens one or more gaps by forming a gap between one or more nanotubes and one or more of the first and second terminals. Under another aspect, the first electrical stimulus opens one or more gaps by separating one or more nanotubes from one or more other nanotubes in an electrical network of nanotubes. Under another aspect, the first electrical stimulus opens one or more gaps by breaking one or more nanotubes into two or more nanotube segments. Under another aspect, the first electrical stimulus opens one or more gaps by exciting one or more phonon modes of one or more nanotubes in the nanotube article. The one or more phonon modes may behave as a thermal bottleneck. The one or more phonon modes may be optical phonon modes. One or more nanotubes in the nanotube article may selected to have a particularly strong radial breathing mode, or a defect mode. Under another aspect, the second electrical stimulus closes one or more gaps by attracting one or more nanotubes to one or more conductors. The second electrical stimulus may attract one or more nanotubes to one or more conductors by generating an electrostatic attraction.

Under another aspect, a selectable memory cell includes a cell selection transistor including a gate, a source, and a drain, with the gate in electrical contact with one of a word line and a bit line, and a drain in electrical contact with the other of the word line and the bit line. The cell also includes a two-terminal switching device, which includes a first conductive terminal, a second conductive terminal, and a nanotube article having at least one nanotube and overlapping at least a portion of each of the first and second terminals. The first terminal is in electrical contact with the source of the cell selection transistor and the second terminal is in electrical contact with a program/erase/read line. The cell also includes a memory operation circuit in electrical communication with the word line, bit line, and program/erase/read line. The memory operation circuit is capable of applying a select signal on the word line to select the cell and an erase signal on the program/erase/read line to change the resistance of the device between the first and second terminals from a relatively low resistance to a relatively high resistance. The memory operation circuit is also capable of applying a select signal on the word line to select the cell and a program signal on the program/erase/read line to change the resistance of the device between the first and second terminals from a relatively high resistance to a relatively low resistance. The relatively high resistance between the first and second terminals corresponds to a first informational state of the memory cell, and the relatively high resistance between the first and second conductive elements corresponds to a second informational state of the memory cell. The first and second informational states may be nonvolatile.

Under another aspect, the memory operation circuit applies a select signal on the word line to select the cell and a read signal on the program/erase/read line to determine the informational state of the memory cell. Determining the informational state of the memory cell may not change the state of the memory cell. Under another aspect, a plurality of selectable memory cells are connected to the program/erase/read line.

Under another aspect, a reprogrammable two-terminal fuse-antifuse device includes a first conductor, a second conductor in spaced relation to the first conductor, and a nanotube element having at least one nanotube and overlapping at least a portion of each of the first and second conductors. The nanotube element is capable of opening an electrical connection between the first and second conductors in response to a first threshold voltage across the first and second conductors to form a first device state. The nanotube element is also capable of closing an electrical connection between the first and second conductors in response to a second threshold voltage across the first and second conductors to form a second device state. The device may be a cross-point switch. The first and second device states may be nonvolatile.

Under another aspect, a reprogrammable interconnection between a plurality of wiring layers includes a first conductive terminal and a plurality of wiring layers, each of which includes a wiring layer conductive terminal. The interconnection also includes a stimulus circuit in electrical communication with the first conductive terminal and with each wiring layer conductive terminal. The interconnection also includes a nanotube article having at least one nanotube. The nanotube article is arranged to overlap at least a portion of the first conductive terminal and at least a portion of each wiring layer conductive terminal. The stimulus circuit is capable of applying a first electrical stimulus to cause the nanotube article to form an interconnection between two wiring layers of the plurality of wiring layers. The stimulus circuit is also capable of applying a second electrical stimulus to cause the nanotube article to break an interconnection between two wiring layers of the plurality of wiring layers. Under another aspect, the stimulus circuit breaks all interconnections in response to a security concern.

Under another aspect, a method of making a two terminal memory device includes providing a first conductive terminal, and providing a second conductive terminal in spaced relation to the first terminal. The method also includes providing a stimulus circuit in electrical communication with at least one of the first and second terminals. The method also includes providing a nanotube article comprising at least one nanotube. The nanotube article overlaps by a predetermined extent at least a portion of at least one of the first and second terminals. The device response is a function of the predetermined extent of overlap between the nanotube article and the at least one of the first and second terminals.

The predetermined extent of overlap may be determined by a timed isotropic etch procedure. The predetermined extent of overlap may be determined by a directional etch procedure. The predetermined extent of overlap may be determined by a thickness of a sacrificial film. The predetermined extent of overlap may be determined by a thickness of the at least one of the first and second terminals.

Under another aspect, the method includes fabricating a second memory device, which has a structure that is a mirror image of a structure of the two terminal memory device.

BRIEF DESCRIPTION OF THE DRAWINGS

In the Drawing,

FIGS. 8A-F illustrate cross sectional views of structures created during fabrication steps according to certain embodiments of the invention;

FIGS. 10A-I illustrate cross sectional views of structures created during fabrication steps according to certain embodiments of the invention;

FIGS. 11A-C illustrate cross sectional views of structures created during fabrication steps according to certain embodiments of the invention;

FIGS. 12A, B and 13 illustrate cross sectional views of structures created during fabrication steps according to certain embodiments of the invention;

FIGS. 14A-J illustrate cross sectional views of structures created during fabrication steps according to certain embodiments of the invention;

FIGS. 16A-L illustrate cross sectional views of structures created during fabrication steps according to certain embodiments of the invention;

FIGS. 17A-M illustrate cross sectional views of structures created during fabrication steps according to certain embodiments of the invention;

FIGS. 33A-G illustrate cross sectional views of structures created during fabrication steps according to certain embodiments of the invention;

DETAILED DESCRIPTION

Figure 1A:
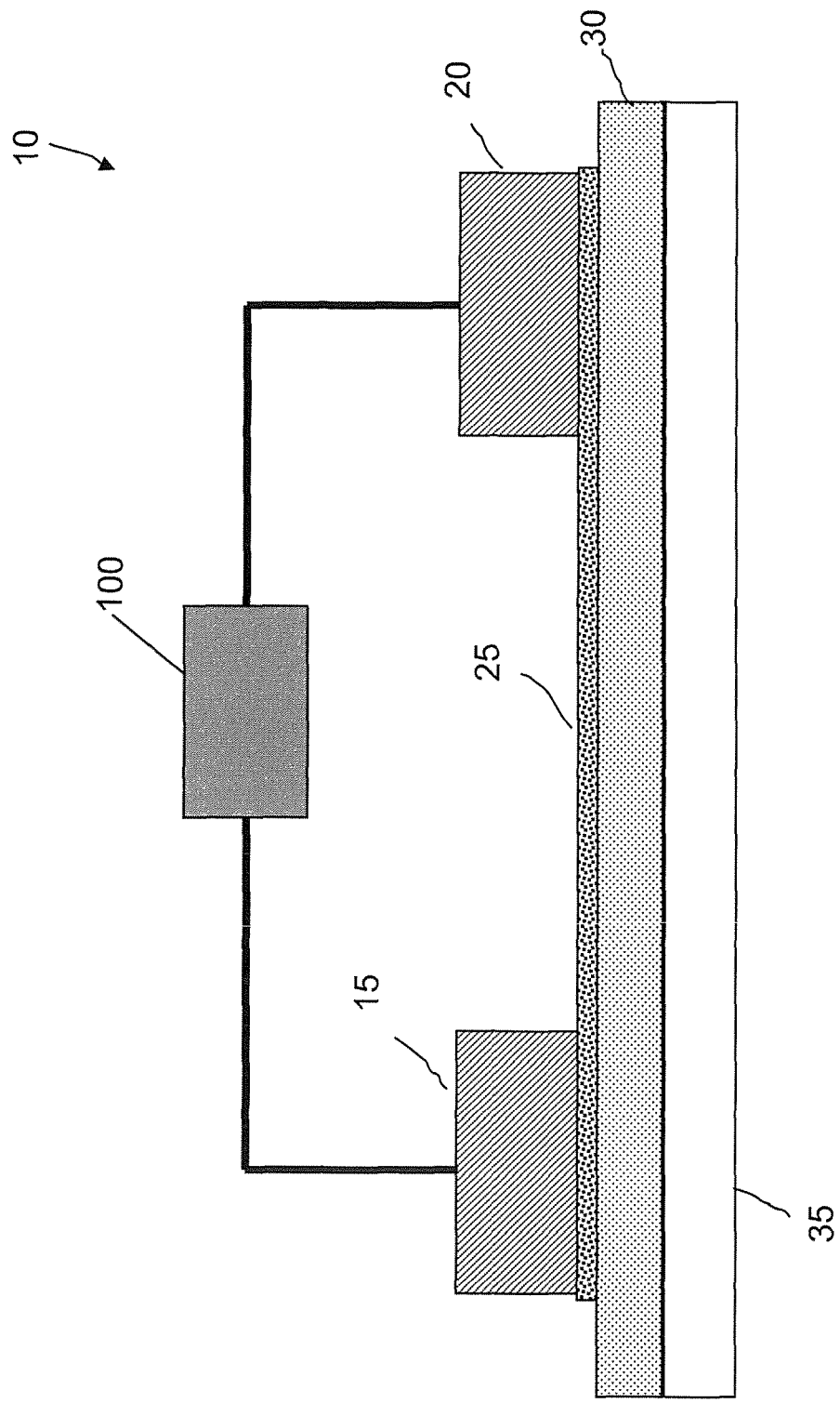
FIG. 1A illustrates a cross sectional view of an exemplary embodiment of the present invention.

Preferred embodiments of the present invention provide two-terminal nanotube switches, and a number of devices using those switches. In general, a nanotube element or article overlaps at least a portion of each of two terminals, e.g., conductive elements. A stimulus circuit, connected to one or both of the terminals, applies appropriate electrical stimulus to which the nanotube element responds by changing the state of the switch. For example, the resistance of an electrical pathway between the two terminals characterizes the state of the switch. A relatively high resistance pathway corresponds to an "open" or OFF state of the switch, and a relatively low resistance pathway corresponds to a "closed" or ON state of the switch. The two states are non-volatile. The stimulus circuit can non-destructively read-out (NDRO) the state of the switch, and can change the state (e.g., resistance) of the switch repeatedly.

The inventors believe that the ability to change the switch between the two states is related to a relationship between the thermal and electrical characteristics of the switch. More specifically, the inventors believe that the performance of the switch is related to a relationship between the electrical current that passes through the nanotube element and the dissipation of heat out of the nanotube element. Desirably, in order to change the switch to the "open" state, the stimulus circuit applies a stimulation that is, the inventors believe, large enough to cause overheating in the nanotube element, and at the same time the switch has design characteristics that limit the amount of current-induced heat that can flow out of the nanotube element. The inventors believe that this allows the overheating of the nanotube element, which breaks conductive paths in the switch and creates the "open" state. In other words, the inventors believe that thermal and electrical management of the switch enhance the buildup of heat in the nanotube element, so that an "open" state can be formed. In some embodiments, thermal and electrical management is accomplished by overlapping the nanotube article with at least one of two terminals, e.g., conductive elements, in a predetermined, controlled way. For example, in some embodiments, the nanotube element overlaps at least one of the two terminals with a specified geometry, e.g., a controlled overlap length of a preferred length. Then heat flows poorly from the nanotube element into the terminal, but the length of contact is long enough that current flows well from the terminal into the nanotube element. In some embodiments, thermal and electrical management is accomplished by fabricating the switch from selected materials that dissipate heat particularly poorly. For example, the switch can be passivated with a layer that has a low thermal conductivity, which helps to trap heat in the nanotube element. Or, the terminals can be fabricated from a material that has a relatively good electrical conductivity and a relatively poor thermal conductivity. Other designs and materials for thermal and electrical management of the switch are contemplated. It should be noted that while changes in the resistance of the switch due to electrical stimulation have been repeatedly observed, that the causes of these resistance changes are still being considered from both a theoretical and experimental standpoint. At the time of filing, it is the inventors' belief that thermal effects as described herein may cause or contribute to the observed behavior. Other effects may also cause or contribute the observed behavior.

The switch can be fabricated using methods that are easily integrated into existing semiconductor fabrication methods, as described in greater detail below. Several methods that allow the fabrication of an overlap of specified geometry between the nanotube article or element and a terminal are described in detail.

Because the switch can be controllably switched between two non-volatile states, and because the fabrication of the switch can be integrated into existing semiconductor fabrication methods, the switch is useful in a number of applications. For example, the switch can be implemented in non-volatile random access memory (NRAM) arrays, reprogrammable fuse/antifuse devices, and in reprogrammable wiring applications.

First, embodiments of nanotube-based nonvolatile memory devices/switches will be shown, and their various components will be described. Next, methods of fabricating switching elements will be illustrated. Methods of testing as-fabricated switching elements will be described. Last, embodiments of devices that utilize nanofabric-based nonvolatile elements, such as memory arrays, fuse/antifuse devices, and reprogrammable wiring, and methods of making same, will be illustrated.

2-Terminal Nanotube Switches

FIG. 1A illustrates a cross sectional representation of nonvolatile 2-terminal nanotube switch (2-TNS) 10. Nanotube element 25 is disposed on substrate 35, which includes a layer of insulator 30. Nanotube element 25 at least partially overlaps two terminals, e.g., conductive elements 15 and 20, which are both deposited directly onto nanotube element 25.

In this embodiment, nanotube element 25 is patterned within a region that can be defined before or after deposition of conductive elements 15 and/or 20.

Conductive elements 15 and 20 are in contact with a stimulus circuit 100. Stimulus circuit 100 electrically stimulates at least one of conductive elements 15 and 20, which changes the state of switch 10. More specifically, nanotube element 25 responds to the stimulation by changing the resistance of switch 10 between the conductive elements 15 and 20; the relative value of the resistance corresponds to the state of the switch. For example, if stimulus circuit 100 applies a relatively high voltage and relatively high current across conductive elements 15 and 20, then nanotube element 25 responds by changing the resistance of the switch between conductive elements 15 and 20 to a relatively high resistance. This corresponds to an "erased" state of the device, where electrical conduction is relatively poor between conductive elements 15 and 20. For example, if stimulus circuit 100 applies a relatively low voltage and relatively low current across conductive elements 15 and 20, then nanotube element 25 responds by changing the resistance of the switch between conductive elements 15 and 20 to a relatively low resistance. This corresponds to a "programmed" state of the device, where electrical conduction is relatively good, or even near-ohmic, between conductive elements 15 and 20. Generally it is preferable that the values of the high and low resistances are separated by at least an order of magnitude. Example voltages, currents, and resistances for "programmed" and "erased" switch states for some embodiments of two-terminal nanotube switches are described in greater detail below.

Conductive elements 15 and 20 are preferably made of a conductive material, and can be made of the same or different materials depending on the desired performance characteristics of switch 10. Conductive elements 15 and 20 can, for example, be composed of metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, or semiconductor, materials can also be used. Conductive elements 15 and 20 generally have a thickness in the range of 5 to 500 nm, for example. In this embodiment, conductive elements 15 and 20 are preferably separated by about 160 nm. The separation can be as small or as large as allowed by process design, for example from 5 nm up to 1 micron, depending on the desired characteristics of switch 10. Preferably the separation is less than about 250 nm.

Preferred methods of fabricating a full overlap between a nanotube element and a terminal, or conductive element, follow well known techniques described in patent publications and issued patents listed above and commonly assigned to the assignee of the present application, or are currently used in present-day electronic industry practices. Preferred methods of fabricating a partial overlap between a nanotube element and a terminal, or conductive element, of a controlled overlap length are described in greater detail below.

Insulator 30 may be composed of $SiO_2$, SiN, $Al_2O_3$, BeO, polyimide, or other suitable insulating material, and have a thickness in the range of 2 to 500 nm, for example. Insulator 30 is supported by substrate 35, made from silicon for example. Substrate 35 may also be a composite of semiconductors, insulators, and/or metals that connect to conductive elements 15 and 20 to supply electrical signals to nonvolatile 2-terminal nanotube switch (2-TNS) 10 as illustrated further below. In some embodiments, substrate 35 may be of the same material as insulator 30, e.g. quartz. In general, the substrate 35 may be any material that will accept the deposition of nanotubes by spin coating, but preferably a material chosen from the group consisting of a thermal oxide or nitride, including but not limited to silicon dioxide, silicon nitride, alumina on silicon, or any combination of the following on silicon or silicon dioxide: aluminum, molybdenum, iron, titanium, platinum, and aluminum oxide, or any other substrate useful in the semiconductor industry.

In some embodiments, nanotube element 25 is a fabric of matted carbon nanotubes (also referred to as a nanofabric). Methods of making nanotube elements and nanofabrics are known and are described in the incorporated patent references. In some embodiments, the nanotube element or fabric is porous, and material from conductive elements 15 and/or 20 fills at least some of the pores in the nanotube element. In some embodiments, nanotube element 25 includes single-walled nanotubes (SWNTs) and/or multi-walled nanotubes (MWNTs). In some preferred embodiments, the nanotube element 25 includes double walled nanotubes (DWNT). In some preferred embodiments, nanotube element 25 includes one or more bundles of nanotubes. In some preferred embodiments, nanotube element 25 includes one or more bundles of DWNTs. In some embodiments, nanotube element 25 includes SWNTs, MWNTs, nanotube bundles, and a large proportion of DWNTs. In some embodiments, nanotube element 25 includes a single nanotube.

Some nanotubes fabricated by some methods are preferred for use in 2-TNS 10. For example, nanotubes produced by CVD processes are preferred, e.g., they tend to consistently exhibit the switching behavior described herein.

Figure 2A:
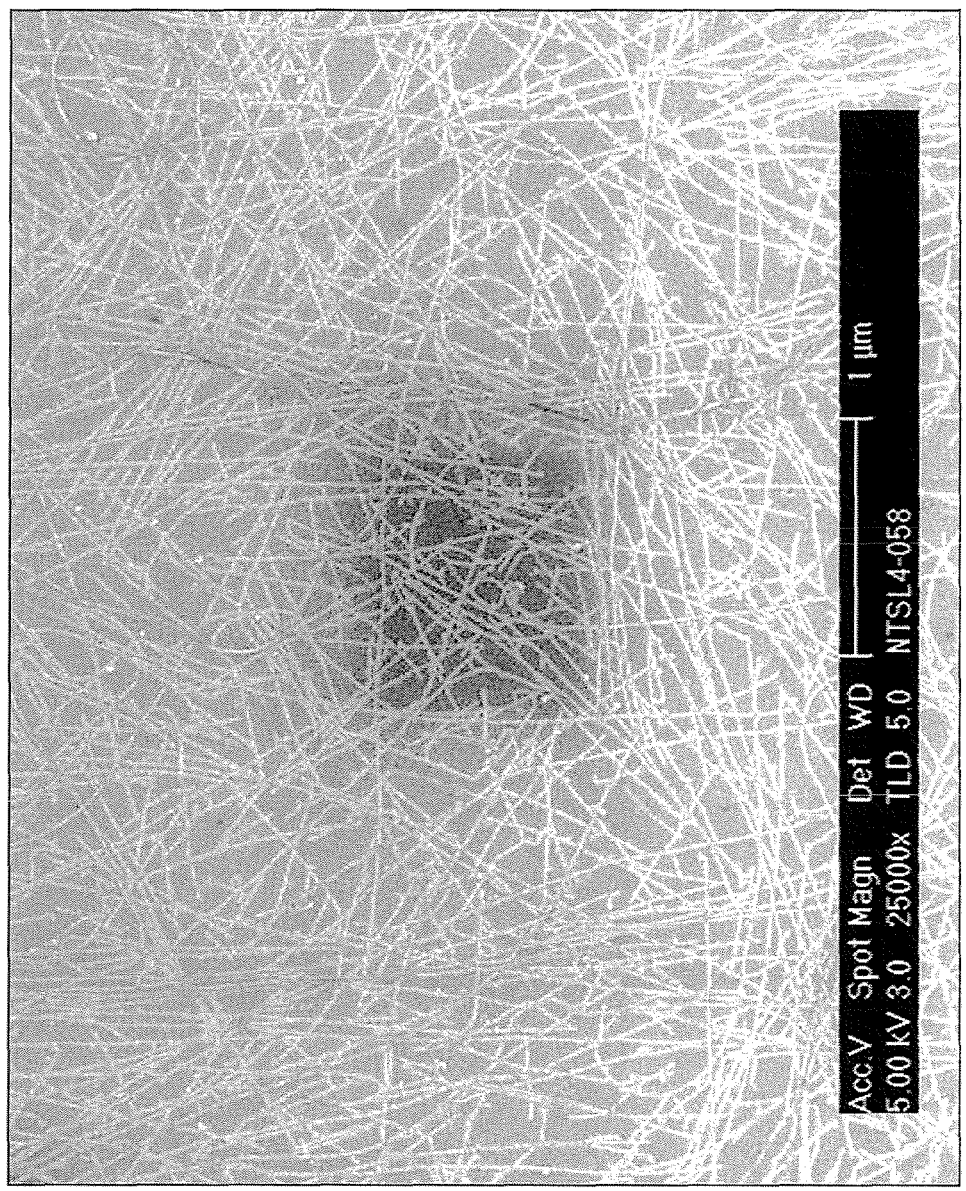
FIGS. 2A-I are SEM micrographs of structures according to certain embodiments of the invention.

FIG. 2A shows an SEM image of an example SWNT nanofabric 50 that is fabricated with a spin-on method as a substantially single layer of matted nanotubes. While FIG. 2A illustrates a nanofabric that is a monolayer, multiple layers of nanofabric may be fabricated with other appropriate techniques. That is, preferred embodiments do not require a nanofabric that is necessarily a monolayer of nanotubes. For example, the nanofabric can include bundles of nanotubes and/or single nanotubes. While FIG. 2A shows a nanofabric having randomly oriented nanotubes, aligned or nearly aligned nanotubes may be used as well. Also, the nanotubes can be metallic and/or semiconducting, as described in the incorporated patent references. In general, the nanofabric need not include carbon nanotubes at all, but simply needs to be made of a material and have a form that exhibits nonvolatile switching behavior as described herein, e.g. silicon nanowire based fabrics, other nanowires or quantum dots.

Figure 2B:
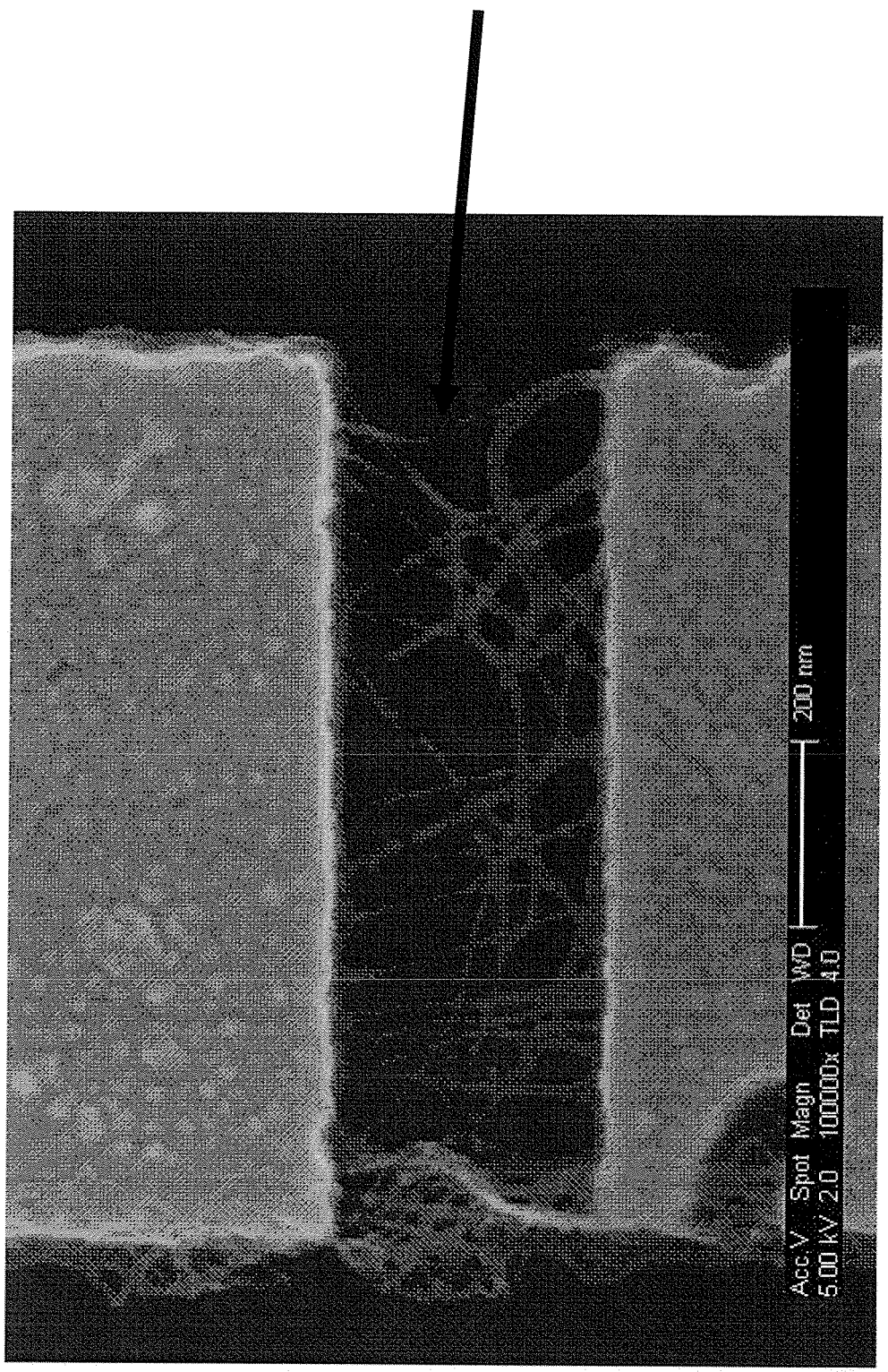
Figure 2C:
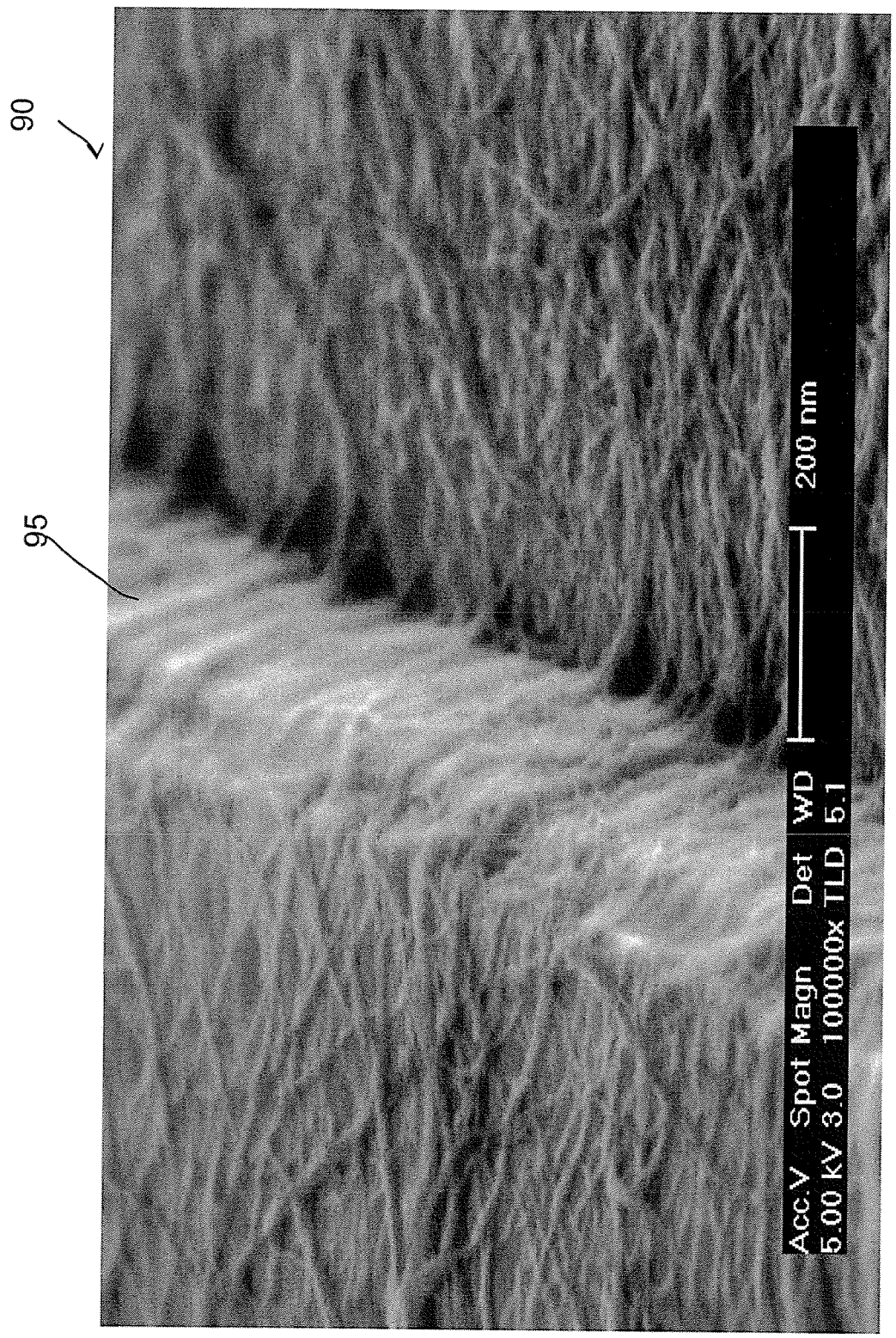

The nanofabric shown in FIG. 2A is preferably fabricated on a horizontal surface. In general, fabrics are conformal and may be oriented at various angles, without limitations. FIG. 2C is an SEM image of structure 90 with nanofabric 95 conforming to an underlying step after deposition. These conformal properties of nanofabrics may be used to fabricate vertically oriented 2-TNS with enhanced dimensional control and requiring less area (e.g. can be fabricated at greater density) as illustrated further below.

In some embodiments, nanotube element 25 in FIG. 1A is a SWNT nanofabric with a thickness between 0.5 to 5 nm. In other embodiments nanotube element 25 in FIG. 1A is a MWNT nanofabric with a thickness between 5 to 20 nm. SWNT diameters may be in the range of 0.5 to 1.5 nm, for example. Individual nanotubes may have a length in the 0.3 to 4 um range, and thus can be long enough to span the separation between conductive elements 15 and 20. Nanotubes may also be shorter than the distance between conductive elements 15 and 20 but contact (or "network with") other nanotubes to span the separation between the elements. See U.S. Pat. No. 6,706,402, entitled "Nanotube Films and Articles" for details of conductive articles and networks formed from nanotubes. In general, the nanotube density should be high enough to ensure that at least one nanotube or network of nanotubes spans the entire distance between conductive elements 15 and 20. Other preferred characteristics for nanotubes are described herein.

The two-terminal nanotube switch 10 illustrated in FIG. 1A has a pathway between conductive elements 15 and 20 that can be in one of two states. One state is characterized by a pathway that has a relatively high resistance, $R_{HIGH}$ between conductive elements 15 and 20. Current generally flows poorly between conductive elements 15 and 20 in this "open," "erased", or OFF state. The other state is characterized by a pathway that has a relatively low resistance, $R_{LOW}$ between conductive elements 15 and 20. Current generally flows easily between conductive elements 15 and 20 in this "closed," "programmed," or ON state.

Switch 10 is typically fabricated in the low-resistance state. The resistance of this state depends on the characteristics of nanotube element 25 and of conductive elements 15 and 20. The inherent resistance of nanotube element 25, and nanofabrics in general, can be controlled to be in the range of 100 to 100,000 ohms per square, for example, as measured by four-point probe measurements. Films with resistances between 1,000 to 10,000 ohms per square typically have a density of 250 to 500 nanotubes per square micron. In some embodiments nanotube element 25 preferably has, for example, between 1 and 30 nanotubes. In some embodiments nanotube element preferably has 5 to 20 nanotubes.

The total resistance of switch 10 between conductive elements 15 and 20 in the "closed" state includes the contact resistance of each overlap region in series, plus the inherent series resistance of the nanotube, divided by the number of nanotube pathways (which may be single nanotubes and/or networks of nanotubes) between elements 15 and 20. In some preferred embodiments, the total as-fabricated resistance of 2-TNS 10 is typically in the range of 10 kΩ to 40 kΩ. In other preferred embodiments, the switch can be designed such that the resistance is less than 100Ω or greater than 100 kΩ. An explanation of nanotube resistance may be found in the reference N. Srivastava and K. Banerjee, "A Comparative Scaling Analysis of Metallic and Carbon Nanotube Interconnections for Nanometer Scale VLSI Technologies", Proceedings of the $21^{st}$ International VLSI Multilevel Interconnect Conference (VMIC), Sep. 29-Oct. 2, 1004, Wikoloa, Hi., pp. 393-398.

In general, the device performance does not vary strongly with the density of nanotubes in the nanotube element. For example, the sheet resistance of the nanofabric can vary by a factor of at least 10, and the device performs equally well. In a preferred embodiment, the sheet resistance of the nanofabric is below approximately 1 kΩ. In some embodiments, the resistance of the nanofabric is assessed after fabrication, and if the resistance is found to be greater than approximately 1 kΩ, then additional nanofabric is deposited with a density sufficient to lower the resistance below about 1 kΩ.

Stimulus circuit 100 applies appropriate electrical stimulation to at least one of conductive elements 15 and 20 to switch 2-TNS 10 between the low resistance and high resistance states. In general, the appropriate electrical stimulation to 2-TNS 10 depends on the particular embodiment of the switch. For example, in some embodiments, stimulus circuit 100 can change switch 10 to the high resistance "open" state by applying a relatively high voltage bias across conductive elements 15 and 20 with unrestricted current. In some embodiments, this voltage is about 8-10 V, or about 5-8 V, or 3-5 V, or less. Sometimes, the electrical stimulation is a voltage pulse, and sometimes a series of pulses is used to switch 2-TNS 10 to the "open" state, for example a series of one or more pulses between 1-5 V. The duration of one or more pulses may also be varied to switch 2-TNS 10 to the "open" state. It has been found in some embodiments that allowing a relatively high current e.g. greater than 50 uA to flow through the switch can enhance its ability to switch to the "open" state. In some embodiments, stimulus circuit 100 must apply a stimulation that exceeds a critical voltage and/or current in order to switch 2-TNS 10 to an "open" state. In general, any electrical stimulation that is sufficient to cause 2-TNS 10 to switch to a relatively high resistance state can be used. In some embodiments, the state is characterized by a resistance $R_{HIGH}$ on the order of 1 GΩ or more. In general, the state can also be considered to be characterized by a relatively high impedance.

In some embodiments, stimulus circuit 100 can change switch 10 to the low resistance "closed" state by applying a relatively voltage bias across conductive elements 15 and 20. In some embodiments, a voltage of about 3-5 V, or about 1-3 V, or less, switches 2-TNS to the low-resistance state. In some cases, the electrical stimulation required to switch 2-TNS 10 to a "closed" state depends in part on the electrical stimulation that was used to switch 2-TNS 10 to an "open" state. For example, if a relatively high voltage bias was used to "open" the switch, then a relatively high voltage bias may be needed to "close" the switch. For example, if an 8-10 V pulse is used to "open" the switch, then a 3-5 V pulse may be needed to "close" the switch. If 3-5 V pulse is used to "open" the switch, then a 1-2 V pulse may be needed to "close" the switch. In general, the stimulation used to "open" and "close" the switch can vary each time, although the "close" stimulation depends in part on the "open" stimulation. In other words, even though the switch is "opened" for example with an 8-10 V pulse, and then "closed" with a 3-5 V pulse, the switch can subsequently be "opened" again with a 3-5 V pulse and "closed" with a 1-2 V pulse. Greater voltages used to open the switch lead to greater voltages to close the switch. Although the examples listed here use "open" voltages that are higher than the "close" voltages, in some embodiments the "close" voltages may be higher than the "open" voltages. A distinction between close and open operations relies more on current control than on voltage amplitude. As an example: a 6V erase pulse without current restriction can be used to open the switch and subsequently, an 8V program pulse with a current cap of 1 uA can be used to close the switch.

Sometimes, the electrical stimulation is a voltage pulse, and sometimes a series of pulses is used to switch 2-TNS 10 to the "closed" state, for example a series of one or more pulses between 1-5 V. The duration of one or more pulses may also be varied to cause 2-TNS 10 to switch to the "closed" state. In some embodiments, the same voltage level can be used to "close" and "open" the switch, but the waveforms of the two stimuli are different. For example, a series of pulses at a given voltage could be used to "open" the switch, and a single pulse at the same or a similar voltage could be used to "close" the switch. Or, for example, a long pulse at a given voltage could be used to "open" the switch, and a short pulse at the same or a similar voltage could be used to "close" the switch. Using these sorts of waveforms may simplify the design of 2-TNS 10 because multiple voltages may not need to be applied to the switch. In particular embodiments of the invention, this phenomenon occurs when currents are limited during program and unrestricted during erase.

It has also been found in some cases that limiting the current that flows through the switch can enhance its ability to switch to the "closed" state. For example, adding a 1 MΩ inline resistor between stimulus circuit 100 and one of conductive element 15 or 20, to limit the current in the switch to less than 1000 nA, can enhance the ability of 2-TNS 10 to switch to the "closed" state by about 40%. Another example is active circuitry that would limit the current during the program cycle. In general, any electrical stimulation that is sufficient to cause 2-TNS 10 to switch to a relatively low-resistance state can be used. In some embodiments, the state is characterized by a resistance $R_{LOW}$ on the order of about 100 kΩ or less. In some preferred embodiments, the resistance of the relatively high resistance state is at least about 10 times higher than the resistance of the relatively low resistance state. In general, the state can also be considered to be characterized by a relatively low impedance. In some preferred embodiments, the impedance of the relatively high impedance state is at least about 10 times higher than the impedance of the relatively low impedance state.

The two states are nonvolatile, i.e. they do not change until stimulus circuit 100 applies another appropriate electrical stimulus to at least one of conductive elements 15 and 20, and they retain state even if power is removed from the circuit. Stimulus circuit 100 can also determine the state of 2-TNS 10 with a non-destructive read-out operation (NDRO). For example, stimulus circuit 100 applies a low measurement voltage across conductive elements 15 and 20, and measures the resistance, R between the conductive elements. This resistance can be measured by measuring the current flow between conductive elements 15 and 20 and from that calculating the resistance R. The stimulus is sufficiently weak that it does not change the state of the device, for example is a voltage bias of about 1-2 V in some embodiments. In general it is preferable that $R_{HIGH}$ is at least ten times greater than $R_{LOW}$ so that stimulus circuit 100 can more easily detect the state.

The inventors believe that when the switch changes states, the conductive pathway in the switch experiences physical changes that modify its ability to carry current. In other words, the inventors believe that the electrical relationship changes between one or more conductors along the conductive pathway due to a change in the physical relationship between the conductors. In the state where the resistance of 2-TNS 10 is high, the inventors believe that an electrical separation, or discontinuity, exists between a sufficient number of conductors to significantly limit the pathway's ability to carry current. This may arise from a physical gap forming between those elements in response to electrical stimulation by stimulus circuit 100. In the state where the resistance of 2-TNS 10 is low, the inventors believe that an electrical contact or continuity exists between a sufficient number of conductors to allow the pathway to carry current relatively well. This may arise from the closing of a gap between one or more conductors in response to electrical stimulation by stimulus circuit 100.

The different conductors in the pathway of the switch include one or more individual nanotubes or nanotube segments in nanotube element 25, and two terminals 15 and 20. Because one or more nanotubes in the nanotube element provide the pathway between the two terminals, it is possible that a change in the physical relationship between the nanotubes and the terminals, and/or between the nanotubes, and/or within or between segments of each individual nanotube itself, causes the change in the switch state. For example, nanotubes may contact one or more of the terminals in the low resistance state, and may lose physical contact with one or more of the terminals in the high resistance state. Or, for example, an electrical network of nanotubes within the nanotube element may touch each other in the low resistance state, and may be separated by gaps in the high resistance state. Or, for example, an individual nanotube may be physically continuous in the low resistance state, and may have a physical gap in the middle of the nanotube in the high resistance state. The two resulting nanotube pieces or segments can each be considered to be a (shorter) nanotube. In general, the physical relationship between a nanotube and one or more conductors in the two-terminal nanotube switch may change. The inventors believe that depending on the particular embodiment, changes in one or more particular kinds of physical relationship, e.g., nanotube to terminal, network nanotube to network nanotube, or intra-nanotube, may predominate the switching behavior of the switch. For different physical design rules of the switch, the phenomena may vary.

The inventors believe that physical changes to the conductive pathway in 2-TNS 10 during an "open" stimulation by stimulus circuit 100 may arise from thermal effects in the conductors. More specifically, the inventors believe that overheating caused by the presence of a threshold voltage and/or current density in at least a portion of the nanotubes of nanotube element 25 may cause the nanotubes in the element to physically separate from one or more conductors in the pathway to form a gap. For example, it has been observed that a threshold current of about 20 microamps can physically break an individual nanotube into two distinct segments, which are separated by a gap. In some embodiments the gap is about 1-2 nm, and in other embodiments the gap is smaller than about 1 nm or larger than about 2 nm. This physical gap prevents current from flowing through the nanotube, yielding an "open" path characterized by a high resistance. If nanotube element 25 is a fabric of nanotubes, then the current in each individual nanotube may generally be a function of the total current and the number or density of nanotubes, accounting for the fact that in some cases many nanotubes may join together to form an electrical pathway. The inventors believe that in some embodiments, by applying a total current sufficient that the current in one or more individual nanotubes exceeds about 20 microamps, those nanotubes may overheat and break. Because those nanotubes no longer carry current, the current in unbroken nanotubes may increase, causing one or more of those nanotubes to overheat and break. Thus in rapid sequence most or all of the current-carrying nanotubes may overheat and break, creating an "open" path or "erased" state in 2-TNS 10, characterized by a relatively high resistance. FIG. 2B is a micrograph of a nanofabric switch that appears to show all or most of the conductive nanotubes pathways broken (for example, see arrow).

Similarly, the inventors believe that overheating caused by a threshold voltage and/or current density applied to the nanotubes may physically break contact between one or more nanotubes within an electrical network of nanotubes. While a particular threshold voltage and/or current density required to separate two nanotubes from each other within 2-TNS 10 is not currently identified, it is possible that the voltage and/or current density is comparable to or lower than that required to break an individual nanotube. Also, overheating caused by a threshold voltage and/or current density may physically break contact between one or more nanotubes in nanotube element 25 and one or more of conductive elements 15 and 20.

The inventors believe that in general, 2-TNS 10 may experience physical breaks at locations susceptible to overheating, e.g., weak thermal links or thermal bottlenecks along the pathway that nanotube element 25 provides between conductive elements 15 and 20. The inventors believe that if the pathway breaks at a given location, the current density may increase throughout the remainder of the pathway, which may induce overheating and breaks at other locations. Thus in rapid sequence most or all of the current-carrying pathways may overheat and break, creating an "open" path or "erased" state in 2-TNS 10, characterized by a relatively high resistance.

The inventors believe that a "close" stimulation by stimulus circuit 100 causes an electrostatic attraction that may cause the creation of a conductive pathway in 2-TNS 10. This attraction may pull or move the nanotubes and conductors into contact with each other. As discussed above, the electrical stimulation that is needed to switch 2-TNS 10 to a "closed" state has been observed to be in part a function of the electrical stimulation that was previously used to switch 2-TNS 10 to an "open" state. The inventors believe that this effect may be related to the size of the gap or gaps that a particular "open" stimulation causes between nanotubes and conductors in the pathway. For example, a relatively low "open" voltage may cause relatively small overheating, which may create relatively small gaps between nanotubes and conductors. Then, a relatively low "close" voltage may be required to sufficiently attract the nanotubes and conductors across those small gaps, and may bring them into contact with each other. Or, for example, a relatively high "open" voltage may cause relatively large overheating, which may create relatively large gaps between nanotubes and conductors. Then, a relatively high "close" voltage may be required to sufficiently attract the nanotubes and conductors across those large gaps, to bring them into contact with each other. An insufficiently high "close" voltage may not attract the nanotubes and conductors with sufficient strength to draw them into contact.

The inventors believe that an undesirably high "close" voltage, for example of about 8-10 V in some embodiments, may be high enough to attract a nanotube to a conductor. However, once the nanotube and conductor touch, the current that begins to flow through the connection may cause a local temperature jump at the connection. This may overheat the connection, and may cause the nanotube and conductor to again separate. This process of connecting and disconnecting may repeat until the "close" voltage is removed. In this case, the switch may fail because it cannot be programmed or "closed." However, the switch may be closed by a somewhat lower "close" voltage. An undesirably high "open" voltage, for example of about 15-16 V in some embodiments, may cause overheating that may cause a very large gap between the nanotubes and conductors, for example of 30-40 nm. This gap may be so large that no "close" voltage will be high enough to sufficiently attract the nanotubes and conductors so as to bring them into contact with each other. In this case, the switch may fail because it is no longer programmable. The switch may be irreparably damaged because no stimulus is sufficient to attract the nanotubes and conductors into contact.

The inventors believe that an alternative mechanism that can close the electrical pathway by stimulus circuit 100 may be due to electrical arcing that would occur across the gap (a gap formed by a previous "open" operation.) The electrons and/or resulting high temperature may draw material (located in the vicinity of the gap) into the gap, to re-establish a contiguous electrical pathway.

The inventors have observed that if 2-TNS 10 is not passivated, and is stimulated in an inert gas, then the strength of stimulation required to "close" the switch is related to the stimulation used to "open" the switch. In other words, the size of the gap may be related to the "close" stimulation in an inert gas. The inventors have also observed that if 2-TNS 10 is not passivated, and is stimulated in a vacuum, that the strength of the stimulation required to "close" the switch stays approximately constant, within about 10%, regardless of the stimulation used to "open" the switch. In other words, the size of the gap may be unrelated, or weakly related, to the stimulation in a vacuum. The inventors believe that a vacuum may allow heat to build up more rapidly in the nanotube element than it would in a gas, possibly because heat may leak from the nanotube element into the gas.

The inventors believe that overheating caused by the presence of a threshold voltage and/or current in 2-TNS 10, which may break contact between a nanotube and a conductor, is possibly related to the presence of thermally-induced lattice vibrations, or phonons, in the nanotube. In particular, the inventors believe that overheating may excite one or more particular phonon modes in the nanotube, and that this phonon mode may break contact between a nanotube and a conductor. In general, heat excites a spectrum of acoustic and optical phonons in a material, e.g., in a nanotube. Acoustic phonon modes can transport heat, while optical phonon modes generally do not contribute to the transport of heat. Some optical phonon modes may couple to acoustic phonon modes, allowing heat to flow from optical modes into acoustic modes, which then transport heat. However, if heat does not flow easily from optical modes into the acoustic modes, e.g., cannot be transported through the nanotube, then a rapid buildup of heat, or a thermal bottleneck, may occur in the nanotube. This may cause overheating that may be sufficient to break contact between the nanotube and a conductor.

The inventors have obtained Raman spectra for different species of nanotubes that have been tested in 2-TNS 10, and have observed that preferred nanotubes, e.g., nanotubes that consistently exhibit the switching behavior described herein, typically have a pronounced optical phonon mode that corresponds to a radial breathing mode of the nanotube. The inventors believe that this breathing mode may be related to the switching behavior of 2-TNS 10. For example, the mode may behave as a thermal bottleneck, trapping heat inside the nanotube. The mode may allow the nanotube, or a contact between the nanotube and a conductor, to be more easily damaged by a threshold voltage and/or current density than other species of nanotubes that do not exhibit the mode. This breathing mode may also couple to a mode that is related to the breaking of a nanotube, or of contact between the nanotube and a conductor. In other words, the breathing mode itself may not be directly related to the possible formation of gaps in the switch, but may be related to a phenomenon that may form gaps in the switch.

Preferred nanotubes may also have in common other phonon modes that relate to their ability to break contact with conductors. For example, in certain nanotubes one or more defect modes may exist, or one or more modes that may couple strongly to the mode of a bond between the nanotube and a conductor. In general, one or more optical or acoustic phonon modes may contribute to breaking the pathway in 2-TNS 10, e.g., "opening" the switch may be phonon-induced. Different species of nanotubes, for example nanotubes fabricated by different methods or with different process conditions, and/or nanotubes with different numbers of walls, may have different phonon spectra. Some species may possess phonon modes or other features that may cause or enhance the breakability of contact between a nanotube and a conductor. For example, having more than one wall may enhance the breakability of contact between a nanotube and a conductor.

The inventors believe that the switching behavior of 2-TNS 10 may result from a key relationship between the thermal and electrical characteristics of the components of the switch. The inventors believe that two-terminal nanotube switches preferably may provide a sufficiently high voltage and/or current to a nanotube element, and at the same may allow a sufficient amount of heat to build up in the nanotube element so as to break contact between one or more nanotubes and conductors. Preferably, this break is small enough that it can be re-programmably closed. By managing this relationship, preferred embodiments having enhanced performance can be designed and fabricated. These goals may be accomplished with electrical and/or thermal engineering, or management, of the device.

The goal of providing sufficient electrical stimulation to the nanotube element can be accomplished with techniques known in the art. In particular, the conductive elements preferably provide relatively good conduction of current into the nanotube element. The conductive elements are preferably relatively good electrical conductors. For example, the conductive elements can be metal or some other kind of conductive material. Preferably, the conductive elements can be fabricated with processed and materials that are easily integrated into, or already used in, existing fabrication methods. In at least the "closed" state, one or both of the conductive elements is preferably in near-ohmic contact with the nanotube element. Methods of fabricating near-ohmic contacts are known.

The goal of potentially allowing a sufficient amount of heat to build up in the nanotube element so as to break contact between a nanotube and a conductor, in response to an "open" stimulus, is somewhat more challenging. Many materials that can be useful for conductive elements, e.g., that conduct electricity well, also conduct heat well. For example, metals generally conduct electricity well, and are conveniently used in the fabrication of many embodiments of 2-TNS, but typically also conduct heat well. Materials that conduct heat well, e.g., good thermal conductors, may draw enough heat away from the nanotube element that the element may not overheat in response to an "open" stimulation. Alternately, the nanotube element may only overheat in response to an undesirably large "open" stimulation. In order to fabricate a 2-TNS that allows heat to build up in the nanotube element in response to sufficient (but not undesirably large) "open" stimulation, several embodiments of are contemplated.

In some preferred embodiments, the nanotubes themselves may be thermally engineered by selecting them to as to have features that are particularly susceptible to breaking in response to an "open" stimulation. For example, as described above, some nanotubes may be selected to have certain modes that build up heat or couple to other modes that break contact between the nanotube and a conductor. The nanotubes may have defects that are easily broken by overheating. In some embodiments, the nanotubes are pretreated before deposition in order to induce defects.

In some preferred embodiments, the conductive elements may be thermally engineered by fabricating them from a material (or materials) that conduct electricity relatively well, but conduct heat relatively poorly. For example, the material may have a relatively low thermal conductivity, a relatively high heat capacity, and/or a relatively low thermal diffusion constant. For example, in some embodiments, doped semiconductors may be able to provide a sufficiently high "open" stimulation to the nanotube element, and withdraw a relatively low amount of heat from the nanotube element. Other kinds of materials having this characteristic are contemplated, for example a conductive polymer. Preferably the conductive elements supply a sufficient electrical stimulus to "open" the switch, and at the same time do not significantly impede the buildup of heat in the nanotube element.

Additionally, in some preferred embodiments, the distance between the two conductive elements is relatively small, for example less than about 250 nm. Switches having conductive elements spaced relatively far apart, and therefore have a relatively long nanotube element spanning the distance between them, have been observed to have the tendency to require relatively large "erase" stimuli in order to change the device to an "open" state. Switches with a relatively large spacing between the conductive elements tend to have a higher resistance between the conductive elements, and therefore have a lower current density through the nanotube element for a given erase voltage.

In general, the nanotube element may also be in physical contact with other materials in the 2-TNS besides the conductors, for example an underlying insulator and an overlying passivation layer. These materials may withdraw heat from the nanotube element. In some preferred embodiments, one or more materials that contact the nanotube elements may be selected to be relatively poor thermal conductors, for example having a sufficiently high heat capacity and/or a sufficiently low thermal conductivity. In other words, the materials may transport heat poorly, and may be good thermal insulators. This can be useful because the nanotube element may overheat more readily if materials in contact with the element withdraw little heat from the element. For example, the inventors have found that including a preferred passivation layer over the nanotube element can significantly reduce the level of stimulation required to "open" the 2-TNS, in addition to providing other benefits. By including a preferred passivation layer over the switch, in one embodiment, the stimulation required to "open" the switch was reduced by a factor of two. In general, the inventors believe that it may be preferable that one or more materials that contact the nanotube element preferably conduct heat relatively poorly, which may help heat to build up in the nanotube element.

The inventors believe that preferred passivation layers can also be useful for isolating components of the 2-TNS, e.g., the nanotube element and/or conductive elements, from the environment. For example, water in the air, or that adheres to the nanotube element, can etch the element at high temperatures. If an "open" stimulation is applied to a bare 2-TNS, overheating in the nanotube element may occur at a high enough temperature that any water at the element may sufficiently damage the element so that it no longer conducts current well. This "opens" the 2-TNS, but the switch cannot be subsequently "closed" because the conductive pathway provided by the nanotube element is irreversibly damaged. If instead, the 2-TNS is passivated with a preferred passivation layer, then the switch may be isolated from damaging water and may be repeatedly "opened" and "closed." It is preferable that any water adhered to the 2-TNS is removed before deposition of the passivation layer; otherwise the layer will simply trap water next to the switch. It is also preferable that the passivation layer does not outgas water, and is not permeable by water. It is also preferable that the passivation layer is not fabricated using a high power plasma, which can damage the nanotube element. Passivation layers may be made from any appropriate material known in the CMOS industry, including, but not limited to: PVDF (Polyvinylidene Fluoride), PSG (Phosphosilicate glass) oxide, Orion oxide, LTO (planarizing low temperature oxide) oxide, sputtered oxide or nitride, flowfill oxide, ALD (atomic layer deposition) oxides. CVD (chemical vapor deposition) nitride also these materials may be used in conjunction with each other, i.e., a PVDF layer or mixture of PVDF and other copolymers may be placed on top of CNTs and this complex may be capped with an ALD $Al_2O_3$ layer, however any non-oxygen containing high temp polymers could be used as passivation layers. In some preferred embodiments passivation materials such as PVDF may be mixed or formulated with other organic or dielectric materials as copolymers such as PC7 to generate specific passivation properties such as to impart extended lifetime and reliability.

Passivation of NRAM devices may be used to facilitate device operation in air, at room temperature, and as a protecting layer in conjunction with stacked material layers on top on the NRAM device. Operation of unpassivated NRAM devices are typically performed in an inert ambient, such as argon, nitrogen, or helium, or an elevated (greater than 125 C) sample temperature to remove adsorbed water from the exposed nanotubes. Therefore, the requirements of a passivation film are typically twofold. First, the passivation should form an effective moisture barrier, preventing exposure of the nanotubes to water. Second, the passivation film should not interfere with the switching mechanism of the NRAM device.

One approach to passivation involves cavities, which have been fabricated around the NRAM devices to provide a sealed switching region. Cavities both around individual devices (device-level passivation) and around an entire die of 22 devices (die-level passivation) have been demonstrated. However, the process flow to fabricate is complicated, with at least 2 additional lithography steps, and at least 2 additional etching steps required.

Another approach to passivation involves depositing a suitable dielectric layer over the NRAM devices. An example of this approach is the use of spin-coated polyvinyledenefluoride (PVDF) in direct contact with the NRAM devices. The PVDF is patterned into either die-level (over an entire die active region) or device-level patches (individual patches covering individual devices). Then a suitable secondary dielectric passivation film, such an alumina or silicon dioxide is used to seal off the PVDF and provide a passivation robust to NRAM operation. It is thought that NRAM operation thermally decomposes the overlying PVDF, hence a secondary passivation film is required to seal off the devices. Since the die level passivations are typically ~100 micron square patches, this local decomposition can lead to ruptures of the secondary passivation, exposure of NRAM devices to air, and their subsequent failure. To avoid such failures of the secondary passivation film, the die-level passivated devices are "burned-in" electrically by pulsing the devices typically with 500 ns pulses from 4V to 8V in 0.5V steps. This is thought to controllably decompose the PVDF and prevent a rupture of the overlying secondary passivation film. After the burn-in procedure the die-level passivated NRAM devices operate normally. Devices passivated with a device-level PVDF coating and a secondary passivation film do not require such a burn in procedure and may be operated in air at room temperature directly at operating voltages. With device-level passivation the PVDF is patterned in the exact shape of the CNT fabric, typically 0.5 microns wide and 1-2 microns long. It is thought that such small patches can decompose without stressing the secondary passivation film to failure. It is possible that for a given defect density in the secondary passivation, there are no defects on average over the smaller footprint of the device-level PVDF patches in comparison to the larger, die-level patches.

The inventors believe that in some preferred embodiments, the "open" stimulus applied by the stimulus circuit may be engineered in order to enhance the buildup of heat in the nanotube element. Applying a relatively large voltage to the switch is one example of engineering the "open" stimulus in one embodiment. In other embodiments, a series of pulses may be applied to the switch, and the pulses may be spaced by a timing that is faster than the timescale of the transport of heat out of the nanotube element. The inventors believe that in this case, the pulses themselves do not necessarily have to have a large amplitude, but the total amount of heat deposited in the nanotube element by the pulses may be sufficient to overheat and break the element.

The inventors believe that in some preferred embodiments, two-terminal nanotube switches may be thermally engineered by designing them so as to have a "hot spot," or thermal bottleneck, where one or more nanotubes may be particularly susceptible to overheating. For example, as described in greater detail below, the nanotube element can be made to partially overlap at least one conductor with a controlled geometrical relationship, e.g., with a controlled overlap length. For example, by controlling the length of overlap to a length that is less than 100 nm, or less than 50 nm, the amount of heat that the conductor can withdraw from the nanotube element may be sufficiently lessened so as to possibly allow rapid overheating of the nanotube element in one or more locations. In contrast, an increased overlap length may inhibit overheating by pulling heat out of the nanotube element.

For example, it has been observed that at least 10% more as-fabricated switches can be "opened" by limiting the overlap length to less than 50 nm, as compared with more than 100 nm. Also, the times required to "open" the switch are significantly reduced for embodiments that have an overlap length of less than 50 nm, which implies or suggests that the nanotube element may overheat more rapidly in response to "open" stimulation. For example, "open" times for as-fabricated switches with less than 50 nm overlap lengths may be on the order of 100 ns, and with greater than 100 nm overlap lengths may be on the order of 1 millisecond or longer. Engineering may provide faster switching speeds, for example as fast as 1 nanosecond or faster. In general, arranging the nanotube element and one or more conductive elements with a specified geometrical relationship may be useful for managing the thermal relationship between the nanotube element and conductive elements. This, or other arrangements, may create a thermal bottleneck, or "hot spot," in the 2-TNS, that may enhance the operation of the switch.

In summary, in one or more embodiments, thermal and/or electrical engineering, or management, can be used to enhance the performance of a two-terminal nanotube switch. More than one of the described thermal and/or electrical engineering techniques described herein may be used at the same time in the design and fabrication of a preferred two-terminal nanotube switch. For example, a switch can be fabricated having a controlled overlap length to reduce the amount of heat that the conductive element can withdraw from the nanotube element, and the switch can further be passivated with a preferred passivation layer which in some cases may include a mixture of copolymers.

It should be noted that while changes in the resistance of the switch due to electrical stimulation have been repeatedly observed, that the causes of these resistance changes are still being considered from both a theoretical and experimental standpoint. At the time of filing, it is the inventors' belief that thermal effects as described herein may cause or contribute to the observed behavior. Other effects may also cause or contribute the observed behavior.

Figure 1B:
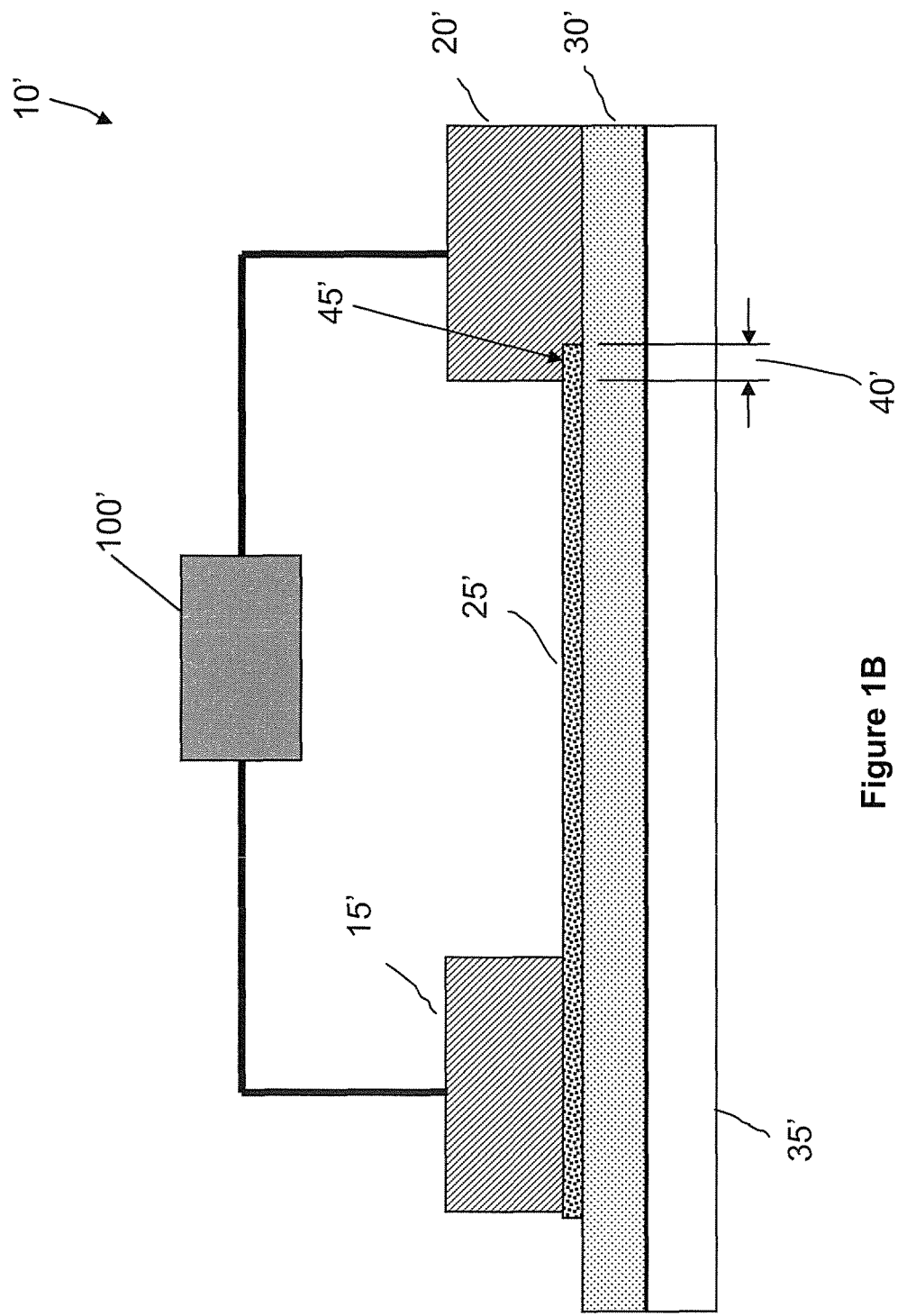
FIG. 1B illustrates a cross sectional view of an exemplary embodiment of the present invention.

FIG. 1B illustrates a cross sectional representation of nonvolatile 2-terminal nanotube switch (2-TNS) 10', in which thermal management is accomplished by limiting the overlap between nanotube element 25' and conductive element 20'. Nanotube element 25' is disposed on substrate 35', which includes a layer of insulator 30'. Nanotube element 25' is arranged to overlap by a predetermined extent at least a portion of at least one of the terminals, e.g., conductive elements 15' and 20', which are both deposited directly onto nanotube element 25'.

In this embodiment, nanotube element 25' is patterned within a region that can be defined before or after deposition of conductive elements 15' and/or 20'. Conductive element 15' overlaps one entire end-region of nanotube element 25', forming a near-ohmic contact. At the opposite end of nanotube element 25', at overlap region 45', conductive element 20' overlaps nanotube element 25' by controlled overlap length 40'. Controlled overlap length 40' may be in the range of 1 to 150 nm, or in the range of 15-50 nm, for example. In one preferred embodiment, controlled overlap length 40' is about 45 nm. The switch is thermally and electrically managed to enhance the buildup of heat in the nanotube element by limiting the overlap nanotube element 25' and conductive element 20' so that heat flows poorly from the nanotube element into the conductive element, with a sufficiently long length of contact that current flows well from the conductive element into the nanotube element.

In one or more embodiments, one or more electrical characteristics of switch 10' are a function of controlled overlap length 40'. For example, as described in greater detail below, the time required to erase and/or program switch 10' is a function of controlled overlap length 40'.

FIGS. 2D through 2I show top-view SEM images of a few different embodiments of functional two-terminal nanotube switches, fabricated using the materials, nanotube elements, and methods according to some embodiments described herein. In the embodiment shown in FIG. 2D, 2-TNS 60D is fabricated on a layer of insulator 62D, disposed on a silicon substrate (not visible in this top view). Insulator 62D is about 20 nm of $SiO_2$, used as a bottom (back) gate. Conductive elements 70D and 75D, which correspond to conductive elements 15' and 20' respectively in FIG. 1B, are palladium and have a thickness of about 100 nm. Conductive elements 70D and 75D each have a width of about 400 nm, and have a separation 85D of approximately 150 nm.

In the image, nanotube element 65D includes several nanotubes, which appear in the right half of the image as light grey lines on the grey background of insulator 62D. Conductive element 70D overlaps a substantial portion of nanotube element 65D, resulting in conductive element 70D having a relatively rough texture in the image as compared to the texture of conductive element 75D, which overlaps a limited portion of nanotube element 65C as described in greater detail below. Conductive element 70D has striations such as that indicated by area 55D, which are areas of the element that are raised due to the presence of an underlying nanotube. Nanotube element 65D also can be seen to extend beyond the periphery of conductive element 70D. This feature does not affect the performance of the device, but conveniently allows imaging and/or characterization of an exposed portion of nanotube element 65D.

Some of the nanotubes in nanotube element 65D can be seen to span the distance 85D between conductive elements 70D and 75D. Conductive element 75D overlaps nanotube element 65D in region 80D by a controlled overlap length of about 17.4 nm, which corresponds to controlled overlap length 40' in FIG. 1B. Conductive elements 70D and 75D can be seen to have white borders, which is a charging artifact of the imaging process. This artifact obscures controlled overlap region 80D, which has a length that is substantially smaller than the length of the artifact. However, as illustrated further below, some embodiments have overlap regions that are large enough to be observed in an SEM micrograph.

Figure 2D:
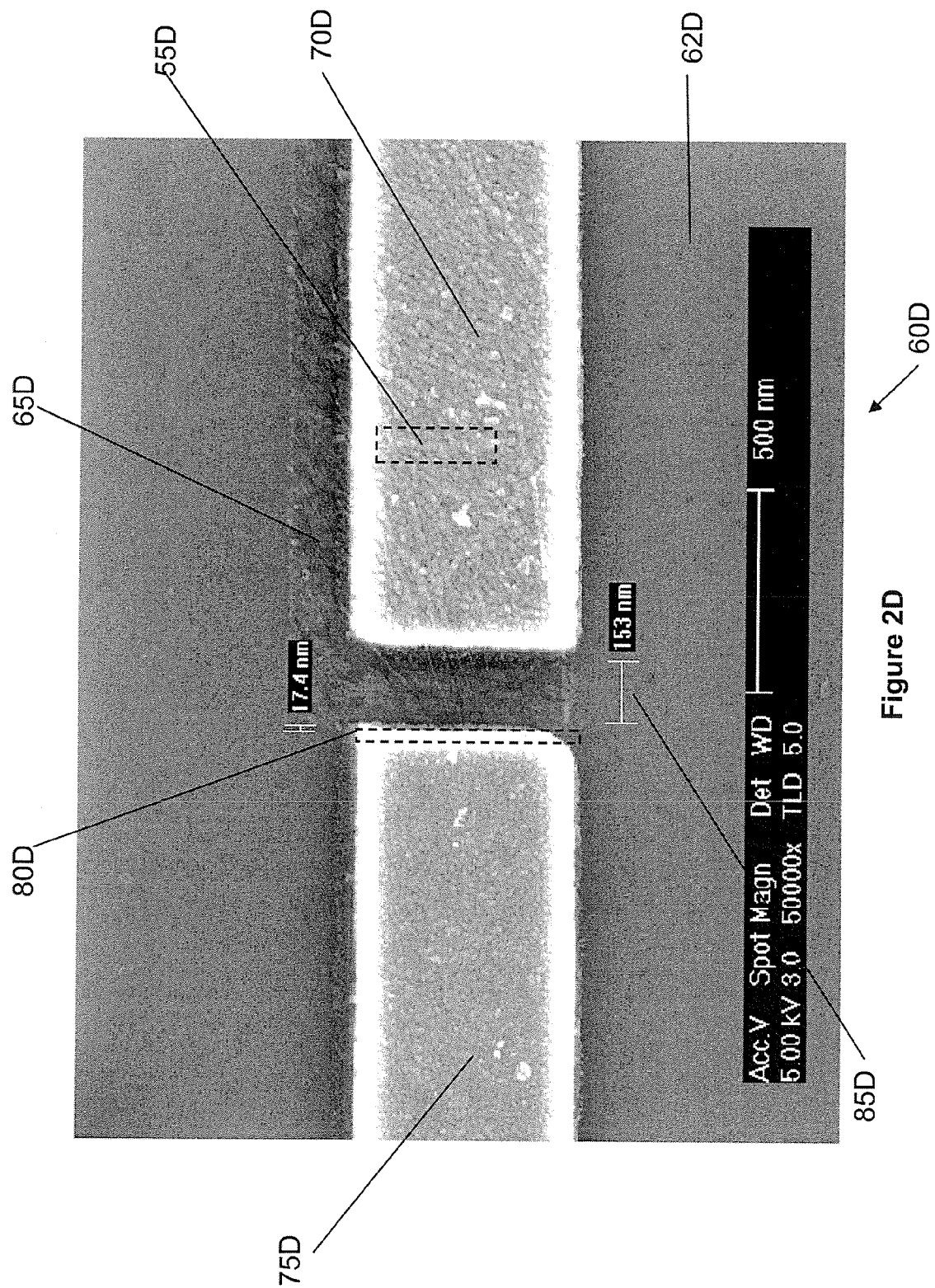
Figure 2E:
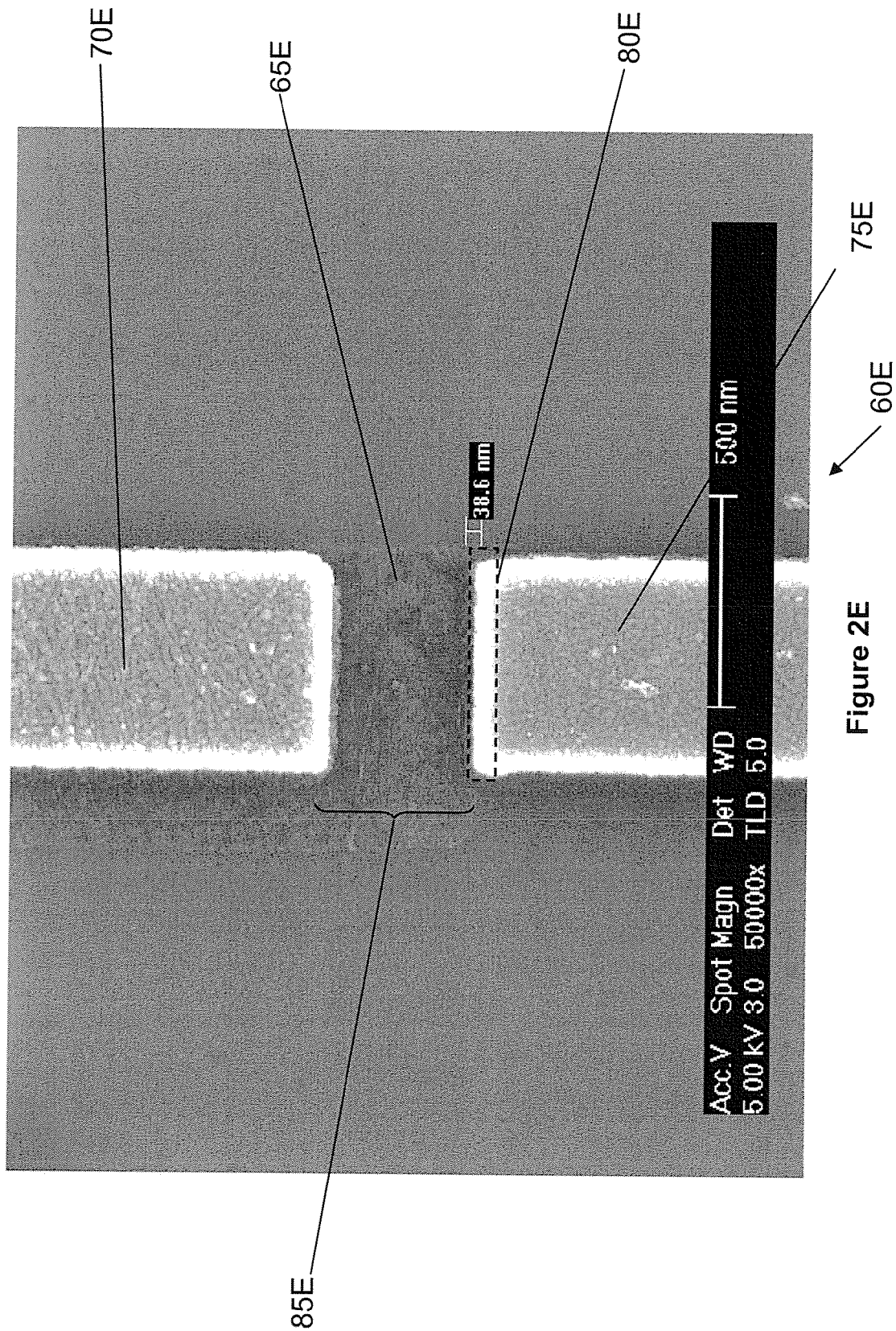
Figure 2F:
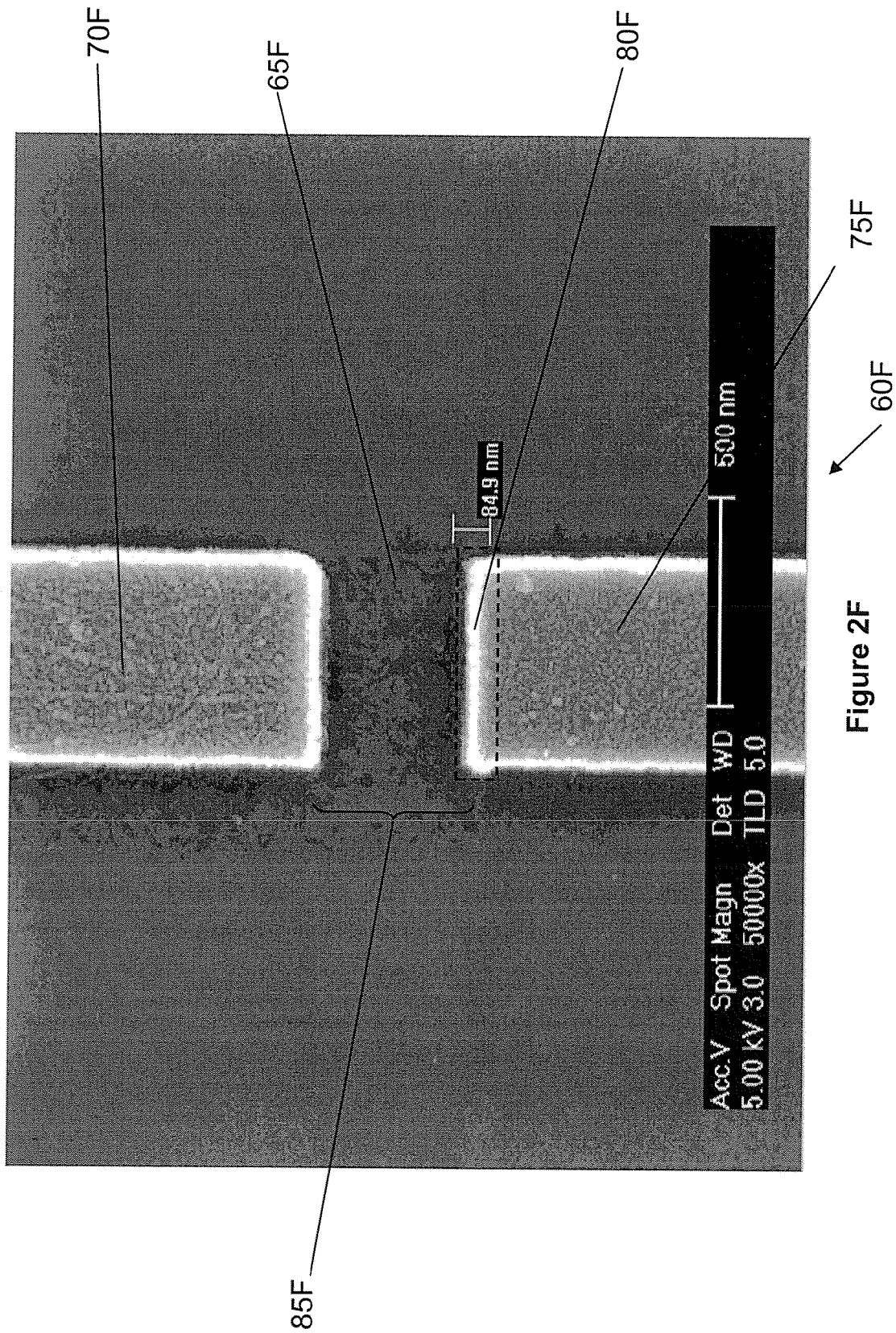
Figure 2G:
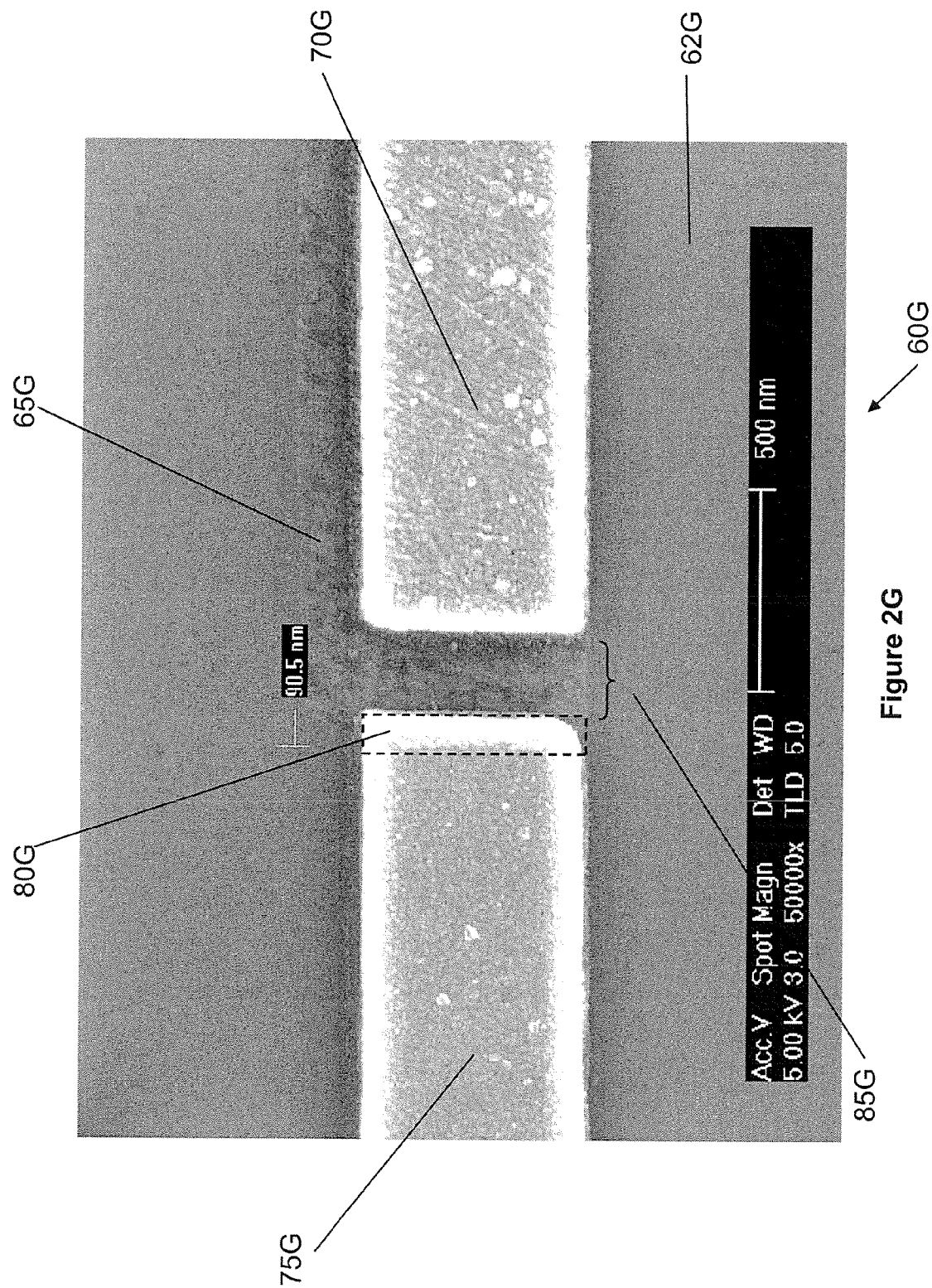
Figure 2H:
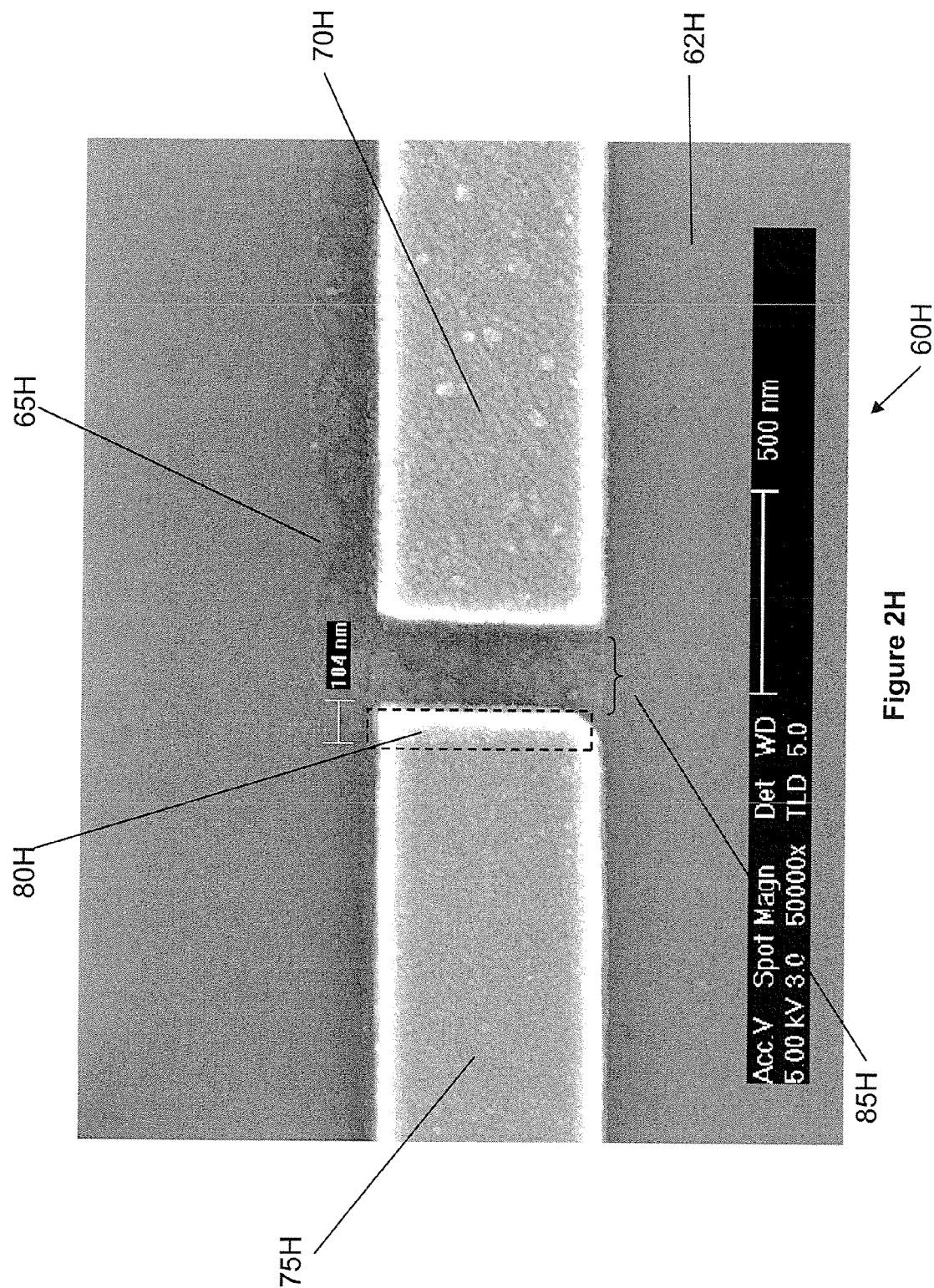
Figure 2I:
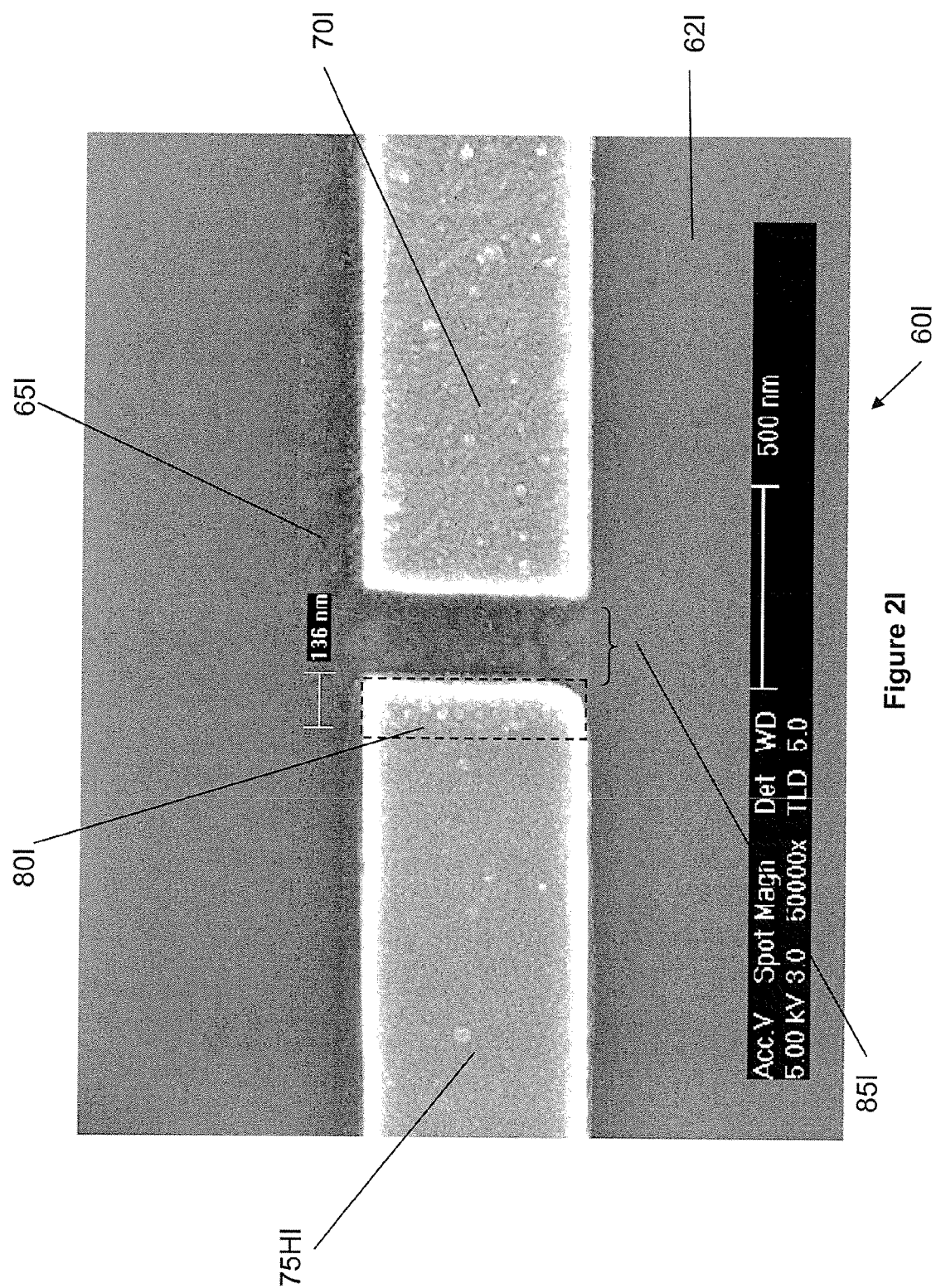

The embodiment shown in FIG. 2E has a similar structure to the embodiment of FIG. 2D, with conductive elements 70E and 75E having similar dimensions as the elements in FIG. 2D, but are instead separated by a distance 85E of about 250 nm. The image is rotated by 90 degrees relative to FIG. 2D. Here, conductive element 75E overlaps nanotube element 65E by about 38.6 nm in region 80E. Despite the substantial differences between distances 80D and 80E, and 65D and 65E, the embodiments shown in FIGS. 2D and 2E operate comparably. The embodiment shown in FIG. 2F is similar to the embodiments shown in FIGS. 2D and 2E, but with conductive elements 70F and 75F separated by a distance of about 250 nm. Here, conductive element 75F overlaps nanotube element 65F by about 84.9 nm. The embodiment shown in FIG. 2G is similar to the embodiments shown in FIGS. 2D-2F, but with conductive elements 70G and 75G separated by a distance of about 150 nm. Here, conductive element 75G overlaps nanotube element 65G by about 90.5 nm.

The embodiment shown in FIG. 2G is similar to the embodiments shown in FIGS. 2D-2G, but with conductive elements 70H and 75H separated by a distance of about 150 nm. Here, conductive element 75H overlaps nanotube element 65H by about 104 nm. In this figure, conductive element 75H can be seen to have a significantly roughened texture in region 80H where element 75H overlaps nanotube element 65H. The texture is comparable to that of conductive element 70H, which overlaps a large portion of nanotube element 65H, but region 80H is limited to 104 nm. The embodiment shown in FIG. 2I has a similar structure to that in FIG. 2H, but conductive element 75I overlaps nanotube element 65I in region 80I by about 136 nm. Here conductive element 75I can again be seen to have a significantly roughened texture in region 80I as compared with the rest of the element, which does not overlap nanotube element 65I. This roughened texture results from nanotubes underlying the material of element 75I.

All of the embodiments illustrated in 2D-2I are functional switches, wherein thermal management is accomplished by arranging the nanotube element and a conductive element with a specified geometrical relationship, e.g., a controlled overlap length. In some of the embodiments it was found that the controlled overlap length affected the yield of the as-fabricated working switches, e.g., the percentage of as-fabricated switches of a particular embodiment that functioned properly. For example, it was found that about 10-20% fewer as-fabricated switches of embodiments that had overlap lengths of greater than 100 nm functioned properly, as compared with as-fabricated switches of embodiments that had overlap lengths of less than 50 nm. Methods of testing 2-TNS are described in greater detail below.

The voltages, currents, and resistances listed here are meant to be examples of appropriate values for a particular embodiment; appropriate values may be different for one or more other embodiments.

In certain applications, it may be desirable to overlap the nanotube element with conductive elements in geometries that are different than the embodiments shown in FIG. 1A-1B or 2D-2I in order to thermally engineer the switch. For example, it may be desirable to position the nanotube element above, below, or even on vertical sides of the contact elements. In general any configuration that provides a specified geometry sufficient to allow the described switching behavior in the device can be employed. In particular, the conductive elements should be arranged to provide a sufficient electrical stimulation to the nanotube element, and at the same time the switch as a whole should have sufficient thermal management to allow overheating that breaks contact between a nanotube in the nanotube element and a conductor in the pathway of the switch.

It should be understood that the rest of the embodiments described herein include a stimulus circuit in contact with the conductive elements, e.g., stimulus circuit 100 of FIGS. 1A and 1B, although it is not illustrated. It should also be understood that although many of the described embodiments illustrate two-terminal nanotube switches wherein thermal management is accomplished by limiting the overlap between a nanotube element and a conductive element, e.g., a terminal, other methods of thermal management can be used. For example, in some embodiments the nanotube element can partially or fully overlap one or both conductive elements and the materials in the switch can be selected so as to ensure a sufficient buildup of heat within at least a portion of the nanotube element.

Figure 3A:
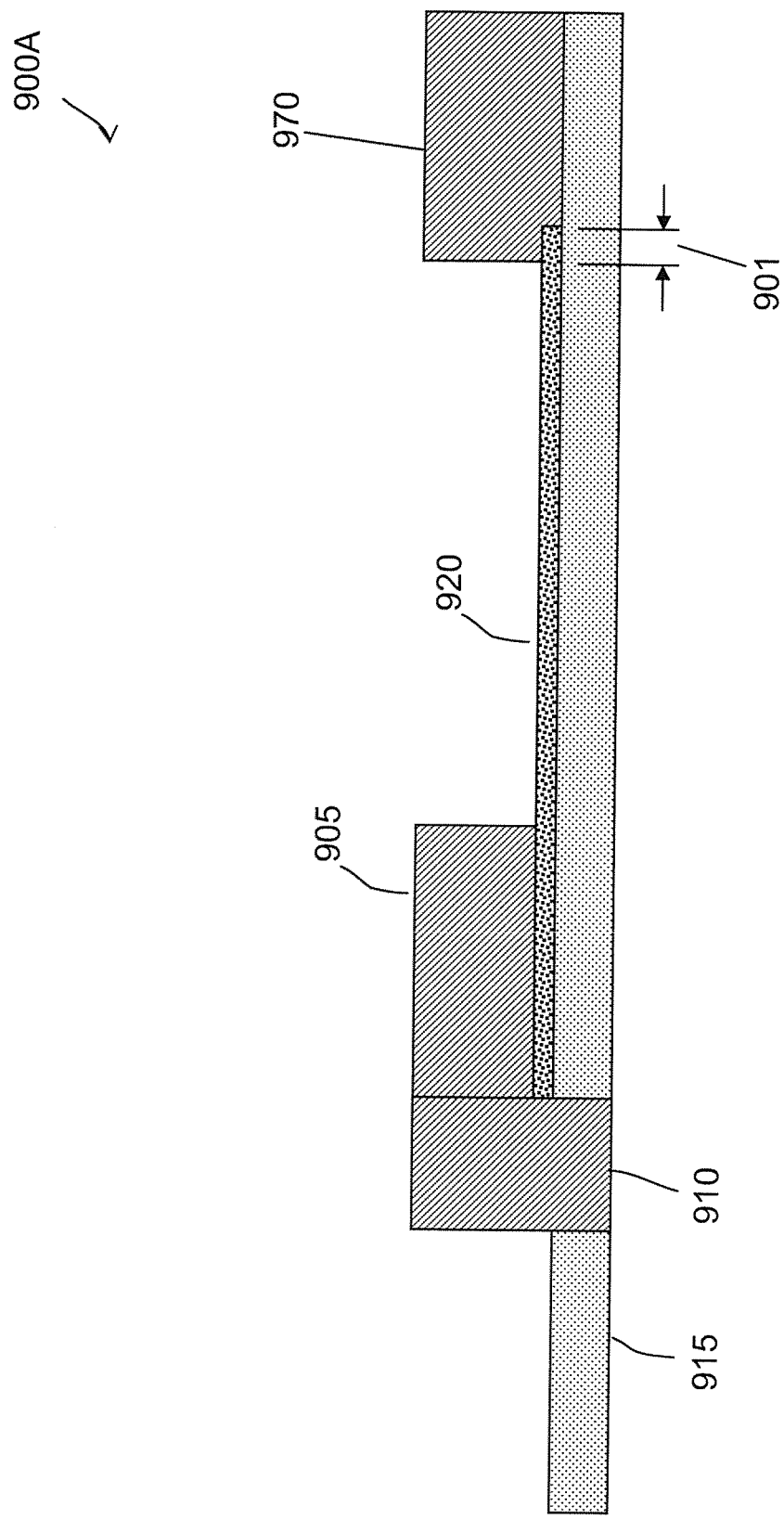
FIGS. 3A-E illustrate cross sectional views of structures according to certain embodiments of the invention.

FIG. 3A illustrates switch 900A, which is a variation of 2-TNS 10' illustrated in FIG. 1B and is fabricated using preferred methods. In this embodiment, conductive element 905 overlaps the top and sides of nanotube element 920, forming a near-ohmic contact, and also fills via hole 910 in insulator 915. This connects nanotube element 920 to an electrode (not shown) below insulator 915. Conductive element 970 overlaps the top and side of nanotube element 920 over controlled overlap length 901.

Figure 3B:
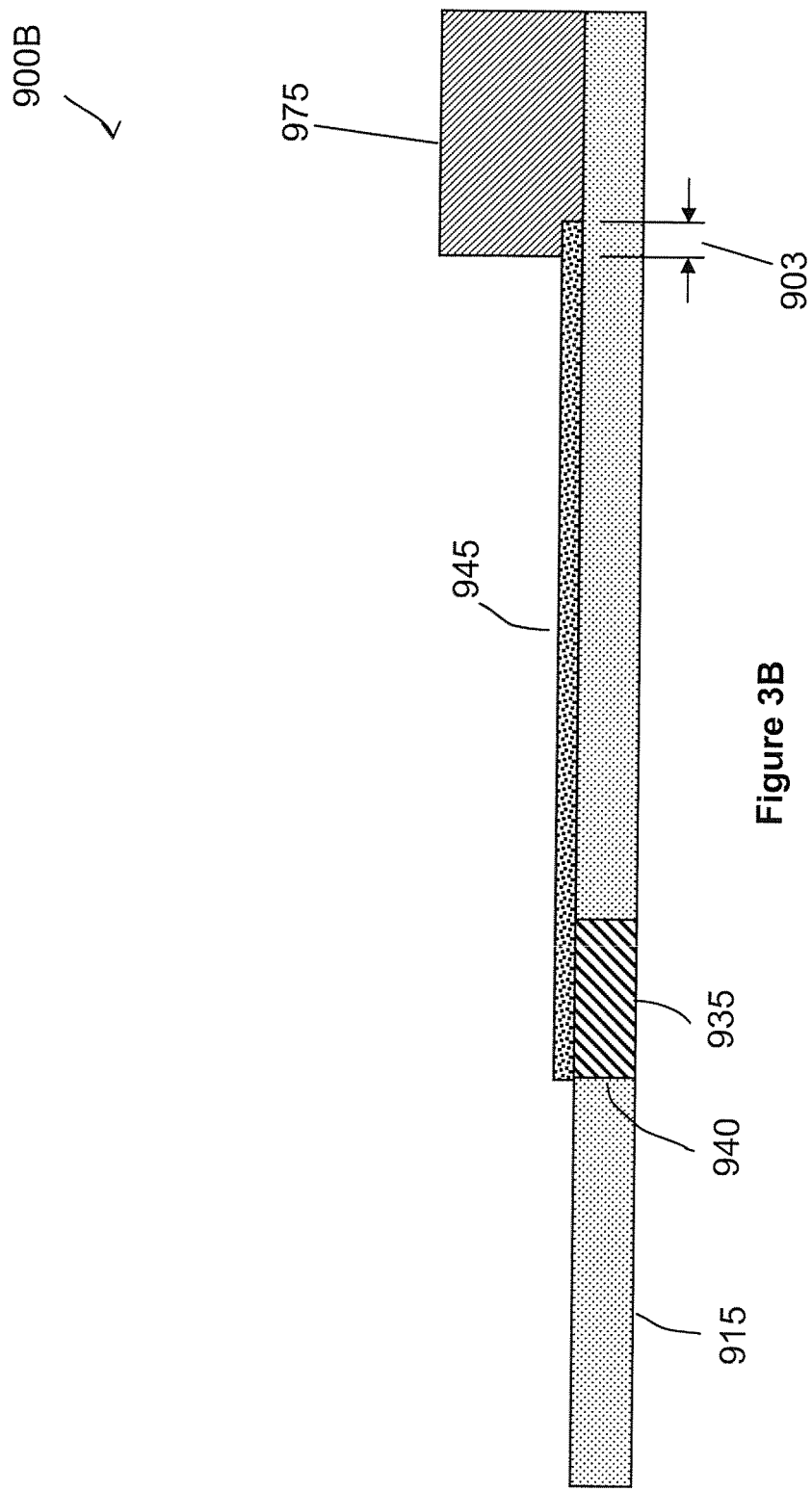

FIG. 3B illustrates switch 900B, which is another variation of 2-TNS 10' illustrated in FIG. 1B and is fabricated using preferred methods. In this embodiment, conductive element 935 overlaps the bottom of nanotube element 945, forming a near-ohmic contact, and fills via hole 940 in insulator 915. This connects nanotube element 945 to an electrode (not shown) below insulator 915. Conductive element 975 overlaps the top and side of nanotube element 920 over controlled overlap length 903.

Figure 3C:
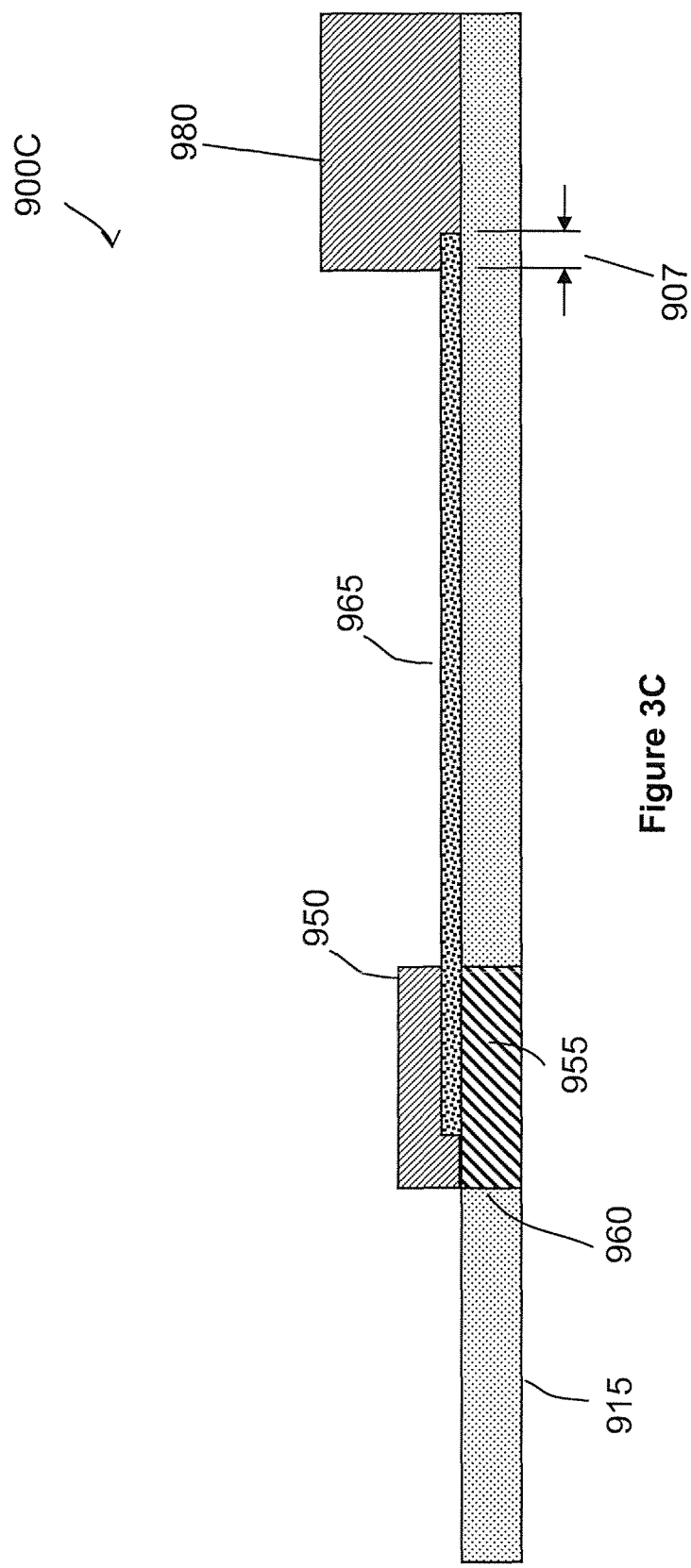

FIG. 3C illustrates switch 900C, which is another variation of 2-TNS 10' in FIG. 1B and is fabricated using preferred methods. In this embodiment, upper conductive element 950 and lower conductive element 955 in contact with each other, and overlap the top, bottom, and side surfaces of nanotube element 965 forming a near-ohmic contact. Lower contact element 955 fills via hole 960 in insulator 915. This connects nanotube element 965 to an electrode (not shown) below insulator 915. Conductive element 980 overlaps the top and side of nanotube element 965 by controlled overlap length 907.

Upper and lower conductive elements 950 and 955 are illustrated as extending beyond an end of nanotube element 965. Upper and lower conductive elements 950 and 955 are in contact with each other, as well as in near-ohmic contact with nanotube element 965, in the region of nanotube element 965 because nanotube element 965 is porous, typically more than 90% porous. Upper and lower conductive elements 950 and 955 fill at least some of the pores in nanotube element 965. Therefore, in an alternative embodiment, upper and lower conductive elements 950 and 955 need not extend beyond an end of nanotube element 965 to in order to contact nanotube element 965 and each other.

Figure 3D:
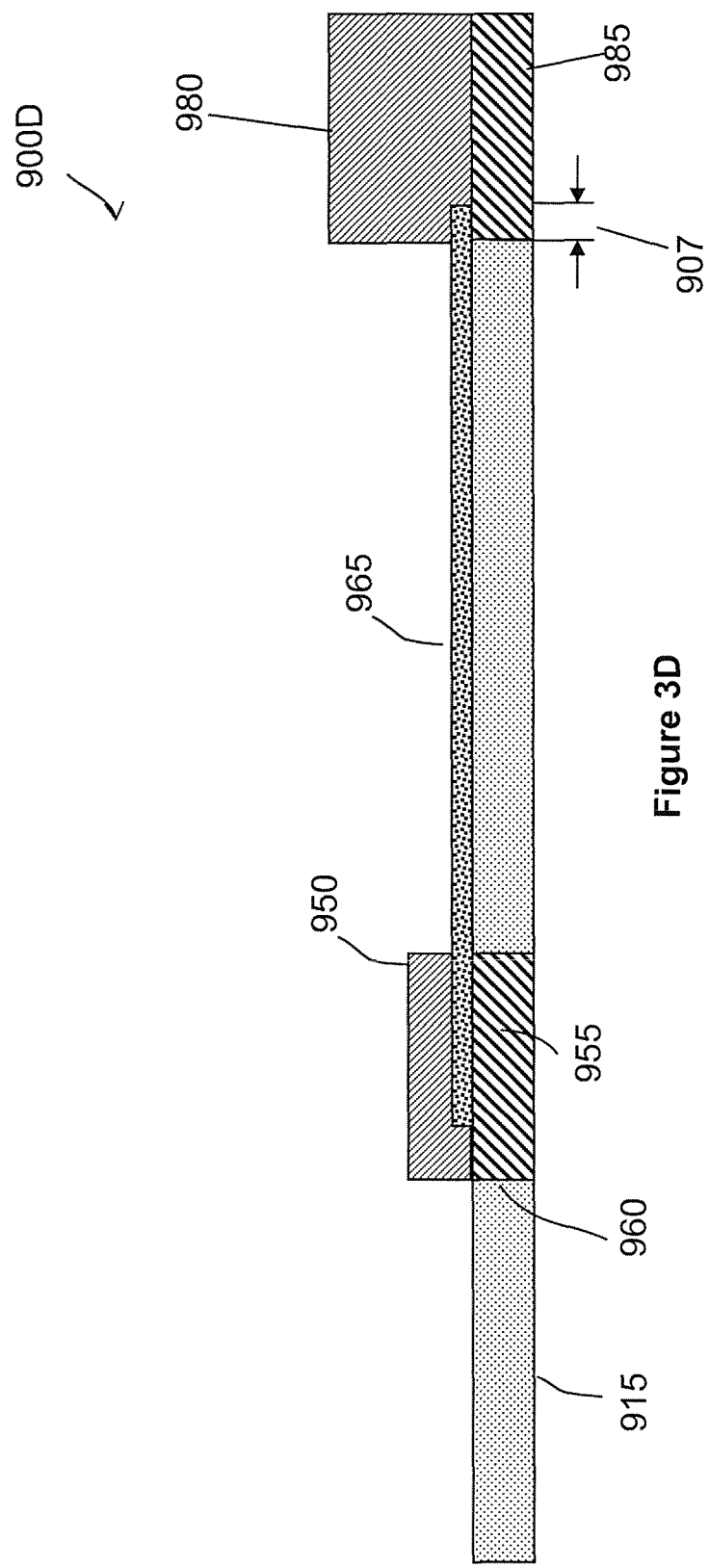

FIG. 3D illustrates switch 900D, which is another variation of 2-TNS 10' in FIG. 1B and is fabricated using preferred methods. In this embodiment, upper conductive element 950 and lower conductive element 955 in contact with each other, and overlap the top, bottom, and side surfaces of nanotube element 965 forming a near-ohmic contact. Lower contact element 955 fills via hole 960 in insulator 915. This connects nanotube element 965 to an electrode (not shown) below insulator 915. Upper conductive element 980 and lower conductive element 985 in contact with each other, and overlap the top, bottom, and side surfaces of nanotube element 965 by controlled overlap length 907.

Figure 3E:
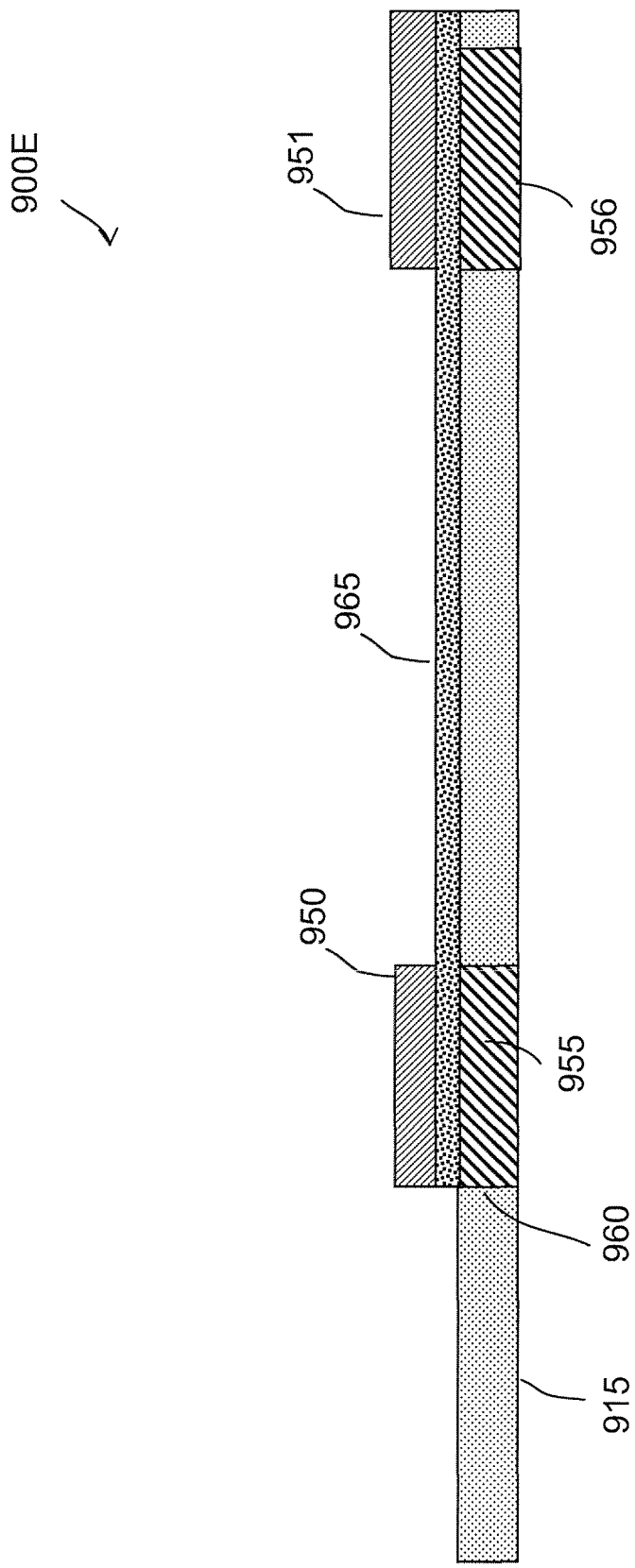

FIG. 3E illustrates switch 900E, which is a variation of 2-TNS 10 in FIG. 1A and is fabricated using preferred methods. In this embodiment, upper conductive element 950 and lower conductive element 955 in contact with each other, and overlap the top, and bottom surfaces of nanotube element 965 forming a near-ohmic contact. Material in elements 950 and 955 fill at least some of the pores in nanotube element 965. Lower contact element 955 fills via hole 960 in insulator 915. This connects nanotube element 965 to an electrode (not shown) below insulator 915. Upper conductive element 951 and lower conductive element 956 in contact with each other, and overlap the top and bottom surfaces of nanotube element 965 by controlled overlap length 907. Material in elements 951 and 956 fill at least some of the pores in nanotube element 965. In this embodiment, thermal management is accomplished not by having a controlled overlap length between the nanotube element and a conductive element, but by one or more other thermal management techniques described herein.

Figure 4:
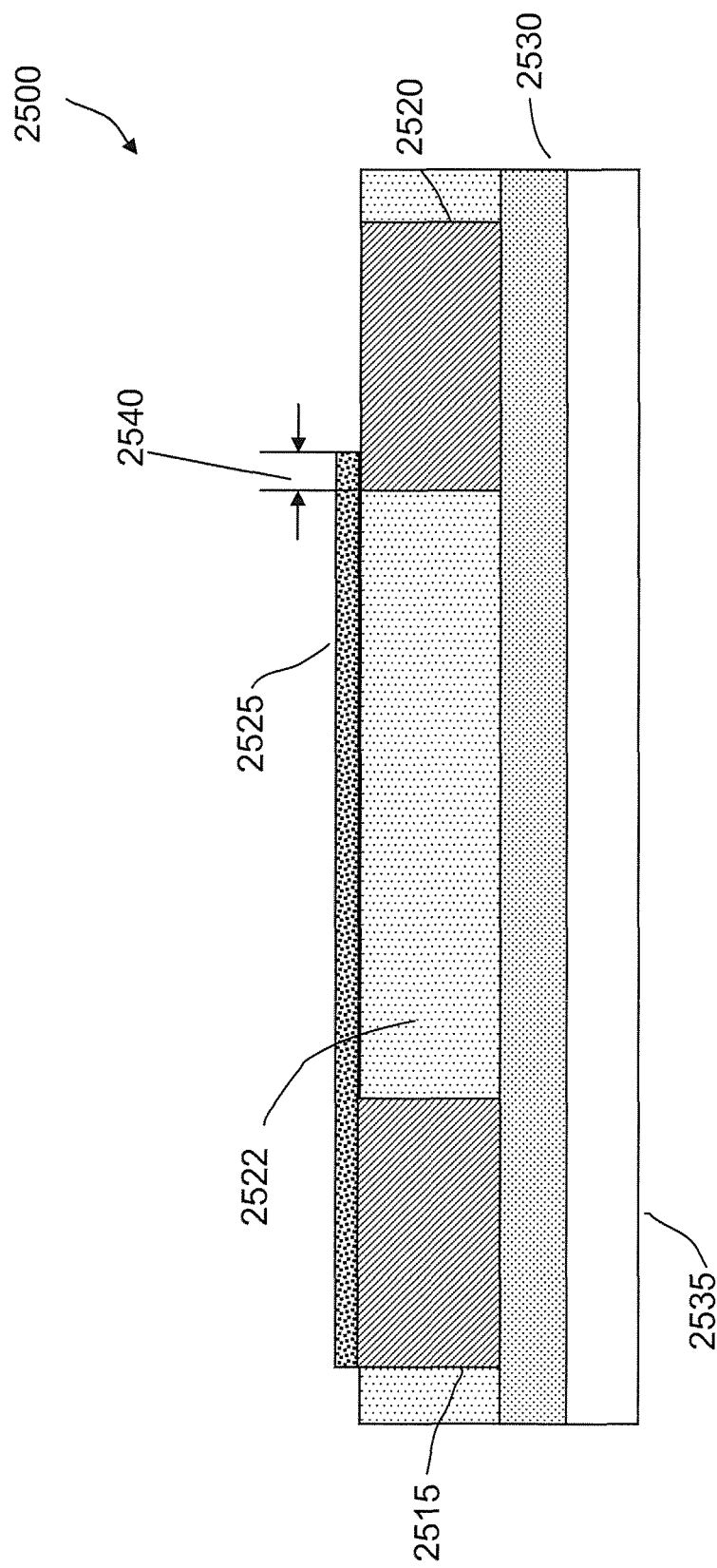
FIG. 4 is a cross sectional view of a structure according to certain embodiments of the invention.

FIG. 4 illustrates a cross sectional representation of another embodiment of a nonvolatile two terminal nanotube switch (2-TNS) 2500. In this embodiment, conductive elements 2515 and 2520 are both deposited directly onto the surface of insulator 2530 and patterned. Insulator 2522 fills in regions between patterned conductive elements 2515 and 2520, and is planarized. Nanotube element 2525 is conformally deposited over conductive elements 2515 and 2520, overlapping at least a portion of the top surfaces of conductors 2515 and 2520, as well as the top surface of insulator 2522, all of which are supported by substrate 2535. At one end, nanotube element 2525 overlaps the top surface of conductive element 2515, forming a near-ohmic contact. At an opposing end, nanotube element 2525 contacts the top surface of contact element 2520 by controlled overlap length 2540.

Figure 5:
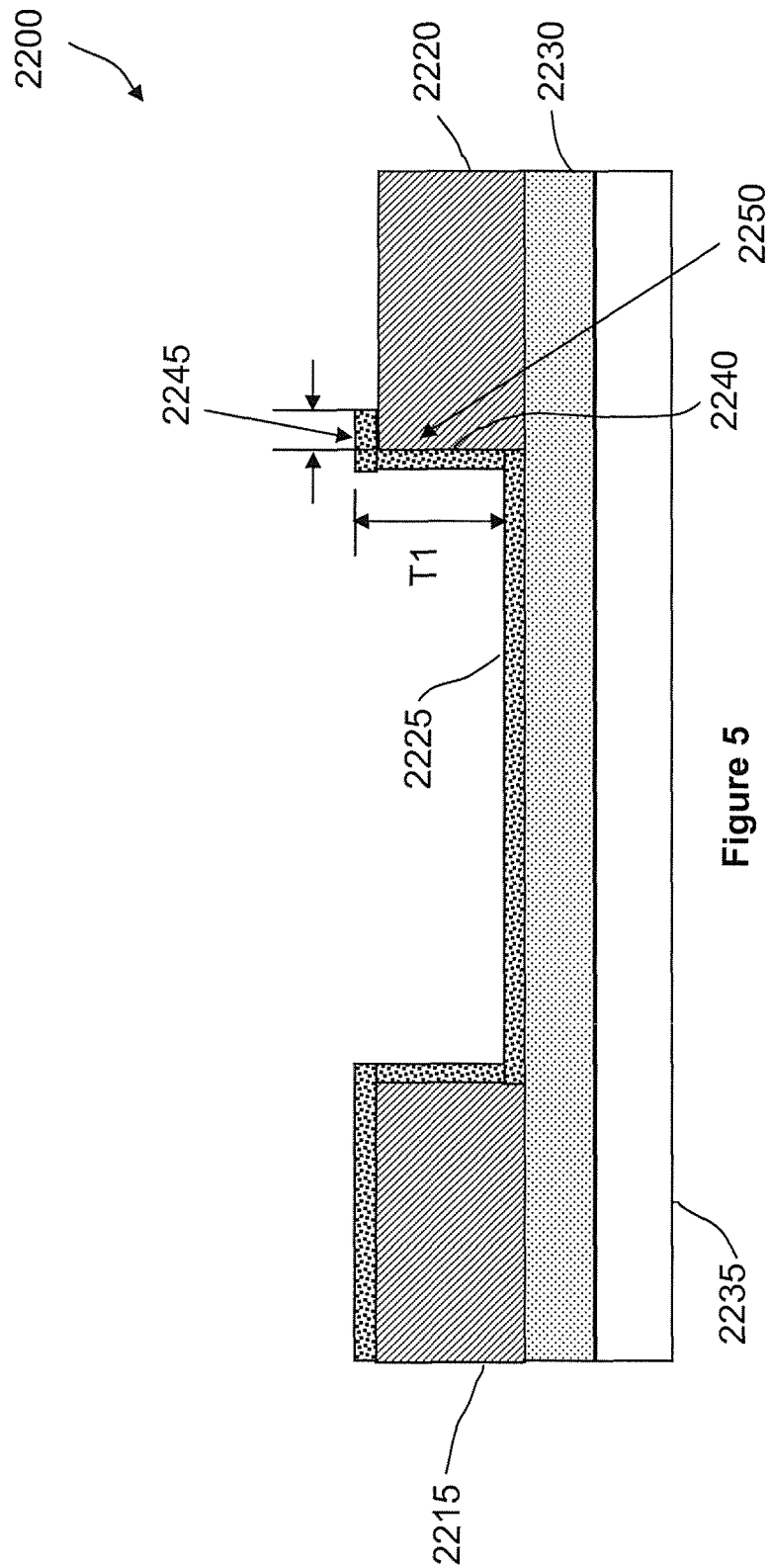
FIG. 5 is a cross sectional view of a structure according to certain embodiments of the invention.

FIG. 5 illustrates a cross sectional representation of another embodiment of a nonvolatile 2-terminal nanotube switch (2-TNS) 2200. In this embodiment, conductive elements 2215 and 2220 are both deposited directly onto the surface of insulator 2230 and patterned. Conductive element 2220 has thickness T1, which may range in thickness from 5 to 500 nm, for example. Nanotube element 2225 is conformally deposited over conductive elements 2215 and 2220, contacting the top and side surfaces of the elements as well as the top surface of insulator 2230, which is supported by substrate 2235. Nanotube element 2225 is then patterned using conventional photolithographic techniques as described in greater detail below, such that it overlaps the entire top and side walls of conductive element 2215, forming a near-ohmic contact. Nanotube element 2225 overlaps conductive element 2220 at sidewall contact region 2240, yielding a controlled overlap of approximately length T1. Nanotube element 2225 also overlaps the top of conductive element 2220 by a controlled overlap length 2245, which may be defined lithographically as described in greater detail below. The total controlled overlap length 2250 is approximately defined by the sum of the length T1 of sidewall contact region 2240 and overlap length 2245.

Figure 6:
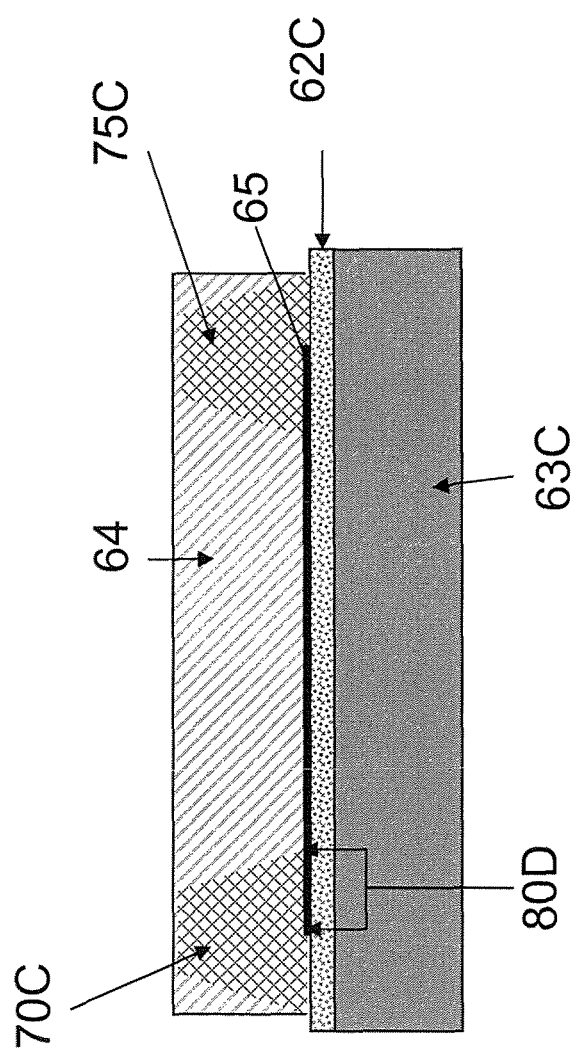
FIG. 6 is a cross sectional view of a structure according to certain embodiments of the invention.

FIG. 6 illustrates a cross sectional view of one embodiment of the present invention. The structure shown in FIG. 6 is analogous to the structure in the micrograph shown in FIG. 2C and has the same elements; a silicon substrate 63C, an insulator 62C, a nanofabric element 65, first and second conductive elements 70C and 75C, respectively, an overlap region 80D and shown in FIG. 6, but absent from FIG. 2C is a passivation layer 64. The insulator 62C is disposed above the silicon substrate 63C and below nanotube element 65. First and second conductive elements 70C and 75C respectively sit partially atop insulator layer 62C and nanotube element 65. First conductive element 70C overlaps nanotube element 65 in overlap region 80C and passivation layer 64 is disposed over conductive elements 70C and 75C and nanotube element 65.

The described embodiments may be fabricated using the materials and methods as described for FIGS. 1A-1B and 2A-2I. Further details of fabricating two-terminal nanotube switching elements and devices including same are described in greater detail below. Several additional embodiments, and methods of making them, are also described below.

Many of the embodiments described herein illustrate two-terminal nanotube switches wherein thermal management is accomplished by overlapping the nanotube element with a conductive element by a controlled overlap length. However, it should be understood that the embodiments described herein may also, or alternately, be thermally managed by other techniques. The embodiments described herein have the common features of a nanotube article having at least one nanotube that is arranged to overlap at least a portion of each of two terminals. Some preferred embodiments are thermally and/or electrically managed, or engineered, in order to enhance one or more properties of the switch. For example, in some preferred embodiments the nanotube overlaps one terminal, forming a near-ohmic contact, and overlaps another terminal by a controlled overlap length. In some preferred embodiments, one or more materials in the switch, for example the nanotubes, conductive elements, insulator layers, and/or passivation layers which in many preferred embodiments may include copolymers or a mixture of layers, are selected in order to enhance the buildup of heat in the nanotube element.

A stimulus circuit in electrical communication with at least one of the terminals of embodiments of the two-terminal nanotube switch can be used to change the switch from a relatively high resistance "erased" or "open" state to a relatively low resistance "programmed" or "closed" state. The circuit can also be used to measure the resistance between the two terminals, and determine the state of the switch, in a non-destructive read-out (NDRO) operation.

Fabricating 2-Terminal Nanotube Switches With Controlled Overlap Regions

In embodiments of two-terminal nanotube switches where thermal management is accomplished by arranging a nanotube element and a conductive element with a specified geometrical relationship, e.g., a controlled overlap length, accurately controlling that relationship can enhance the performance of the switch. Some characteristics of nonvolatile 2-terminal nanotube switches (2-TNS) may be a function, among other things, of the controlled overlap length, for example region 40' of switch 10' illustrated in FIG. 1B. Several methods will be described for fabricating controlled overlap lengths of a specified geometry. Several additional embodiments, and methods of making them, will also be described. In some embodiments, the controlled overlap length is a dimension of the conductive element, for example, the width or thickness of the conductive element. In general, overlap lengths between 1-150 nm, and preferably 15-50 nm, can be fabricated using techniques described herein.

To fabricate a controlled overlap length between a nanotube element and a conductive element, some methods use preferred fabrication methods with a horizontally oriented nanotube element and a timed etch with well controlled etch concentrations and temperature. This method exposes a controlled length of the nanotube element, which can be overlapped with a conductive element. This length corresponds to controlled overlap length 40' in FIG. 1B, although the particular embodiment or embodiments may have a different geometrical relationship between the nanotube element and conductive element than is shown in FIG. 1B.

Other methods use preferred fabrication methods with a horizontally oriented nanotube element and a sidewall spacer having a well controlled film layer thickness, which is removed after defining the nanotube element to expose a controlled length of the element, which can be overlapped with a conductive element. This length corresponds to controlled overlap length 40' in FIG. 1B, although the particular embodiment or embodiments may have a different geometrical relationship between the nanotube element and conductive element than is shown in FIG. 1B.

Other methods use preferred fabrication methods based on photolithography with nanotube elements that conform to horizontal features, and in some cases additionally conform to vertical features, of one or more conductive elements. In cases where nanotube elements conform to horizontal features, the elements are disposed on and lithographically patterned to overlap one conductive element by a controlled overlap length. This length corresponds to length 40' in FIG. 1B, though in this embodiment the nanotube element can have a different geometrical relationship with the conductive element. In cases where the nanotube element additionally conforms to a vertical feature of a conductive element, the nanotube element may contact the vertical feature of the conductive element over a length defined by the thickness of that feature, and may contact the horizontal feature over a length that is lithographically defined. The vertical and horizontal lengths together define a controlled overlap length that corresponds to length 40' in FIG. 1B, although the particular embodiment or embodiments may have a different geometrical relationship between the nanotube element and conductive element than is shown in FIG. 1B.

Figure 7:
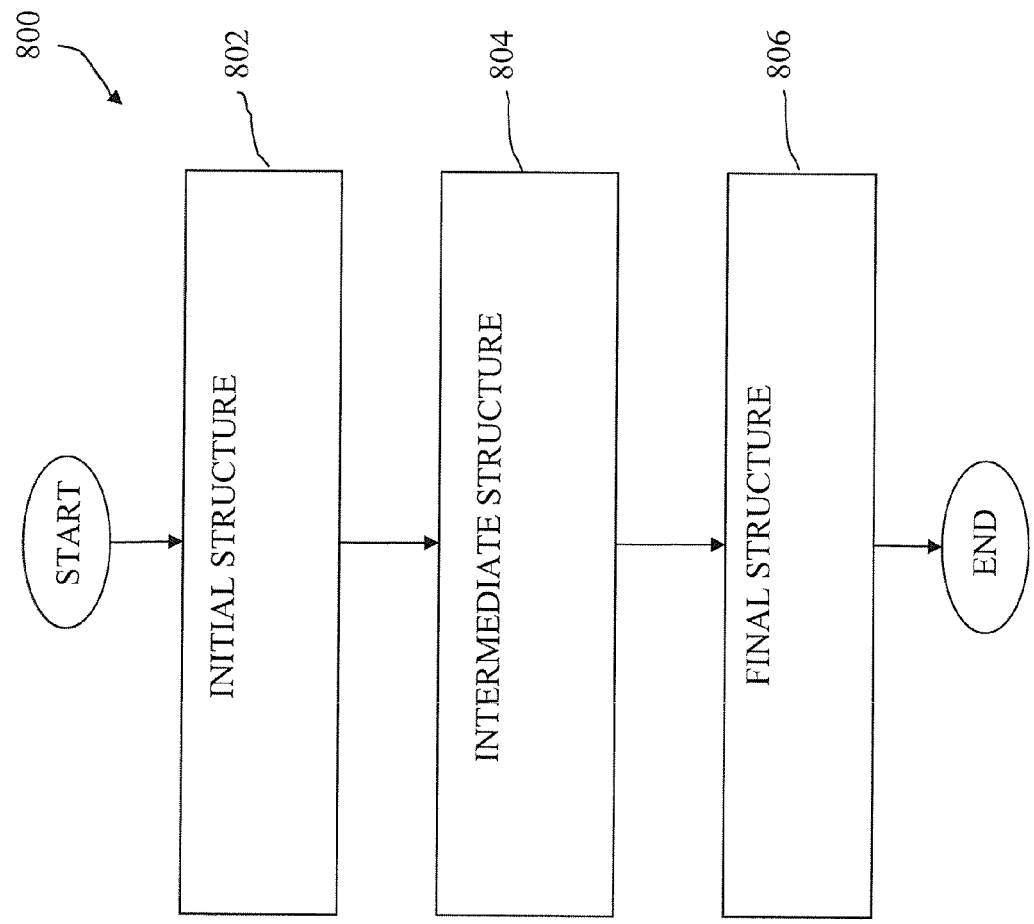
FIG. 7 is a flow chart illustrating general fabrication processes according to certain embodiments of the invention.

The general procedure for fabricating 2-TNS, and devices based on a 2-TNS, is illustrated in FIG. 7. FIG. 7 is a high-level flow diagram of the basic method 800 of fabricating preferred embodiments of the invention. 2-TNS can be fabricated by first providing an initial structure (step 802), on which a nanotube element and possibly conductive elements will later be formed. In a simple embodiment, the initial structure is a substrate on which all elements of the 2-TNS will later be formed. In some embodiments, the initial structure is a partially fabricated, planarized, semiconductor structure with device level definition, with metal filled via holes (studs) providing conductive paths between transistor terminals and the planarized surface of the resulting partially fabricated semiconductor structure. In some embodiments, the initial structure includes both conductive elements. In some embodiments, the initial structure even includes a nanofabric that has not yet been formed into a nanotube element. In general, structures that do not yet have a defined nanotube element can be considered initial structures. "Initial structure" is not intended to be a limiting term but rather a point of reference in the fabrication of 2-TNS.

2-TNS can be fabricated by next providing an intermediate structure (step 804). An intermediate structure is characterized in some embodiments by having a defined nanotube element on a surface of the initial structure (provided in step 802). As illustrated further below, in some embodiments an intermediate structure has a nanotube element overlapping and in near-ohmic contact with one conductive element. In some embodiments an intermediate structure has a nanotube element overlapping a conductive element by a controlled overlap length. This length may, for example, be in the range of 1 to 150 nm. "Intermediate structure" is not intended to be a limiting term but rather a point of reference in the fabrication of 2-TNS.

2-TNS can be fabricated by next providing a final structure (step 806). In some embodiments, the final structure is a completely fabricated 2-TNS. This 2-TNS could be used in wired nonvolatile random access memory arrays as shown further below. Some embodiments of final structures may include memory array on-pitch circuits, peripheral and other circuit wiring, chip passivation, input and output pads; these features and their fabrication are not shown, as they use well known industry fabrication methods. "Final structure" is not intended to be a limiting term but rather a point of reference in the fabrication of 2-TNS.

Methods That Utilize a Controlled Etch to Fabricate a 2-TNS

The embodiment illustrated in FIG. 3B may be fabricated using the timed-etch methods illustrated in FIGS. 8A-8F. Referring to FIG. 8A, preferred methods deposit a layer of insulator 1000 on an underlying structure (not shown). Conductive element 1005, in via hole 1010, forms a conductive path between nanofabric 1015 and a conductor (not shown) below insulator 1000. Insulator 1000 and conductive element 1005 correspond to insulator 915 and conductive element 935, respectively, in FIG. 3B. Insulator 1000 may be $Si_xN_y$, $Al_2O_3$, or other suitable insulating material, for example, having a thickness in the range of 5 to 200 nm, for example, deposited using well known industry techniques on a planar surface (not shown). Next, preferred methods deposit and pattern insulator 1020, $SiO_2$ for example, of thickness 5 to 50 nm, for example as illustrated in FIG. 8A. Insulator 1020 is patterned using well known industry techniques. The resulting assembly can be considered an initial structure.

Next, preferred methods form and pattern nanofabric 1015, using insulator 1020 as a mask, forming nanotube element 1025 as illustrated in FIG. 8B. Methods of forming and patterning nanofabric to form nanotube elements are described in the incorporated patent references. Next, preferred methods perform a controlled isotropic etch selective to insulator 1020 as illustrated in FIG. 8C. Insulator 1020 lateral and vertical dimensions are reduced by this controlled etch, removing insulator region 1030. This reduces insulator 1020 dimensions by, for example, 1 to 150 nm in all directions, depending on the characteristics of the etch. This exposes nanotube element 1025 in region 1050 by controlled length 1035, for example in the range of 1 to 150 nm, with corresponding insulator 1040 of reduced dimensions as illustrated in FIG. 8D.

Next, preferred methods deposit conductor 1045 as illustrated in FIG. 8E with conductor 1045 in contact with the exposed region 1050 of nanotube element 1025. Conductor 1045 may be have a thickness in the range of 5 to 500 nm, and may be composed of metal such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, and semiconductor, materials can also be used.

Then, preferred methods use well known industry techniques to pattern conductor 1045 to provide conductive element 1055 as illustrated in FIG. 8F. Conductive element 1055 overlaps nanotube element 1025 in exposed region 1050. Controlled overlap length 1035 illustrated in FIG. 8F is in the range of 1 to 150 nm, for example, and corresponds to controlled overlap length 40 illustrated in FIG. 1 although in this embodiment the nanotube element 1025 and conductive element 1055 have a different geometrical relationship. The structure shown in FIG. 8F can be considered a final structure. The structure can also be included in other devices as described in greater detail below.

Figure 9A:
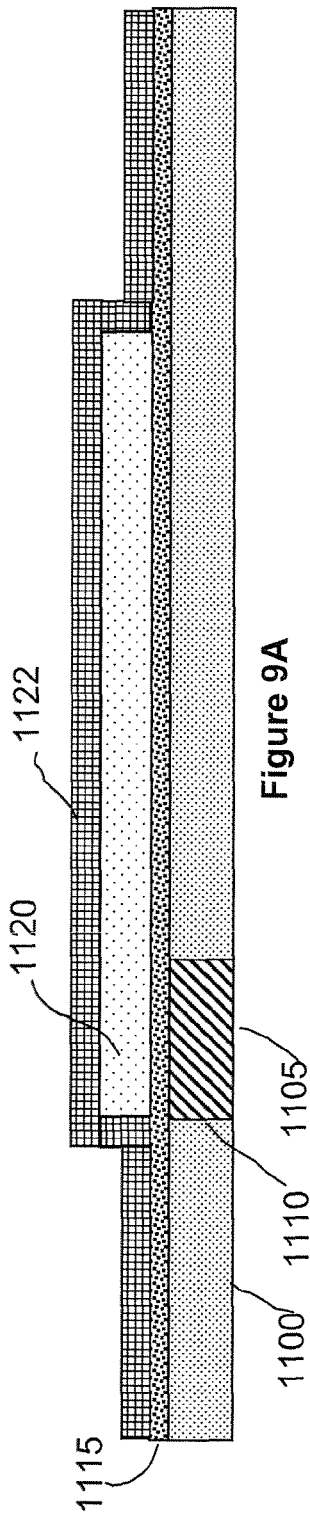
FIGS. 9A-C illustrate cross sectional views of structures created during fabrication steps according to certain embodiments of the invention.
Figure 9B:
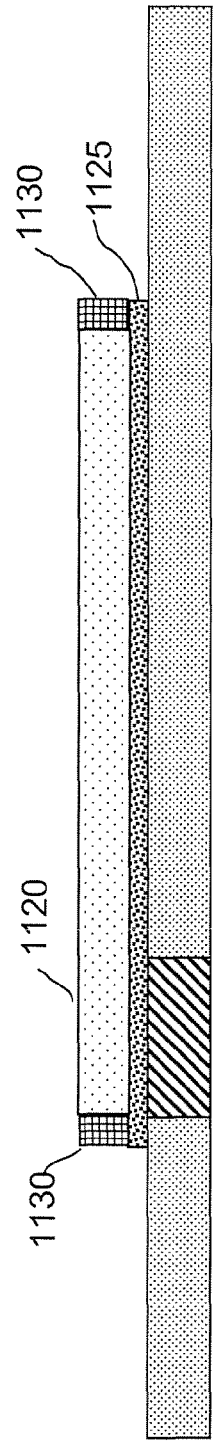
Figure 9C:
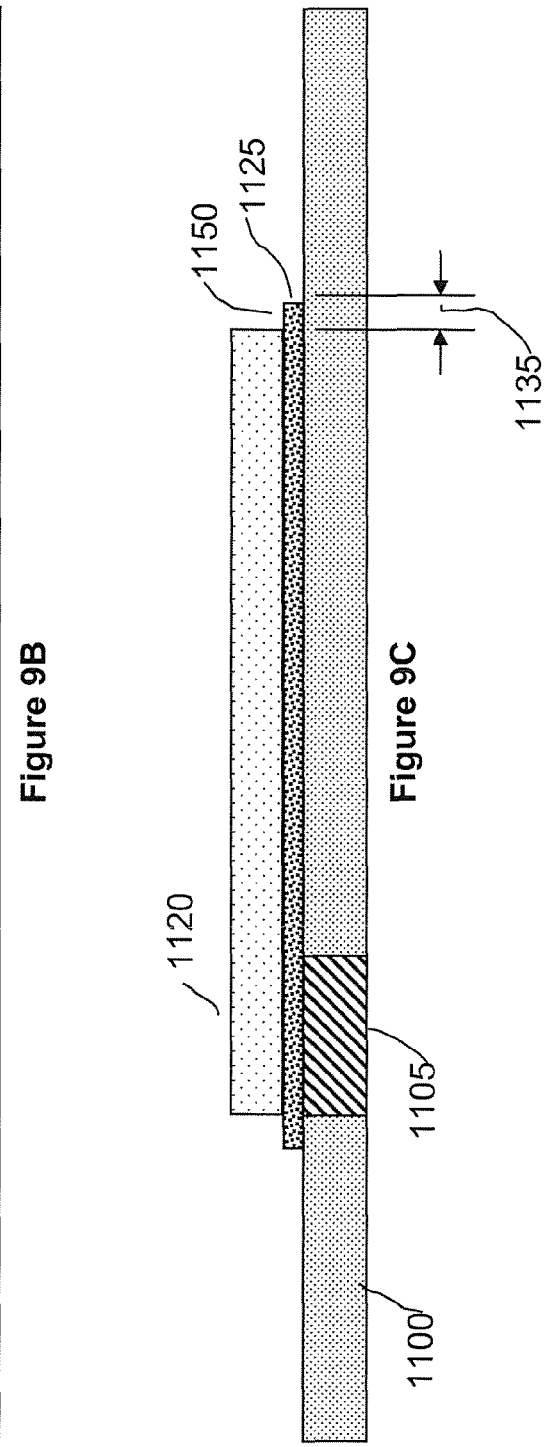

A different route to the intermediate structure illustrated in FIG. 8D may be taken using the directional etch methods illustrated in FIGS. 9A-9C. FIG. 9A illustrates the initial structure of shown in FIG. 8A, including nanofabric 1115 and further including a conformal sacrificial layer 1122 such as silicon for example, using well known industry techniques. The thickness of layer 1122 is well-controlled, and can be for example in the range of 1 to 150 nm. Preferred methods of thickness control are used because in a later step, the film thickness of conformal sacrificial layer 1122 will determine a controlled overlap length between a nanotube element and a conductive element. The assembly of FIG. 9A can be considered an initial structure.

Next, preferred methods directionally etch conformal sacrificial layer 1122 using well known industry methods such as RIE, for example, leaving sidewall regions 1130 as illustrated in FIG. 9B. Next, preferred methods pattern nanofabric 1115, using insulator 1120 and sidewall spacers 1130 together as a mask. This forms nanotube element 1125 as illustrated in FIG. 9B. Methods of depositing and patterning nanofabric to form nanotube elements are described in the incorporated patent references.

Next, preferred methods etch (remove) the remaining sidewall spacers 1130 using well known industry techniques, exposing nanotube element 1125 in region 1150 as illustrated in FIG. 9C. At this point in the process, the intermediate structure illustrated in FIG. 9C corresponds to the intermediate structure illustrated in FIG. 8D. Insulators 1000 and 1100, conductive elements 1005 and 1105, nanotube elements 1025 and 1125, insulators 1040 and 1120, and controlled overlap lengths 1035 and 1135 correspond to each other respectively. The method continues as described above with respect to FIGS. 8E and 8F to form nonvolatile 2-terminal nanotube switch (2-TNS) 1070 illustrated in FIG. 8F.

Figure 10C:
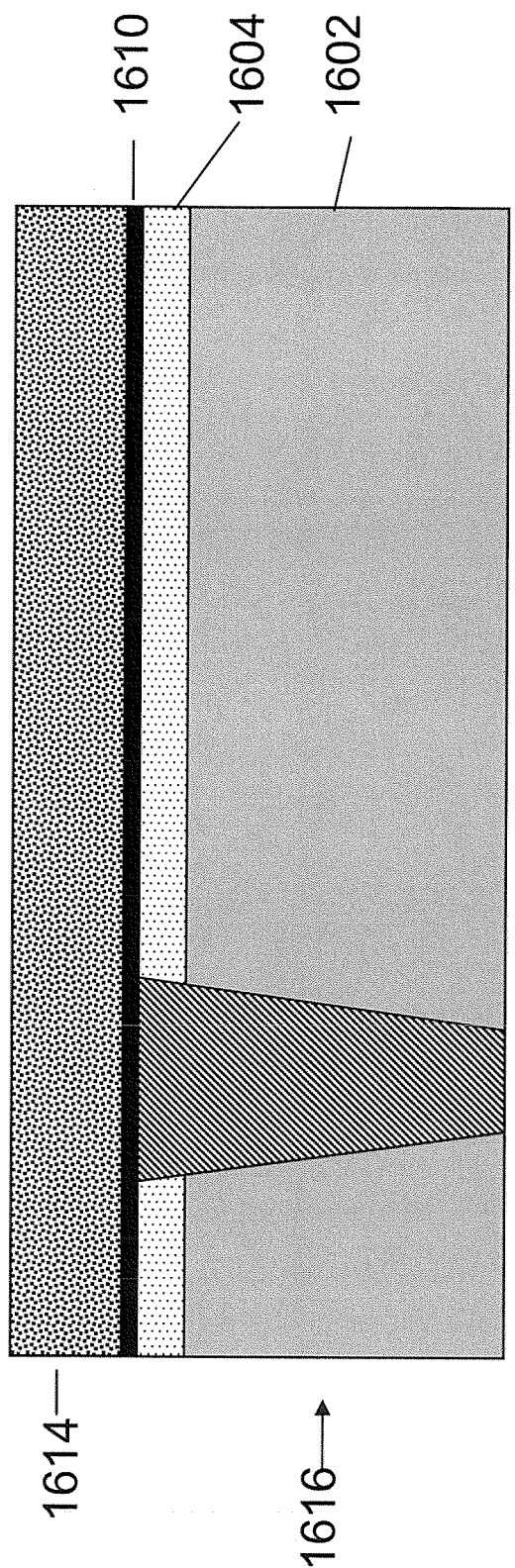

Another embodiment, and a method of fabricating it using a timed etch procedure to form a controlled overlap region between a nanotube element and a conductive element, is illustrated in FIGS. 10A-10I. Initial structure 1600 is created or supplied as shown in FIG. 10A, having a substrate 1602 that may be silicon or any appropriate material (or combination of materials). Insulator 1604, disposed on substrate 1602, may be made from silicon nitride or any appropriate material. A metal plug 1608 is disposed with a portion of substrate 1602 and insulator 1604, so that its top surface is approximately planar with insulator 1604. Nanofabric 1610 is applied to structure 1600, forming intermediate structure 1612, as illustrated in FIG. 10B. Methods for applying nanofabric 1610 are described in the incorporated patent references and will not be described here for the sake of brevity.

Figure 10D:
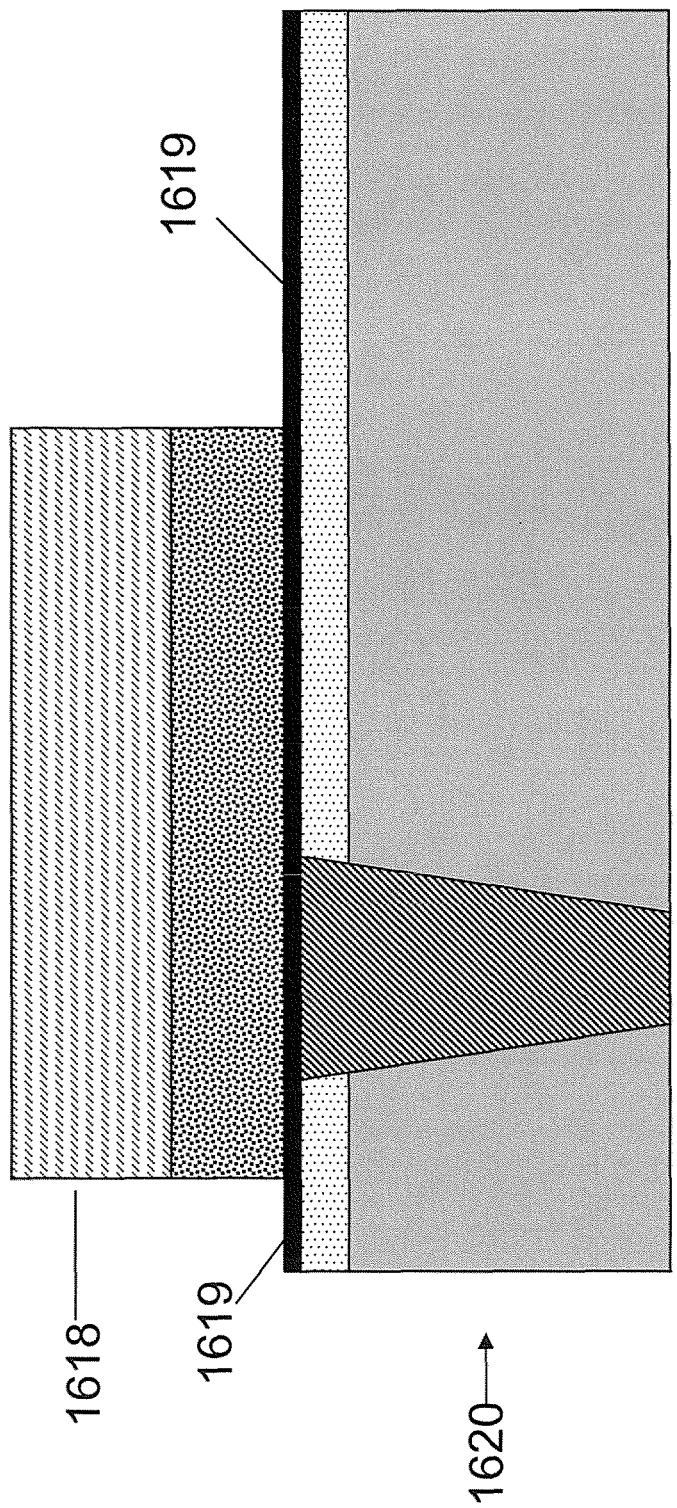
Figure 10F:
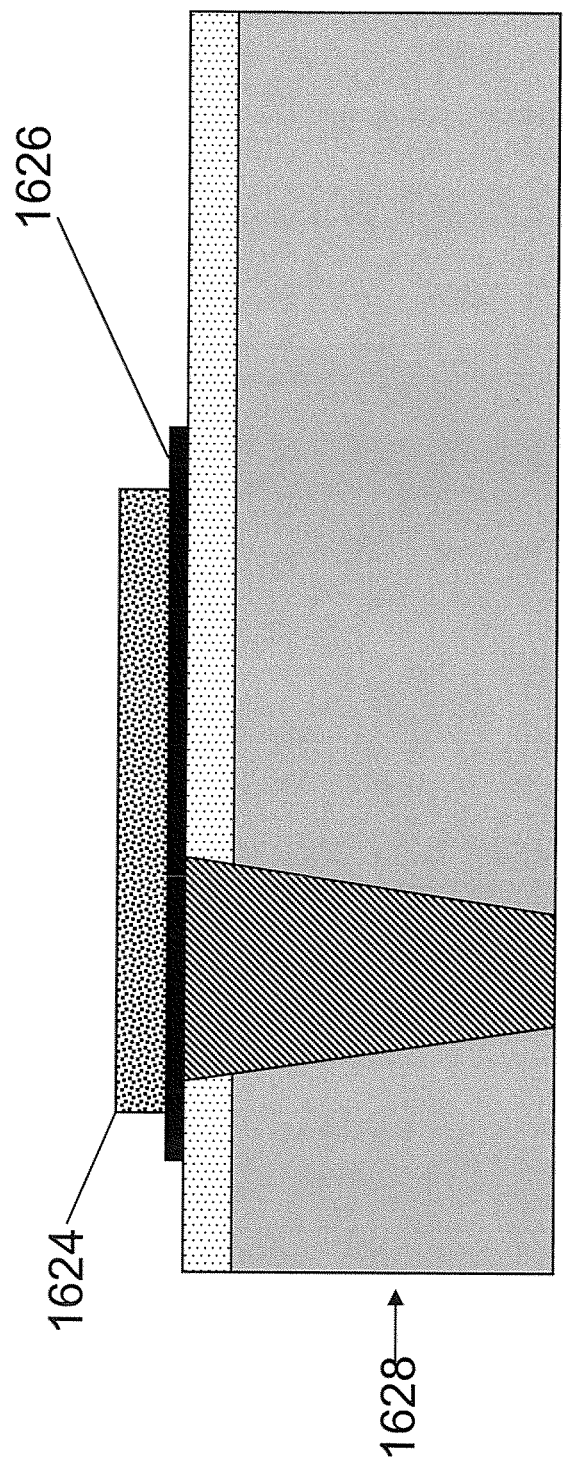

Oxide layer 1614 is applied to the intermediate structure 1612 of FIG. 10B, forming intermediate structure 1616 in FIG. 10C. A resist coat 1618 is applied to intermediate structure 1616 and patterned, leaving intermediate structure 1620 as illustrated in FIG. 10D. Regions 1619 of nanofabric 1610 are exposed in structure 1620. Then intermediate structure 1620 is exposed to a dry etch procedure to remove exposed nanofabric regions 1619, forming nanotube element 1650. Then the remaining resist is removed, forming intermediate structure 1622 shown in FIG. 10E. Intermediate structure 1622 is exposed to a wet etch procedure to remove some of oxide layer 1614 (as shown by dotted lines in FIG. 10E), leaving remaining oxide 1624 and exposed nanotube element region 1626. Region 1626 can have a length, for example, of 1-150 nm. Intermediate structure 1628 is shown in FIG. 10F.

Figure 10G:
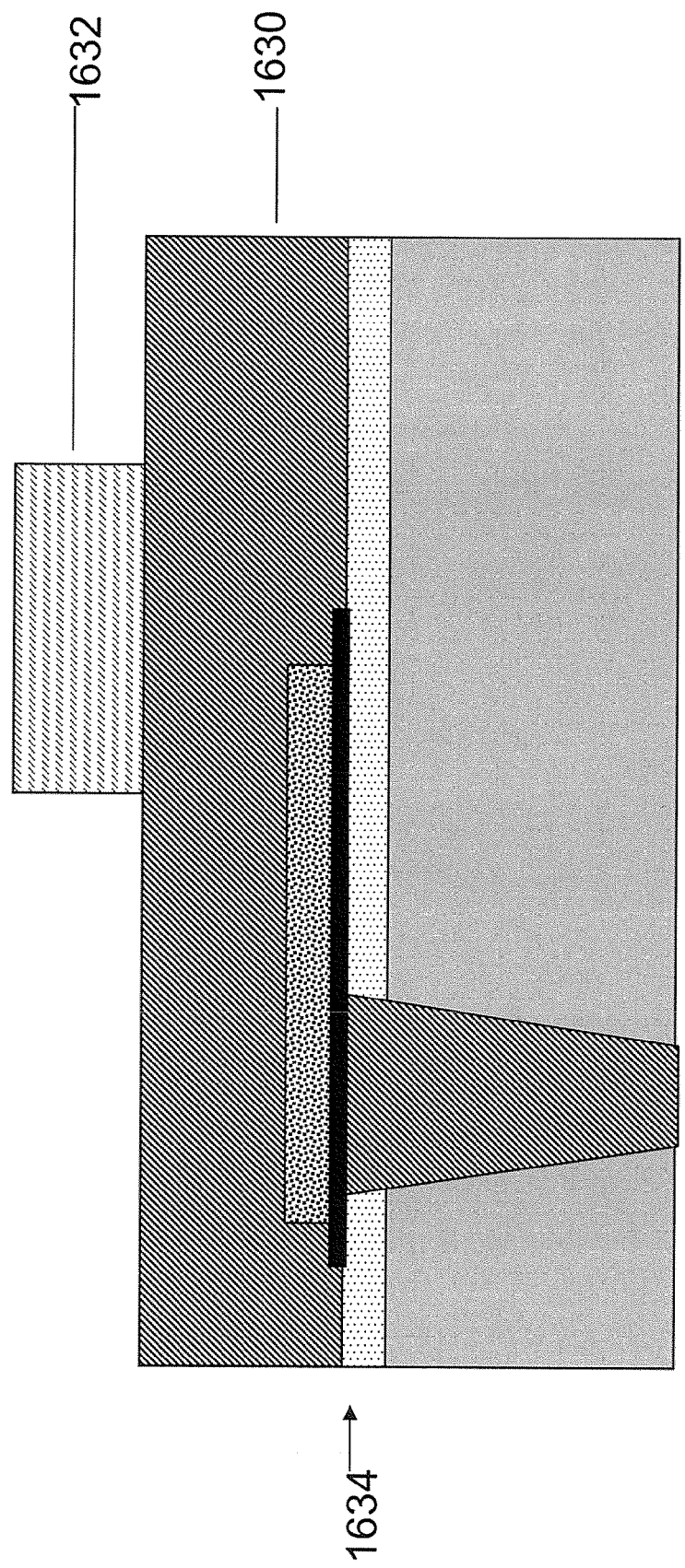
Figure 10H:
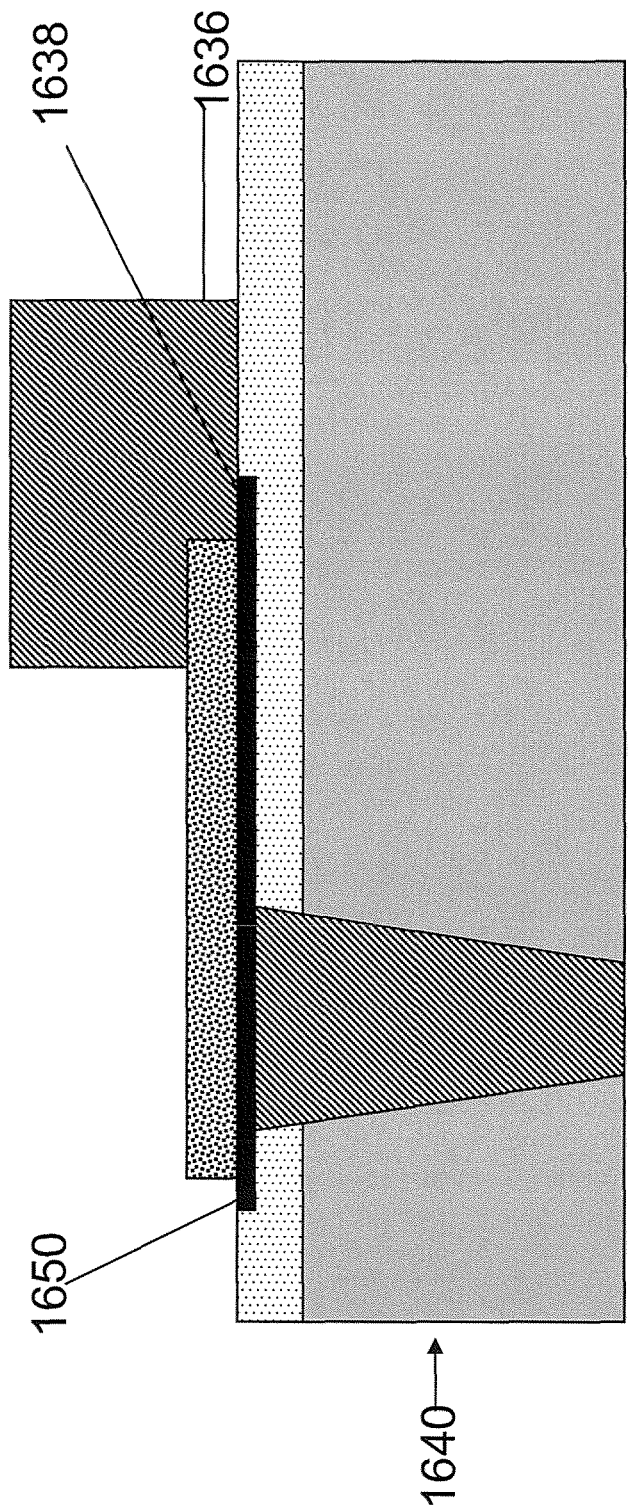
Figure 10I:
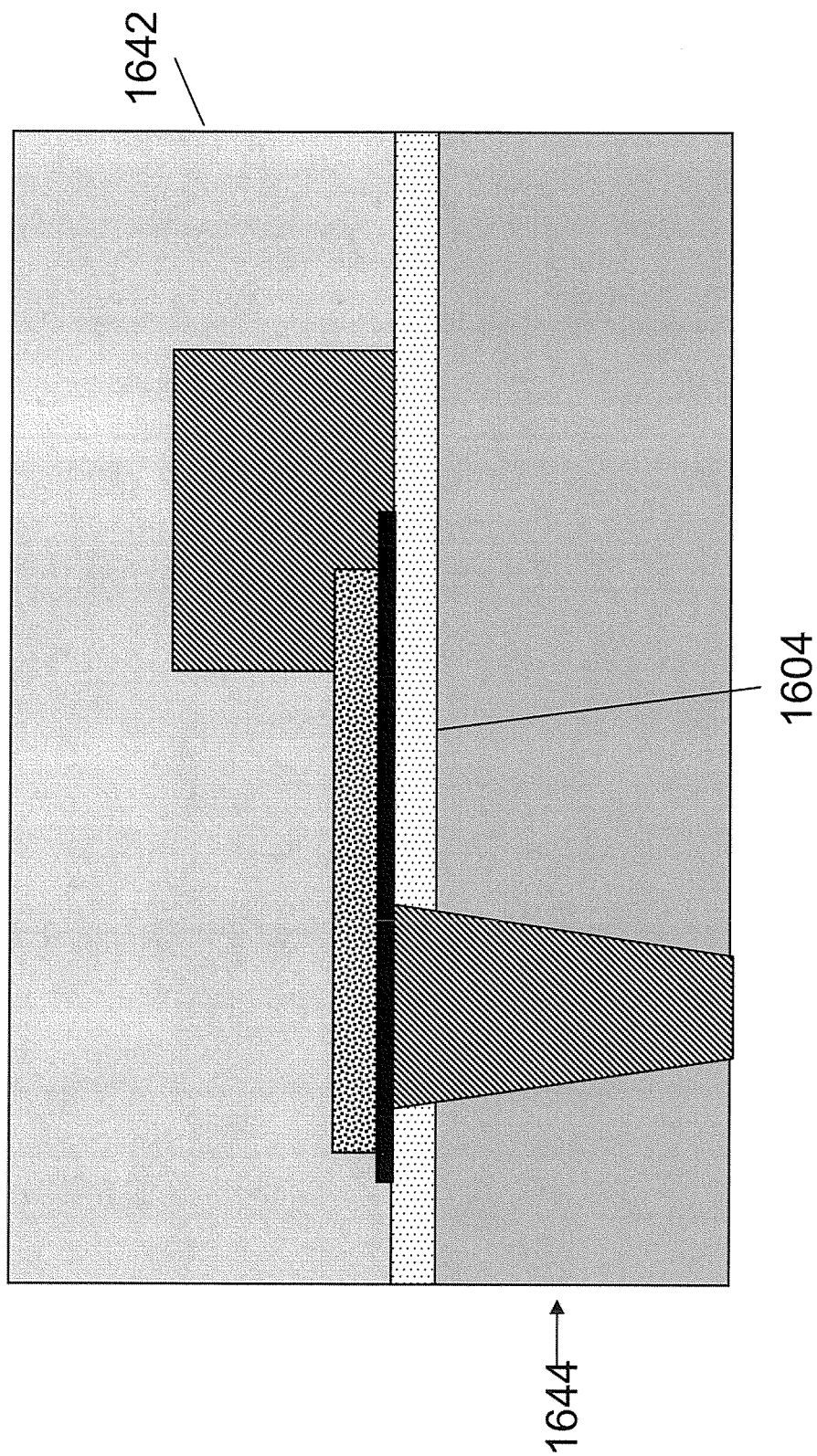

As shown in FIG. 10G, conductive material 1630 is then deposited over intermediate structure 1628. Photoresist 1632 is deposited over conductive material 1630 and patterned to leave a region of resist 1632 above exposed nanotube element region 1626, thus forming intermediate structure 1634. Conductive material 1630 and resist 1632 are exposed to appropriate etch procedures, leaving remaining conductive element 1636. Conductive element 1636 overlaps nanotube element 1650 at region 1638, to form intermediate structure 1640, as illustrated in FIG. 10H.

A layer 1642, which in certain embodiments may be composed of a copolymer or other mixtures of materials, is applied to intermediate structure 1640, which may be intermetal dielectric, forming final structure 1644 as shown in FIG. 10G. Note that insulating layer 1604 may act as a passivation layer preseal.

Methods That Utilize Lithography to Fabricate a 2-TNS

A method that does not rely on a controlled etch, but rather uses lithographic techniques to form a controlled contact overlap region, is illustrated in FIGS. 11A-11C. A method of fabricating the embodiment of FIG. 4, using lithographic techniques, is illustrated in FIGS. 11A-11C. Referring to FIG. 11A, preferred methods deposit and pattern conductive elements 2605 and 2610 on substrate 2600. Substrate 2600 may include semiconducting devices, polysilicon gates and interconnections, metallic wiring layers and studs for contacting other layers. Conductive elements 2605 and 2610 may have a well-controlled thickness in the range of 5 to 500 nm, and may be composed of metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, and semiconductor, materials can also be used. Preferred methods of patterning conductive elements 2605 and 2610 may use well known photolithographic techniques and/or well known etching techniques, such as reactive ion etching (RIE).

Next, still referring to FIG. 11A, preferred methods deposit and planarize insulator 2622 using known fabrication techniques. Insulator 2622 fills regions between conductive elements 2605 and 2610. Next, still referring to FIG. 11A, preferred methods conformally deposit nanofabric 2615 over contact elements 2605 and 2610, and insulator 2622. Methods for applying nanofabric 2615 are described in the incorporated patent references and will not be described here for the sake of brevity. The assembly in FIG. 11A can be considered an initial structure.

Next, preferred methods deposit, pattern, and align photolithographic layer 2620 on nanofabric 2615, using known semiconductor industry fabrication methods, as illustrated in FIG. 11B. The relative alignment of patterned photolithographic layer 2620 and conductive element 2610 determines the controlled overlap length between a nanotube element and the conductive element, as described further below. FIG. 11B can be considered an intermediate structure.

Next, preferred methods pattern nanofabric 2615, using patterned photolithographic layer 2620 as a mask. This forms nanotube 2625 as illustrated in FIG. 11C, and completes the fabrication of two-terminal switch 2670, which corresponds to switch 2500 illustrated in FIG. 4. Next, preferred methods deposit a protective insulating layer (not shown) using well known insulators such as $SiO_2$, $Si_xN_y$, $Al_2O_3$, and other well known insulators used in semiconductor fabrication 2-TNS 2670 includes nanotube element 2625 which overlaps the top of conductive element 2605, forming a near-ohmic contact. Nanotube element 2625 overlaps conductive element 2610 over a controlled overlap length 2640 that may range in length from 1 to 150 nm, for example. Overlap length 2640 is determined by the alignment of patterned photolithographic layer 2620 with respect to conductive element 2610.

The embodiment of FIG. 5 may be fabricated, using lithographic techniques and a conformal nanotube element, as shown in FIGS. 12A-13. Referring to FIG. 12A, preferred methods deposit and pattern conductive elements 2305 and 2310 on substrate 2300. Substrate 2300 may include semiconducting devices, polysilicon gates and interconnections, metallic wiring layers and studs for contacting other layers as illustrated further below. Elements 2305 and 2310 may have a well-controlled thickness in the range of 5 to 500 nm, and may be composed of metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, and semiconductor, materials can also be used. Preferred methods of patterning conductive elements 2305 and 2310 may use well known photolithographic techniques and well known etching techniques, such as reactive ion etching (RIE).

Next, still referring to FIG. 12A, preferred methods conformally deposit nanofabric 2315 over conductive elements 2305 and 2310, overlapping top and side surfaces of elements 2305 and 2310, as well as a portion of the top surface of substrate 2300. Methods of forming and patterning nanofabric are described in the incorporated patent references. The assembly illustrated in FIG. 12A can be considered an initial structure.

Next, preferred methods deposit, pattern, and align photolithographic layer 2320 on nanofabric 2315 using known semiconductor industry fabrication methods as illustrated in FIG. 12B. The relative alignment of patterned photolithographic layer 2320 and conductive element 2310 determines the controlled overlap length between a nanotube element and conductive element 2310 as described further below. The assembly illustrated in FIG. 12B can be considered an intermediate structure.

Next, preferred methods pattern the nanofabric 2315, using patterned photolithographic layer 2320 as a mask. This forms nanotube element 2325 as illustrated in FIG. 13, and completes the fabrication of nonvolatile two-terminal nanotube switch 2370 which corresponds switch 2200 illustrated in FIG. 5. Next, preferred methods deposit a protective insulating layer (not shown) using well known insulators such as $SiO_2$, SiN, $Al_2O_3$, and other well known insulators used in semiconductor fabrication.

As discussed above regarding corresponding FIG. 5, nanotube element 2325 overlaps conductive element 2310 in region 2350, which is defined by sidewall overlap region 2340 (having a length approximately the same as thickness T1 of conductive element 2310) and controlled overlap length 2345, for example 1-150 nm.

In the embodiment illustrated in FIGS. 12A-13, the total length by which nanotube element 2325 overlaps two surfaces of conductive element 2310 defines a controlled overlap region. However, in other embodiments, nanotube element 2325 could feasibly contact more than two surfaces of a conductive element 2310 to define a controlled overlap region, the length of which may affect one or more electrical characteristics of the resulting 2-TNS switch.

Fabricating Dense 2-Terminal Nanotube Switches With Controlled Overlap Regions

While the above-described embodiments are 2-TNS that are relatively dense (i.e. many can be fabricated in a small area), even denser scalable nonvolatile nanotube two terminal switches are possible. Some methods for fabricating dense switches use preferred fabrication methods to fabricate a picture frame structure, which provides for dense 2-TNS that can are useful in many applications.

Other described methods for fabricating dense switches use preferred fabrication methods with vertically oriented nanotube elements. In these, spacing between the conductive elements is controlled by a film thickness instead of by photolithographic means. The thickness of a removable (or sacrificial) film is used to define a controlled overlap length between a vertically-oriented nanotube element and a conductive element. Alternately, the thickness of a conductive element itself defines a controlled overlap length.

Methods That Fabricate a Picture Frame Design 2-TNS

An embodiment that provides for relatively dense 2-TNS is a picture frame design. A picture frame design has symmetric features that can be scaled in proportion to the metal ground rules that define each technology generation. Picture frame design techniques for nanotube three terminal structures are described in U.S. patent application Ser. No. 10/864,186, entitled "Non-volatile Electromechanical Field Effect Devices and Circuits using Same and Methods of Manufacturing Same" and filed Jun. 9, 2004, and in U.S. patent application Ser. No. 10/936,119, entitled "Patterned Nanoscopic Articles and Methods of Making the Same" and filed Sep. 8, 2004. A picture frame design example for nonvolatile nanotube two terminal switches is described further below with respect to FIGS. 14A-14J.

Referring to FIG. 14A, preferred methods deposit insulator 1800 on an underlying structure (not shown). Conductive element 1805, in via hole 1810, forms a conductive path between nanofabric 1815 and a conductor (not shown) below insulator 1800. At this point the initial structure is similar to a portion of that shown in FIG. 3B. For example, insulator 1800 and conductive element 1805 in FIG. 14A correspond to insulator 915 and conductive element 935, respectively, in FIG. 3B. However in this embodiment, conductive element 1805 is designed to be at the center of a picture frame switch as illustrated further below, as opposed to at the end of a nanotube element. Insulator 1800 may be SiN, $Al_2O_3$, or other suitable insulating material, for example, having a thickness in the range of 5 to 200 nm, for example, deposited using well known industry techniques on a planar surface (not shown). The assembly shown in FIG. 14A can be considered an initial structure.

Next, preferred methods deposit and pattern optional conductive element 1807 as illustrated in FIG. 14B. Optional element 1807 can provide a near-ohmic contact with improved resistance between nanofabric 1815 and conductive element 1805. Optional element 1807 may be metal such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, and semiconductor, materials can also be used.

Next, preferred methods deposit and pattern insulator 1820, $SiO_2$ for example, of thickness 5 to 50 nm, for example as illustrated in FIG. 14C. Insulator 1820 is patterned using well known industry techniques.

Figure 14D:
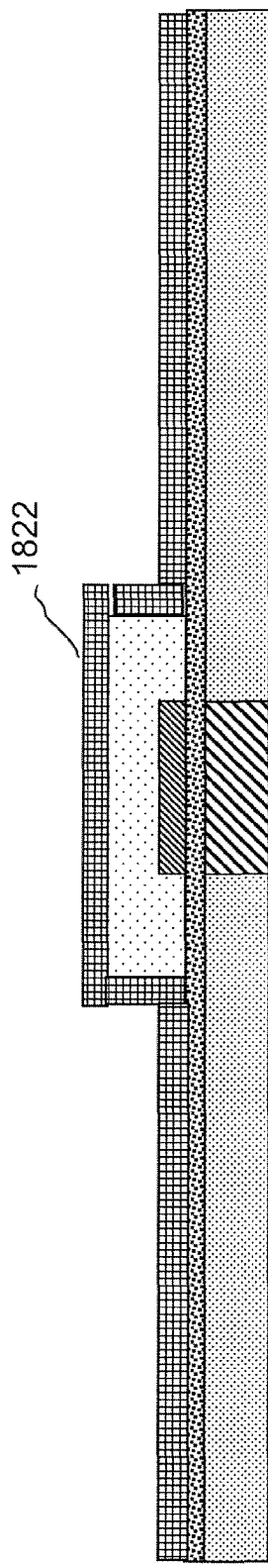

Next, preferred methods deposit and pattern a conformal sacrificial layer 1822, such as silicon for example, as illustrated in FIG. 14D. Layer 1822 has a well-controlled thickness, for example in the range of 1 to 150 nm, controlled using well known industry techniques. Preferred methods of thickness control are used because the thickness of conformal sacrificial layer 1822 will determine the controlled overlap length between a nanotube element and conductive element, later in the process.

Figure 14E:
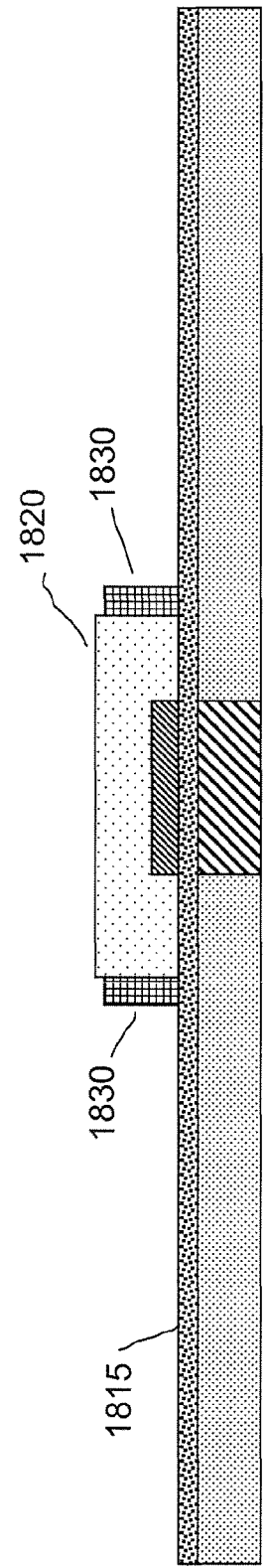

Next, preferred methods directionally etch conformal sacrificial layer 1822 using well known industry methods such as RIE, for example, leaving sidewall regions 1830 as illustrated in FIG. 14E.

Figure 14F:
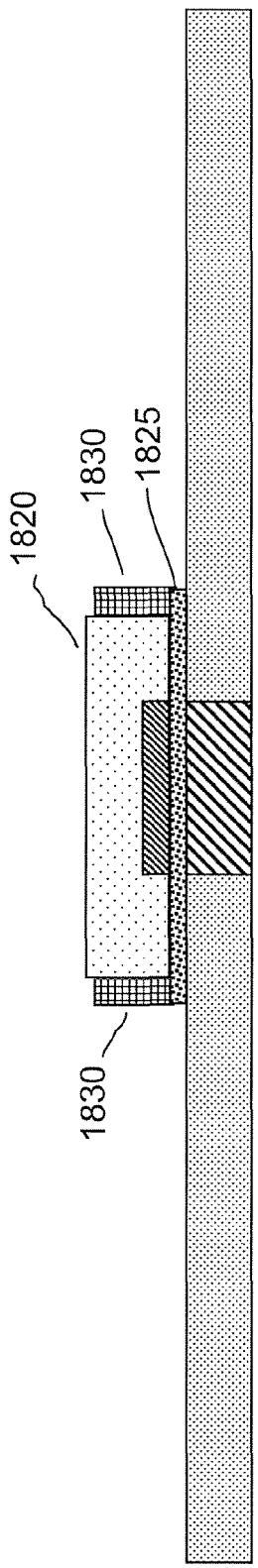

Next, preferred methods pattern nanofabric 1815, using insulator 1820 and sidewall spacers 1830 as a mask, forming nanotube element 1825 as illustrated in FIG. 14F. Methods of patterning nanofabrics to form nanotube elements are described in the incorporated patent references.

Figure 14G:
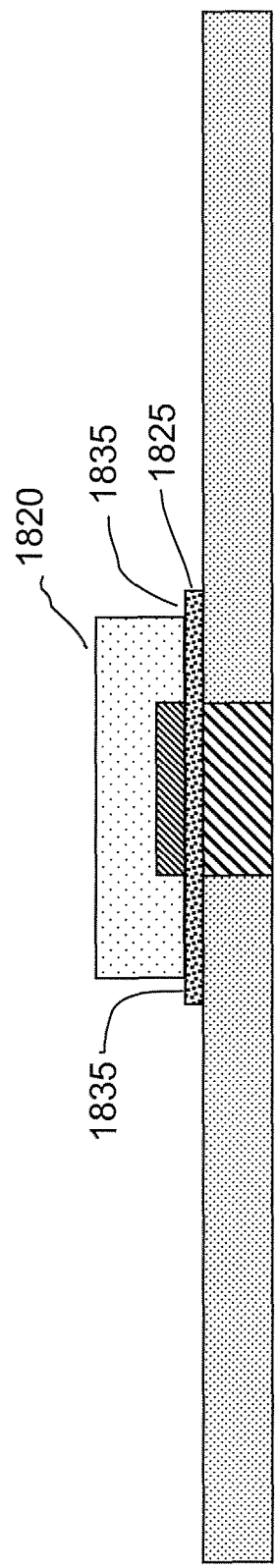

Next, preferred methods etch (remove) the remaining sidewall spacers 1830 using well known industry techniques, exposing nanotube element 1825 in region 1835 as illustrated in FIG. 14G.

Figure 14H:
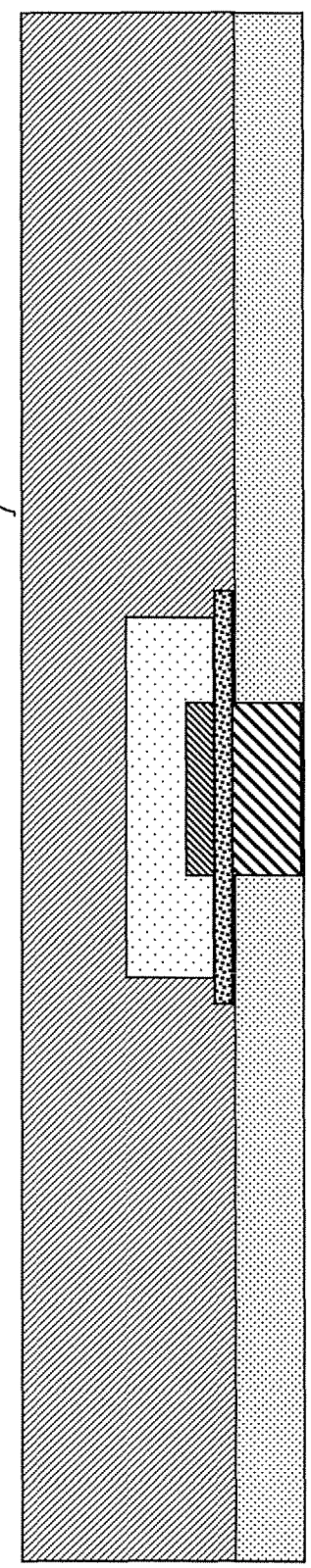

Next, preferred methods deposit conductor 1845 as illustrated in FIG. 14H. Conductor 1845 overlaps exposed regions 1835 of nanotube element 1825 as illustrated in FIG. 14H. Conductor 1845 may be have a thickness in the range of 5 to 500 nm, and may be composed of metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, and semiconductor, materials can also be used. The assemblies shown in FIGS. 14B-14H can be considered intermediate structures.

Then, preferred methods use well known industry techniques to pattern conductor 1845 to form conductive element 1855 as illustrated in FIG. 14I. Conductive element 1855 overlaps nanotube element 1825 in exposed region 1835 by a controlled overlap length 1860. Overlap length 1860 is in the range, for example, of 1 to 150 nm. Although this embodiment has a different geometrical relationship between the conductive element and nanotube switch, controlled overlap length 1860 corresponds length 40' illustrated in FIG. 1B.

FIG. 14I illustrates picture frame 2-TNS 1870 cross section including a supporting insulator 1800 on an underlying substrate (not shown) and conductive element 1805 in via hole 1810. FIG. 14J illustrates a plan view of switch 1870 that corresponds to the cross section illustrated in FIG. 14I. Conductive element 1855 can be seen to overlap the periphery or outer edges of nanotube element 1825, and conductive element 1807 can be seen to overlap the central region of nanotube element 1825. The embodiment shown in FIGS. 14I and 14J can be considered a final structure.

Picture frame 2-TNS structures have numerous potential applications due to their density, scalability, and symmetry. In addition to potential uses for memory (e.g., nonvolatile random access memory) cells, picture frame nonvolatile two terminal nanotube switches may be used as programmable and reprogrammable fuse/antifuse switches between metal layers, and/or for reconfigurable wiring, for example, as described in more detail below.

Methods That Utilize Thin Film Techniques to Fabricate Dense 2-TNS

Figure 15G:
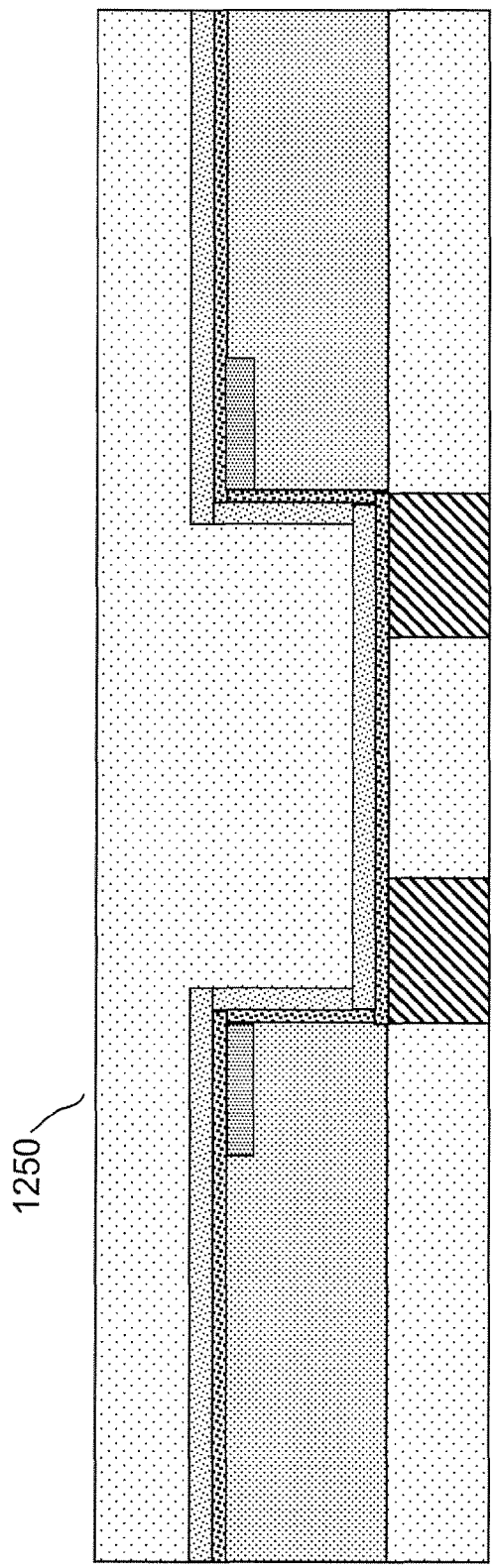
FIGS. 15A-N illustrate cross sectional views of structures created during fabrication steps according to certain embodiments of the invention.
Figure 15H:
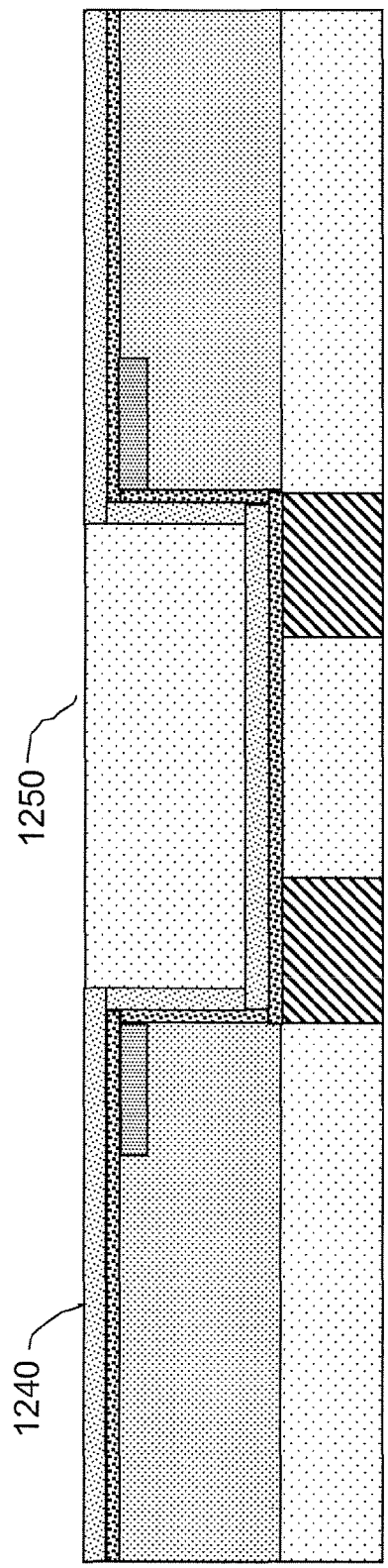
Figure 15I:
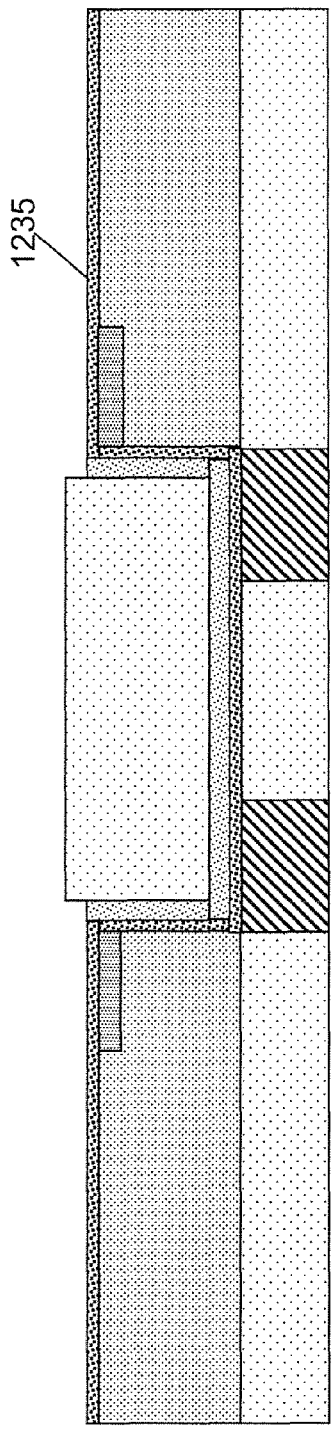
Figure 15J:
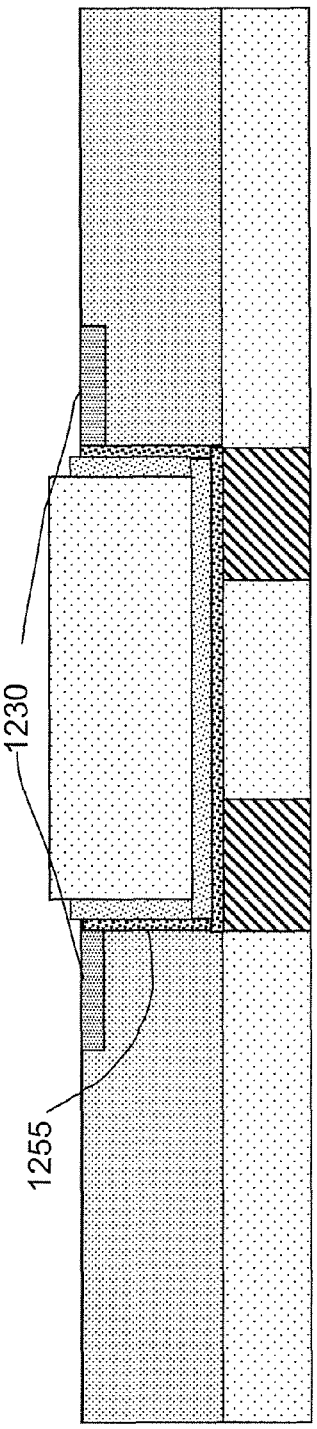
Figure 15K:
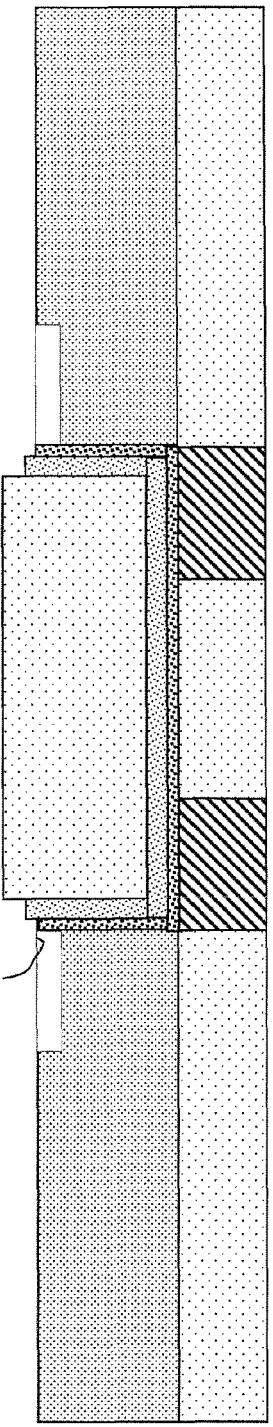
Figures 15L, 15M:
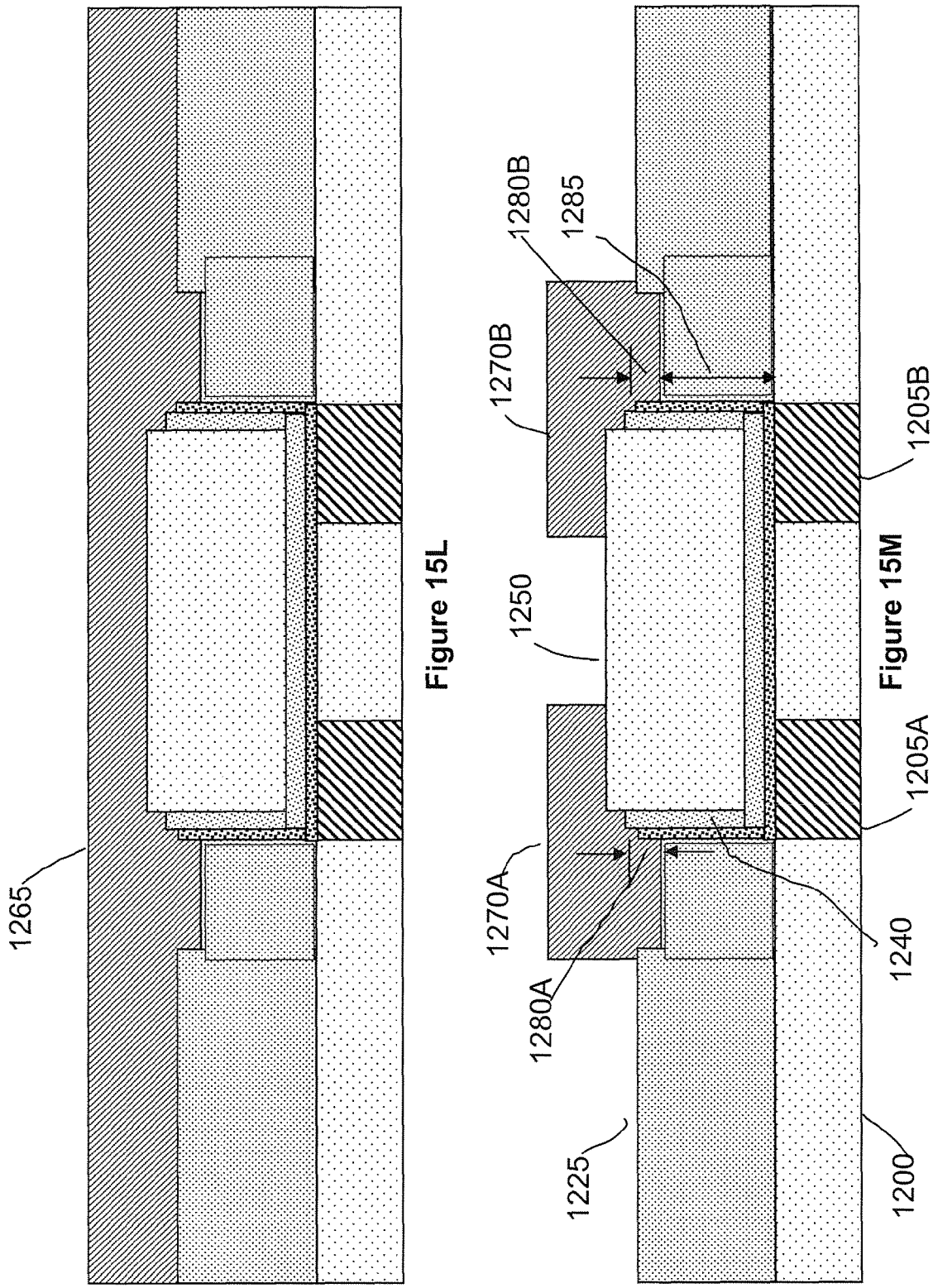
Figure 15N:
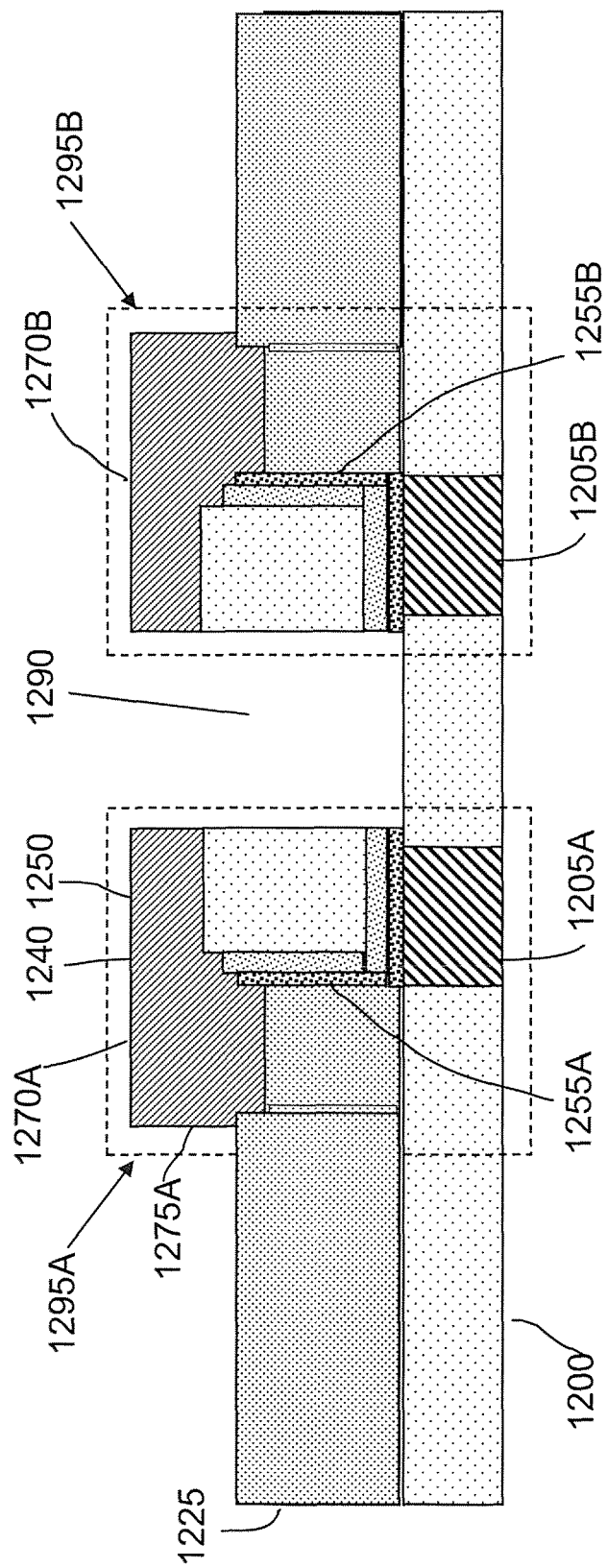

FIGS. 15A-15N illustrate the fabrication of a pair of vertically-oriented 2-TNS. Referring to FIG. 15A, preferred methods deposit insulating layer 1200, $SiO_2$ for example, on an underlying structure (not shown). Conductive elements 1205A and 1205B are provided in respective via holes 1210A and 1210B.

Next, preferred methods deposit insulator 1212 as illustrated in FIG. 15A which may be SiN, $Al_2O_3$, or other suitable insulating material, for example, having a thickness in the range of 2 to 200 nm, for example, deposited using well known industry techniques on the surface of insulator 1200. The thickness of insulator 1212 is used to define the separation between, for example, conductive element 1205A and a conductive element that is deposited in a later process step. Defining separation between the conductive elements by using a controlled deposited layer thickness can be more accurate than using photolithography.

Next, preferred methods deposit sacrificial layer 1215 illustrated in FIG. 15A, such as silicon for example, using well known industry techniques, in the thickness range of 1 to 150 nm, for example. Preferred methods of thickness control are used because the thickness of sacrificial layer 1215 will determine the controlled overlap length between a nanotube element and conductive element later in the process. The assembly illustrated in FIG. 15A can be considered an initial structure.

Next, preferred methods pattern sacrificial layer 1215 using well known industry techniques, forming sacrificial insulator 1220 illustrated in FIG. 15B.

Next, preferred methods deposit additional insulating material and planarize to embed sacrificial insulator 1220 in insulator 1225, as illustrated in FIG. 15C. A nonconformal insulating layer may be deposited and etched back using directional etching such as RIE, with the sacrificial insulator 1220 surface acting as an etch stop, for example. The resulting surface need not be highly planar in order to maintain sacrificial insulator 1220 thickness control.

Next, preferred methods pattern and directionally etch sacrificial insulator 1220 as shown in FIG. 15D. These methods form sacrificial insulators 1230 and directionally etch insulator 1225, selectively stopping at the surface of insulator 1200. These methods expose conductive elements 1205A and 1205B and leave opening 1245. Directional etch using RIE selective to underlying insulator 1200 and conductive element 1205 may be used, for example.

Next, as shown in FIG. 15E, preferred methods deposit a conformal nanofabric 1235 using methods described in the incorporated patent references.

Next, preferred methods deposit conformal protective insulator 1240 on nanofabric 1235 as illustrated in FIG. 15F. Protective insulator 1240 may use SiN, $Al_2O_3$, or other suitable insulating material.

Next, preferred methods deposit insulator 1250 using TEOS, for example, as illustrated in FIG. 15G. TEOS is deposited using well known industry techniques and fills opening 1245. SiO$_2$ is another example of an insulator that can be used for this purpose. Next, preferred methods planarize insulator 1250 using well known industry techniques, as illustrated in FIG. 15H. This exposes regions of protective insulator 1240.

Next, preferred methods selectively remove the exposed portion of protective insulator 1240. Directional etching such as RIE may be used, for example, resulting in the structure illustrated in FIG. 15I.

Next, preferred methods are used to remove exposed regions of nanofabric 1235 using ashing, for example, or other appropriate technique as described in the incorporated patent references. The resulting structure with vertically oriented nanotube element 1255 is illustrated in FIG. 15J.

Next, preferred methods remove sacrificial insulator regions 1230 as illustrated in FIG. 15K. This exposes regions 1260 at the ends of the vertically oriented nanotube element 1255. The length of this region is defined by the thickness of removed sacrificial insulator 1230.

Next, preferred methods deposit conductor 1265 as illustrated in FIG. 15L. Conductor 1265 overlaps the exposed regions of nanotube element 1255. Conductor 1265 may have a thickness in the range of 5 to 500 nm, and may be composed of metals such as Ti, Cr, Al, Au, Pd, Ni, W, Cu, Mo, Ag, In, Ir, Pb, Sn, for example, as well as other suitable metals, and combinations of these. Metal alloys such TiAu, TiCu, TiPd, PbIn, TiN, and others, for example, may be used.

Next, preferred methods use well known industry techniques to pattern conductor 1265 to form conductive elements 1270A and 1270B as illustrated in FIG. 15M. Elements 1270A and 1270B overlap respective ends of nanotube element 1255 by respective controlled overlap lengths 1280A and 1280B. These lengths may be in the range of 1 to 150 nm, for example. Controlled spacing 1285 between conductive elements 1270A and 1205A is determined by insulator 1212 thickness as described above with respect to FIG. 15A. The assemblies of FIGS. 15B-15M can be considered intermediate structures.

Next, as illustrated in FIG. 15N, preferred methods use conductive elements 1270A and 1270B as masking layers for the directional etch of insulator 1250 selective to insulator 1225 and insulator 1240. This etch creates opening 1290, which stops at the surface of insulator 1240. Then conductive elements 1270A and 1270B are used again as masking layers for the etch of insulator 1240 selective to insulator 1250 and insulator 1200. Then conductive elements 1270 and 1270B are used again as masking layers for the selective etch of exposed regions of nanotube element 1255. This etch creates two separate vertically-oriented nanotube element segments 1255A and 1255B. Conductive elements 1205A and 1205B overlap respective nanotube element segments 1255A and 1255B, forming near-ohmic contacts, and form conductive paths between the segments and corresponding contacts (not shown) below insulator 1200. This forms mirror image nonvolatile 2-terminal nanotube switches (2-TNS) 1295A and 1295B as illustrated in FIG. 15N. The assembly shown in FIG. 15N can be considered a final structure.

Vertically-oriented mirror image nonvolatile 2-terminal nanotube switches (2-TNS) 1295A and 1295B include conductive elements 1270A and 1270 B, which overlap corresponding nanotube element segments 1255 by corresponding controlled overlap lengths 1280A and 1280B. Though the geometry of this embodiment differs in many ways from that shown in FIG. 1B, lengths 1280A and 1280B correspond to controlled overlap length 40' illustrated in FIG. 1B.

Another method of fabricating dense 2-TNS switches uses preferred fabrication methods with vertically oriented nanotube elements in which a controlled overlap length between the nanotube element and a conductive element is determined by selectively masking sidewall regions of a trench (also may be referred to as a concave surface). U.S. Pat. No. 5,096,849 to Bertin, et al., teaches a fabrication method of selectively masking sidewall regions of a trench, and this method has been adapted here to control controlled overlap lengths. Vertically oriented nanotube elements can be used to form potentially denser 2-TNS, and can be fabricated in pairs as illustrated further below.

Referring to FIG. 16A, preferred methods deposit and pattern conductor 2805 on substrate 2800. Substrate 2800 may include semiconducting devices, polysilicon gates and interconnections, metallic wiring layers and studs for contacting other layers as illustrated further below. Conductor 2805 may have a well-controlled thickness in the range of 5 to 500 nm, and may be composed of metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, CoSi$_x$ and TiSi$_x$ may be used. Other kinds of conductor, and semiconductor, materials can also be used. Preferred methods of patterning conductor 2805 use well known photolithographic techniques and/or well known etching techniques, such as reactive ion etching (RIE).

Next, preferred methods deposit and planarize insulator 2810 such that the surface of insulator 2810 and conductor 2805 are coplanar as illustrated in FIG. 16A. Insulator 2810, supported by substrate 2800, may have a thickness in the range of 5 to 500 nm, for example, and may use one or more dielectric layers of SiO$_2$, SiN, Al$_2$O$_3$, or other suitable insulating material.

Next, preferred methods deposit insulator 2815. Insulator 2815 may have a thickness in the range of 5 to 500 nm, for example, as illustrated in FIG. 16A and may be composed of SiO$_2$, SiN, Al$_2$O$_3$, or other suitable insulating material. Insulator 2815 thickness controls the separation between the top surface of conductor 2805 and the bottom surface of a second conductor deposited on the top surface of insulator 2815 as illustrated further below.

Next, still referring to FIG. 16A, preferred methods deposit conductor layer 2820 on insulator 2815. Conductor layer 2820 may have a thickness T1 in the range of 5 to 500 nm, for example, using a well controlled deposition thickness, and may be composed of metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, CoSi$_x$ and TiSi$_x$ may be used. Other kinds of conductor, and semiconductor, materials can also be used. FIG. 28A can be considered to be an initial structure.

Next, preferred methods deposit and pattern mask layer 2825 on conductor layer 2820 as illustrated in FIG. 16B. Mask layer 2825 may be a photolithographic layer, for example, and may be patterned using methods known in the semiconductor industry.

Figure 16C:
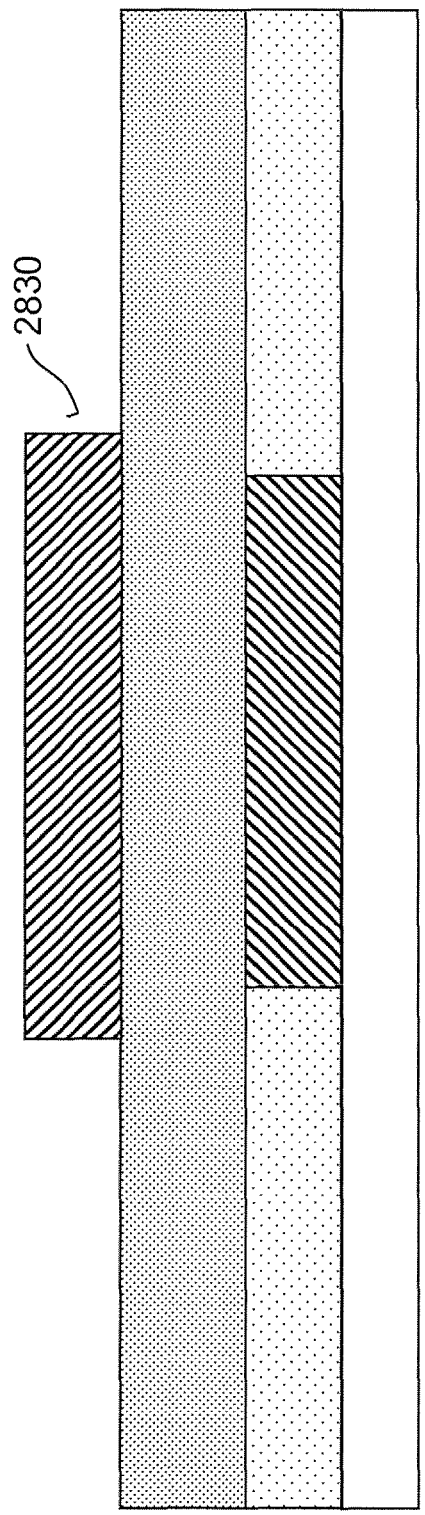

Next, preferred methods remove (etch) exposed portions of conductor layer 2820 resulting in conductor 2830 as illustrated in FIG. 16C. Known etch methods such as RIE may be used to define conductor 2830.

Figure 16D:
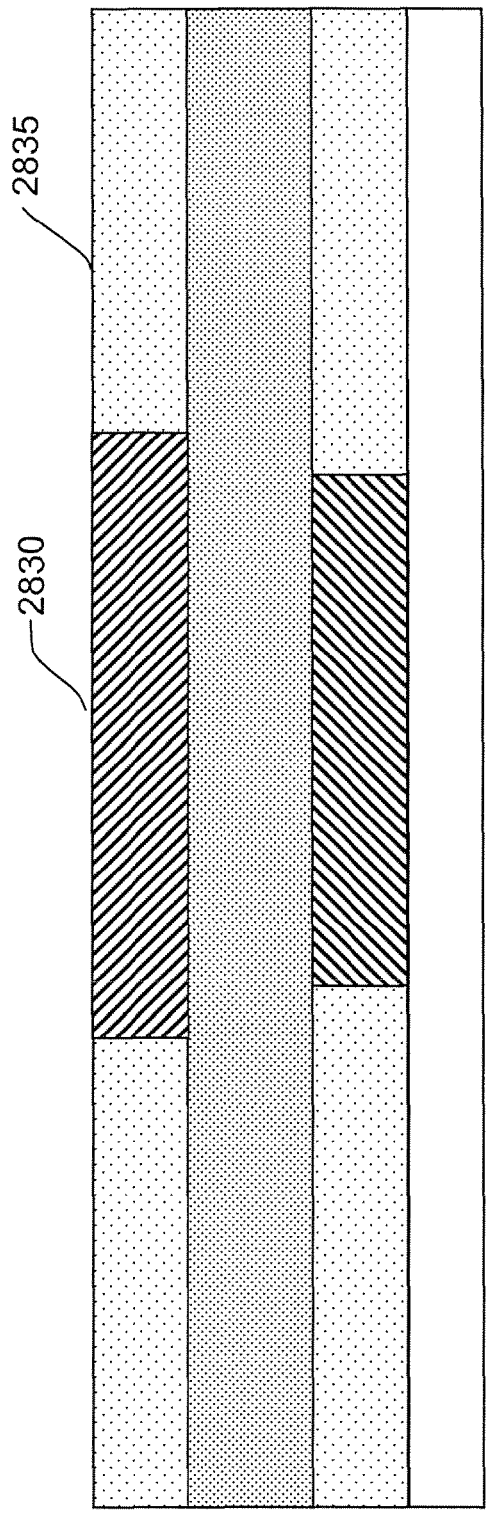

Next, preferred methods deposit and planarize insulator 2835, such that the top surface of insulator 2835 and the top surface of conductor 2830 are coplanar as illustrated in FIG. 16D. Insulator 2835 may be composed of $SiO_2$, SiN, $Al_2O_3$, or other suitable insulating material. Alternatively, structures that do not introduce insulator 2835 for planarization at this step in the process may be used. However, planarization at this step may facilitate subsequent process steps.

Next, preferred methods deposit and pattern mask layer 2840, with opening 2845 as illustrated in FIG. 16E. Opening 2845 corresponds to the position of vertical trenches to be used in later process steps for fabricating vertical nonvolatile nanotube two-terminal switches formed by depositing nanotube elements directly onto conductive elements.

Next, preferred methods directionally etch conductor 2830, directionally etch insulator 2815, and directly etch conductor 2805, stopping at the surface of substrate 2800 to form trench 2860 as illustrated in FIG. 16F. Any appropriate directional etch methods of fabrication may be used to form trench 2860, for example reactive ion etch (RIE) may be used. Methods of forming trench 2860 separate conductor 2830 into two conductive elements 2850A and 2850B. Methods of forming trench 2860 also separate conductor 2805 into two conductive elements 2855A and 2855B. Methods of forming trench 2860 also form a corresponding trench opening in insulator 2815.

Figure 16G:
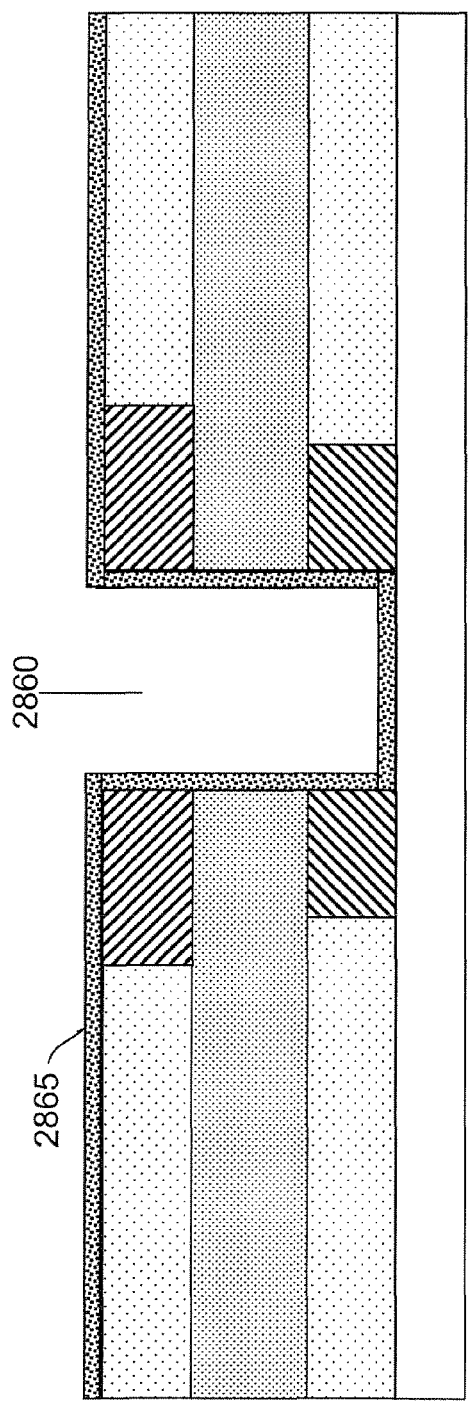

Next, preferred methods remove mask layer 2840, which may be photoresist, for example, using known semiconducting fabrication techniques. Next, preferred methods deposit conformal nanofabric 2865 on the bottom and sidewalls of trench 2860, on the top surface of conductive elements 2650A and 2650B, and on the top surface of insulator 2835 as illustrated in FIG. 16G. Methods of depositing nanofabrics are described in the incorporated patent references.

Figure 16H:
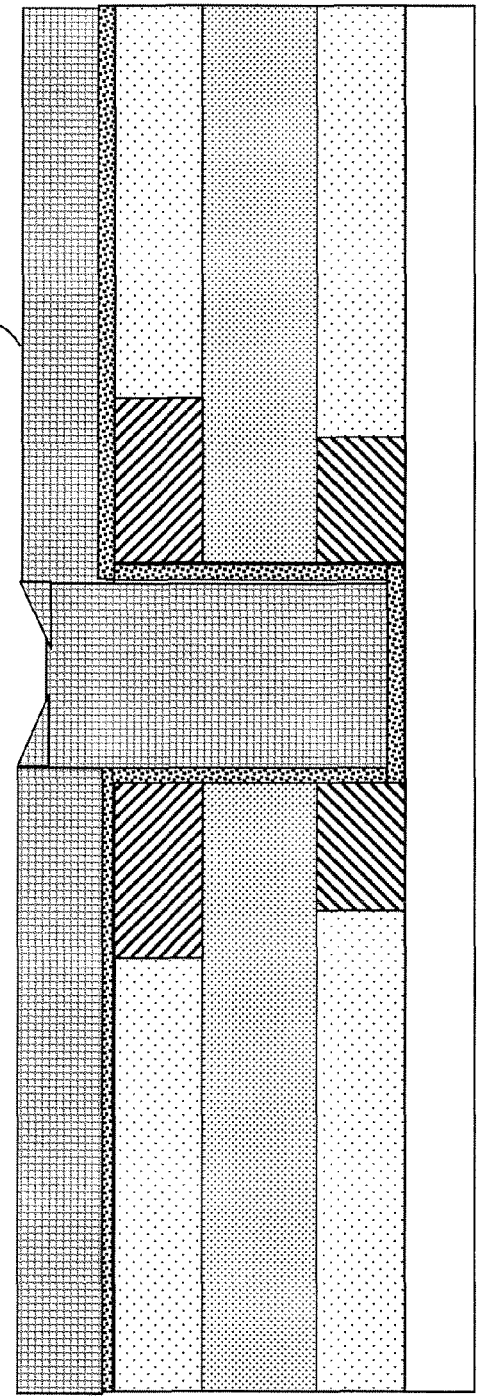

Next, preferred methods fill trench 2860 with insulator 2870, TEOS for example, with the surface of insulator 2870 nearly planarized as illustrated in FIG. 16H, such structures may be further planarized as desired, by CMP, for example.

Next, preferred methods etch an opening 2875 in insulator 2870 in the trench region as illustrated in FIG. 16I. This exposes the bottom region of nanofabric 2865. Opening 2875 does not have to be centered in the trench region, however opening 2875 should not expose sidewall regions (portions) of nanofabric 2865. Preferred methods of etching the insulator TEOS, or other insulators, are known in the semiconductor industry.

Next, preferred methods are used to selectively remove the exposed bottom region of at the bottom of opening 2875 using ashing, for example, or other appropriate technique as described in incorporated patent references. This forms vertically oriented nanofabric segments 2865A and 2865B as is illustrated in FIG. 16I.

Next preferred methods fill opening 2875 with an insulator, TEOS for example, and nearly planarize resulting in nearly planarized insulator 2880 as illustrated in FIG. 16J, such structures may be further planarized as desired, by CMP, for example.

At this point in the process, there is a need to define a controlled overlap length between vertically oriented nanofabric segments 2865A and 2865B and corresponding conductive elements 2850A and 2850B. A method of selectively masking sidewall regions in a trench (or concave region) with vertically oriented nanotube fabric may be used. A prior art process (fabrication method) for selective removal of material inside a trench in a silicon substrate is described in U.S. Pat. No. 5,096,849, to Bertin et al. Adapting fabrication techniques described in prior art U.S. Pat. No. 5,096,849 to a trench having sidewalls that include insulators, nanotube fabric, and conductors, preferred methods of fabrication continue as described further below.

Preferred methods directionally etch (using RIE for example) planarize insulator 2880 and remove insulator material, to a predetermined depth D1 below the surfaces of conductive elements 2850A and 2850B as illustrated in FIG. 16K. This defines the top surface of the remaining trench fill insulator 2885. Portions of nanofabric segments 2865A and 2865B, are also selectively removed using preferred methods to depth D1, forming nanotube elements 2890A and 2890B. Depth D1 defines the top edges of covered (i.e., protected) nanotube elements 2890A and 2890B with respect to the top surface of conductive elements 2850A and 2850B, respectively. In some embodiments, RIE simultaneously removes the insulator material and portions of nanofabric segments in the same step. However, in the event that the nanofabric portions are not completely removed by the RIE process, then preferred methods may be used to remove exposed nanofabric using ashing, for example, or other appropriate technique as described in incorporated patent references.

Nanotube elements 2890A and 2890B overlap conductive elements 2850A and 2850B by a controlled overlap length defined by the difference T1−D1. T1 may be in the range of 5 to 500 nm, for example, and overlap length T1−D1 may be in the range of 1 nm to 150 nm, for example. The assemblies illustrated in FIGS. 16B-16K can be considered intermediate structures.

Then, preferred methods remove remaining insulator 2885 as illustrated in FIG. 16L. Alternatively, additional insulator material may be added, and the structure planarized (not shown). The assembly illustrated in FIG. 16L can be considered a final structure. 2-TNS 2895A and 2895B are mirror image pairs. Switch 2895A includes nanotube element 2890A which overlaps the full height of the side of conductive element 2855A, forming a near-ohmic contact. Nanotube element 2890A overlaps conductive element 2850A by controlled overlap length 2892A that may range in length from 1 to 150 nm, for example, and is defined by T1−D1. Switch 2895B includes nanotube element 2890B which overlaps the full height of the side of conductive element 2855B, forming a near-ohmic contact. Nanotube element 2890B overlaps conductive element 2850B by controlled overlap length 2892B that may range in length from 1 to 150 nm, for example, and is defined by T1−D1. Though the geometry of this embodiment differs in many ways from that shown in FIG. 1B, lengths 2892A and 2892B correspond to controlled overlap length 40' illustrated in FIG. 1B.

Another method of fabricating dense 2-TNS uses preferred fabrication methods in which a controlled overlap length between a vertically oriented nanotube element and a conductive element is determined by a thickness of the conductive element. This method may result in improved overlap length control and process simplification. This fabrication method uses a conductive element that includes first and second electrical conductors that are in electrical contact. A first conductor has a controlled sidewall thickness, and overlaps a vertically oriented nanotube element over this thickness. This thickness defines a controlled overlap length. A second conductor forms a wiring layer that interconnects multiple switches. Vertically-oriented nanotube elements can form potentially denser structures, and can be fabricated in pairs as illustrated further below.

Figure 17A:
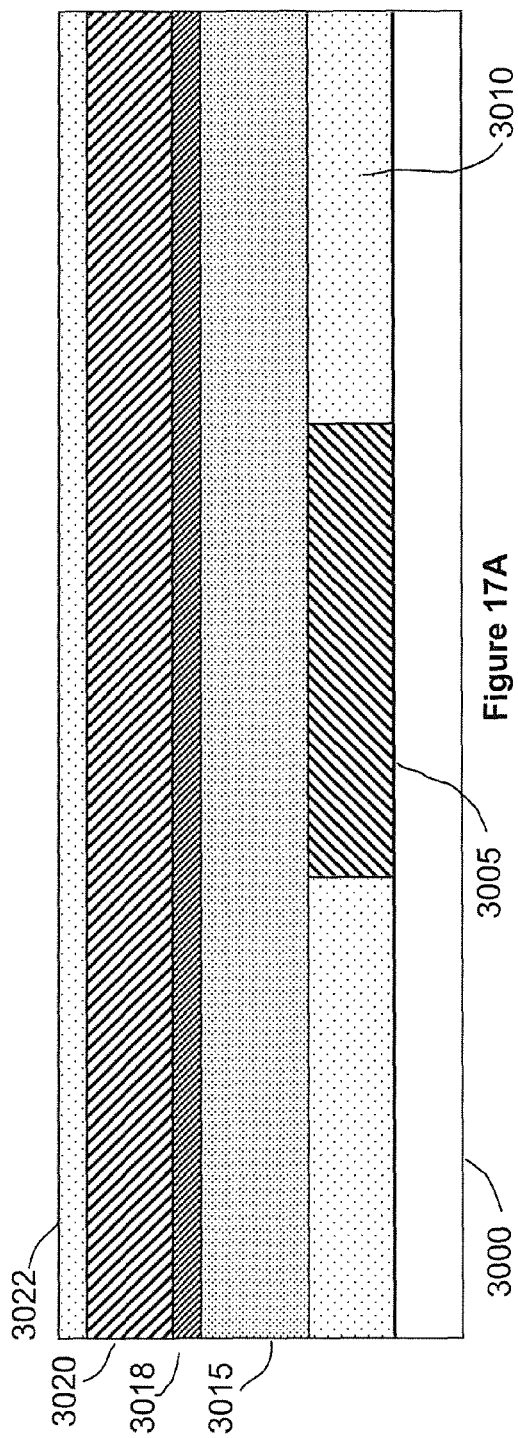

Referring to FIG. 17A, preferred methods deposit and pattern conductor 3005 on substrate 3000. Substrate 3000 may include semiconducting devices, polysilicon gates and interconnections, metallic wiring layers and studs for contacting other layers as illustrated further below. Conductor 3005 may have a thickness in the range of 5 to 500 nm using a well controlled deposition thickness, and may be composed of metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, and semiconductor, materials can also be used. Preferred methods of patterning conductor 3005 using well known photolithographic techniques and well known etching techniques, such as reactive ion etching (RIE).

Next, preferred methods deposit and planarize insulator 3010 such that the surface of insulator 3010 and conductor 3005 are coplanar as illustrated in FIG. 17A. Insulator 3010, supported by substrate 3000, may have a thickness in the range of 5 to 500 nm, for example, and may use dielectric layers of $SiO_2$, SiN, $Al_2O_3$, or other suitable insulating material.

Next, preferred methods deposit insulator 3015, as illustrated in FIG. 17A. Insulator 3015 may have a thickness in the range of 5 to 500 nm, for example and may be composed of $SiO_2$, SiN, $Al_2O_3$, or other suitable insulating material. The thickness of insulator 3015 controls the separation between the top surface of conductor 3005 and the bottom surface of another conductor deposited on the top surface of insulator 3015 as illustrated further below.

Next, still referring to FIG. 17A, preferred methods deposit conductor layer 3018 on insulator 3015. The thickness of conductor layer 3018 determines a controlled overlap length between a nanotube element and a first conductor, as described further below. Conductor layer 3018 may have a thickness in the range of 5 to 500 nm, for example, using a well controlled deposition thickness, and may be composed of metals such as Ti, Cr, Al, Au, Pd, Ni, W, Cu, Mo, Ag, In, Ir, Pb, Sn, for example, as well as other suitable metals, and combinations of these. Metal alloys such TiAu, TiCu, TiPd, PbIn, and others, for example, may be used.

Next, preferred methods deposit conductor layer 3020 in and electrical contact with conductor layer 3018 as illustrated in FIG. 17A. Conductor layer 3020 may be used to interconnect nanotube two-terminal switches as described further below. Conductor layer 3020 may have a thickness in the range of 5 to 500 nm, for example, using a well controlled deposition thickness, and may be composed of metals such as Ti, Cr, Al, Au, Pd, Ni, W, Cu, Mo, Ag, In, Ir, Pb, Sn, for example, as well as other suitable metals, and combinations of these. Metal alloys such TiAu, TiCu, TiPd, PbIn, TiN, and others, for example, may be used.

Next, preferred methods deposit insulator 3022 on the top surface of conductor layer 3020. Insulator 3022 may have a thickness in the range of 5 to 500 nm, for example, as illustrated in FIG. 17A and may be composed of $SiO_2$, SiN, $Al_2O_3$, or other suitable insulating material. FIG. 17A can be considered an initial structure.

Figure 17B:
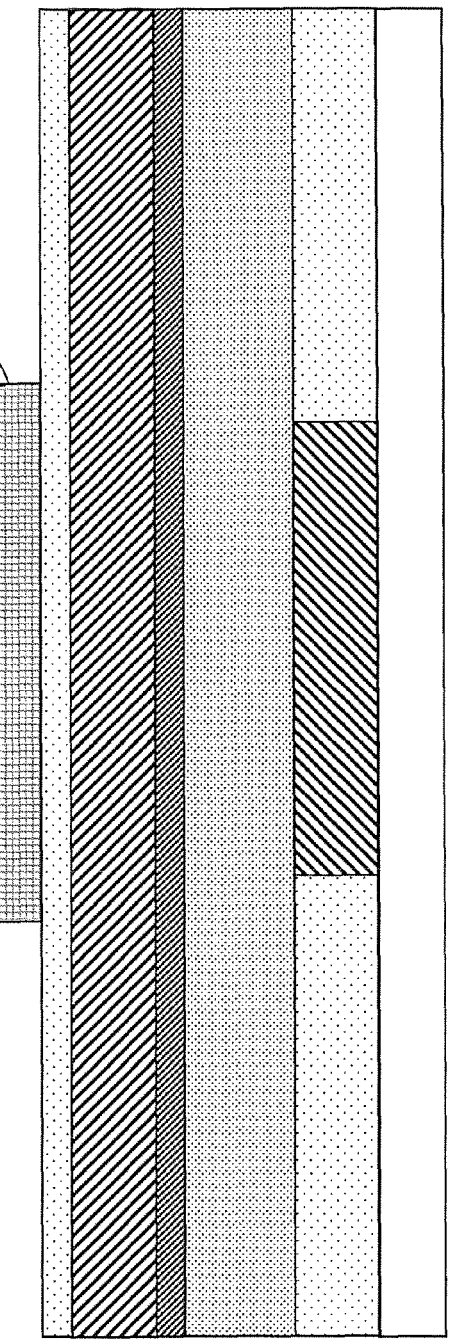

Next, preferred methods deposit and pattern mask layer 3025 on insulator 3022 as illustrated in FIG. 17B. Mask layer 3025 may be a photolithographic layer, for example, and is patterned using methods known in the semiconductor industry.

Figure 17C:
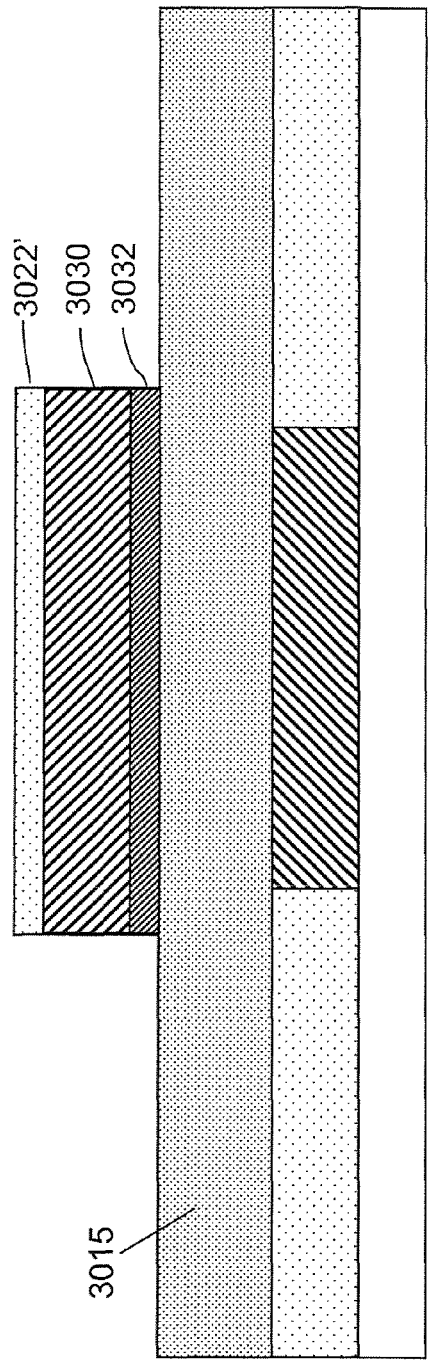
Figure 17D:
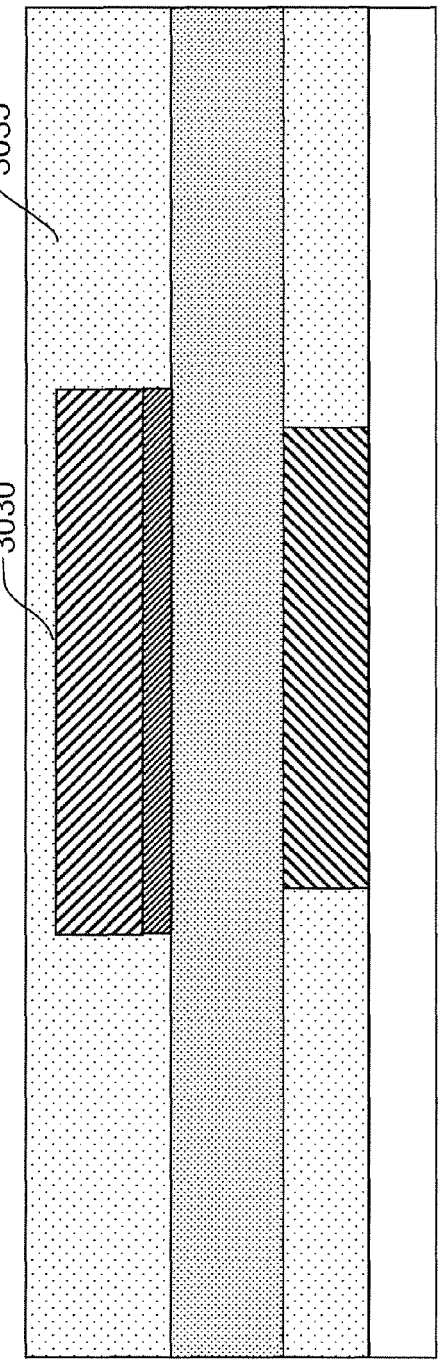

Next, preferred methods selectively remove exposed portions of insulator 3022 and conductor layers 3020 and 3018. Next, preferred methods remove patterned mask layer 3025, leaving patterned insulator 3022', conductor 3030, and conductor 3032 as shown in FIG. 17C. These methods expose portions of insulator 3015. Preferred known etch methods such as RIE may be used to remove portions of the different layers.

Figure 30:
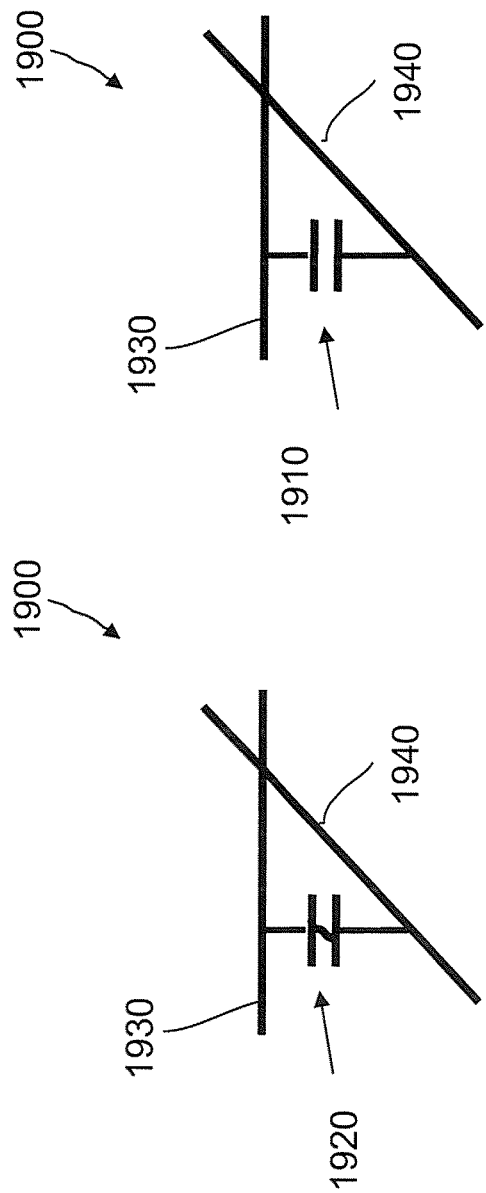
FIGS. 30A and 30B illustrate schematics of prior art structures.

Next, preferred methods deposit and planarize insulator 3035, such that insulator 3035 insulates (covers) the top surface of conductor 3030 as illustrated in FIG. 30D. The thickness of insulator 3035 above the top surface of conductor 3030 is not critical, and may vary from 5 nm to 500 nm, for example. Insulator 3035 may be composed of $SiO_2$, SiN, $Al_2O_3$, or other suitable insulating material.

Next, preferred methods deposit and pattern mask layer 3040, with opening 3045 as illustrated in FIG. 17E. Opening 3045 corresponds to the position of vertical trenches to be used in fabricating vertical nonvolatile nanotube two-terminal switches formed by vertically oriented nanotube elements deposited directly on conductive elements.

Next, preferred methods directionally etch conductor 3030, exposing the top layer of conductor 3032, and forming conductors 3050A and 3050B as illustrated in FIG. 17F. Preferred known etch methods such as RIE, selective to conductor 3032, may be used. This step separates conductor 3030 into two conductors, conductor 3050A and conductor 3050B.

Next, preferred methods deposit and pattern conformal sacrificial layer 3047 such as $SiO_2$, SiN, $Al_2O_3$, or other insulators, for example, using well known industry techniques, as illustrated in FIG. 17F. Layer 3047 has a thickness in the range, for example, 1 to 150 nm. Thickness control of sacrificial layer 3047 is not critical because the sacrificial layer thickness is not used to define the controlled contact overlap length as described further below.

Next, preferred methods directionally etch conformal sacrificial layer 3047 using well known industry methods such as RIE, for example. This leaves sidewall spacers 3048A and 3048B on the sidewall regions of corresponding conductors 3050A and 3050B. This also exposes a portion of the top surface of conductor 3032 as illustrated in FIG. 17G.

Next, preferred methods directionally etch conductor 3032, directionally etch insulator 3015, and directionally etch conductor 3005, stopping at the surface of substrate 3000, to form trench 3060 as illustrated in FIG. 17H. Known directional etch methods of fabrication using reactive ion etch (RIE) may be used to form trench 3060, for example. Methods of forming trench 3060 separate conductor 3032 into two electrical conductors, conductor 3052A and conductor 3052B. Methods of forming trench 3060 also separate conductor 3005 into two conductive elements, 3055A and 3055B. Methods of forming trench 3060 also form a corresponding trench opening in insulator 3015.

Figure 17I:
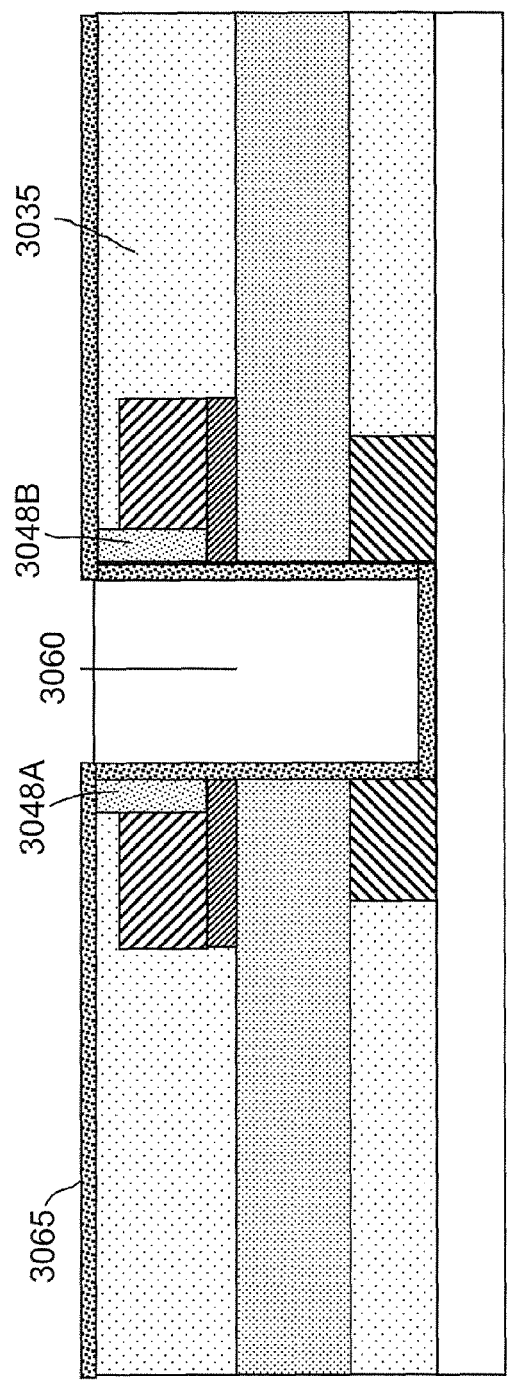

Next, preferred methods deposit a conformal nanofabric 3065 on the bottom and sidewalls of trench 3060, on the top surface of insulator 3035, and the top surface of sidewall spacers 3048A and 3048B as illustrated in FIG. 17I. Nanofabric 3065 may be deposited as described in the incorporated patent references.

Figure 17J:
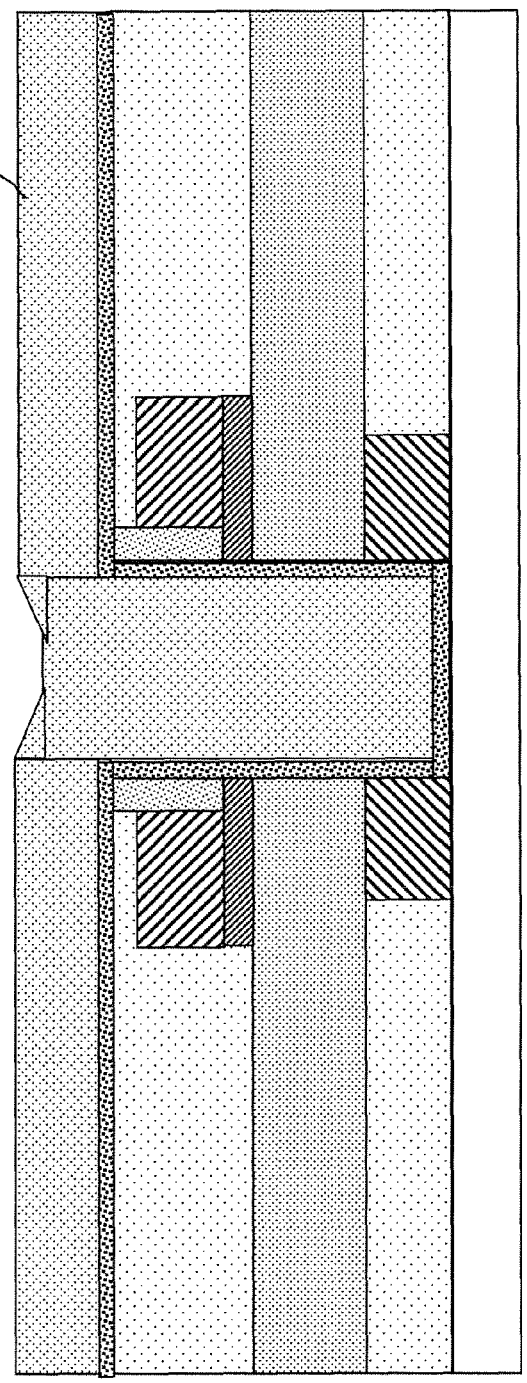

Next, preferred methods fill trenches 3060 with insulator 3070, TEOS for example, with the surface of insulator 3070 approximately planarized as illustrated in FIG. 17J.

Next, preferred methods etch an opening 3075 in insulator 3070 in the trench region as illustrated in FIG. 17K, exposing the bottom region of nanofabric 3065. Opening 3075 does not have to be centered in the trench region, however, opening 3075 should not expose sidewall regions (portions) of nanofabric 3065. Preferred methods of etching the insulator TEOS, or other insulators, are known in the semiconductor industry.

Next, preferred methods remove (etch) the exposed region of nanofabric at the bottom of opening 3075 using ashing, for example, or other appropriate technique as described in incorporated patent references. The resulting structure with vertically oriented nanofabric segments 3065A and 3065B is illustrated in FIG. 17K.

Next, preferred methods fill opening 3075 with an insulator, TEOS for example, and nearly planarize resulting in nearly planarized insulator 3080 as illustrated in FIG. 17L, such structures may be further planarized as desired, by CMP, for example. The assemblies illustrated in FIGS. 17B-17L can be considered intermediate structures.

Figure 17M:
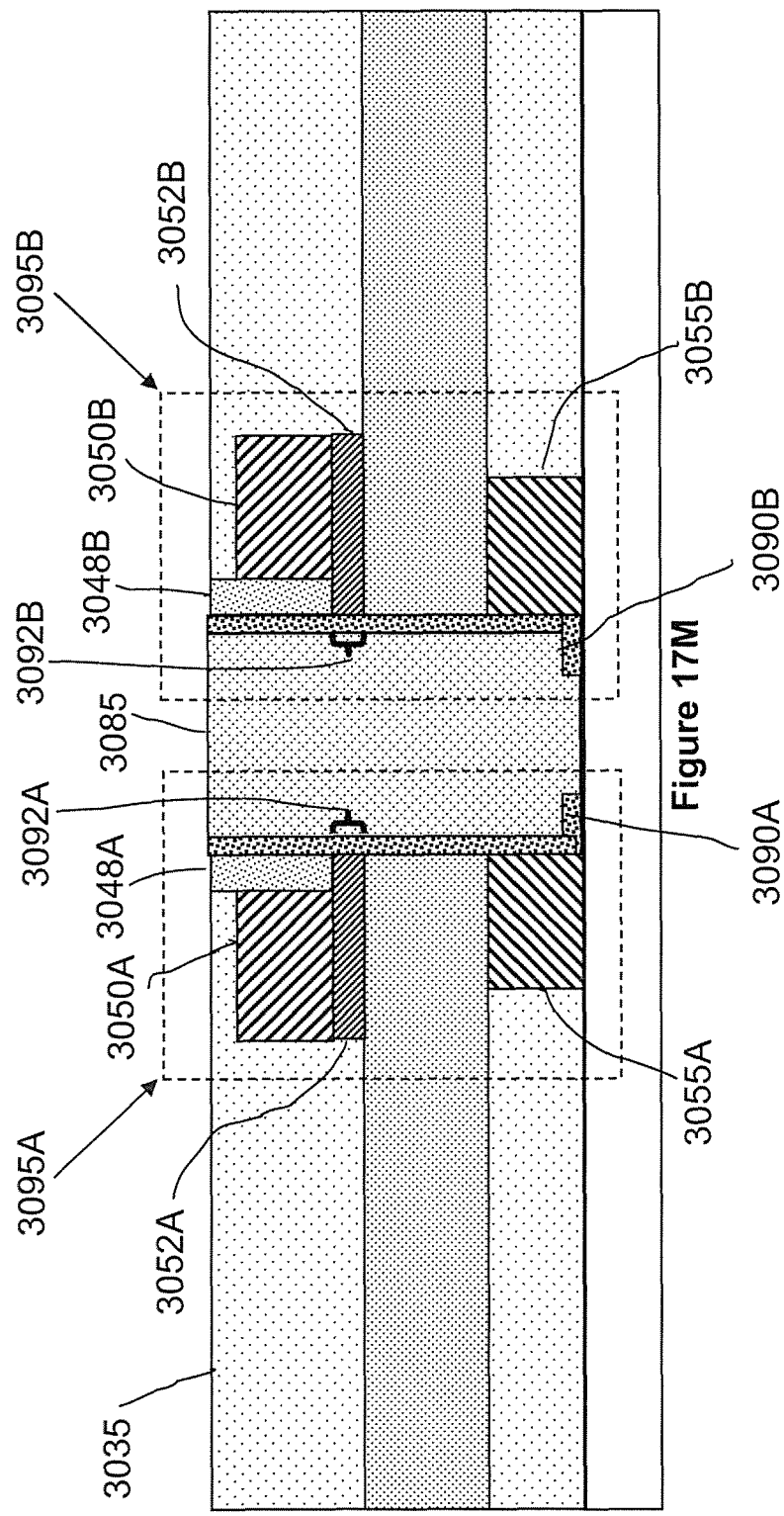

Next, preferred methods remove (etch) insulator 3080 and expose horizontal top portions of nanofabric segments 3065A and 3065B. Then, preferred methods remove these horizontal top portions using ashing, for example, or other appropriate technique as described in the incorporated patent references, to form nanotube elements 3090A and 3090B. The resulting structure with vertically oriented nanotube elements 3090A and 3090B is illustrated in FIG. 17M. The assembly illustrated in FIG. 17M can be considered a final structure.

Switches 3095A and 3095B are a mirror image pair as illustrated in FIG. 17M. Switch 3095A includes nanotube element 3090A, which overlaps the full height of conductive element 3055A forming a near-ohmic contact. Nanotube element 3090A overlaps the full height of the sidewall of conductor 3052A. The height of conductor 3052A defines controlled overlap length 3092A, which may range in length for example from 1 to 150 nm, for example. Switch 3095B includes nanotube element 3090B, which overlaps the full height of conductive element 3055B forming a near-ohmic contact. Nanotube element 3090B overlaps the full height of the sidewall of conductor 3052B. The height of conductor 3052B defines controlled overlap length 3092B, which may range in length from 1 to 150 nm, for example. Though the geometry of this embodiment differs in many ways from that shown in FIG. 1B, lengths 3092A and 3092B correspond to controlled overlap length 40' illustrated in FIG. 1B.

Example Fabrication Procedure

An initial structure consists of a 4" Si wafer with a layer of 30 nm of thermal SiO2. A set of gold alignment marks is patterned on the wafer to define an array of 60 die measuring 7 mm square. The wafer is pre-treated with an oxygen plasma for 2 min using an $O_2$ asher. 3 ml of aqueous nanotube solution containing a majority of MWNTs (greater than 50%) and SWNTs, (and bundles thereof), is dispensed onto the oxide layer of a Si wafer. A fabric of nanotubes is applied via a spin coating process which is more fully described in incorporated references. The wafer is baked on a hotplate at 150 C after the nanotube spin coat, and the sheet resistance of the resulting nanofabric is measured by 4-point probe. This nanotube deposition procedure is repeated until the sheet resistance of the nanofabric is below a specified value of about 1-2 k$\Omega$). The wafer is baked on a hotplate at 150 C between and after the nanotube spin coats.

400 nm of PMMA resist is spun over the nanofabric and baked on a hotplate at 18° C. for 5 min. An area of the resist is exposed using electron beam lithography (EBL) and developed in a solution of MIBK:IPA. This opens a window of controlled length over the nanofabric that will become an overlap region of controlled length between the nanofabric and a conductive element. A bi-layer of e-beam evaporated germanium on alumina (100 nm/10 nm respectively) is deposited and lifted off. The lift off is done in NMP at 70 C. This hardmask pattern is transferred to the nanofabric using plasma reactive ion etching (RIE) such that the nanofabric is removed everywhere except for this active region. This defines a nanotube article.

The NT hardmask is stripped (using 10:1 DI:peroxide at room temperature for 5 min) to remove the Ge and a solution of TMAH (Microposit 321 developer, room temperature for 10 min) to strip the alumina. PMMA resist is deposited again. Patterns for conductive elements are written in the resist using EBL and are developed as before. 100 nm of Pd metal is deposited using e-beam evaporation. (2 nm of Ti is used for adhesion between the Pd and the oxide.) Liftoff is done in NMP at 70 C. Shipley 1805 photoresist is spun onto the wafer. A contact aligner is used to pattern larger metal contacts comprising pads and traces that connect to the conductive elements. Photoresist is developed in Microposit 321 developer. 200 nm Au is deposited (having 2 nm of Ti for adhesion of the Au to the oxide). Liftoff is done in NMP at 70 C.

10 die were electrically tested, and device yield was measured for devices with overlap regions of varying length between the nanotube element and a conductive element, ranging from no overlap to 500 nm overlap. Each device contains two conductive elements (or terminals). This testing was done at wafer level using a probe-card and some were diced and packaged by mounting and wire-bonding to a ceramic DIN chip package. The devices were tested using a DC source-meter and by using arbitrary function generators/pulse-pattern generators. To read the state of the device, a 1 volt pulse was applied and the corresponding current flow was measured. High or infinite resistance corresponds to the "open" state and relatively low resistance corresponds to the "closed" state.

Typically, "open" states exhibited a resistance across the two conductive elements on the order of a G$\Omega$, while "closed" states exhibited a resistance on the order of 10 k$\Omega$ to several M$\Omega$. The states were switched between the two states with voltage pulses. The desired state of the device can be set by imposing a current limit during the PROGRAM pulse (which switches the device to low-resistance state), or by imposing no current restriction during the ERASE pulse (which switches the device to a high-resistance state.) The current limit (compliance) of the PROGRAM pulse is set to 800 nA while the amplitude of this pulse is set to 5V. The ERASE pulse amplitude is set to 8V. The PROGRAM and ERASE pulse widths were set to 6 ms and 1 us respectively. The resistance of the devices during their "open" and "closed" states were recorded through hundreds of iterations of switching the device between the "open" and "closed" states. Device errors are defined as "closed" states having a resistance greater than 10 M$\Omega$, and "open" states having a resistance greater than 10 M$\Omega$. Typical percentage of error for devices having less than 100 nm NT-metal overlap was found to be less than 5%.

Testing As-Fabricated Two Terminal Nanotube Switches

Figure 18:
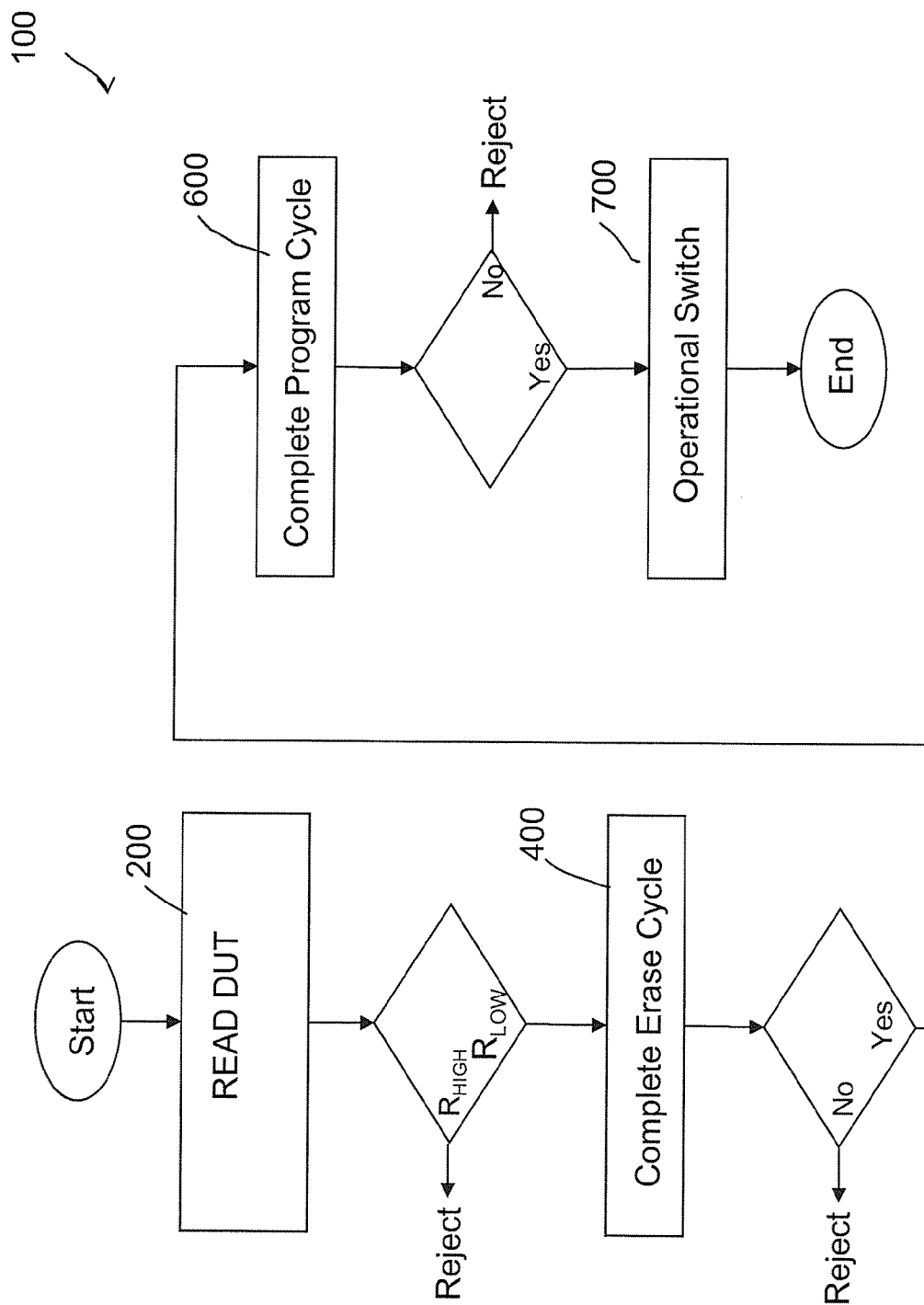
FIG. 18 is a flow chart illustrating switch operability verification using read, erase, and programming cycles according to certain embodiments of the invention.

FIG. 18 is a flow chart illustrating steps in an embodiment of an initial device operability test 100. Test 100 assesses the operation of as-fabricated 2-TNS devices, such as the embodiments illustrated herein. First the device-under-test (DUT), a 2-TNS, receives READ operation (step 200) in order to measure the state of the as-fabricated DUT. READ operation (step 200) is typically performed by applying a voltage of 1 to 3 volts, for example, across two appropriate conductive elements of the DUT, see, e.g., conductive elements 15 and 20 in FIG. 1A. The current flow through the two conductive elements and a nanotube element, see, e.g., nanotube element 25 in FIG. 1A, is measured. In some embodiments, this current is typically in the range between 100 nA and 100 uA. From this information, the resistance between the first and second conductive elements of the device can be determined. This in turn allows the state of the device to be determined. In general, the impedance between the first and second conductive elements of the device is a function of the state of the device, and can also be determined by measuring electrical characteristics of the switch.

In general it is preferable that an as-fabricated DUT is fabricated in a state with a relatively low resistance path, $R_{LOW}$, between the first and second conductive elements. As discussed above, a relatively low resistance pathway corresponds to a "closed" or "programmed" device state where current flows relatively easily between the first and second conductive elements through a nanotube element. A relatively high resistance path, $R_{HIGH}$, corresponds to an "open" or "erased" device state where current flows relatively poorly between the first and second conductive elements through the nanotube element. In a preferred embodiment, $R_{HIGH}$ is at least ten times higher than $R_{LOW}$. In a preferred embodiment, $R_{HIGH}$ is greater than 1 MΩ. Both the $R_{HIGH}$ and $R_{LOW}$ states are nonvolatile, that is, the states remain unchanged if power is removed or lost.

If READ operation (step 200) measures a resistance $R=R_{HIGH}$, then the DUT is rejected. If READ operation (step 200) measures a resistance $R=R_{LOW}$, then the DUT is then subjected to ERASE cycle (step 400), which is described in greater detail below.

In ERASE cycle (step 400), the DUT is preferably switched from a low resistance state, with $R_{LOW}$, to a high resistance state, with $R_{HIGH}$. If the DUT is not ERASED and remains in the $R_{LOW}$ state, the DUT is rejected. If the DUT is ERASED and transitions to the $R_{HIGH}$ state, then the DUT is accepted and proceeds to PROGRAM cycle (step 600), which is described in greater detail below.

In PROGRAM cycle (step 600), the DUT is preferably switched from the $R_{HIGH}$ state to the $R_{LOW}$ state. If the DUT is not PROGRAMMED and remains in the $R_{HIGH}$ state, then the DUT is rejected. If the DUT is PROGRAMMED and transitions to the $R_{LOW}$ state, then the DUT accepted as an operational switch (step 700). In an alternate embodiment, for example in the case of a high yield process, the DUT may be assumed to be an operational switch (step 700) as-fabricated and the other steps in operational test 100 are skipped.

Figure 19:
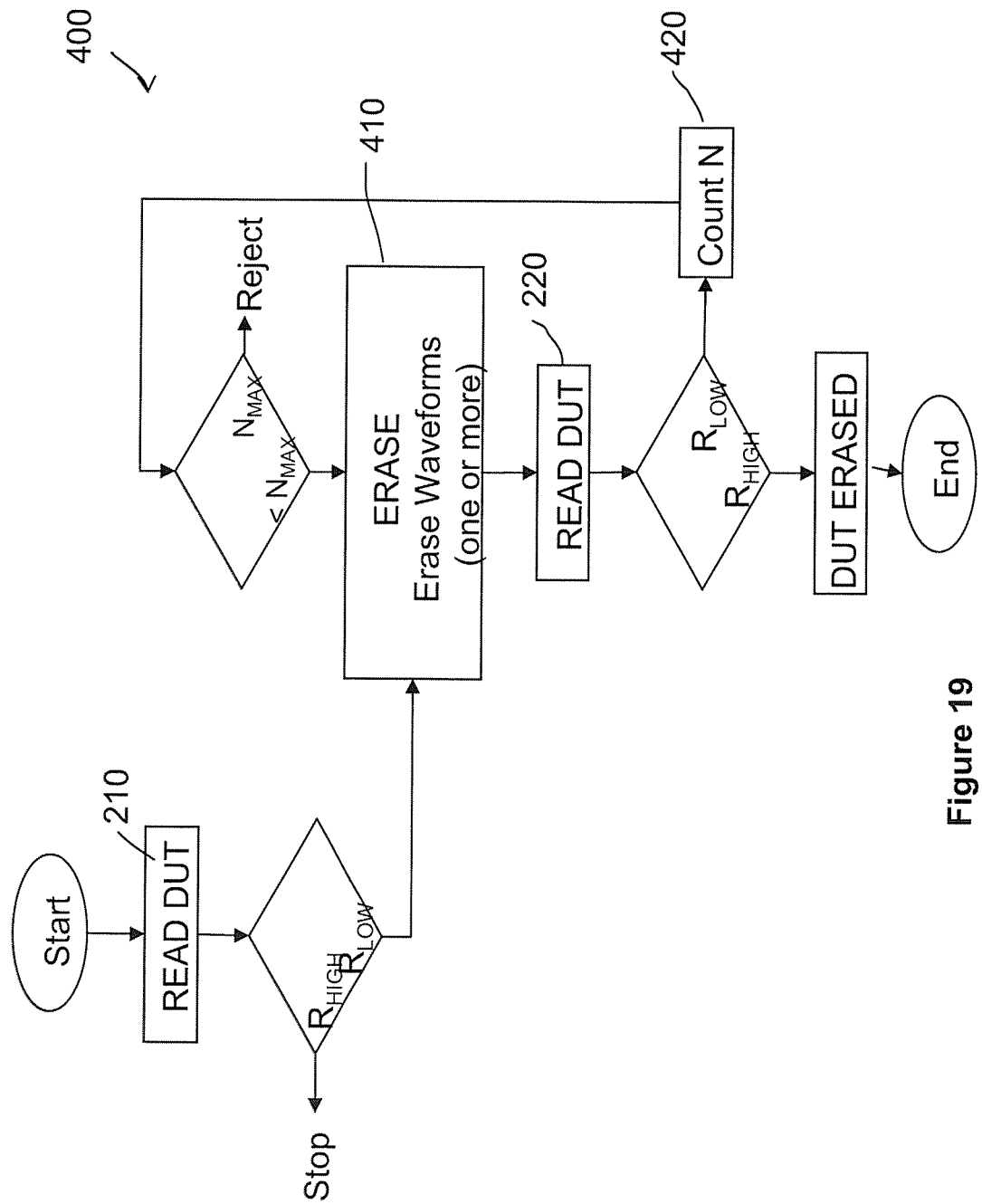
FIG. 19 is a flow chart illustrating erase cycles according to certain embodiments of the invention.

FIG. 19 is a flow chart illustrating steps of ERASE cycle (step 400). ERASE cycle (step 400) preferably switches the DUT from a relatively low resistance state to a relatively high resistance state. FIG. 5 shows corresponding ERASE Waveforms 410. ERASE cycle (step 400) begins with READ operation (step 210). If READ operation (step 210) measures a device resistance $R=R_{HIGH}$, then the device is already in a relatively high resistance state. In this case, ERASE cycle (Step 400) terminates. If READ operation (step 210) measures a device resistance $R=R_{LOW}$, then ERASE waveforms (step 410) are applied to the DUT. These waveforms preferably switch the DUT from the low resistance state to the high resistance state.

Figure 20:
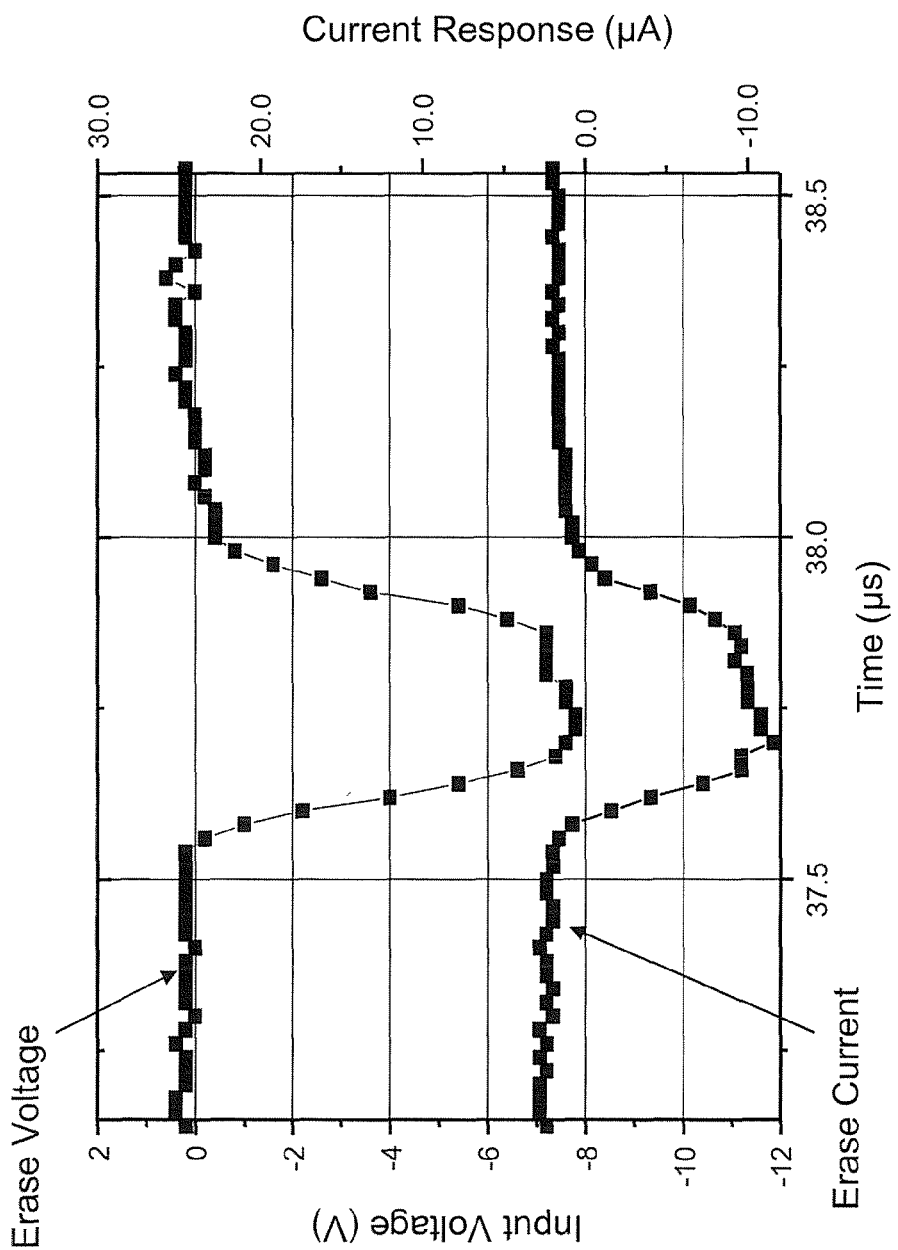
FIG. 20 is a graph illustrating current and voltage erase characteristics of devices according to certain embodiments of the invention.

A maximum voltage, of approximately 8 volts in one embodiment, as illustrated in FIG. 20, is applied between the conductive elements of the DUT. See, e.g., conductive elements 15 and 20 in FIG. 1A. This voltage causes a corresponding current flow, with a maximum current, in one embodiment, of approximately 15 uA, which indicates a successful ERASE operation. The result of the ERASE cycle (step 400) is independent of ERASE voltage polarity and/or ERASE current direction. The voltage polarity and direction of current flow in FIG. 20 may be reversed with no change to ERASE cycle (step 400).

In some embodiments, maximum ERASE voltages are in the range of 8 to 10 volts. ERASE current may vary over a relatively wide range, and generally depend on the density of nanotubes in the nanotube element and/or the controlled overlap length. For DUTs with 5 to 10 nanotubes (or electrical networks of nanotubes) spanning the distance between the conductive elements, the current may be in the range of 1 to 30 uA, or it may be significantly higher, for example. It may be difficult to know what the operational erase current will be at the onset of the erase pulse because the device reacts to this voltage at very short time scales, making knowledge of the instantaneous erase current difficult to obtain. The voltages, currents, and success of the ERASE cycle (step 400) do not vary significantly as a function of the contact metallurgy, for example, Al, W, Ti, Pd.

However, the voltages, currents, and time required for the ERASE cycle (step 400), do vary with the controlled overlap length between the nanotube element and a conductive element. See, e.g., length 40' in FIG. 1B. For waveforms 410 shown in FIG. 20, ERASE time is approximately 300 ns for an exemplary overlap size between 50-100 nm. In general, shorter controlled overlap lengths typically result in shorter ERASE times. For example, controlled overlap lengths greater than about 100 nm, for example, may result in ERASE times in the millisecond range, while lengths less than about 50 nm or less may result in ERASE times in the nanosecond range. A correlation exists such that longer overlaps typically require greater erase voltage amplitudes.

Waveforms 410 in FIG. 20 illustrate a DUT that is ERASED using a single ERASE pulse. However, in many nonvolatile applications, multiple ERASE pulses may be used to successfully ERASE the DUT. Counter (step 420) in FIG. 19 is used to count the number of ERASE cycles applied to a DUT. If the number of cycles reaches a maximum defined number of cycles, $N_{MAX}$, then the DUT is rejected. The maximum allowed value of $N_{MAX}$ depends on the application requirements, process details, and particular embodiment, however, $N_{MAX}$ is not expected to exceed 10 to 12 cycles.

Figure 21:
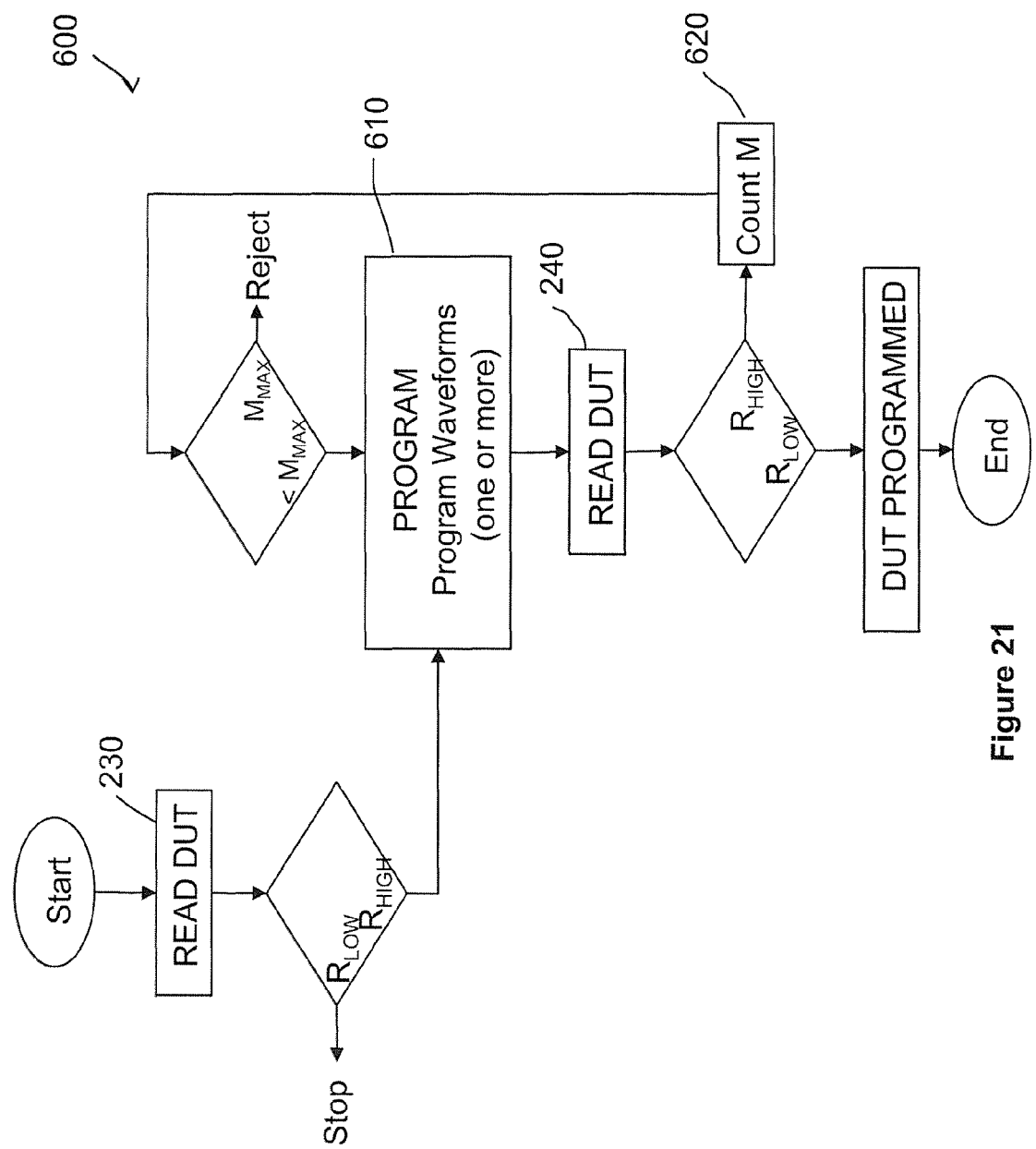
FIG. 21 is a flow chart illustrating programming cycles according to certain embodiments of the invention.
Figure 22A:
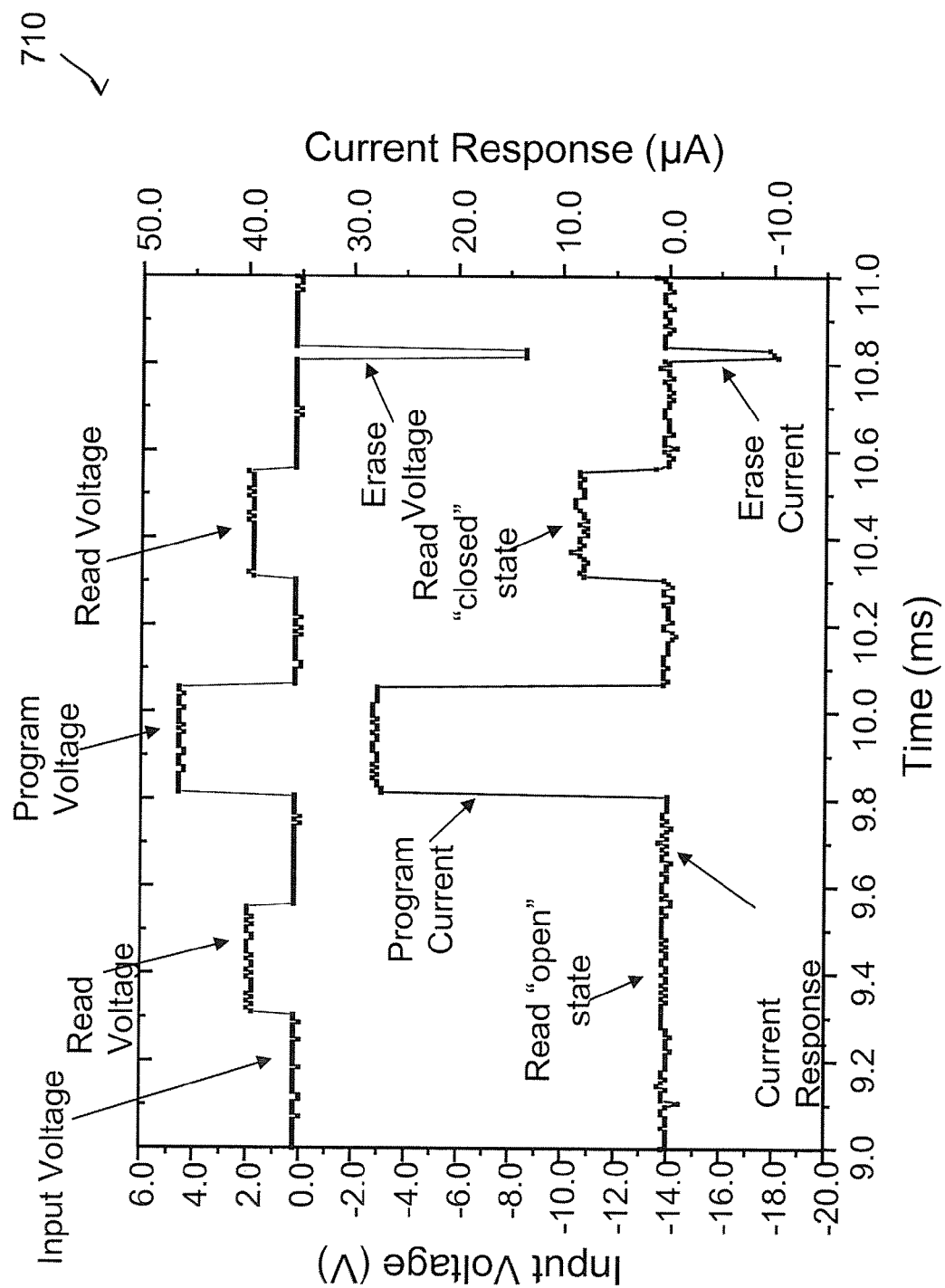
FIGS. 22A and 22B are graphs illustrating read, erase, and program current and voltage characteristics and resistance characteristics, respectively, of devices according to certain embodiments of the invention.

FIG. 21 is a flow chart illustrating steps of PROGRAM cycle (step 600). PROGRAM cycle (step 600) preferably switches the DUT from a relatively high resistance state to a relatively low resistance state. FIG. 22A shows corresponding PROGRAM Waveforms 710. PROGRAM cycle (step 600) begins with READ operation (step 230). If READ operation (step 230) measures a device resistance $R=R_{LOW}$, then the device is already in a low resistance state. In this case, PROGRAM cycle (step 600) terminates. If READ operation (step 230) measures a device resistance $R=R_{HIGH}$, then PROGRAM waveforms (step 610) are applied to the DUT. These waveforms preferably switch the DUT from the high resistance state to the low resistance state.

A maximum voltage, of approximately 5 volts in one embodiment, as illustrated in FIG. 22A, is applied between the conductive elements of the DUT. See, e.g., conductive elements 15 and 20 of FIG. 1A. This voltage causes a corresponding current flow during PROGRAMMING, with a maximum current, in one embodiment, of approximately 30 uA. This indicates a successful PROGRAM operation. The result of PROGRAM cycle (step 600) is independent of PROGRAM voltage polarity and/or PROGRAM current direction. The voltage polarity and direction of current flow in FIG. 22A may be reversed with no change to PROGRAM cycle 600.

In some embodiments, PROGRAM voltages are preferably in the range of 3 to 5 volts. For DUTs with 5 to 20 nanotubes (or electrical networks of nanotubes) spanning the distance between the conductive elements, the current may be in the range of 1 to 60 uA, for example. It may be difficult to know what the operational erase current will be at the onset of the erase pulse because the device reacts to this voltage at very short time scales, making knowledge of the instantaneous erase current difficult to obtain. The voltages, currents, and success of the PROGRAM cycle (step 600) do not vary significantly as a function of the contact metallurgy, for example, Al, W, Ti, Pd.

The timing of the PROGRAM cycle (step 600) does not vary significantly with the controlled overlap length between the nanotube element and a conductive element. See, e.g., length 40' in FIG. 1B.

Success of the PROGRAM cycle can be confirmed with a READ operation (step 240). A current flow of approximately 7.5 uA, in one embodiment, corresponds to the relatively low resistance state. Current in the off state during a read operation may be in the pA range.

Waveforms 710 in FIG. 22A illustrate a DUT that is PROGRAMMED using a single PROGRAM pulse. However, in many nonvolatile applications, multiple PROGRAM pulses may be used to successfully PROGRAM the DUT. Counter (step 620) in FIG. 21 is used to count the number of PROGRAM cycles applied to a DUT. If the number of cycles reaches a maximum defined number of cycles, $M_{MAX}$, then the DUT is rejected. The maximum allowed value of $M_{MAX}$ depends on the application requirements, process details, and particular embodiment, however, $M_{MAX}$ is not expected to exceed 10 to 12 cycles.

Figure 22B:
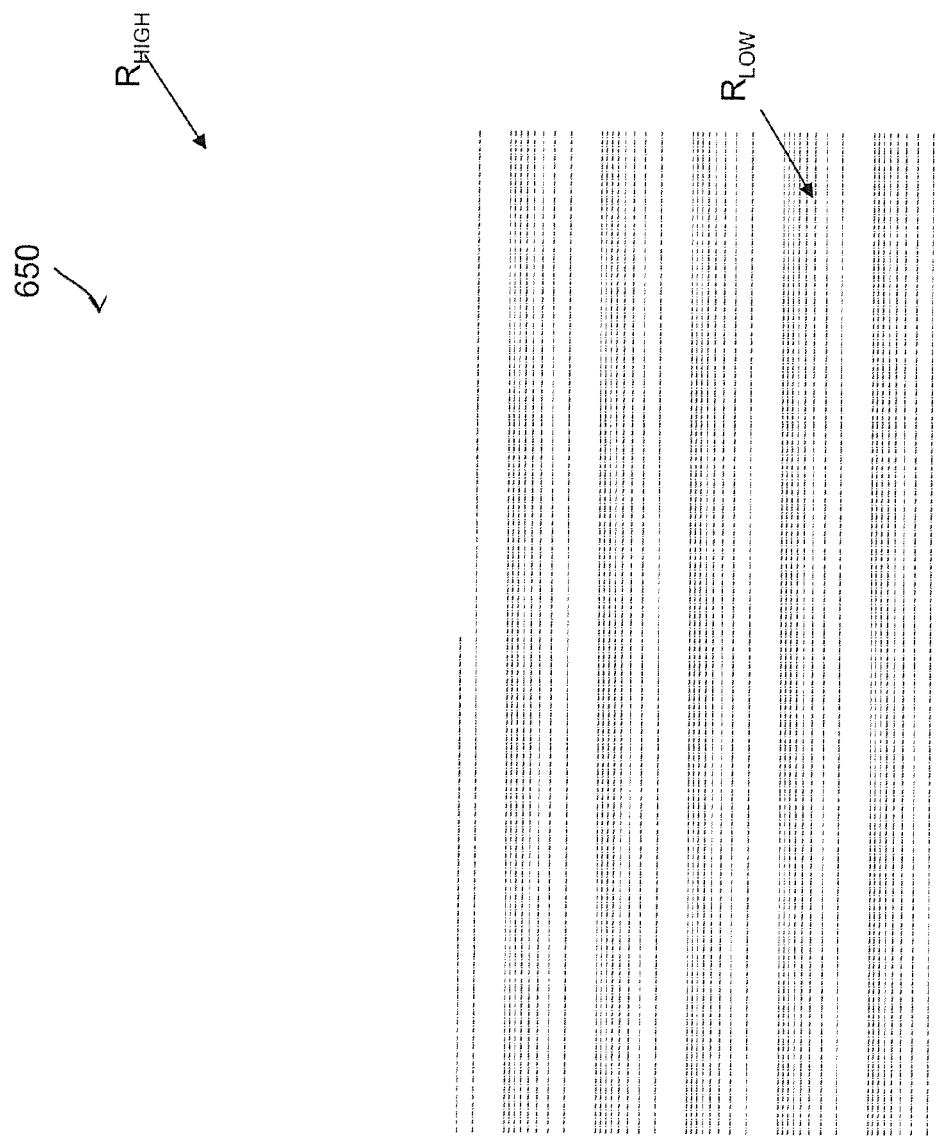

The maximum number of cycles between high resistance "open" states and low resistance "closed" states that a DUT can tolerate before failing is an important parameter. The waveforms 710 of FIG. 22A illustrate voltages and currents for a DUT that is subjected to the following steps: READ, PROGRAM, READ, ERASE. FIG. 22B shows resistance values 650 for DUT repeatedly cycled with these steps for approximately 50 million operations before failing. FIG. 22B shows $R_{LOW}$ values in the range of approximately 10 kΩ to 40 kΩ, and $R_{HIGH}$ values exceeding 10 GΩ. The scatter in the values reflects the resolution of the measurement equipment. The ratio between the values of $R_{HIGH}$ and $R_{LOW}$ ratio exceeds five orders of magnitude, making the corresponding states easy to detect electronically.

In general, 2-TNS having two easily detectable states can be used as non-volatile random access memory (NRAM) devices. The two states can be used as informational states of a device.

Structures for NRAM Memory Arrays Using Cells Having One Transistor and One Two-Terminal Nanotube Switch, and Methods of Making Same Two-terminal nanotube switches can be used to produce nonvolatile random access memory (NRAM) arrays that have many desirable features over memory arrays in the prior art, as discussed in more detail in U.S. patent application Ser. No. (TBA), entitled "Memory Arrays Using Nanotube Articles With Reprogrammable Resistance," filed on an even date herewith and having a common assignee as the present invention. For example, memory devices containing arrays of 2-TNS can achieve a memory density at least as dense as memory cells in current generation technology, offer a non-destructive read out (NDRO) operation, nonvolatile data retention when power is lost or removed, and fast random access times.

As described in more detail in U.S. patent application Ser. No. (TBA), entitled "Non-Volatile Shadow Latch Using A Nanotube Switch," filed on an even date herewith and having a common assignee as the present invention, minimization of NRAM cell area is desirable because NRAM arrays composed of multiple cells use less silicon area, have higher performance, and dissipate less power. Memory performance is increased and power dissipation is decreased because shorter array lines have less capacitive loading. Also, less NRAM array area results in smaller chip size for the NRAM function, resulting in more chips per wafer and corresponding lower memory costs. Cell area may be calculated in terms of minimum feature size F as is well known in the industry. In general, for some embodiments of NRAM cells using two-terminal nanotube switches with one select transistor, the cell densities may be similar to those for DRAM cells such as stacked capacitor DRAM cells. Here a cell area size of about $8F^2$ may be expected, where F is the minimum feature size for a given technology. For other embodiments which include two-terminal nanotube switched that are integrated above a select transistor, the density depends in part on the number of two-terminal switches that can be stacked. Here a cell area size of about 4 to $6F^2$ may be expected, and cell densities similar to those of Flash cells may be accomplished, which are more dense than DRAM cells.

For fabricating preferred embodiments of the invention, preferred methods include one or more of the methods described above for fabricating 2-TNS. While the described methods use 2-TNS that utilize a controlled overlap between a nanotube element and a conductive element in order to thermally engineer the switches, any method can be used to thermally engineer the switches.

In general, though it is not illustrated, it should be understood that elements in the described embodiments are in electrical communication with a memory operation circuit which is similar to the stimulus circuit described above. In the described NRAM arrays, the memory operation circuit is in electrical communication with a bit line, a word line, and a program/erase/read line, which allows the circuit to select one or more cells in the array and to change and/or determine the state of the cells in a similar manner as described above for the stimulus circuit.

Figure 23A:
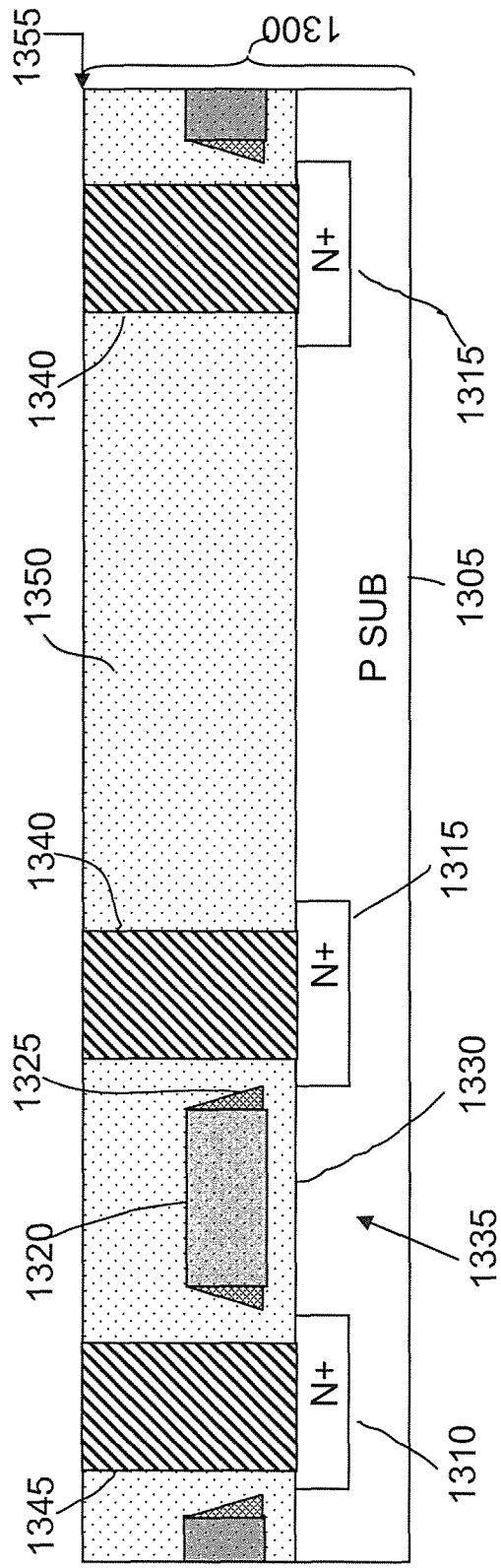
FIGS. 23A-E, 24A-E and 25A-E illustrate cross-sectional views of structures created during fabrication steps according to certain embodiments of the invention.

One method of producing an NRAM array is illustrated in FIGS. 23A-23E. FIG. 23A illustrates initial structure 1300 with planarized top surface 1355. Cell select transistor 1335 includes source 1315, drain 1310, and channel region 1330 formed in silicon substrate 1305. Gate 1320, fabricated with sidewall spacers 1325 and part of an array word line illustrated further below in an array plan view, controls channel region 13300N and OFF states using well known MOSFET device operating methods. Stud 1340 embedded in dielectric 1350 provides a conductive path from source 1315 to planarized surface 1355 of initial structure 1300. Stud 1345 embedded in dielectric 1350 provides a conductive path from drain 1310 to planarized surface 1355 of initial structure 1300.

Figure 23B:
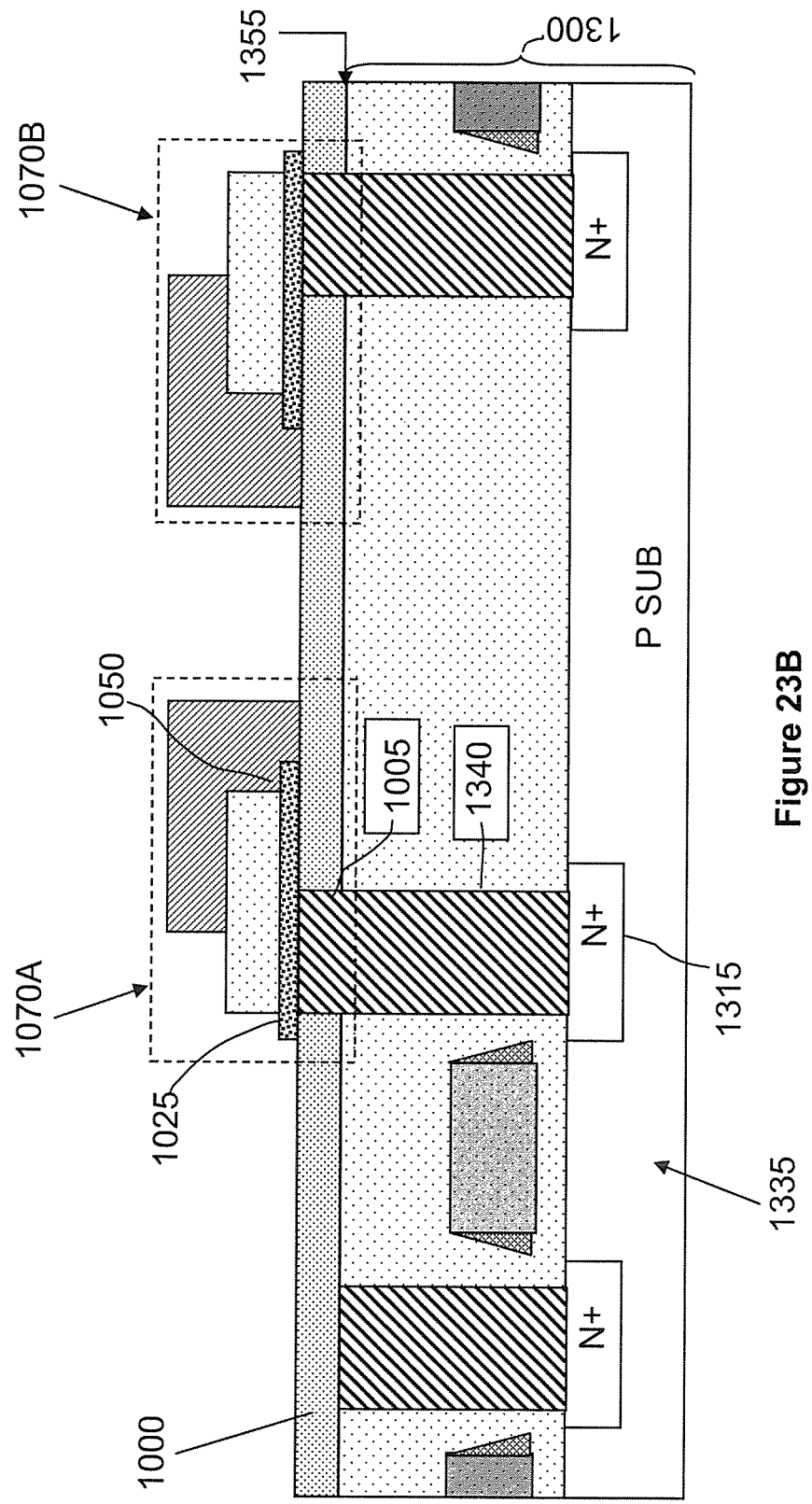

Next, preferred methods described further above form intermediate structures 1070A and 1070B, which are 2-TNS devices in electrical communication with underlying transistors, as illustrated in FIG. 23B. Structure 1070A corresponds to nonvolatile two terminal switch 1070 shown in FIG. 8F. Structure 1070B is a mirror image of structure 1070A with corresponding wiring and interconnections. Conductive element 1005 of 2-TNS 1070A, for example, overlaps and is in near-ohmic contact with nanotube element 1025 and stud 1340. This forms a conductive path between nanotube element 1025 and source 1315 of transistor 1335, enabling ERASE, PROGRAM, and/or READ operations in 2-TNS 1070A. 2-TNS 1070B is connected in a similar way to the source of a transistor below the surface 1355 of structure 1300.

Figure 23C:
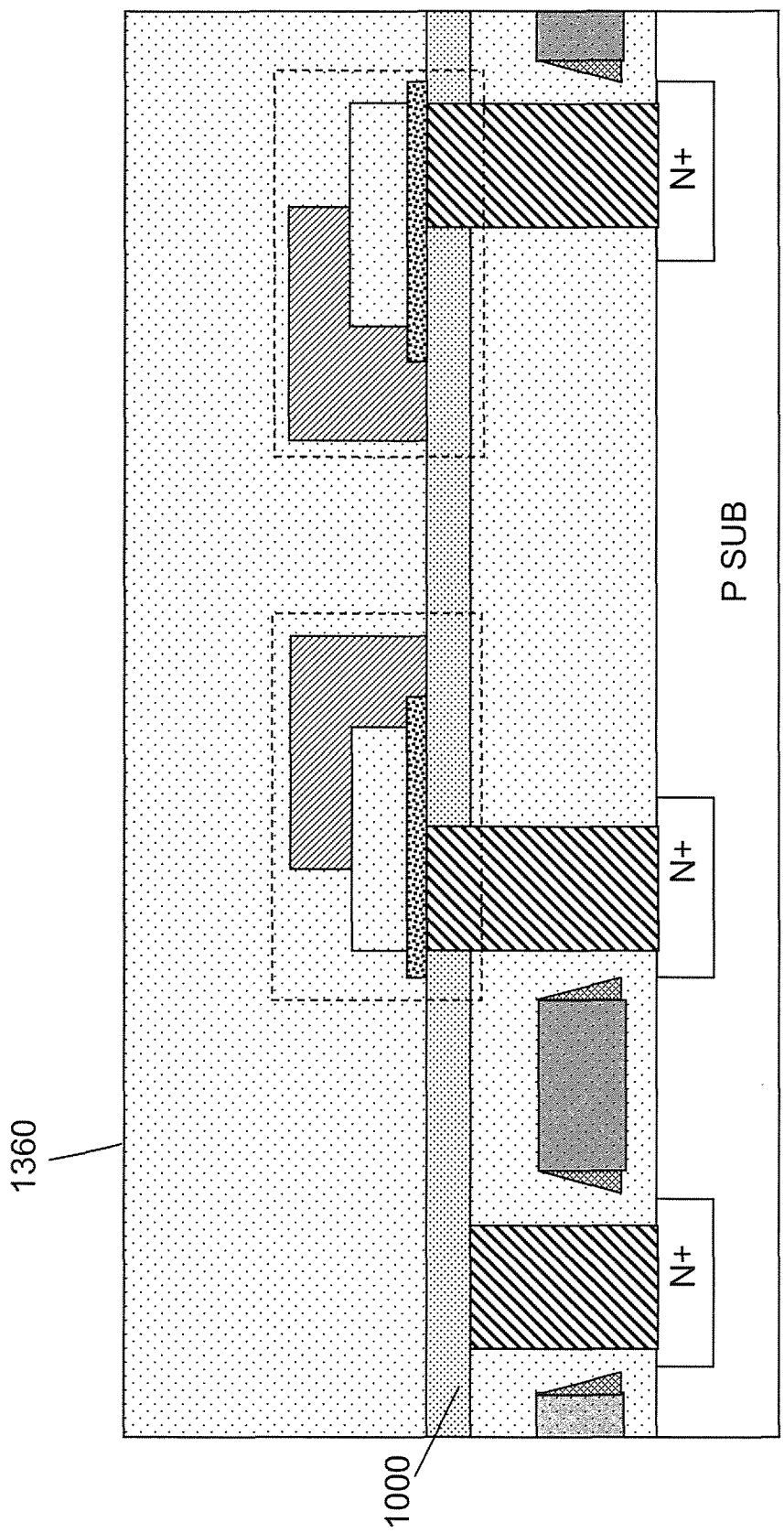

Next, preferred methods deposit and planarize insulator 1360 as illustrated in FIG. 23C. Insulator 1360 may be TEOS, for example, or another insulator deposited and planarized using well known semiconductor fabrication methods.

Figure 23D:
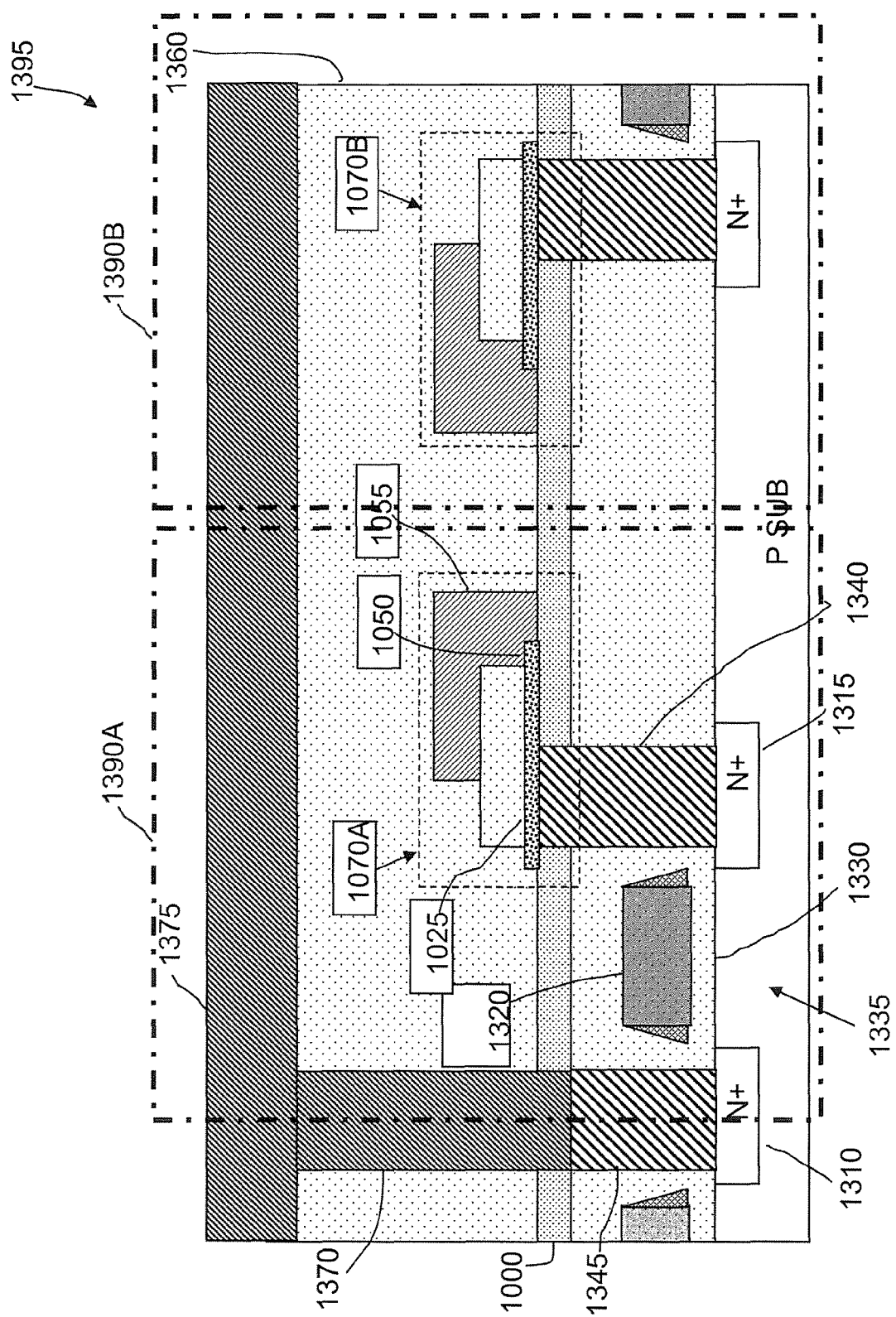

Next, preferred methods etch a via hole in insulator 1360 and insulator 1000 using well known semiconductor fabrication methods, exposing the top surface of stud 1345 as illustrated in cross section 1395 of FIG. 23D.

Figure 23E:
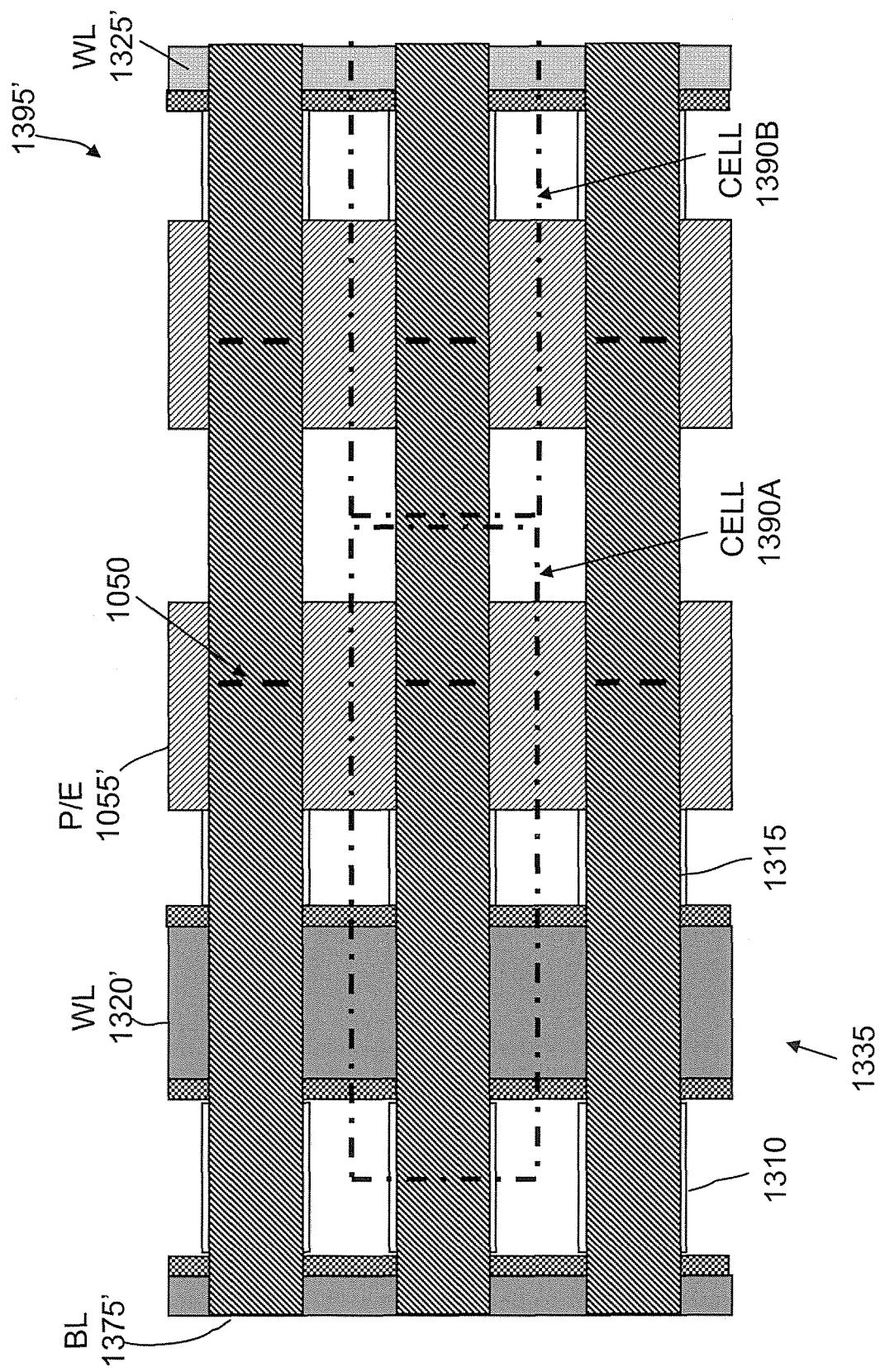

Then, preferred methods deposit and pattern a conducting layer forming conducting stud 1370 and bit line 1375 as shown in cross section 1395 FIG. 23D and bit line 1375' as shown in corresponding plan view 1395' in FIG. 23E. A conducting path is formed between bit line 1375 (1375') and drain 1310 through studs 1370 and 1345. If transistor 1335 is in the OFF state, then channel region 1330 is not formed, and bit line 1375 (1375') is electrically isolated from nanotube element 1025. If, however, transistor 1335 is in the ON state, then a conductive channel is formed, which connects drain 1310 and source 1315. This forms a conductive path between bit line 1375 (1375') and nanotube element 1025 through studs 1370 and 1345, drain 1310, channel 1330, source 1315, stud 1340, and conductive element 1005.

FIGS. 23D and 23E illustrate different views of transistor 1335, which is used to select (or not select) cell 1390A using gate 1320, which is also part of word line 1320'. Other cells such as cell 1390B may be selected instead by activating other word lines, such as 1325'. Conductive element 1055' overlaps nanotube element 1025 in cell 1390A by a controlled overlap length 1050, preferably 1-150 nm, and at the same time overlaps other nanotube elements in other storage cells by approximately the same controlled overlap length 1050. Thus conductive element 1055' interconnects a plurality of cells, and the element is used during ERASE, PROGRAM, and/or READ operations explained in detail above. Nonvolatile storage cells 1390A and 1390B containing one select transistor and one nonvolatile two terminal switch layouts are mirror images of each other. Additional preferred methods of completing fabrication and passivation of the NRAM function (not shown) use well known semiconductor fabrication techniques.

Memory cells 1390A and 1390B (FIG. 23E), corresponding to nonvolatile two terminal switch 1070 shown in FIG. 8F, are illustrated in memory array cross section 1395 and corresponding memory plan view 1395' and result in a cell area of $10F^2$.

A second method of fabrication is described and illustrated in FIG. 24 that may reduce the cell area of cells 1390A and 1390B by approximately 30% by using vertically oriented SWNT fabric switches 1295A and 1295B illustrated in FIG. 15N to enable closer source-to-source spacing between adjacent cells as described further below.

Figure 24A:
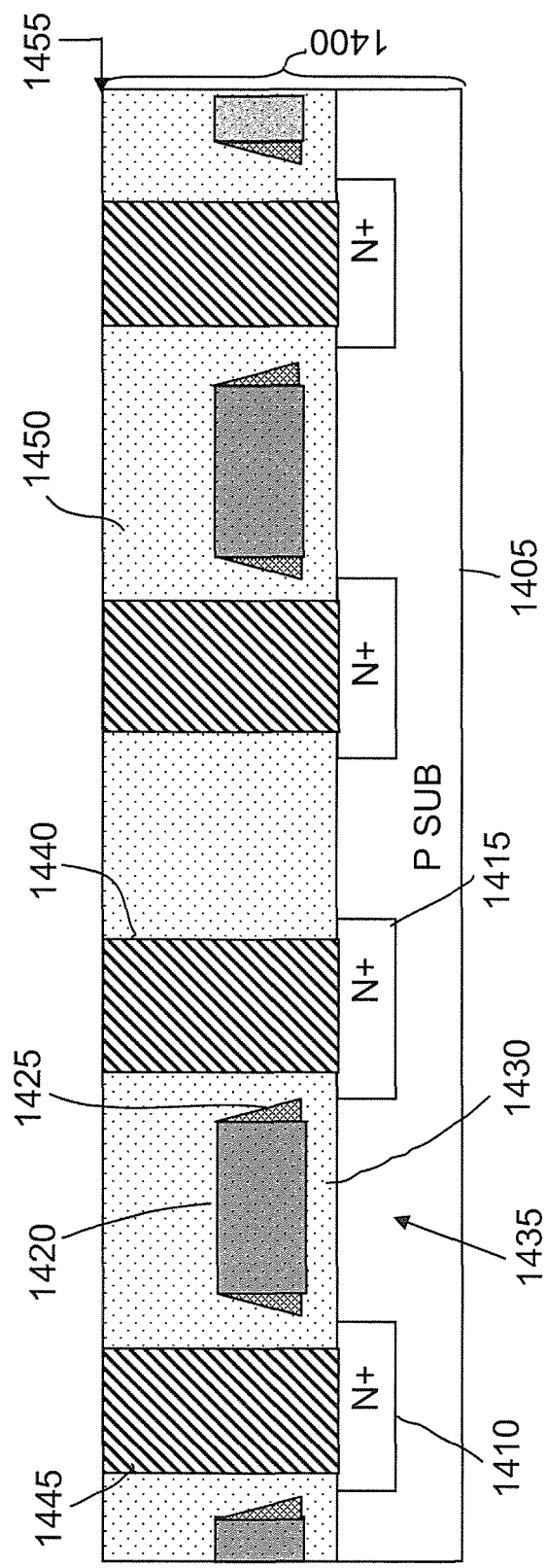

FIG. 24A illustrates initial structure 1400 with planarized top structure 1455. Structure 1400 reduces the separation between source 1415 diffusions relative to the separation of source 1315 diffusions illustrated in FIG. 23A. Closer separation of source diffusions requires a different approach to nonvolatile two terminal intermediate structure fabrication as illustrated further below. Cell select transistor 1435 includes source 1415, drain 1410, and channel region 1430 formed in silicon substrate 1405. Gate 1420, fabricated with sidewall spacers 1425 and part of an array word line illustrated further below in an array plan view, controls channel region 14300N and OFF states using well known MOSFET device operating methods. Stud 1440 embedded in dielectric 1450 provides a conductive path from source 1415 to planarized surface 1455 of partially fabricated semiconductor structure 1400. Stud 1445 embedded in dielectric 1450 provides a conductive path from drain 1410 to planarized surface 1455 of initial structure 1400.

Figure 24B:
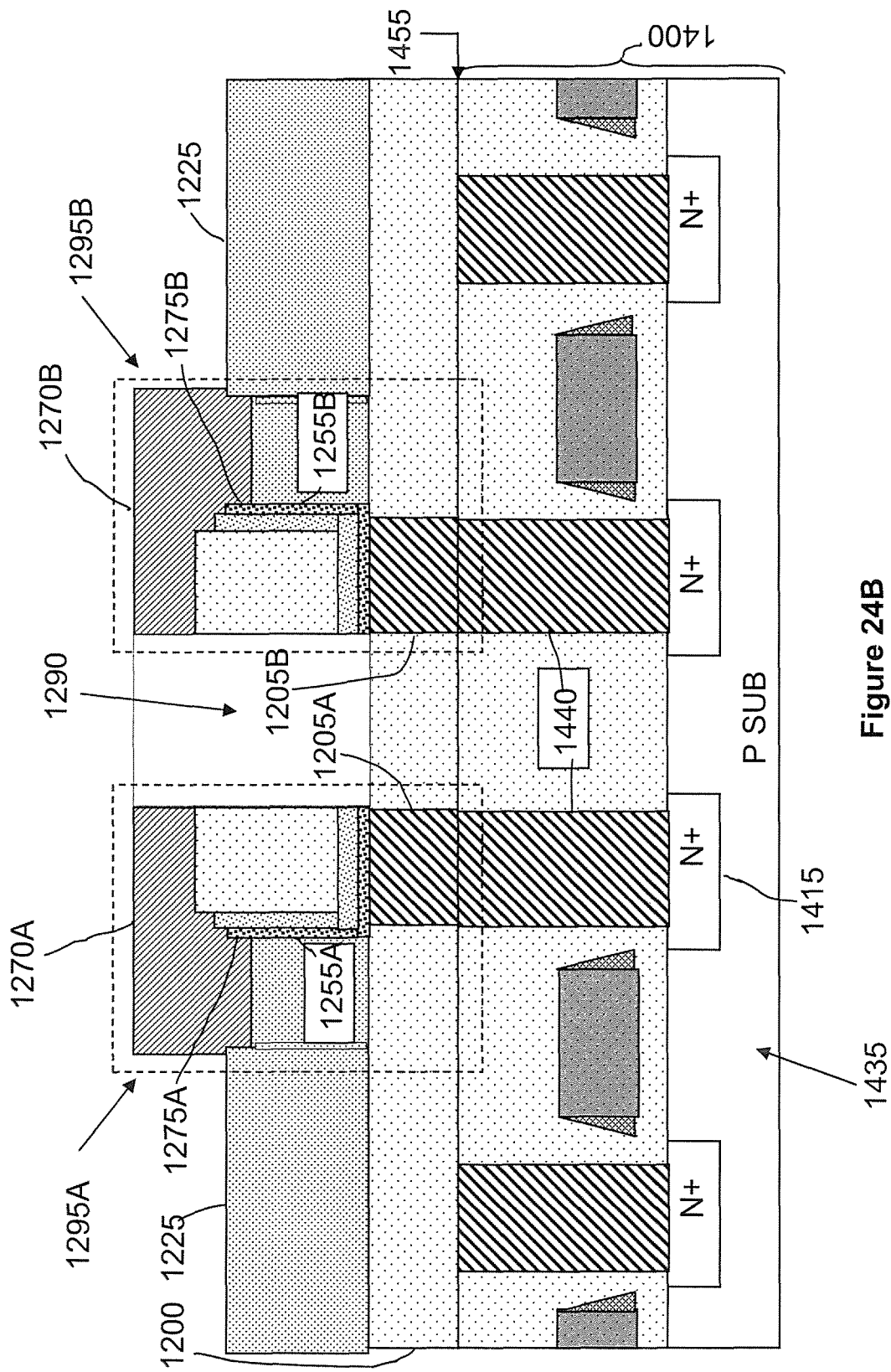

Next, preferred methods described further above form intermediate structures 1295A and 1295B of two terminal nanotube storage devices interconnected with respective underlying transistors as illustrated in FIG. 24B. The vertical orientation of intermediate structures 1295A and 1295B are used to position adjacent nonvolatile two terminal devices on the more closely spaced source diffusions 1415. Structure 1295A is the same as nonvolatile two terminal switch structure 1295A shown in FIG. 15N. Structure 1295B is the same as nonvolatile two terminal switch structure 1295B shown in FIG. 15N. Structure 1295B is the mirror image of structure 1295A with corresponding wiring and interconnections. Conductive element 1205A of 2-TNS 1295A, for example, overlaps and is in near-ohmic contact with nanotube element 1255A and stud 1440. This forms a conductive path between nanotube element 1255A and source 1415 of transistor 1435, enabling ERASE, PROGRAM, and/or READ operations in 2-TNS 1070A. 2-TNS 1270B is connected in a similar way to the source of a transistor below the surface 1455 of structure 1400.

Figure 24C:
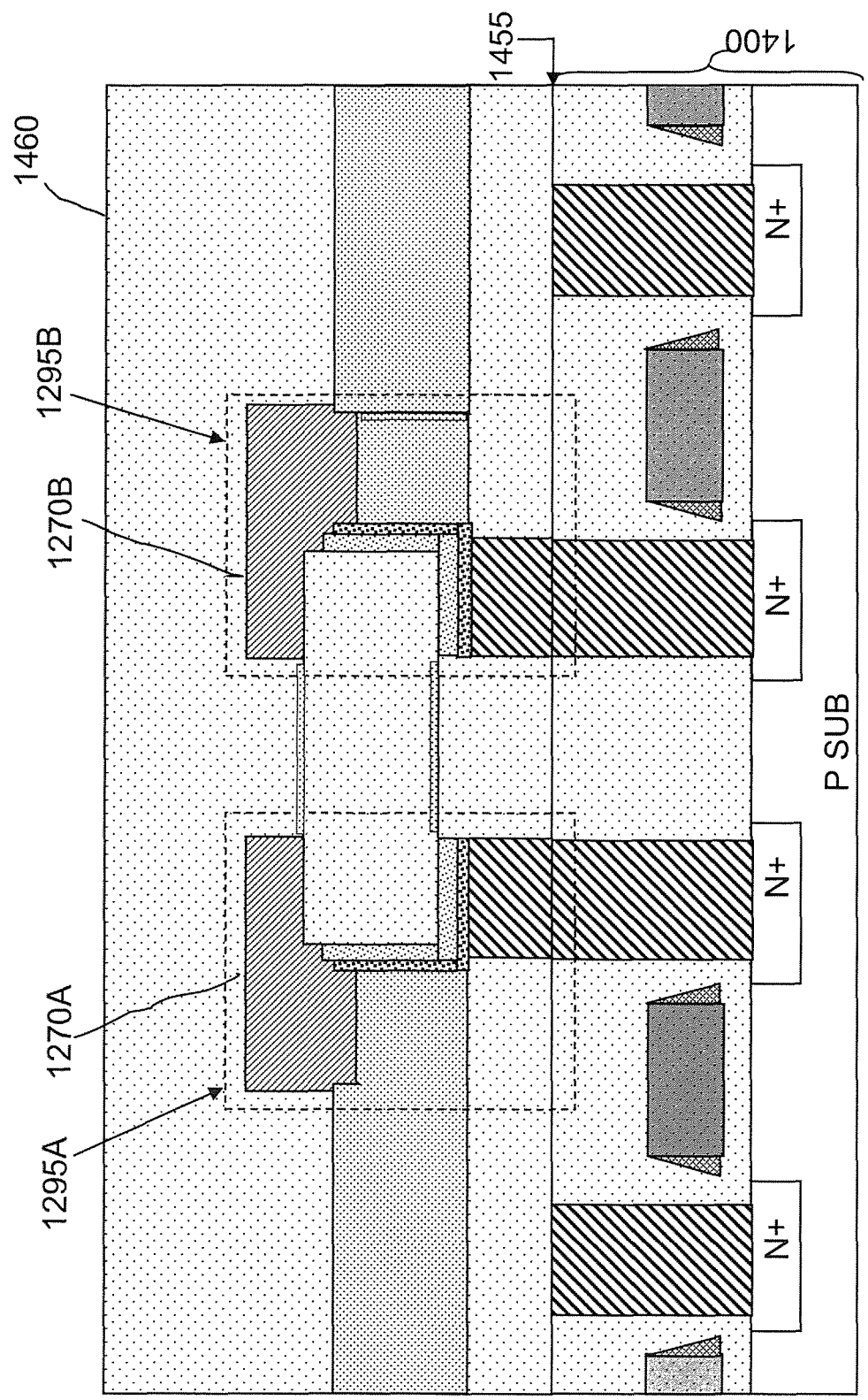

Next, preferred methods deposit and planarize insulator 1460 as illustrated in FIG. 24C. Insulator 1460 may be TEOS, for example, or another insulator deposited and planarized using well known semiconductor fabrication methods.

Figure 24D:
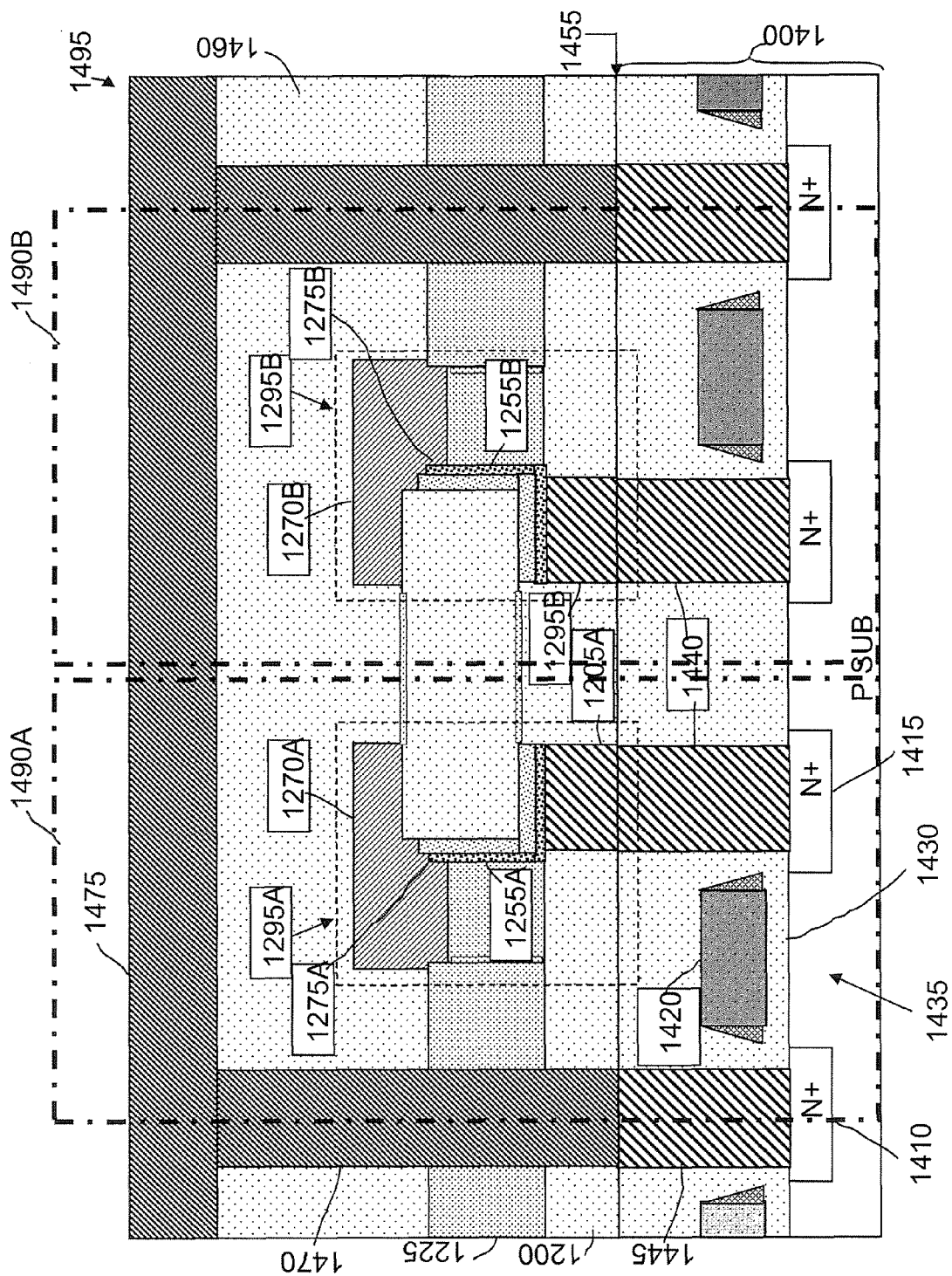

Next, preferred methods etch a via hole in insulator 1460 and insulator 1200 using well known semiconductor fabrication methods, exposing the top surface of stud 1445 as illustrated in cross section view 1495 of FIG. 24D.

Figure 24E:
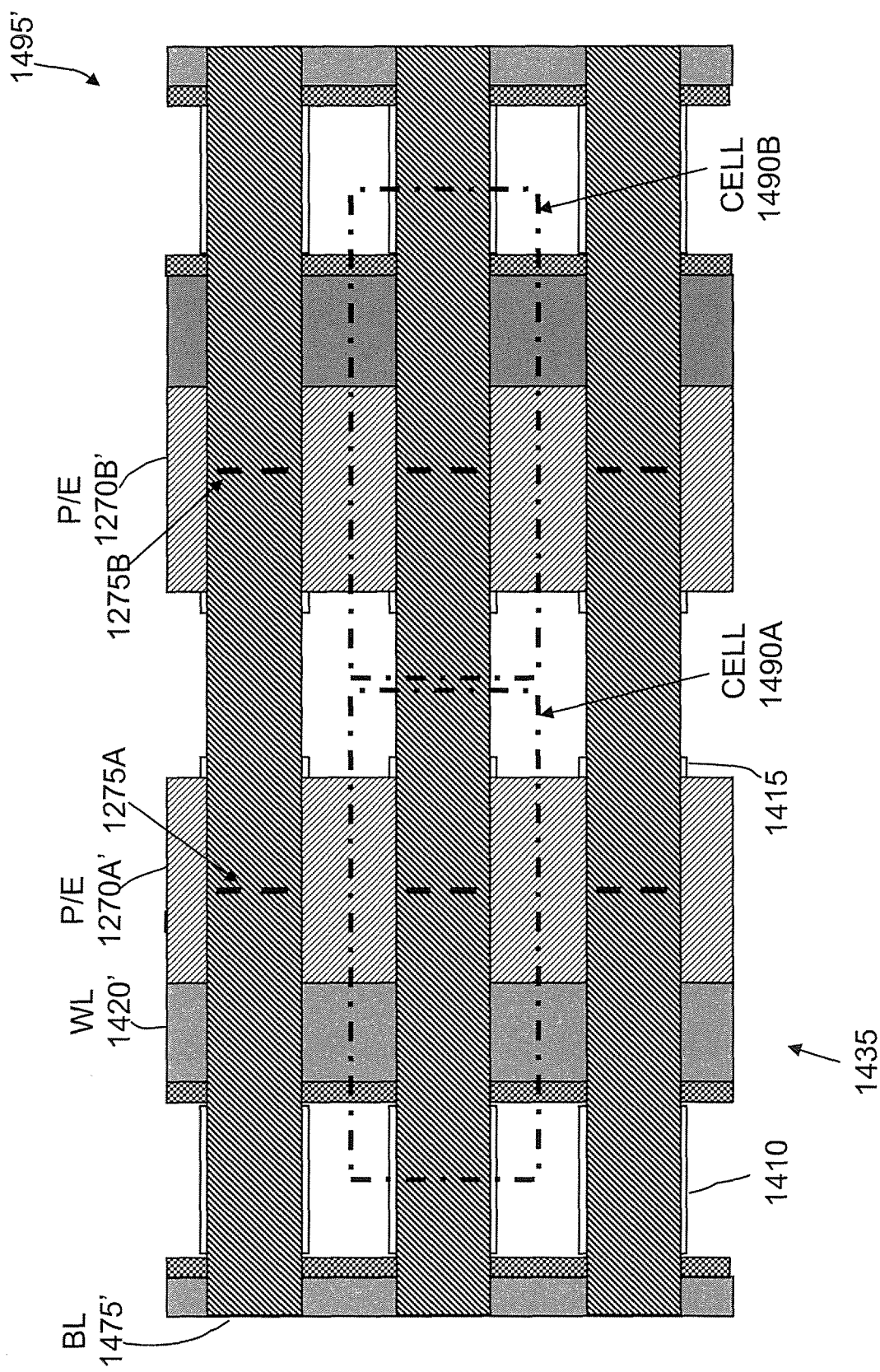

Then, preferred methods deposit and pattern a conducting layer forming conducting stud 1470 and bit line cross section 1475 as shown in FIG. 24D and bit line plan view 1475' as shown in corresponding plan view 1495' in FIG. 24E. A conducting path is formed between bit line 1475 (1475') and drain 1410 through studs 1470 and 1445. If transistor 1435 is in the OFF state, then channel region 1430 is not formed, and bit line 1475 (1475') is electrically isolated from nanotube element 1255A. If, however, transistor 1435 is in the ON state, then a conductive channel is formed in region 1430, which connects drain 1410 and source 1415. This forms a conductive path between bit line 1475 (1475') and nanotube element 1255A through studs 1470 and 1445, drain 1410, channel 1430, source 1415, stud 1440, and conductive element 1205A.

FIGS. 24D and 24E illustrate different view of transistor 1435, which is used to select (or not select) cell 1490A using gate 1420, which is also part of word line 1420'. Conductive element 1270A (1270A') overlaps nanotube element 1255A by controlled overlap length 1275A, preferably 1-150 nm, and at the same time overlaps other nanotube elements in other storage cells by approximately the same controlled overlap length. Thus conductive element 1270A interconnects a plurality of cells, and the element is used during ERASE, PROGRAM, and/or READ operations explained in detail above. Nonvolatile storage cells 1490A and 1490B containing one select transistor and one nonvolatile two terminal switch layouts are mirror images of each other. Additional preferred methods of completing fabrication and passivation of the NRAM function (not shown) use well known semiconductor fabrication techniques.

Memory cells 1490A and 1490B (FIG. 24E) have the same cell area of approximately $7F^2$, which is about 30% smaller than cells 1390A and 1390B (FIG. 23E) having a cell area of approximately $10F^2$.

Another method of fabrication is described and illustrated in FIGS. 25A-E that may reduce the cell area of cells 1390A and 1390B illustrated in FIG. 13E by approximately 30%. This can be done by interchanging cells 1070A and 1070B of FIG. 23D such that conductive elements are adjacent to studs connecting bit line and drain. This enables closer source-to-source spacing between adjacent cells as described further below. An additional insulating step is required at an upper portion of the studs contacting bit lines to prevent shorting between bit line and conductive elements due to via hole misregistration as described further below.

Figure 25A:
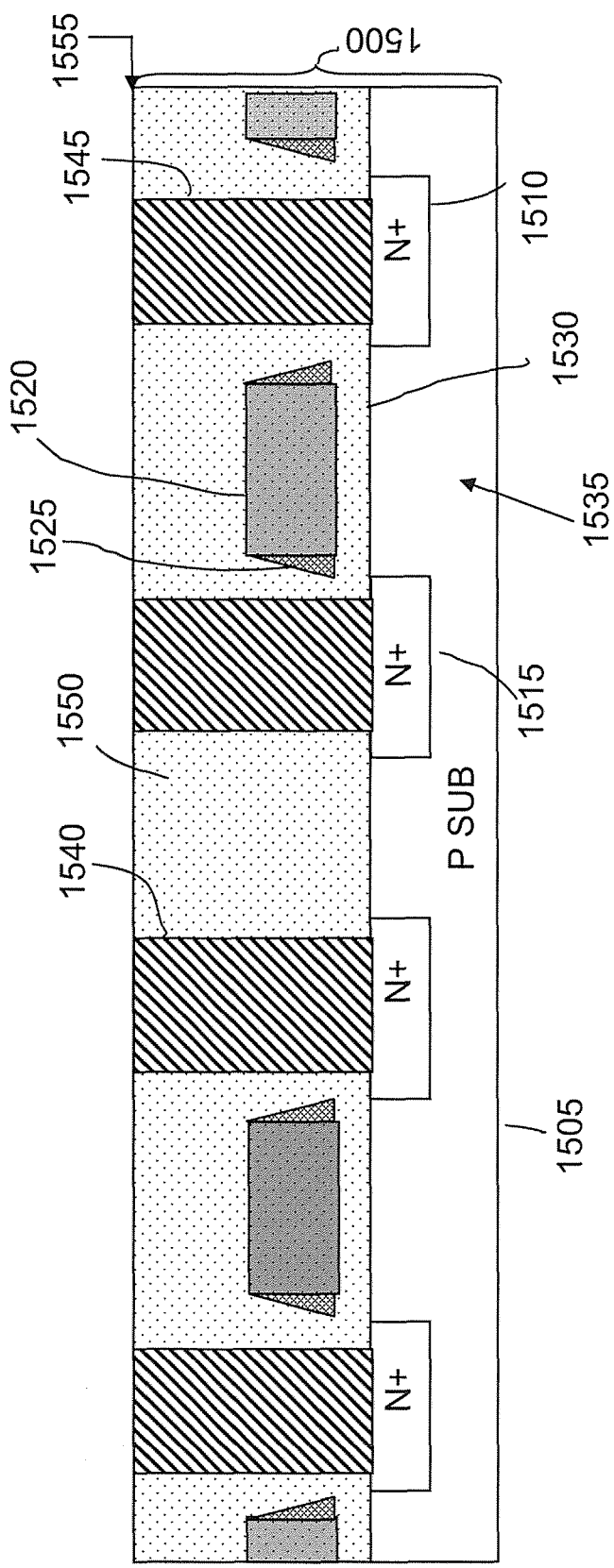

FIG. 25A illustrates initial structure 1500 with planarized top structure 1555. Cell select transistor 1535 includes source 1515, drain 1510, and channel region 1530 formed in silicon substrate 1505. Gate 1520, fabricated with sidewall spacers 1525 and part of an array word line illustrated further below in an array plan view, controls channel region 15300N and OFF states using well known MOSFET device operating methods. Stud 1540 embedded in dielectric 1550 provides a conductive path from source 1515 to planarized surface 1555 of initial structure 1500. Stud 1545 embedded in dielectric 1550 provides a conductive path from drain 1510 to planarized surface 1555 of initial structure 1500.

Figure 25B:
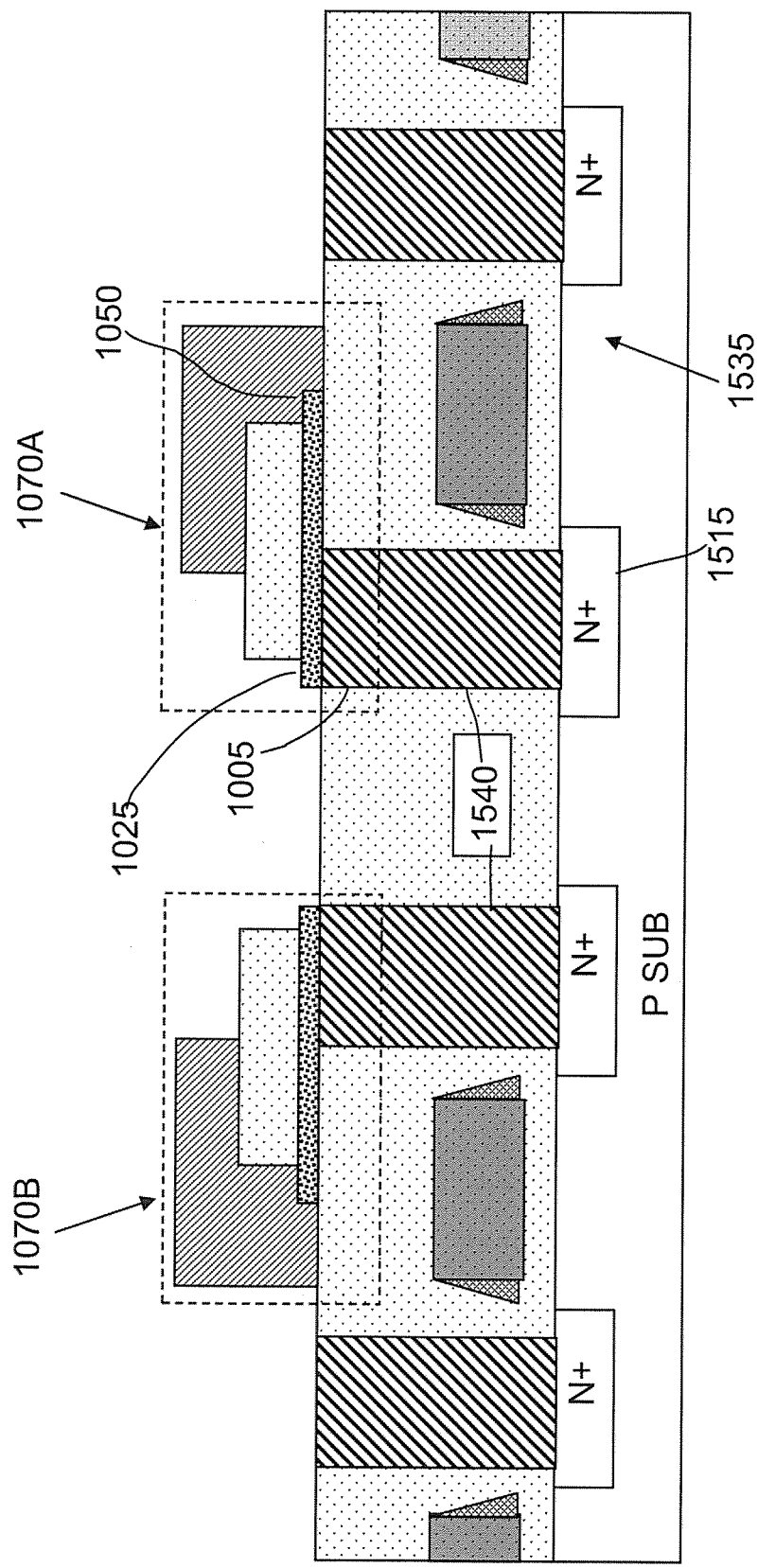

Next, preferred methods described further above form 2-TNS 1070A and 1070B which are interconnected with respective underlying transistors as illustrated in FIG. 25B. Structure 1070A corresponds to nonvolatile two terminal switch 1070 shown in FIG. 8F. Structure 1070B is a mirror image of structure 1070A with corresponding wiring and interconnections. As compared with FIG. 23B, the positions of 2-TNS 1070A and 1070B are interchanged with respect to respective underlying transistors, e.g. transistor 1535. Conductive element 1005 of 2-TNS overlaps and is in near-ohmic contact with nanotube element 1025 and stud 1540. This forms a conductive path between nanotube element 1025 and source 1515 of transistor 1535, enabling ERASE, PROGRAM, and/or READ operations in 2-TNS 1070A.

Figure 25C:
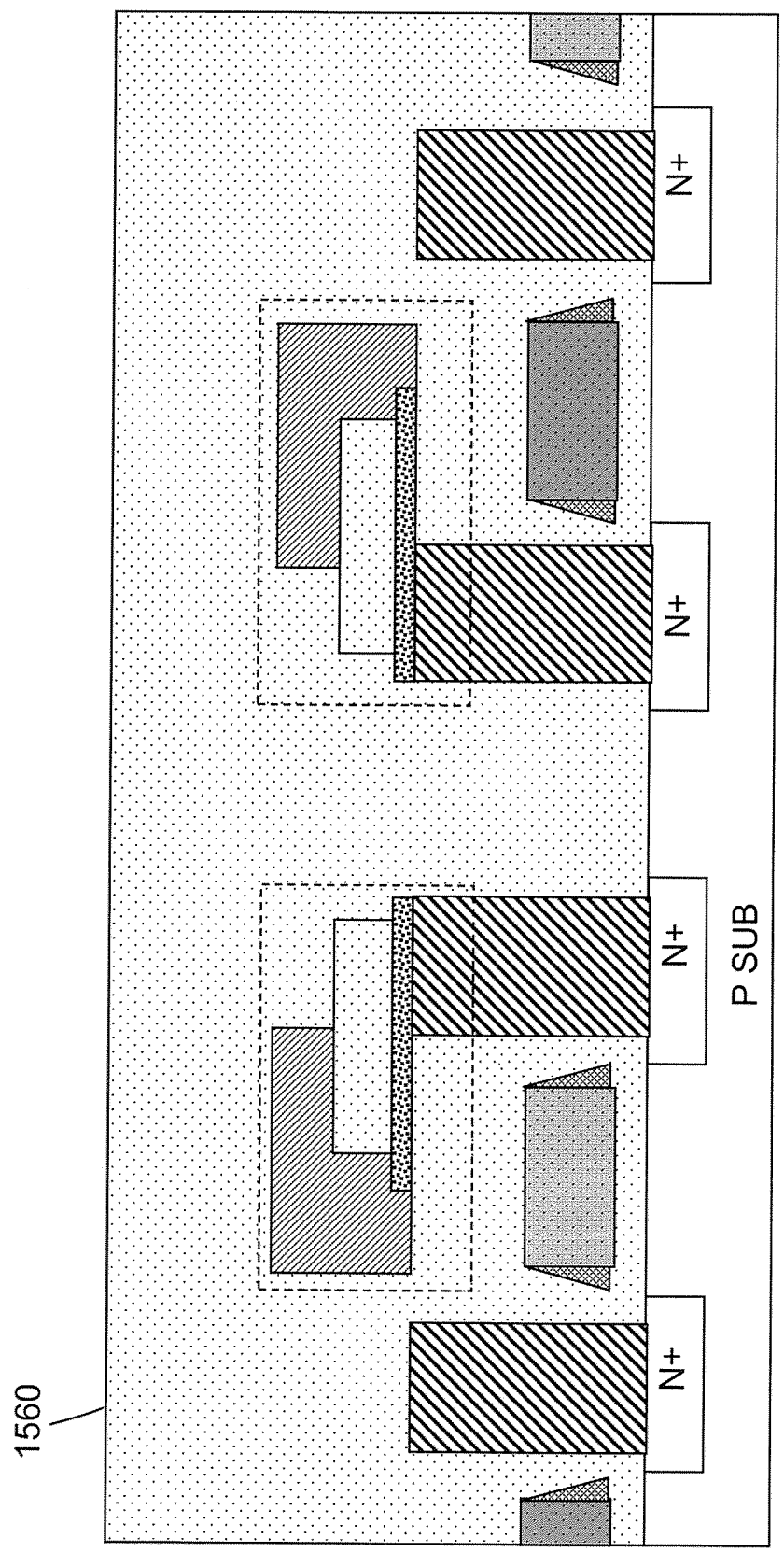

Next, preferred methods deposit and planarize insulator 1560 as illustrated in FIG. 25C. Insulator 1560 may be TEOS, for example, or another insulator deposited and planarized using well known semiconductor fabrication methods.

Figure 25D:
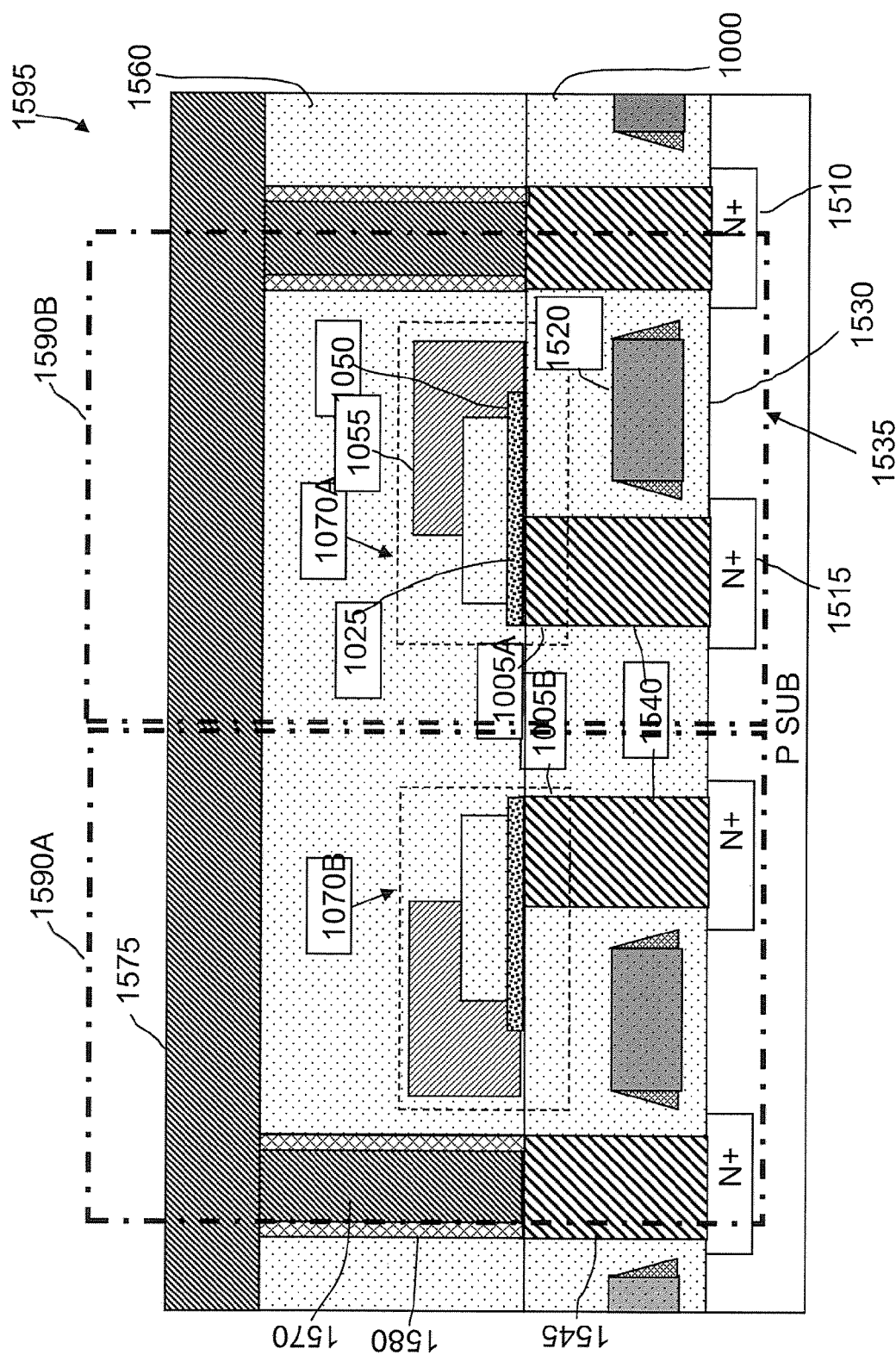

Next, preferred methods etch a via hole in insulator 1560 and insulator 1000 using well known semiconductor fabrication methods, exposing the top surface of stud 1545 as illustrated in cross section 1595 of FIG. 25D.

Next, preferred methods deposit a conformal insulating film and coat via opening sidewalls with insulator 1580. If via holes are not properly registered and expose conductive element 1055, insulator 1580 will insulate exposed portions of conductive element 1055 and prevent electrical shorting to stud 1570. Insulator 1580 may be $SiO_2$, for example.

Figure 25E:
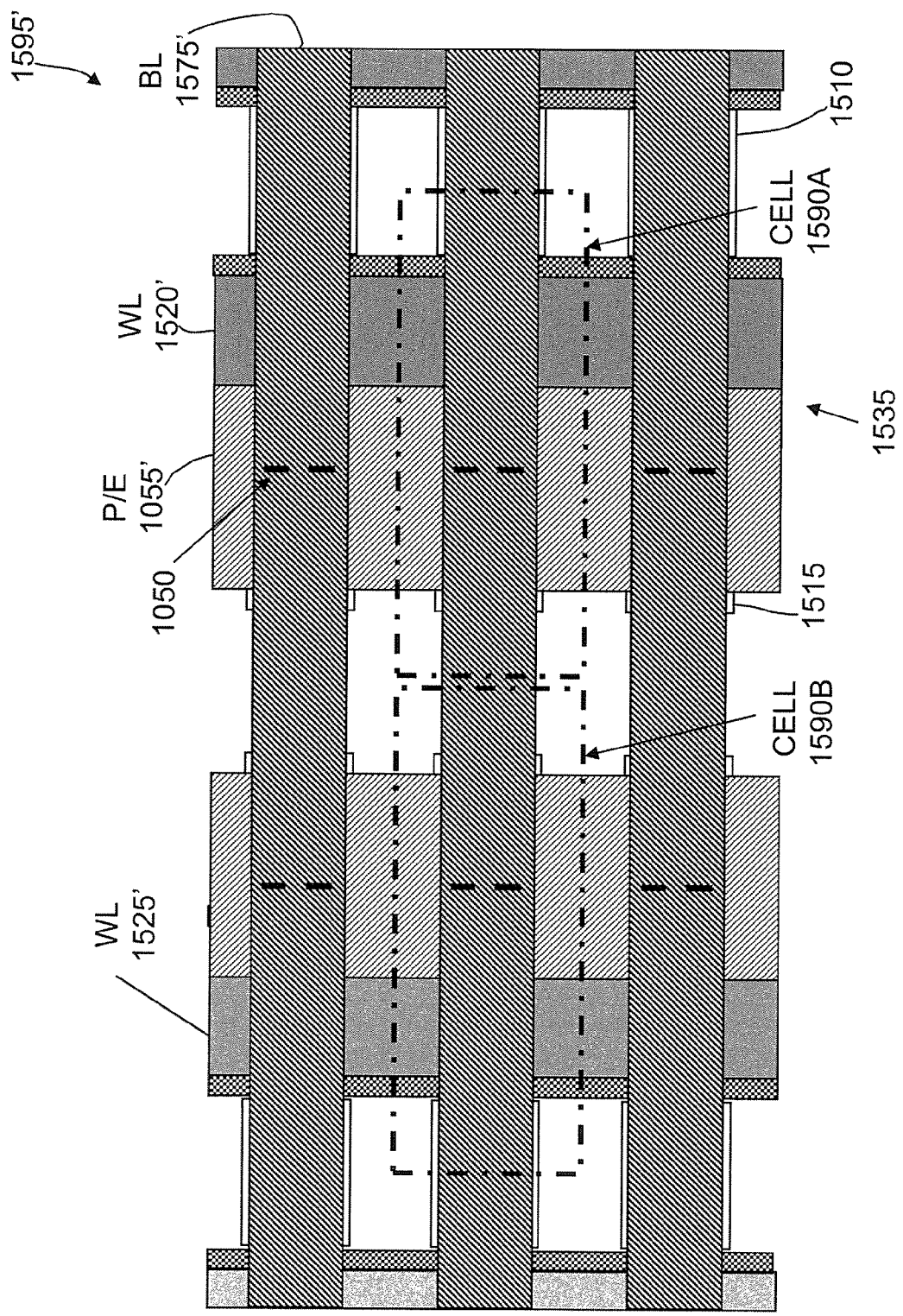

Then, preferred methods deposit and pattern a conducting layer forming conducting stud 1570 and bit line cross section 1575 as shown in FIG. 25D and bit line plan view 1575' as shown in corresponding plan view 1595' in FIG. 25E. A conducting path is formed between bit line 1575 (1575') and drain 1510 through studs 1570 and 1545. If transistor 1535 is in the OFF state, then channel region 1530 is not formed, and bit line 1575 (1575') is electrically isolated from nanotube element 1025. If, however, transistor 1535 is in the ON state, then a conductive channel is formed connecting drain 1510 and source 1515. This forms a conductive path between bit line 1575 (1575') and nanotube element 1025 through studs 1570 and 1545, drain 1510, channel 1530, source 1515, stud 1540, and conductive element 1005.

FIGS. 25D and 25E illustrate different views of transistor 1535, which is used to select (or not select) cell 1590A using gate 1520, which is also part of word line 1520'. Other cells such as cell 1590B may be selected instead by activating other word lines such as 1525'. Conductive element 1055 (1055') forms and interconnects switch region 1050 in multiple nonvolatile storage cells such as 1590A and 1590B (FIG. 25E) and is used during ERASE, PROGRAM, and/or READ operations explained in detail above. Nonvolatile storage cells 1590A and 1590B containing one select transistor and one nonvolatile two terminal switch layouts are mirror images of each other. Additional preferred methods of completing fabrication and passivation of the NRAM function (not shown) use well known semiconductor fabrication techniques.

Cells 1590A and 1590B (FIG. 25E) have the same cell area of approximately $7F^2$, approximately the same area as cells 1490A and 1490B (FIG. 24E), and 30% smaller than cells 1390A and 1390B (FIG. 23E) having a cell area of approximately $10F^2$.

Figure 26:
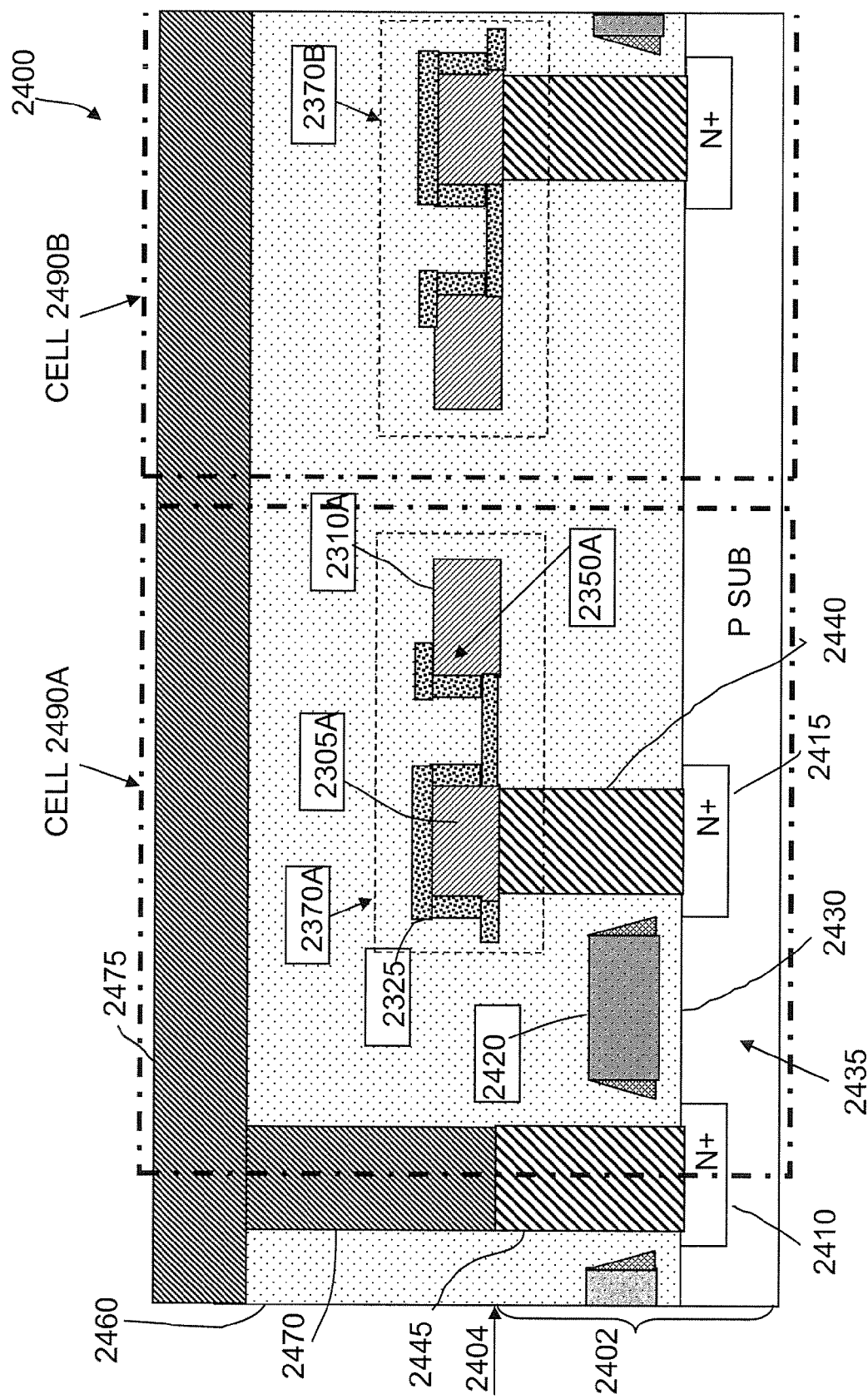
FIG. 26 is a cross sectional view of a structure according to certain embodiments of the invention.

Another method of fabricating an NRAM array with 2-TNS is described and illustrated in FIG. 26. Nonvolatile two-terminal nanotube switch 2370A corresponds to nonvolatile two-terminal nanotube switch 2370 shown in FIG. 13. As illustrated in memory array structure 2400 illustrated in cross section in FIG. 26, nonvolatile memory cell structure 2490A includes nonvolatile 2-TNS 2370A interconnected with transistor 2435, and interconnected with one bit line, one first word line, and one second word line as described further below. Nonvolatile memory cell structure 2490B is a mirror image of 2490A, and 2-TNS 2370B is a mirror image of 2-TNS 2370A Preferred methods fabricate NRAM array cell structure 2400 illustrated in FIG. 26. First, preferred methods fabricate initial structure 2402 having planarized surface 2404.

Next, preferred methods fabricate an intermediate structure including mirror-image 2-TNS 2370A and 2370B on surface 2404 of initial structure 2402 using preferred methods described further above with respect to FIGS. 12A-13.

Then, preferred methods complete fabrication of the nonvolatile memory chip on the intermediate structure to complete NRAM memory array structure 2400 shown in FIG. 26.

In operation, a conducting path is formed between bit line 2475 and drain 2410 through studs 2445 and 2470 in dielectric 2460. If transistor 2435 is in the OFF state, then channel region 2430 is not formed, and bit line 2475 is electrically isolated from nanotube element 2325. If, however, transistor 2435 is in the ON state, then a conductive channel is formed, which connects drain 2410 and source 2415. This forms a conductive path between bit line 2475 and nanotube element 2325 through studs 2470 and 2445, drain 2410, channel 2430, source 2415, stud 2440, and conductive element 2305A.

Transistor 2435 is used to select (or not select) cell 2490A using gate 2420, which is also part of a common word line shared with other cells in the corresponding row. Other cells, such as cell 2490B may be selected instead by activating other word lines. In NRAM memory array structure 2400, conductive element 2310A overlaps nanotube element 2325 in region 2350 of a controlled overlap length, and at the same time overlaps other nanotube elements in other cells by the same controlled overlap length. Thus conductive element 2310A interconnects a corresponding row of cells similar to 2490A, forming a common electrical connection used during ERASE, PROGRAM, and/or READ operations as described above. Nonvolatile storage cells 2490A and 2490B contain one select transistor and one nonvolatile two-terminal switch and have corresponding layouts that are mirror images of each other. Additional preferred methods of completing fabrication and passivation of the NRAM function (not shown) use well known semiconductor fabrication techniques.

Figure 27:
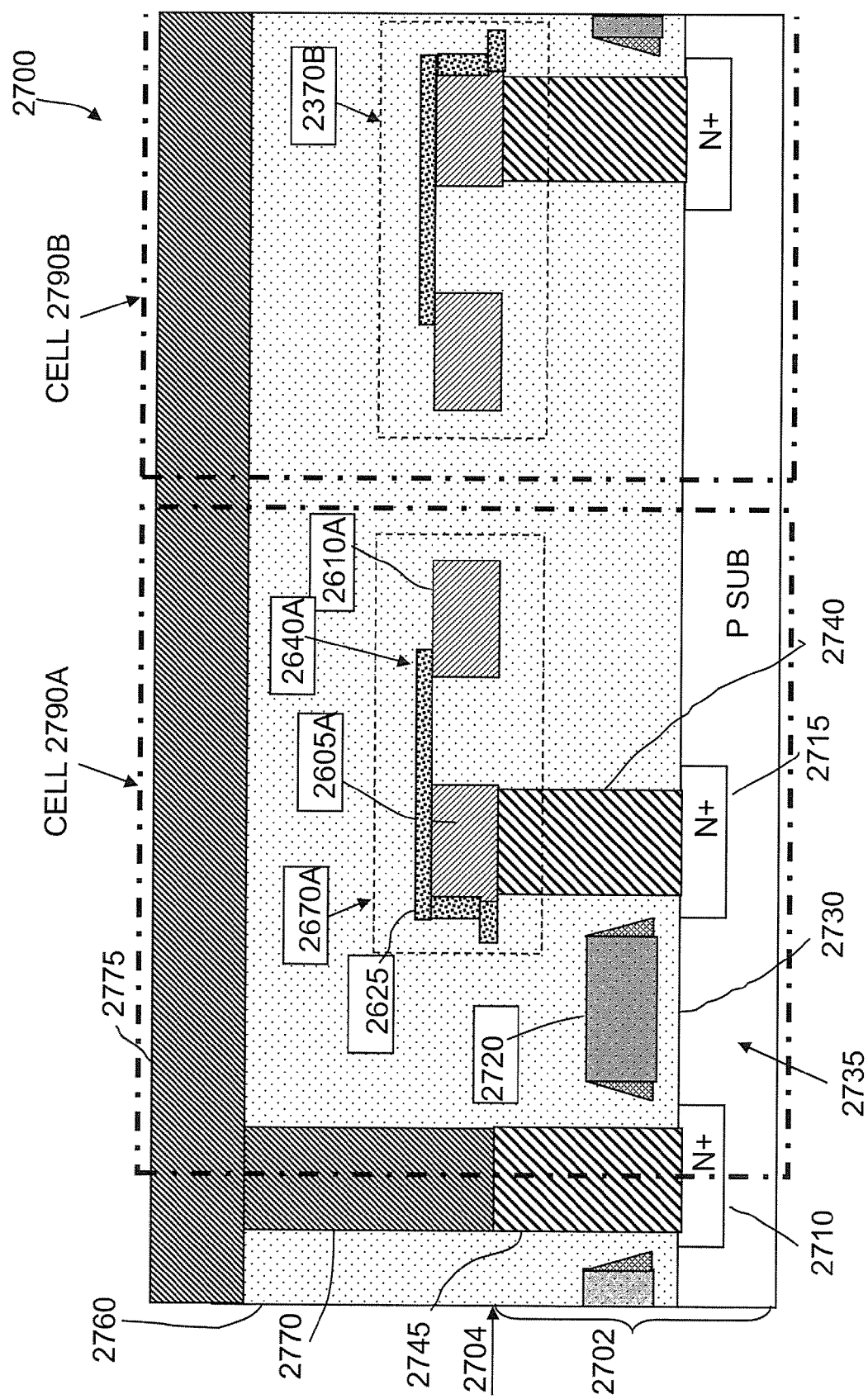
FIG. 27 is a cross sectional view of a structure according to certain embodiments of the invention.

Another method of fabricating an NRAM array with 2-TNS is described and illustrated in FIG. 27. As illustrated in memory array structure 2700 illustrated in cross section in FIG. 27, nonvolatile memory cell structure 2790A includes 2-TNS 2670A interconnected with transistor 2735, and interconnected with one bit line, one first word line, and one second word line as described further below.

Nonvolatile two terminal nanotube switch 2670A corresponds to nonvolatile two terminal nanotube switch 2670 shown in FIG. 11C. Nonvolatile memory cell structure 2790B is a mirror image of 2790A, and 2-TNS 2670B is a mirror image of 2-TNS 2670A.

Preferred methods fabricate NRAM array cell structure 2700 illustrated in FIG. 27. First, preferred methods fabricate initial structure 2702 having planarized surface 2704.

Next, preferred methods fabricate an intermediate structure including 2-TNS 2670A and 2-TNS 2670B on surface 2704 of initial structure 2702 using preferred methods described further above with respect to FIGS. 11A-11C.

Then, preferred methods complete fabrication of the nonvolatile memory chip on the intermediate structure to complete NRAM memory array structure 2700 shown in FIG. 27.

In operation, a conducting path is formed between bit line 2775 and drain 2710 through studs 2745 and 2770 in dielectric 2760. If transistor 2735 is in the OFF state, then channel region 2730 is not formed, and bit line 2775 is electrically isolated from nanotube element 2625. If, however, transistor 2735 is in the ON state, then a conductive channel is formed, which connects drain 2710 and source 2715. This forms a conductive path between bit line 2775 and nanotube element 2625 through studs 2770 and 2745, drain 2710, channel 2730, source 2715, stud 2740, and conductive element 2605A.

Transistor 2735 is used to select (or not select) cell 2790A using gate 2720, which is also part of a common word line shared with other cells in the corresponding row. Other cells, such as cell 2790B, may be selected instead by activating other word lines. In NRAM memory array structure 2700, conductive element 2610A overlaps nanotube element 2625 in region 2640 of controlled overlap length, for examples 1-150 nm, and at the same time overlaps other nanotube elements in other cells by approximately the same controlled overlap length. Thus conductive element 2610A interconnects in parallel with other cells similar to cell 2790A in a corresponding row, forming a common electrical connection used during ERASE, PROGRAM, and/or READ operations as described in detail above. Nonvolatile storage cells 2790A and 2790B each contain one select transistor and one nonvolatile two-terminal switch and have corresponding layouts that are mirror images of each other. Additional preferred methods of completing fabrication and passivation of the NRAM function (not shown) use well known semiconductor fabrication techniques.

Figure 28:
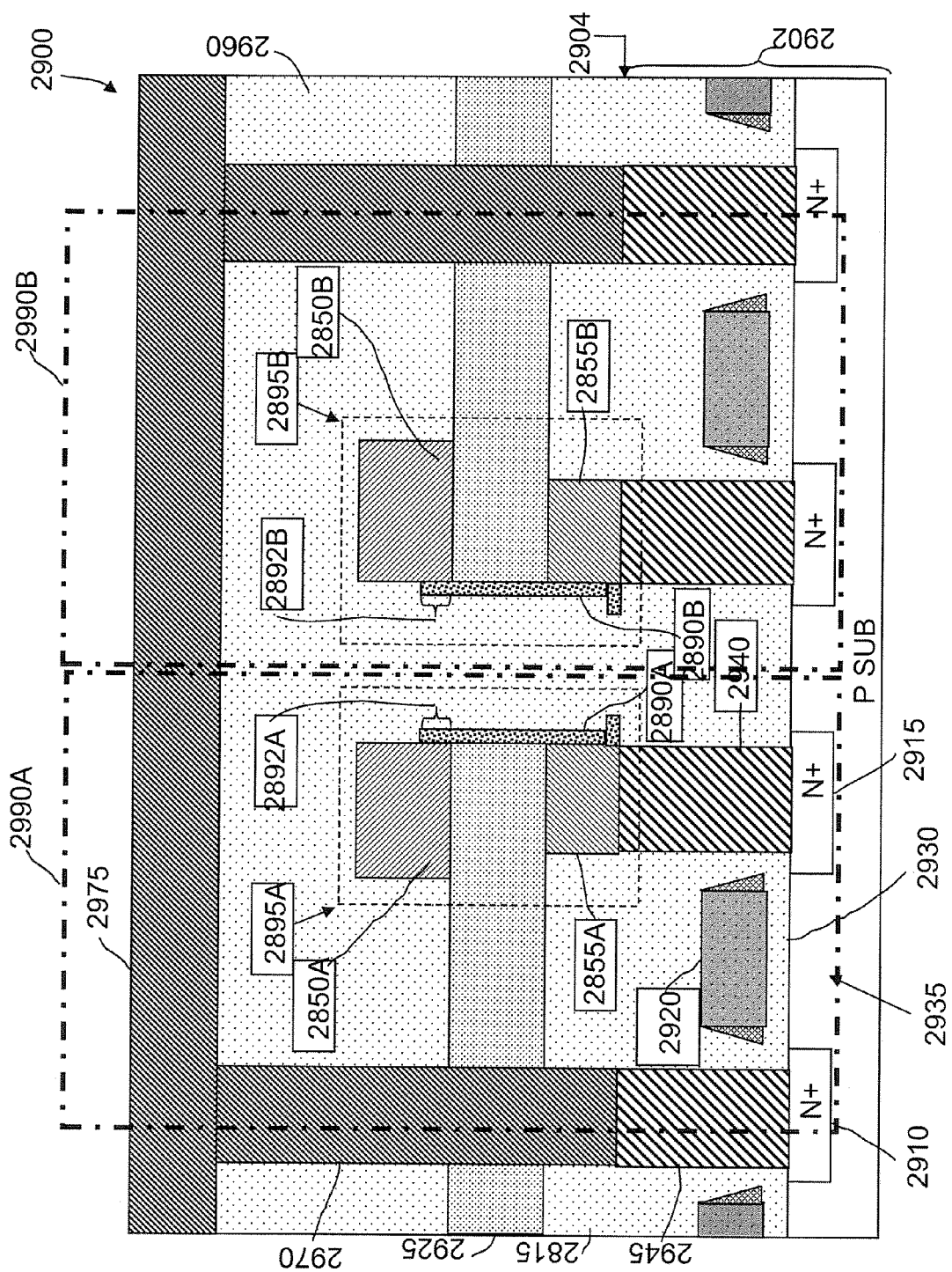
FIG. 28 is a cross sectional view of a structure according to certain embodiments of the invention.

Another method of fabricating an NRAM array with 2-TNS is described and illustrated in FIG. 28. Nonvolatile two terminal nanotube switch 2895A illustrated in FIG. 28 corresponds to vertically-oriented nonvolatile two terminal nanotube switch 2895A shown in FIG. 16L. 2-TNS 2895A is interconnected with transistor 2935 as illustrated in memory array structure 2900 illustrated in cross section in FIG. 28. Vertically oriented switches are designed to minimize NRAM cell size (area).

It is desirable to simplify methods of fabrication while reducing cell area, and corresponding NRAM array area, because NRAM arrays composed of multiple cells use less silicon area, have higher performance, and dissipate less power. Vertically oriented switches are designed to minimize NRAM cell size (area).

Nonvolatile memory cell structure 2990A includes 2-TNS 2895A interconnected with transistor 2935, and interconnected with one bit line, one first word line, and one second word line as described further below. Nonvolatile memory cell structure 2990B is a mirror image of 2990A, and 2-TNS 2895B is a mirror image of 2895A. Insulator 2925 corresponds to insulator 2815 in FIG. 16L.

Preferred methods fabricate NRAM array cell structure 2900 illustrated in FIG. 28.

First, preferred methods fabricate initial structure 2902 having planarized surface 2904.

Next, preferred methods fabricate an intermediate structure including 2-TNS 2895A and 2-TNS 2895B on surface 2904 of initial structure 2902 using preferred methods described further above with respect to FIGS. 16A-16L.

Then, preferred methods complete fabrication of the nonvolatile memory chip on the intermediate structure to complete NRAM memory array structure 2900 shown in FIG. 28.

In operation, a conducting path is formed between bit line 2975 and drain 2910 through studs 2945 and 2970 in dielectric 2960. If transistor 2935 is in the OFF state, then channel region 2930 is not formed, and bit line 2975 is electrically isolated from nanotube element 2890A. If, however, transistor 2935 is in the ON state, then a conductive channel is formed, connecting drain 2910 and source 2915. This forms a conductive path between bit line 2975 and nanotube element 2890A through studs 2970 and 2945, drain 2910, channel 2930, source 2915, stud 2940, and conductive element 2855A.

Transistor 2935 is used to select (or not select) cell 2895A using gate 2920, which is also part of a common word line shared with other cells in the corresponding row. Other cells, such as cell 2895B may be selected instead by activating other word lines. In NRAM memory array structure 2900, conductive element 2850A overlaps nanotube element 2890A by controlled overlap length 2892A, for example 1-150 nm, and at the same time overlaps other nanotube elements in other cells by approximately the same controlled overlap length. Thus conductive element 2850A interconnects a corresponding row of cells similar to 2895A, forming a common electrical connection used during ERASE, PROGRAM, and/or READ operations as described above.

Nonvolatile storage cells 2895A and 2895B containing one select transistor and one nonvolatile two-terminal switch corresponding layouts are mirror images of each other. Additional preferred methods of completing fabrication and passivation of the NRAM function (not shown) use well known semiconductor fabrication techniques.

Figure 29:
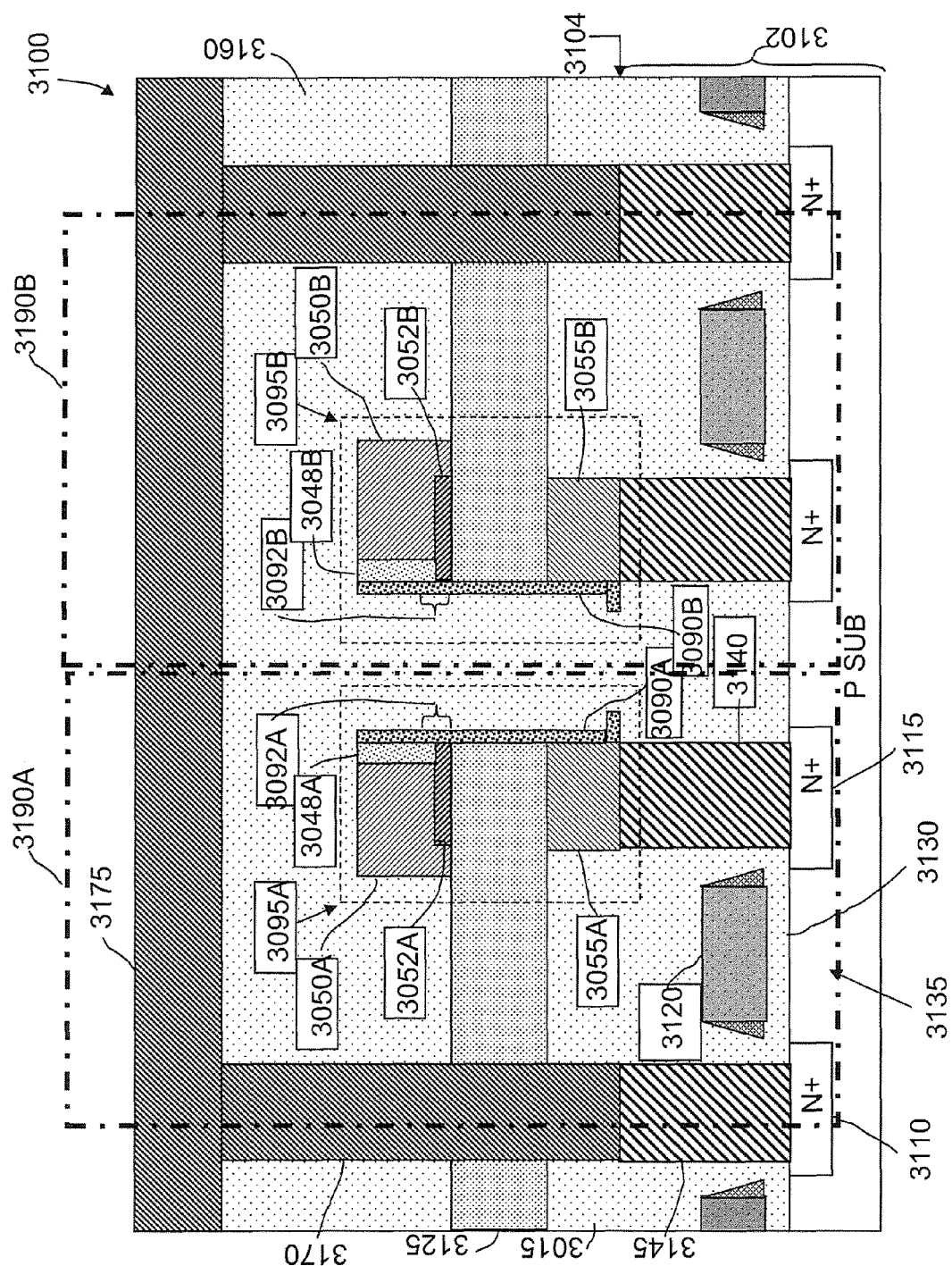
FIG. 29 is a cross sectional view of a structure according to one aspect of the present invention.

Another method of fabricating an NRAM array with 2-TNS is described and illustrated in FIG. 29. Nonvolatile two terminal nanotube switch 3095A illustrated in FIG. 29 corresponds to vertically oriented nonvolatile two terminal nanotube switch 3095A shown in FIG. 17M. 2-TNS 3095A is interconnected with transistor 3135 as illustrated in memory array structure 3100 illustrated in cross section in FIG. 29. Vertically oriented switches are designed to minimize NRAM cell size (area).

Nonvolatile memory cell structure 3190A includes 2-TNS 3095A interconnected with transistor 3135, and interconnected with one bit line, one first word line, and one second word line as described further below. Nonvolatile memory cell structure 3190B is a mirror image of 3190A, and nonvolatile two terminal nanotube switch array cell structure 3095B is a mirror image of 3095A.

Figure 31:
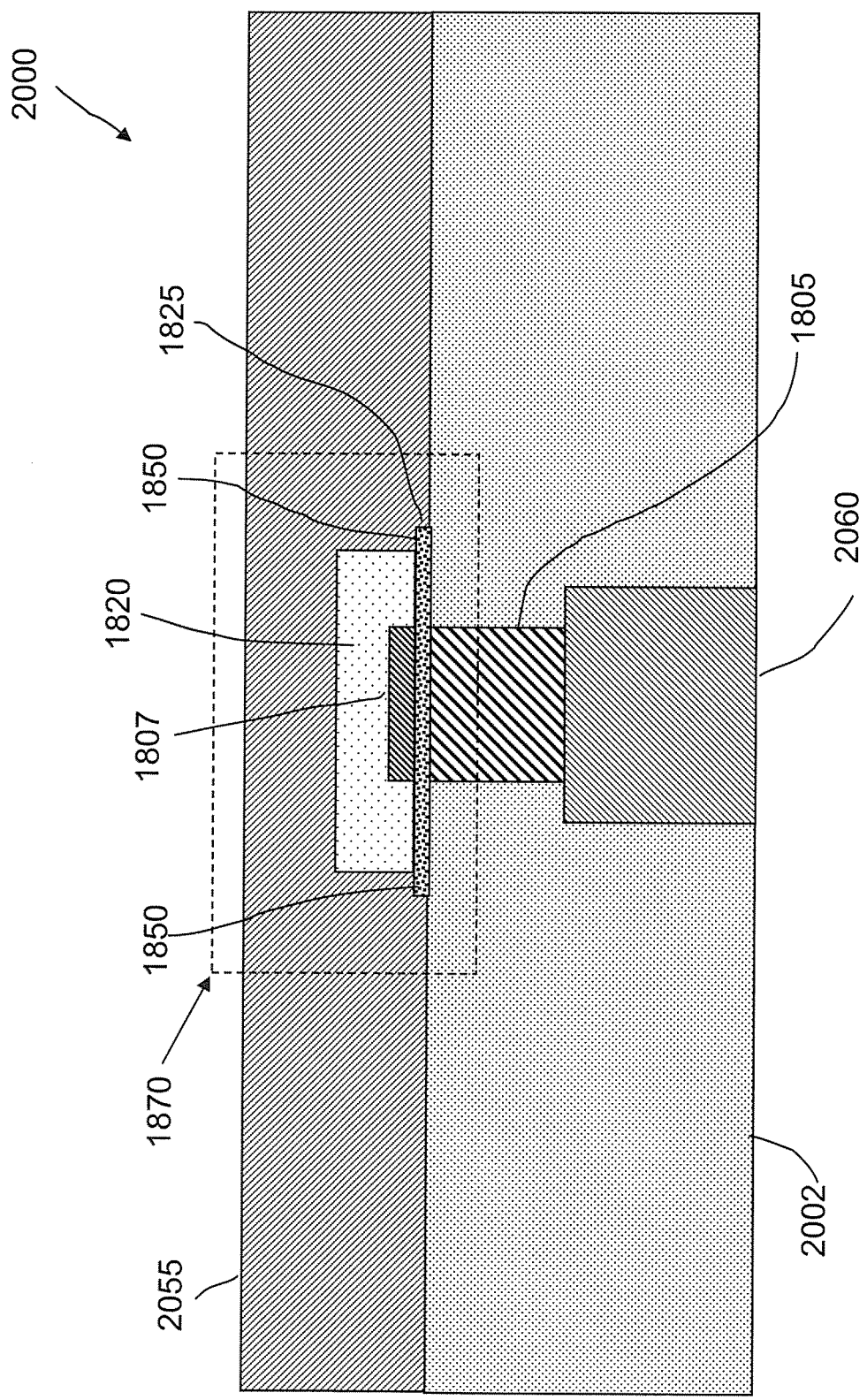
FIG. 31 illustrates a cross section of a device according to certain embodiments of the invention.

Preferred methods fabricate NRAM array cell structure 3100 illustrated in FIG. 31.

First, preferred methods fabricate initial structure 3102 having planarized surface 3104.

Next, preferred methods fabricate an intermediate structure including 2-TNS 3095A and 2-TNS 3095B on surface 3104 of initial structure 3102 using preferred methods described further above with respect to FIGS. 17A-17M.

Then, preferred methods complete fabrication of the nonvolatile memory chip on the intermediate structure to complete NRAM memory array structure 3100 shown in FIG. 29.

In operation, a conducting path is formed between bit line 3175 and drain 3110 through studs 3145 and 3170 in dielectric 3160. If transistor 3135 is in the OFF state, then channel region 3130 is not formed, and bit line 3175 is electrically isolated from nanotube element 3090A. If, however, transistor 3135 is in the ON state, then a conductive channel is formed, connecting drain 3110 and source 3115. This forms a conductive path between bit line 3175 and nanotube element 3090A through studs 3170 and 3145, drain 3110, channel 3130, source 3115, stud 3140, and conductive element 3055A.

Transistor 3135 is used to select (or not select) cell 3190A using gate 3120, which is also part of a common word line shared with other cells in the corresponding row. Other cells, such as cell 3190B may be selected instead by activating other word lines. In NRAM memory array structure 3100, conductive element 3050A overlaps nanotube element 3090A by controlled overlap length 3092A, for example 1-150 nm, and at the same time overlaps other nanotube elements in other cells by approximately the same controlled overlap length. Thus conductive element 3050A interconnects a corresponding row of cells similar to 3190A, forming a common electrical connection used during ERASE, PROGRAM, and/or READ operations as described above.

Nonvolatile storage cells 3095A and 3095B containing one select transistor and one nonvolatile two-terminal switch and corresponding layouts are mirror images of each other. Additional preferred methods of completing fabrication and passivation of the NRAM function (not shown) use well known semiconductor fabrication techniques.

Using the methods and embodiments described herein, one skilled in the art could fabricate an nonvolatile random access memory array utilizing any embodiment of a two-terminal nanotube switch. Some NRAM arrays could even be fabricated including more than one different embodiment of two-terminal nanoswitches.

For example, picture frame nonvolatile two terminal switch 1870 illustrated in FIGS. 14I and 14J may be substituted for the 2-TNS 1070A and 1070B in the NRAM cells illustrated in FIGS. 23D and 23E, and in FIGS. 25D and 25E. Other NRAM cells (not shown) may be designed to take further advantage of dense picture frame nonvolatile two terminal nanotube switch 1870.

Nonvolatile Two Terminal Nanotube Switches as High Density Cross Point Switches

Data processing, communications, and consumer solutions are dictating semiconductor design, test, burn-in, and packaging technology choices. Examples of products covered include: smart card/games, mobile/handheld such as cell phones, personal computers, desktop/workstations, and server/mainframe. These requirements are driven by miniaturization, performance, power, reliability, quality, and time to market. For some applications, such as aerospace, components are exposed to harsh environments such as high radiation levels. In some applications, security features such as a near-impossibility of reverse engineering is a requirement as well.

Time to market, including rapid hardware prototyping and production ramp-up, has resulted in increasing usage of pre-wired reconfigurable logic, field programmable gate arrays (FPGAs) for example. For many applications, pre-wired reconfigurable logic, such as FPGAs, are chosen instead of ASIC chips because the complexity of ASIC logic chips has increased, with 15 to 20 (or more) conductor levels, resulting in increased costs and longer time to market. The density of the pre-wired reconfigurable logic chips are less than those of ASIC chips so that more are required. Some ASIC designs are beginning to include embedded pre-wired reconfigurable logic regions as well.

The size and electrical characteristics of the pre-wired switch essentially determine the reconfigurable logic architecture and potential applications. The smallest pre-wired switch presently used is a prior art nonvolatile one-time-programmable (OTP) two terminal antifuse switch between logic wires as illustrated in FIGS. 30A and 30B. The nonvolatile OTP antifuse is the smallest in size (area) because it is a crosspoint switch placed between pre-wired logic conductors that can be programmed to selectively interconnect various logic conductors as illustrated in FIGS. 30A and 30B. The use of prior art nonvolatile OTP two terminal antifuses to design pre-wired reconfigurable logic functions is described in the following reference: John McCollum, "Programmable Elements and Their Impact on FPGA Architecture, Performance, and Radiation Hardness", Altera Corporation, 1995. The referenced power point presentation file "80_McCollum_5_PROGRAMMABLE LOGIC_ALTERA.ppt" may be found at http://klabs.org. The prior art discloses forming an antifuse using a dielectric layer between two metal layers.

FIG. 30A illustrates prior art antifuse 1900 in the ON(CLOSED) or programmed conducting state 1920. FIG. 30A illustrates prior art antifuse 1900 in the OFF (OPEN) non-conducting state 1910 prior to programming. When antifuse 1900 is in conducting state 1920, conductors 1930 and 1940 are electrically connected by a resistance of less than 100 ohms. In the non-conducting state, conductors 1930 and 1940 are not electrically connected, and the capacitance added by the antifuse is small, less than 1 fF per node, for example.

Advantages of prior art antifuse 1900 include density achieved by using a cross point switch configuration, low capacitance, relatively low resistance, and nonvolatility. Also, it is difficult to "reverse engineer" a chip to trace the logic function, which is very important in security applications. The switch is tolerant of harsh environments such as high temperatures and high levels of radiation (radiation hard switch).

Disadvantages of prior art antifuse 1900 include high voltage programming (10 to 12 volts) at high currents (typically 10 mA per antifuse). Also, because antifuses can only be programmed once (OTP), defective antifuses cannot be completely eliminated from the pre-wired reconfigurable logic parts. Because of these, and other limitations, programming is relatively complex and is usually carried out in a socket (test fixture) prior to use in a system.

What is needed is a way of retaining the density and other advantages of prior art antifuse 1900, while eliminating or reducing the disadvantages (limitations), especially the elimination of defective switches from pre-wired reconfigurable logic parts and eliminating the need to program switches in a socket prior to use in a system.

Nonvolatile two terminal nanotube switches, such as 2-TNS 1870 shown in FIGS. 14I and 14J and other switches described further above, can eliminate or significantly reduce the limitations of prior art switches 1900 shown in FIGS. 30A and 30B. 2-TNS 1870, for example, may be used to replace prior art antifuse switch 1900. 2-TNS 1870 is easily integrated between metal layers, is a small cross point switch, and, perhaps most importantly, may be erased and programmed repeatedly as described further above. As a result, pre-wired reconfigurable logic parts may be shipped with integrated and fully tested 2-TNS ready for programming.

In some embodiments, nonvolatile two terminal nanotube switches have ERASE voltages of 8 to 10 volts, PROGRAM voltages of 4 to 6 volts, and relatively low PROGRAM and ERASE currents, typically less than 100 uA per switch. Because the switches are readily testable, and require about 100 times lower current to PROGRAM compared to prior art antifuse 1900, pre-wired reconfigurable logic chips based on 2-TNS may be programmed in a system environment. The harsh environment tolerance of nanotubes and high security ("reverse engineering" is nearly impossible) means that logic can be used in critical aerospace applications, and programmed in space, for example.

FIG. 31 illustrates a cross section of nonvolatile nanotube cross point switch 2000 resulting from the integration of 2-TNS 1870 shown in FIGS. 14I and 14J with conductor layers 2060 and 2055. Conductor 2055 corresponds to conductive element 1855 shown in FIG. 14I, overlapping nanotube element 1825 in regions 1850 by a controlled overlap length of, for example, 1-150 nm, as described further above. Insulator 2002 corresponds to insulator 1800 shown in FIG. 14I. Conductor 2060 is in electrical contact with nanotube element 1825 of 2-TNS 1870 through stud 1805.

Conductors 2055 and 2060 are in relatively good electrical contact when nonvolatile nanotube cross point switch 2000 is in a relatively low resistance "closed" or ON state. Conductors 2055 and 2060 are in relatively poor electrical contact when nonvolatile nanotube cross point switch 2000 is in the relatively high resistance "open" or ON state.

Figure 32B:
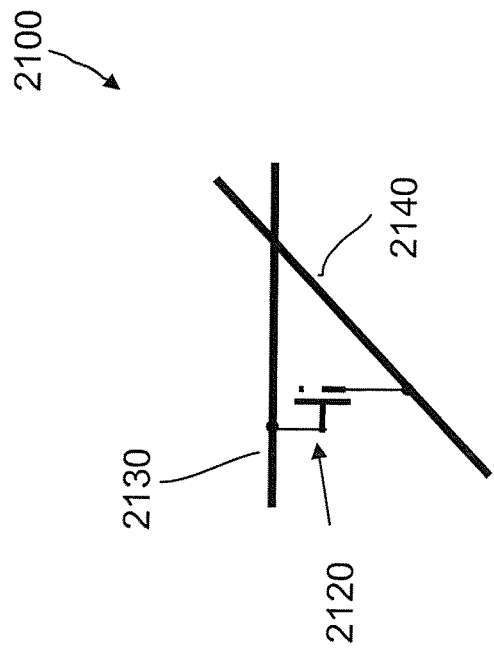
FIGS. 32A and 32B illustrate schematic diagrams according to certain embodiments of the invention.
Figure 32A:
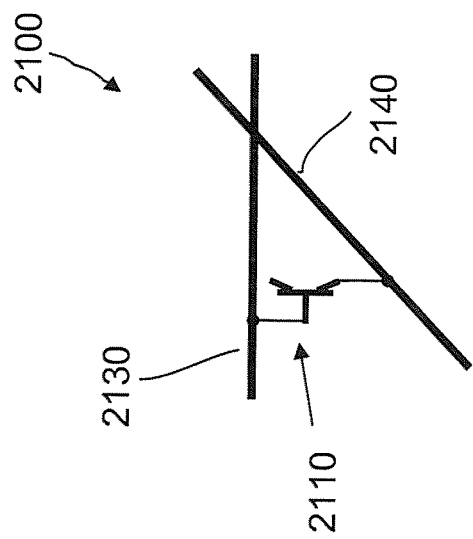

FIGS. 32A and 32B shows a schematic representation 2100 of nonvolatile nanotube cross point switch 2000 illustrated in FIG. 31. FIGS. 32A and 32B illustrate the replacement of prior art antifuse cross point switch 1900 shown in FIGS. 30A and 30B with nonvolatile nanotube cross point switch 2100. Conductors 2130 and 2140 in FIGS. 32A and 32B correspond to conductors 1930 and 1940, respectively, in FIGS. 30A and 30B. FIG. 32A shows nanotube cross point switch 2100 in the as-fabricated/PROGRAMMED "closed" state 2110 as described further above. A "closed" state may be characterized by having a relatively low resistance between conductors 2130 and 2140, for example less than 100 Ohms or less than 1,000 Ohms in some embodiments. FIG. 32B illustrates nanotube cross point switch 2100 in the ERASED "open" state 2120 as described further above. Nanotube cross point switch 2100, state 2120, corresponds to state 1910 of prior art antifuse 1900. Nanotube cross point switch 2100, state 2110, corresponds to state 1920 of prior art antifuse 1900. Nanotube cross point switch 2100 may be PROGRAMMED to change from state 2120 to state 2110, and then ERASED to return to state 2120. Millions of such cycles have been observed as described further above. The operation of each switch may be verified prior to shipping products containing pre-wired reconfigurable logic.

Because of the relatively low programming current of nonvolatile nanotube cross point switches 2100, on-chip ERASE and PROGRAM functions are possible in a system environment. The high voltage requirements described further above may be generated on chip as described in Bertin et al., U.S. Pat. No. 6,346,846. High voltages may be decoded on chips as described in Bertin et al., U.S. Pat. No. 5,818,748.

The sections describing FIGS. 14, 31, and 32 above describe two terminal nanotube switches as high density electrically reprogrammable cross point switches that provide reprogrammable contacts between a first conductive element on the top surface of an insulator and one end of a stud (vertical filled via). The opposite end of the stud contacts a second conductor in contact with the bottom surface of the same insulator. The above sections describe applications of electrically reprogrammable cross point switches.

Two Terminal Nanotube Switches as High Density Electrically Reprogrammable Nanotube Via Interconnections Between Two or More Wiring Layers Further embodiments for electrically reprogrammable via interconnecting switches are described below. In these embodiments, a nanotube element replaces stud via interconnections, which would typically use a conductive material such as tungsten, aluminum, copper, and/or other conductors. The nanotube element provides electrically reprogrammable connections between layers using nonvolatile nanotube two-terminal switches described further above. These embodiments enable electrically reprogrammable wiring interconnection after chip fabrication and packaging.

Nanotube element-based electrically reprogrammable via interconnections are tolerant of harsh environments such as high temperature operation (in excess of 200 degrees centigrade, for example), and tolerant of high radiation levels. High temperature tolerance and radiation tolerance result from certain characteristics of nanotube elements.

Nanotube element-based electrically reprogrammable interconnections provide a high level of security. In the event of a security concern, switch connections may be electrically reprogrammed (opened, for example, a switch ON state erased) in nanoseconds, or at most, microseconds. Even with reverse engineering of the hardware, the interconnect network cannot be determined.

In general, though it is not illustrated, it should be understood that elements in the described embodiments are in electrical communication with a stimulus circuit which is similar to the stimulus circuit described above. In the described reprogrammable interconnections, the stimulus circuit is in electrical communication with a conductive terminal and one or more wiring layer conductive terminals, which allows the circuit to reprogrammably form and break interconnections between one or more wiring layers in a similar manner as described above for the stimulation circuit that changes switches between two states.

One method of fabricating two-terminal nanotube switches as high density reprogrammable nanotube via interconnections between two wiring layers is illustrated in FIGS. 33A-33G.

First, preferred methods deposit conductor 3205 of controlled thickness as illustrated in FIG. 33A. Conductor 3205 may have a thickness in the range of 5 to 500 nm and may be formed using metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, and semiconductor, materials can also be used.

Next, preferred methods deposit and pattern conductor 3210 defining conductor length, width (not shown) and openings 3215 to accommodate vertical vias as illustrated in FIG. 33A using known industry techniques. Opening 3215 in conductor 3210 is formed using known RIE etch selective to conductor 3205, with opening 3215 shown in cross section in FIG. 33A. Conductor 3210 is of sufficient width that hole 3215 leaves a sufficient border region around opening 3215 (not shown) that conductor 3210 remains a continuous conductor. Conductor 3205 width and length is patterned using the same masking step as used to define conductor 3210 dimensions such that conductors 3205 and 3210 form a composite conductor, with the top surface of conductor 3205 and the bottom surface of conductor 3210 in electrical and mechanical contact, except in opening 3215. Conductor 3210 may have a thickness in the range of 5 to 500 nm and may be formed using metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, and semiconductor, materials can also be used.

Next, preferred methods deposit and planarize insulator 3220 using known industry methods. Insulator 3220 fills opening 3215 and provides a planar top surface 3222 as illustrated in FIG. 33A. Insulator 3220 may be $SiO_2$, SiN, $Al_2O_3$, BeO, polyimide, or other suitable insulating material of thickness in the range of 2 to 500 nm, for example. The assembly illustrated in FIG. 33A can be considered an initial structure.

Next, preferred methods deposit and pattern conductor 3225 on surface 3222 of insulator 3220 using known industry techniques, and planarize the surface to form insulator 3224 as illustrated in FIG. 33B. Conductor 3225 may have a thickness in the range of 5 to 500 nm and may be formed using metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, and semiconductor, materials can also be used.

Next, preferred methods deposit, expose, and form a mask layer 3230 with opening 3235 as illustrated in FIG. 33B to define the location of electrically reprogrammable vias described further below.

Figure 33C:
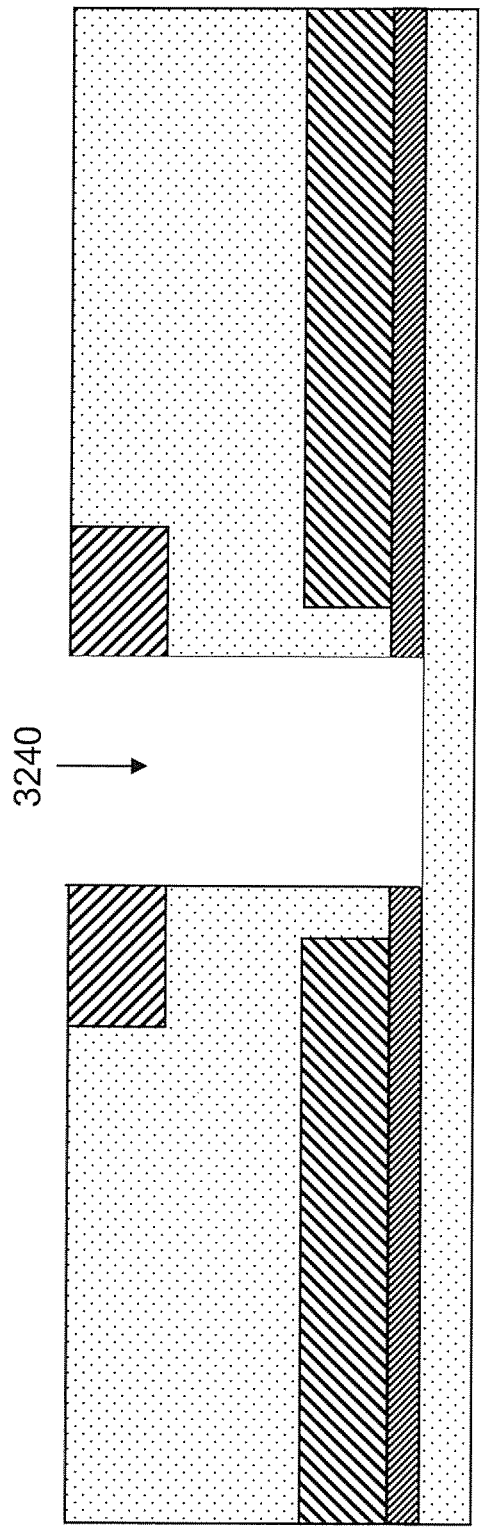

Next, preferred methods directionally etch conductor 3225, directionally etch insulator 3220, and directionally etch conductor 3205, stopping at the surface of insulator 3200 to form via holes 3240 as illustrated in FIG. 33C. Known directional etch methods of fabrication using reactive ion etch (RIE) may be used to form trench 3240, for example.

Figure 33D:
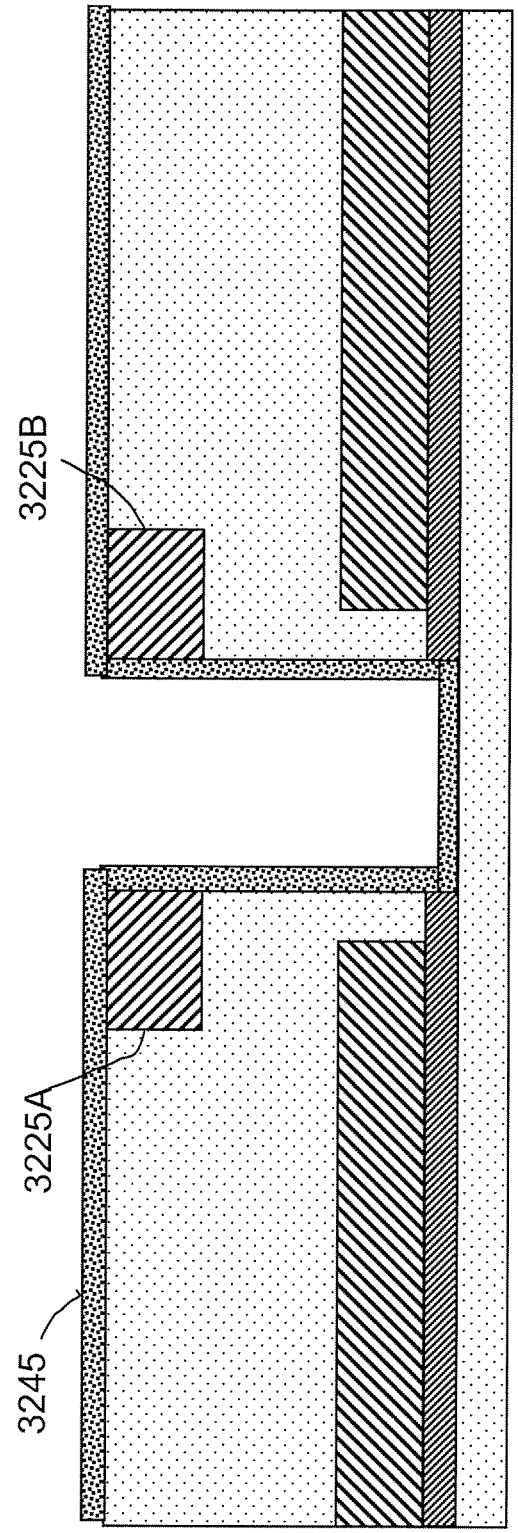

Next, preferred methods deposit a conformal layer of nanofabric 3245 on the bottom and sidewalls of trench 3240, on the top surface of conductive elements 3225A and 3225B, and on the top surface of insulator 3224 as illustrated in FIG. 33D. Nanofabric 3245 deposition may be done with techniques as described in the incorporated patent references.

Figure 33E:
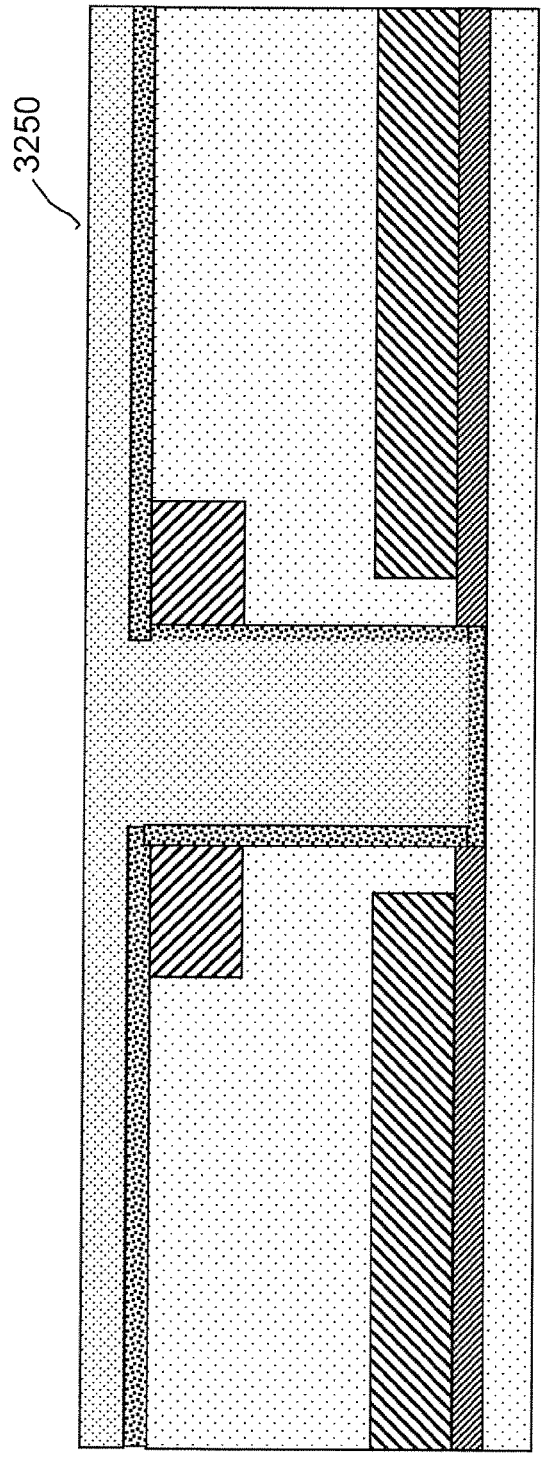

Next, preferred methods fill trench 3240 with insulator 3250, TEOS for example, with the surface of insulator 3250 planarized as illustrated in FIG. 33E using known industry techniques.

Figure 33F:
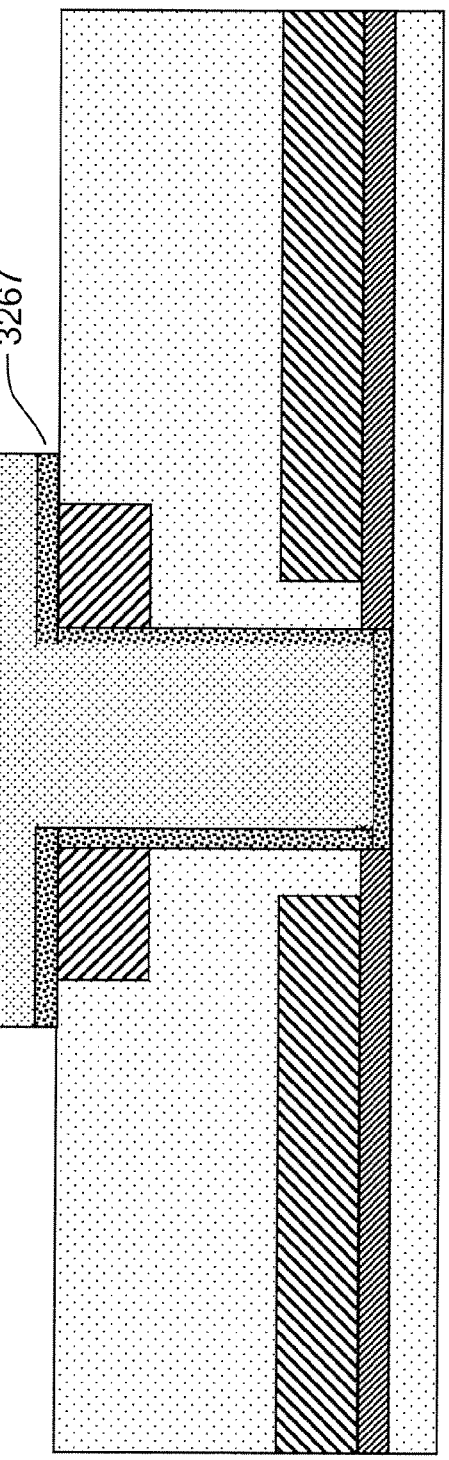

Next, preferred methods pattern and etch insulator 3250 using known industry methods as illustrated in FIG. 33F, exposing a portion of nanofabric 3245. Etching using RIE may remove the exposed portion of nanofabric 3245. Nanofabric 3245 may be only partially removed, or not removed at all by the etch step of insulator 3250.

If nanofabric 3245 is not entirely removed then preferred methods may be used to remove exposed regions of nanofabric using ashing, for example, or other appropriate technique as described in incorporated patent references. This results in nanotube element 3267 as illustrated in FIG. 33F.

Figure 33G:
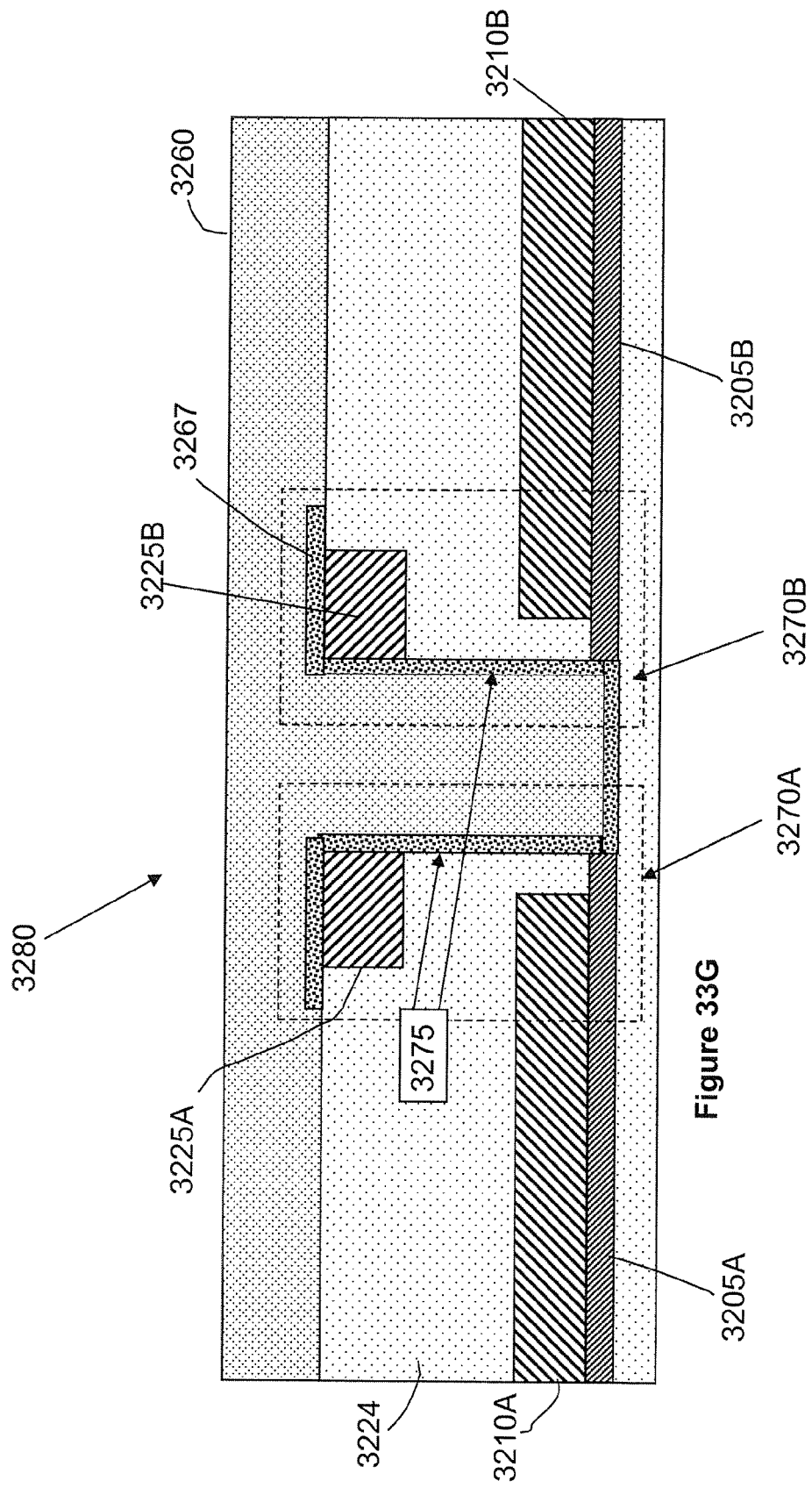

Then, preferred methods deposit and planarize insulator 3260 completing the nonvolatile nanotube element-based electronically reprogrammable via interconnect structure 3280 as illustrated in FIG. 33G.

Structure 3280 includes conductive element 3225A, which overlaps and forms a near-ohmic contact with nanotube element 3267 at sidewall and top surface of conductor 3225A. Structure 3280 also includes conductive element 3225B, which overlaps and forms a near-ohmic contact with nanotube element 3267 at sidewall and top surface of conductor 3225B. Sidewalls 3275 of nanotube element 3267 form vias between conductive element 3225A and conductive element 3205A, and between conductive element 3225B and conductive element 3205B. Conductors 3210A and 3210B, in electrical and mechanical contact with corresponding conductive elements 3205A and 3205B, may be used for interconnections.

Nanotube element 3267 overlaps the sidewall of conductor 3205A by a controlled overlap length that is determined by conductive element 3205A thickness. Nanotube element 3267 also overlaps the sidewall of conductor 3205B by a controlled overlap length that is determined by conductive element 3205B thickness. Thus conductive element 3225A, nanotube element 3267, and conductive element 3205A form a first 2-TNS 3270A, and conductive element 3225B, nanotube element 3267, and conductive element 3205B form a second 2-TNS 3270B.

In operation, a good (e.g., relatively low resistance) electrical connection between conductive elements 3225A and 3205A is formed if 2-TNS 3270A is in a "closed" state. The resistance between elements 3225A and 3205A, in some embodiments, may be in the range of 10 to 1,000 Ω for a "closed" state, for example. There is a relatively poor (e.g., relatively high resistance) electrical connection between conductive elements 3225A and 3205A if 2-TNS 3270 is in an "open" state. The resistance between elements 3225A and 3205A, in some embodiments, may be in the range of greater than 1 MΩ, or greater than 1 GΩ for a "closed" state, for example. Switch 3270B has corresponding states and characteristics. The general operation and characteristics of nonvolatile two-terminal nanotube switches are explained herein.

Two Terminal Nanotube Switches as High Density Electrically Reprogrammable Nanotube Via Interconnections Between Greater Than Two Wiring Layers In some applications it is desirable to have nonvolatile electrically reprogrammable nanotube via interconnections between more than two wiring layers. In the example described further below, nonvolatile electrically reprogrammable interconnections between four wiring layers are illustrated. Four layers are used for illustrative purposes only; many more levels are possible.

Figure 34A:
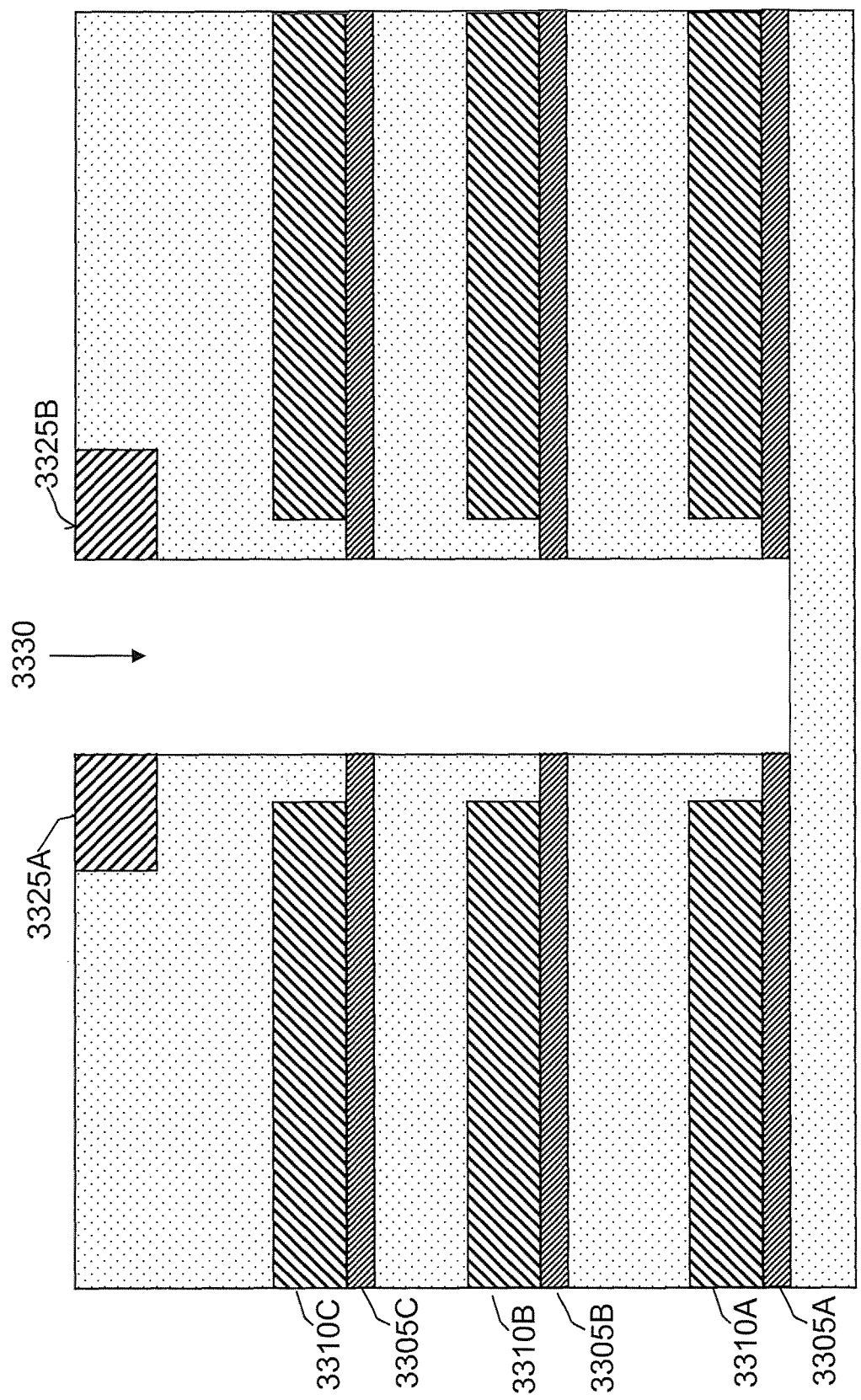
FIGS. 34A-E illustrate cross sectional views of structures created during fabrication steps according to certain embodiments of the invention.

FIG. 34A illustrates is a similar structure to that illustrated in FIG. 33C, but extended to include four layer via interconnections. Preferred methods used to fabricate the initial structure shown FIG. 33A may also be used to fabricate multiple wiring layers with conductive elements 3305A-C and 3310A-C one above the other as illustrated in FIG. 34A.

Next, preferred methods deposit and pattern conductive elements 3325A and 3325B using methods similar to those methods used in defining conductor 3225 as shown in FIG. 33B.

Next, preferred methods etch trench 3330 as illustrated in FIG. 34A using preferred methods of trench formation described further above with respect to formation of trench 3240 illustrated in FIG. 33C.

Figure 34B:
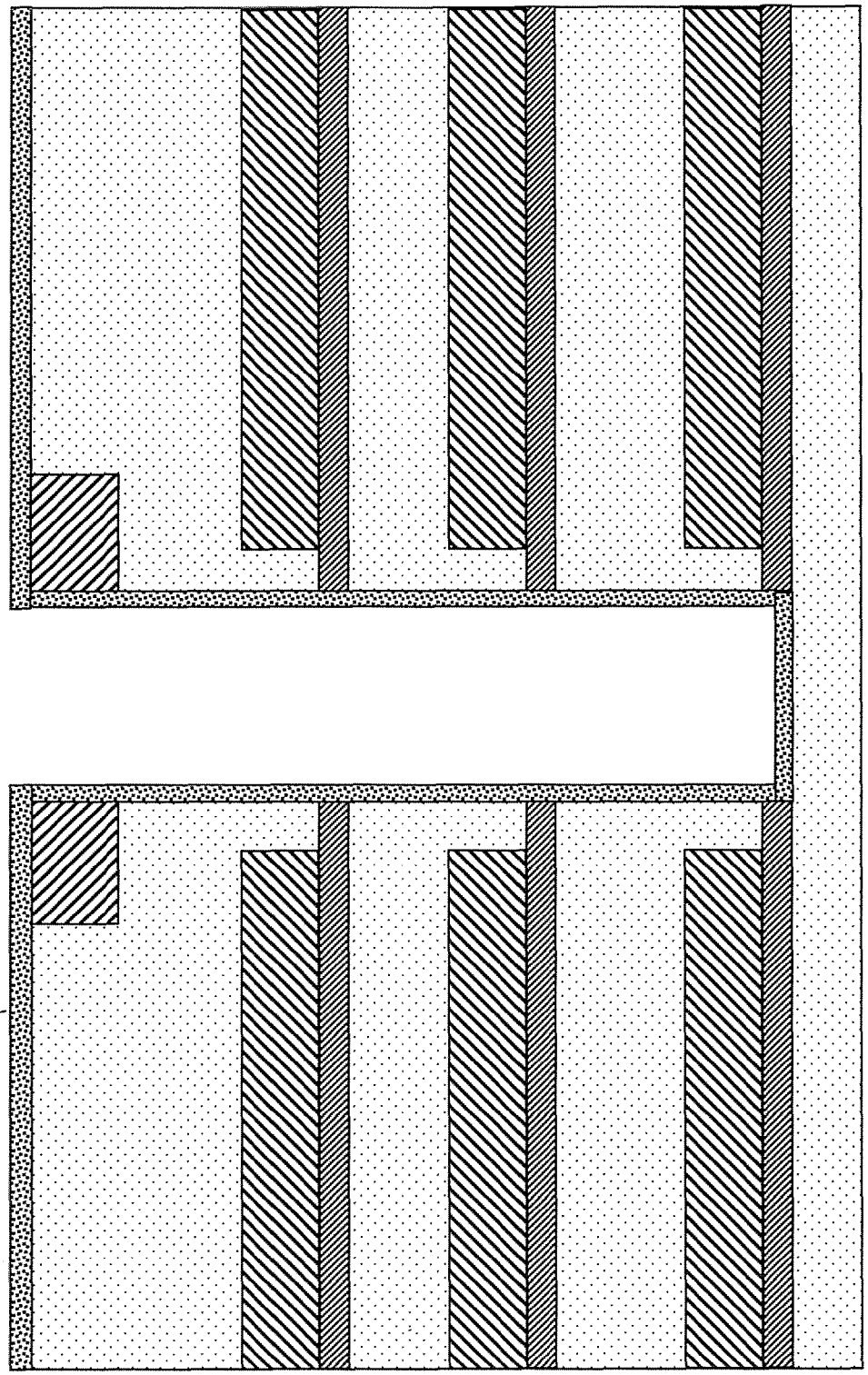
Figure 34C:
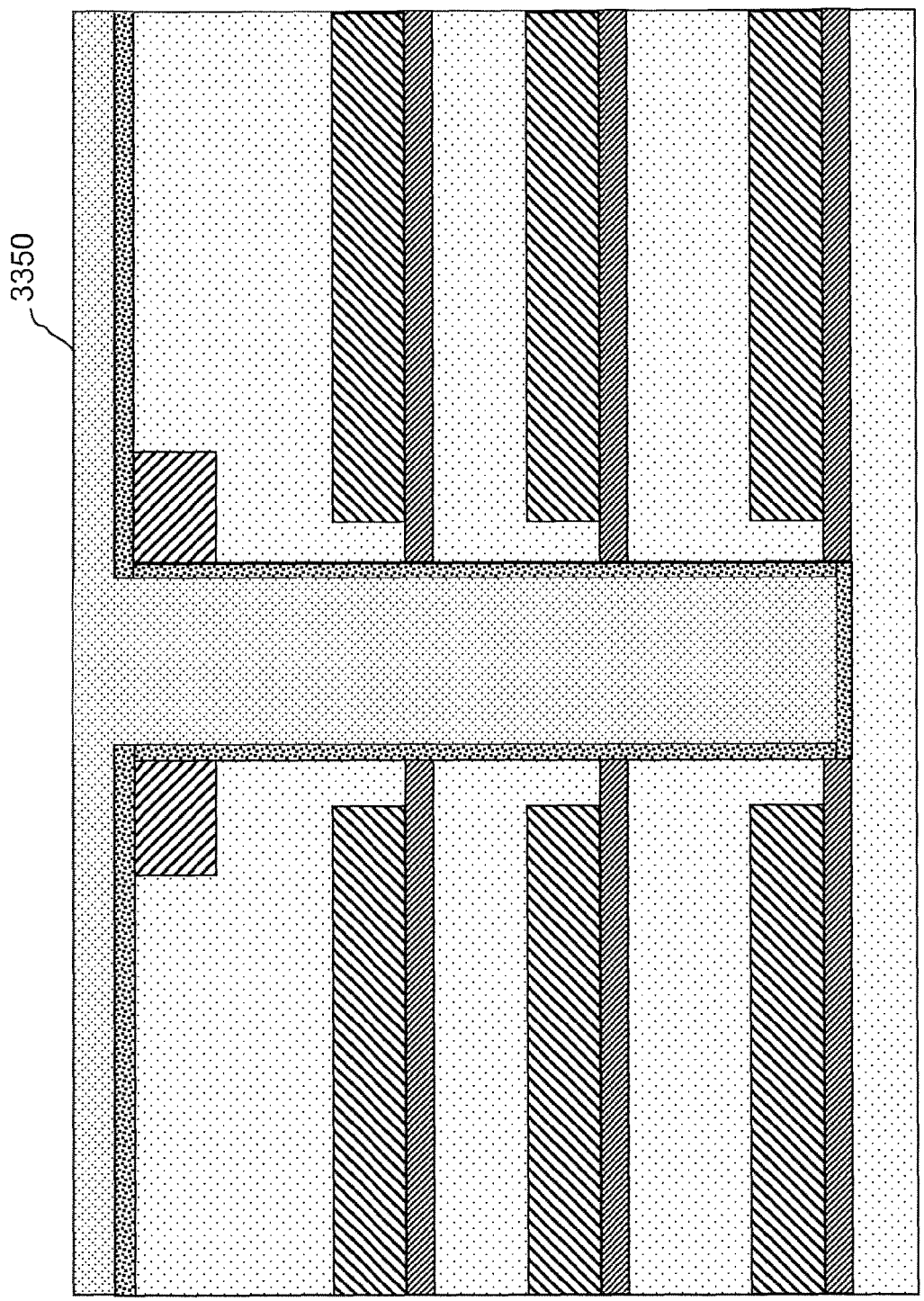

Next, preferred methods deposit nanofabric 3340 as illustrated in FIG. 34B using preferred methods described above and in the incorporated patent references.

Next, preferred methods fill via hole 3330 with insulator 3350 and planarize the surface of insulator 3350 using preferred methods described further above with respect to insulator 3250 illustrated in FIG. 33E.

Figure 34D:
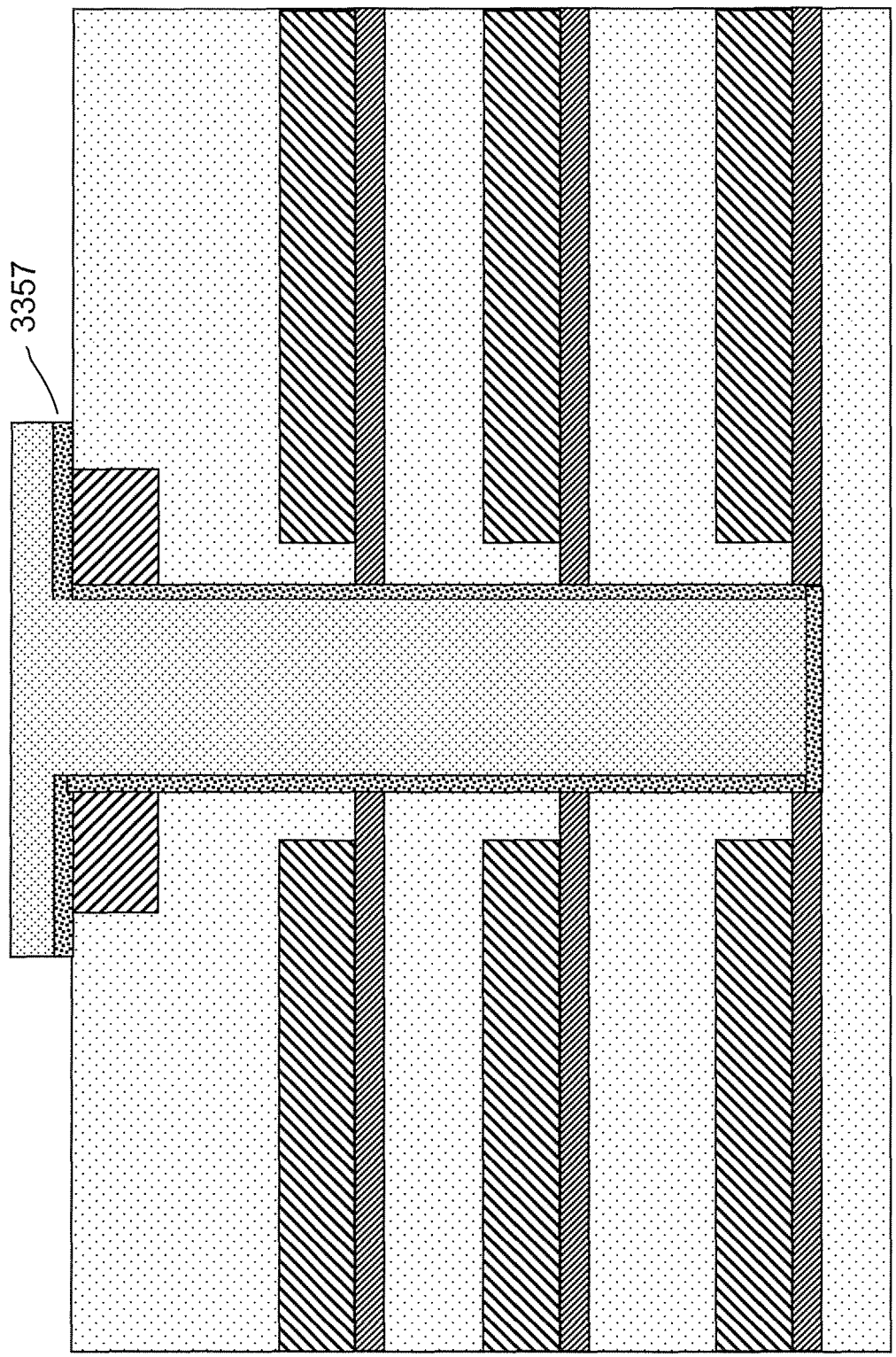

Next, preferred methods pattern insulator 3350 and remove exposed regions of nanofabric to form nanotube element 3367 as illustrated in FIG. 34D, using preferred methods described further above with respect to fabricating nanotube element 3267 illustrated in FIG. 33F.

Figure 34E:
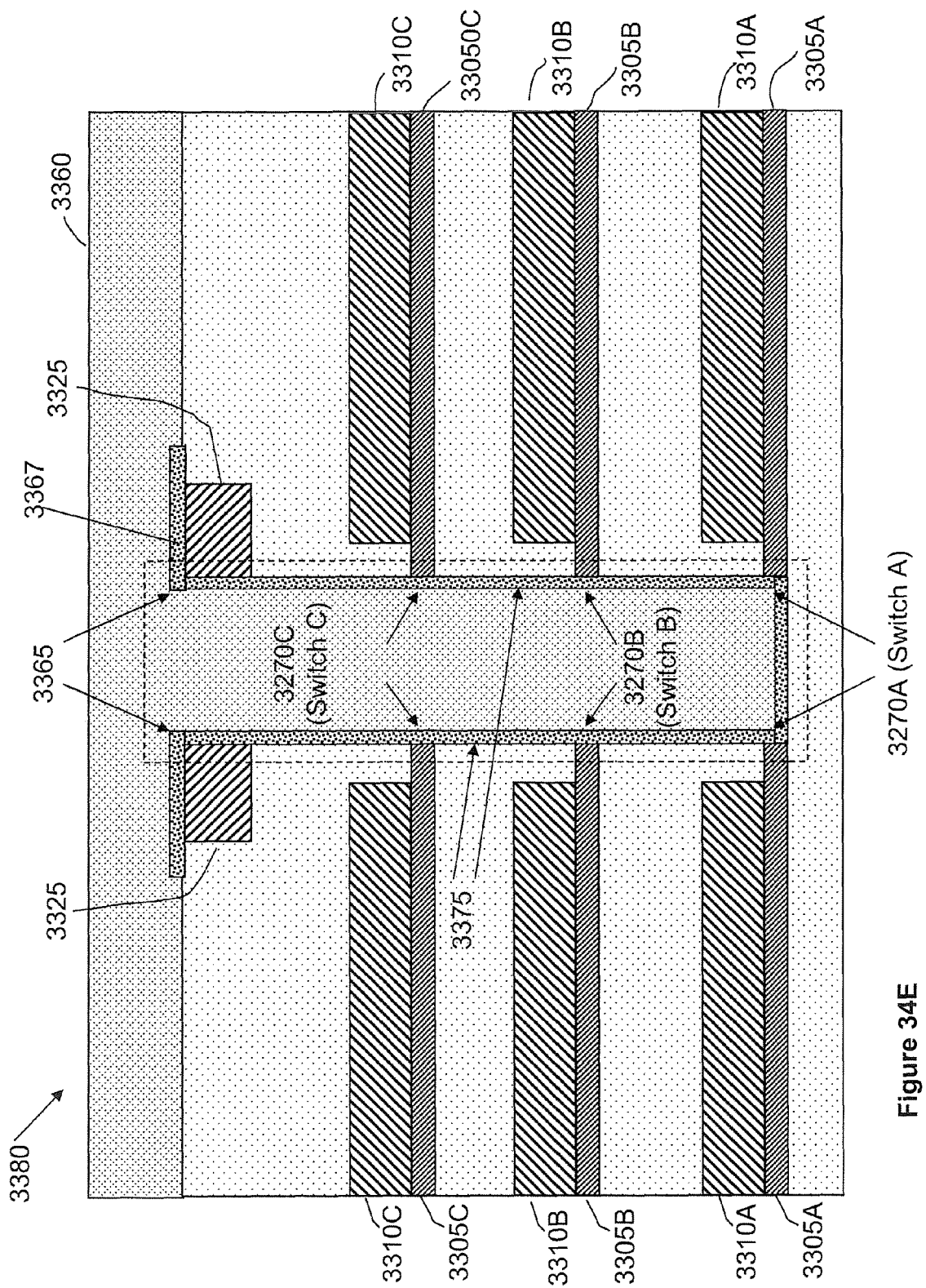

Next, preferred methods deposit and planarize insulator 3360 as illustrated in FIG. 34E using preferred methods described further above with respect to insulator 3260 illustrated in FIG. 33G, resulting in multilevel nonvolatile nanotube element-based electrically reprogrammable via interconnection structure 3380.

Structure 3380 includes conductive element 3325, which overlaps and forms a near-ohmic contact with nanotube element 3367 at sidewall and top surface of conductive element 3325. Sidewalls 3375 of nanotube element 3367 form vias between conductive element 3325 and conductors 3305A, 3305B, and 3305C Nanotube element 3367 overlaps the sidewalls of conductive element 3305A, 3305B, and 3305C, by a controlled overlap length that is determined by the thicknesses of elements 3305A, 3305B, and 3305C. Thus conductive element 3325, nanotube element 3367, and conductive element 3305A form a first 2-TNS 3370A; conductive element 3325, nanotube element 3367, and conductive element 3305B form a second 2-TNS 3370B; and conductive element 3325, nanotube element 3367, and conductive element 3305C form a third 2-TNS 3370C.

In operation, a relatively good (e.g., relatively low resistance) electrical connection between conductive element 3325 and any or all of the conductive elements 3305A, 3305B, 3305C is formed if corresponding 2-TNS 3370A, 3370B, and/or 3370C is in a "closed" state. The resistance between elements 3325 and 3305A, in some embodiments, may be in the range of 10 to 1,000 Ω for a "closed" state, for example. There is a relatively poor (e.g., relatively high resistance) electrical connection between conductive element 3325 and any or all of the conductive elements 3305A, 3305B, 3305C if corresponding 2-TNS 3370A, 3370B, and/or 3370C is in an "open" state. The resistance between elements 3325 and 3305A, for example, in some embodiments, may be in the range of greater than 1 MΩ, or greater than 1 GΩ for a "closed" state. The other switches in structure 3380 have corresponding states and characteristics. The general operation and characteristics of nonvolatile two-terminal nanotube switches are explained herein.

All combinations of single or multiple connections may be activated between conductors 3325 and any other of conductors 3305 A, B, and C. Also, connections between any combination or multiple combinations of conductors 3305 A, B, and C are allowed.

By way of example, referring to nonvolatile nanotube element-based electrically reprogrammable via interconnection 3380 structure illustrated in FIG. 34E, if switch A is "closed", switch B is "open", and switch C is "closed", then since conductive element 3325A is connected with near-ohmic contact to nanotube sidewalls 3375, conductive element 3325 is also connected to elements 3305C and 3310C, and 3305A and 3310A. This also connects conductive elements 3305C and 3305A to each other because switch C is in the "closed" state, and switch A is in the "closed" state.

Two Terminal Nanotube Switches as High Density Electrically Reprogrammable Nanotube Via Interconnections Between Two or More Wiring Layers With Still Greater Densities The cross sections illustrated in FIGS. 33 and 34 and described further above, assume that a via hole is surrounded by conducting layers around the entire perimeter of the via hole opening. Because of alignment considerations, and requirements for sufficient conductor border regions surrounding via holes, landing pads are provided on each level. Such landing pads require an increased spacing between conductors on each level and reduce wiring density. Via connections may also be placed adjacent to metal lines without requiring landing pads, thereby increasing conductor wiring density by reducing the spacing between conductors.

Figure 35:
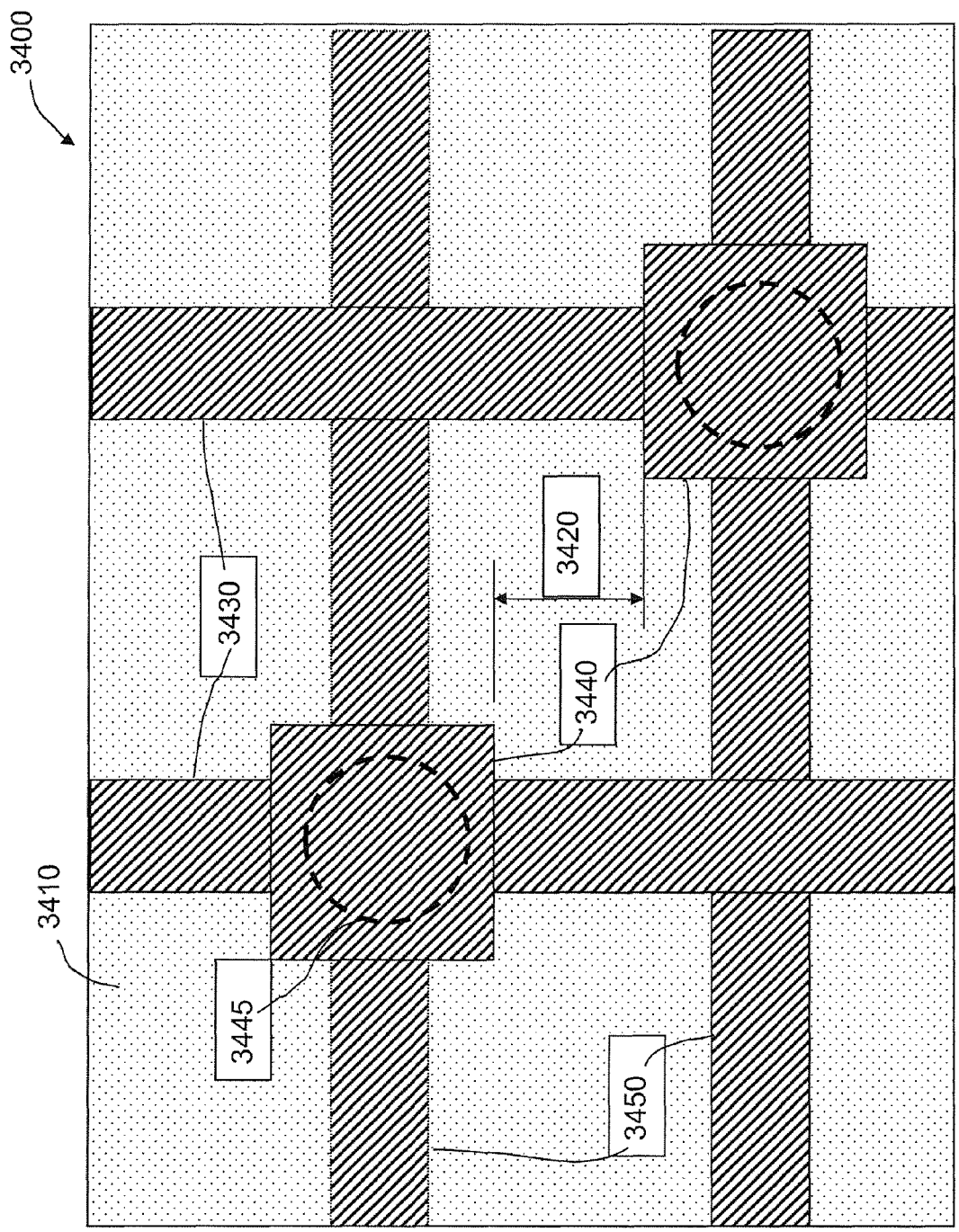
FIGS. 35 and 36 are plan views of structures according to certain embodiments of the invention.

FIG. 35 illustrates a plan view 3400 of conductors 3430 on a top level and one or more lower conductor wiring levels 3450. Top conductor wires 3430 on insulator 3410 include landing pads 3440 at locations where via holes are placed. The spacing between conductors on all wiring levels is increased in order to meet minimum spacing requirements 3420. One or more wiring layers 3450 are interconnected, and also connected with conductor 3430 by via holes 3445. Via holes 3445 contain nanotube elements. Top view 3400 correspond to cross sections illustrated in FIGS. 33 and 34 described further above, with via hole 3445 corresponding to nonvolatile nanotube element-based electrically reprogrammable via interconnections 3280 illustrated in FIGS. 33G and 3380 illustrated in FIG. 34E.

Figure 36:
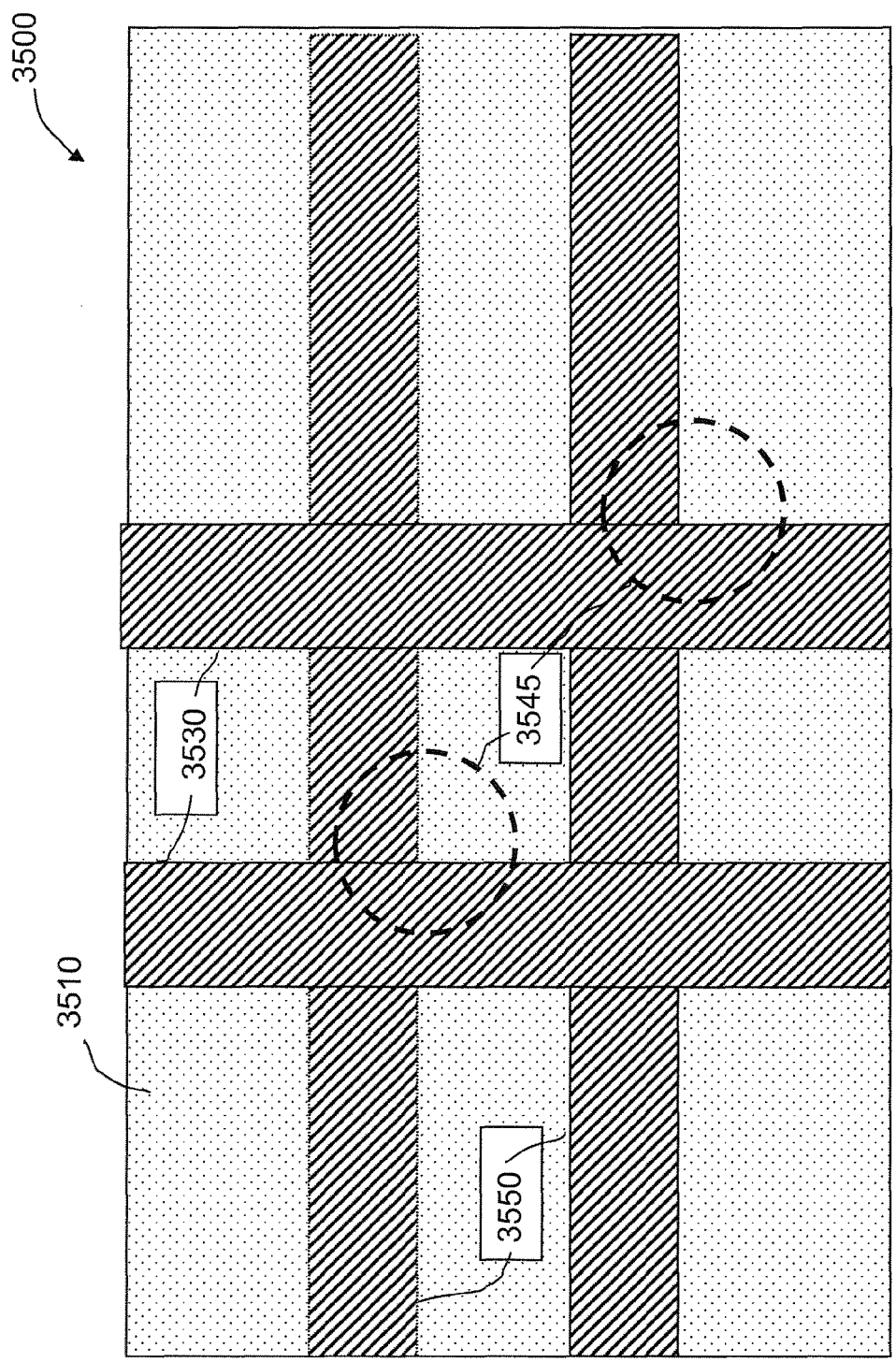

FIG. 36 illustrates a plan view 3500 of conductors 3530 on a top level and one or more lower conductor wiring levels 3550. Landing pads have been eliminated so that spacing between conductors has been reduced and wiring density has been increased. Via holes 3545 are located at a corner defined by the intersection of a top level and lower level conductor. Nonvolatile nanotube element-based electrically reprogrammable via interconnections similar to 3280 in FIGS. 32G and 3380 in FIG. 34E may be fabricated using methods described further above with respect to FIGS. 33 and 34, except that the spacing between nanotube elements and conductors will be smaller in cross sectional area because only a portion of the via hole perimeter will contact each conductor level. Conductors 3530 are patterned on the top surface of insulator 3510. Conductors 3650 are on the top surface of a lower insulator (not shown) and are in contact with the bottom surface of insulator 3510.

Alternate Embodiments

In some embodiments, single walled carbon nanotubes may be preferred, and in other embodiments, multi-walled (e.g., double walled) carbon nanotubes may be preferred. Also nanotubes may be used in conjunction with nanowires. Nanowires as mentioned herein is meant to mean single nanowires, aggregates of non-woven nanowires, nanoclusters, nanowires entangled with nanotubes comprising a nanofabric, mattes of nanowires, etc.

As described above, the interconnect wiring used to interconnect the nanotube device terminals may be conventional wiring such as AlCu, W, or Cu wiring with appropriate insulating layers such as SiO2, polyimide, etc. The interconnect may also be single- or multi-wall nanotubes used for wiring.

The invention may be embodied in other specific forms without departing from the spirit or essential characteristics thereof. The present embodiments are therefore to be considered in respects as illustrative and not restrictive.

Related Applications

This application is related to the following references, which are assigned to the assignee of this application and are hereby incorporated by reference herein in their entireties:

Electromechanical Memory Array Using Nanotube Ribbons and Method for Making Same (U.S. patent application Ser. No. 09/915,093, now U.S. Pat. No. 6,919,592), filed on Jul. 25, 2001;

Electromechanical Memory Having Cell Selection Circuitry Constructed With NT Technology (U.S. patent application Ser. No. 09/915,173, now U.S. Pat. No. 6,643,165), filed on Jul. 25, 2001;

Hybrid Circuit Having NT Electromechanical Memory (U.S. patent application Ser. No. 09/915,095, now U.S. Pat. No. 6,574,130), filed on Jul. 25, 2001;

Electromechanical Three-Trace Junction Devices (U.S. patent application Ser. No. 10/033,323, now U.S. Pat. No. 6,911,682), filed on Dec. 28, 2001;

Methods of Making Electromechanical Three-Trace Junction Devices (U.S. patent application Ser. No. 10/033,032, now U.S. Pat. No. 6,784,028), filed on Dec. 28, 2001;

Nanotube Films and Articles (U.S. patent application Ser. No. 10/128,118, now U.S. Pat. No. 6,706,402), filed on Apr. 23, 2002;

Methods of Nanotube Films and Articles (U.S. patent application Ser. No. 10/128,117, now U.S. Pat. No. 6,835,591), filed Apr. 23, 2002;

Methods of Making Carbon Nanotube Films, Layers, Fabrics, Ribbons, Elements and Articles (U.S. patent application Ser. No. 10/341,005), filed on Jan. 13, 2003;

Methods of Using Thin Metal Layers to Make Carbon Nanotube Films, Layers, Fabrics, Ribbons, Elements and Articles (U.S. patent application Ser. No. 10/341,055), filed Jan. 13, 2003;

Methods of Using Pre-formed Nanotubes to Make Carbon Nanotube Films, Layers, Fabrics, Ribbons, Elements and Articles (U.S. patent application Ser. No. 10/341,054), filed Jan. 13, 2003;

Carbon Nanotube Films, Layers, Fabrics, Ribbons, Elements and Articles (U.S. patent application Ser. No. 10/341,130), filed Jan. 13, 2003;

Non-volatile Electromechanical Field Effect Devices and Circuits using Same and Methods of Forming Same (U.S. patent application Ser. No. 10/864,186), filed Jun. 9, 2004;

Devices Having Horizontally-Disposed Nanofabric Articles and Methods of Making the Same, (U.S. patent application Ser. No. 10/776,059, U.S. Patent Publication No. 2004/0181630), filed Feb. 11, 2004;

Devices Having Vertically-Disposed Nanofabric Articles and Methods of Making the Same (U.S. patent application Ser. No. 10/776,572, U.S. Patent Publication No. 2004/0175856), filed Feb. 11, 2004; and Patterned Nanoscopic Articles and Methods of Making the Same (U.S. patent application Ser. No. 10/936,119, U.S. Patent Publication No. 2005/0128788).

The invention may be embodied in other specific forms without departing from the spirit or essential characteristics thereof. The present embodiments are therefore to be considered in respects as illustrative and not restrictive.

What is claimed is:

1. A two terminal non-volatile nanotube memory device, comprising:
   a first conductive terminal, said first conductive terminal having a first sidewall;
   a second conductive terminal, said second conductive terminal having a second sidewall;
   a nanotube fabric in permanent electrical communication with said first sidewall and said second sidewall, said nanotube fabric comprising a plurality of nanotube elements that provide at least one electrically modifiable conductive pathway through said nanotube fabric between said first conductive terminal and said second conductive terminal;
   an insulating element disposed between said first conductive terminal and said second conductive terminal; and
   a control circuitry in electrical communication with at least one of said first conductive terminal and said second conductive terminal;
   wherein said control circuitry is configured to apply a first voltage difference between said first conductive terminal and said second conductive terminal so as to change the resistance of said nanotube fabric from a relatively low resistance to a relatively high resistance;
   wherein said control circuitry is configured to apply a second voltage difference between said first conductive terminal and said second conductive terminal so as to change the resistance of said nanotube fabric from a relatively high resistance to a relatively low resistance;
   wherein said nanotube fabric is capable of being repeatedly adjusted among at least a relatively high resistance and a relatively low resistance, responsive to an electrical stimulus applied between said first conductive terminal and said second conductive terminal to modify at least one of said at least one electrically modifiable conductive pathway through said nanotube fabric.

2. The device of claim 1, wherein said insulating element has a third sidewall disposed between said first conductive terminal and said second conductive terminal, and wherein said nanotube fabric is positioned adjacent to said third sidewall.

3. The device of claim 1, wherein said second conductive terminal is substantially above said first conductive terminal.

4. The device of claim 1, wherein said nanotube fabric overlaps at least a portion of said first sidewall.

5. The device of claim 4, wherein said nanotube fabric overlaps an entire surface of said first sidewall.

6. The device of claim 1, wherein said nanotube fabric overlaps at least a portion of said second sidewall.

7. The device of claim 6, wherein said nanotube fabric overlaps an entire surface of said second sidewall.

8. The device of claim 1, wherein said first conductive terminal comprises a material that conducts electricity relatively well and conducts heat relatively poorly.

9. The device of claim 1, wherein said first conductive terminal and said second conductive terminal comprise metal.

10. The device of claim 9, wherein said metal is selected from the list consisting of Ru, Ti, Cr, Al, Au, Pd, Ni, W, Cu, Mo, Ag, In, Ir, Pb, Sn, TiN, TiAu, TiCu, TiPd, PbIn, and TiW.

11. The device of claim 1, wherein said nanotube fabric comprises one or more of single-walled nanotubes, double-walled nanotubes, multi-walled nanotubes, and bundles of nanotubes.

12. The device of claim 1, wherein said relatively high resistance corresponds to a first state of said nanotube memory device and said relatively low resistance corresponds to a second state of said nanotube memory device, said first state and said second state being nonvolatile.

13. The device of claim 12, wherein said control circuitry is further configured to apply a third voltage difference between said first conductive terminal and said second conductive terminal so as to determine said state of said nanotube memory device.

14. The device of claim 13, wherein said third voltage difference is sufficiently low such that said control circuitry senses the resistance between said first conductive terminal and said second conductive terminal, and keeps said state of said nanotube memory device.

15. The device of claim 14, wherein said third voltage difference is less than about 2 V.

16. The device of claim 1, wherein said relatively high resistance is at least about ten times greater than said relatively low resistance.

17. The device of claim 16, wherein said relatively high resistance is greater than about 1 mega-ohm and said relatively low resistance is less than about 100 kilo-ohm.

18. The device of claim 1, wherein said first voltage difference comprises a relatively high voltage difference, ranging from about 3 V to about 10 V.

19. The device of claim 1, wherein said second voltage difference comprises a relatively low voltage difference, ranging from about 1 V to about 5 V, thereby rendering a relatively low current, ranging from about 100 nA to about 100 µA, across said first conductive terminal and second conductive terminal.

20. The device of claim 1 wherein said nanotube fabric conforms to at least one of said first conductive terminal, said second conductive terminal, and said insulating element.

21. A two terminal non-volatile nanotube memory device, comprising:
   a first conductive terminal, said first conductive terminal having a first sidewall;
   a second conductive terminal, said second conductive terminal having a second sidewall;
   a nanotube fabric in permanent electrical communication with said first sidewall and said second sidewall, said nanotube fabric comprising a plurality of nanotube elements that provide at least one electrically modifiable conductive pathway through said nanotube fabric between said first conductive terminal and said second conductive terminal;
   an insulating element disposed between said first conductive terminal and said second conductive terminal;
   a protective insulator on a surface of said nanotube fabric, said surface of said nanotube fabric being remote to said first sidewall and said second sidewall; and
   a control circuitry in electrical communication with at least one of said first conductive terminal and said second conductive terminal;
   wherein said control circuitry is configured to apply a first voltage difference between said first conductive terminal and said second conductive terminal so as to change the resistance of said nanotube fabric from a relatively low resistance to a relatively high resistance;
   wherein said control circuitry is configured to apply a second voltage difference between said first conductive terminal and said second conductive terminal so as to change the resistance of said nanotube fabric from a relatively high resistance to a relatively low resistance;
   wherein said nanotube fabric is capable of being repeatedly adjusted among at least a relatively high resistance and a relatively low resistance, responsive to an electrical stimulus applied between said first conductive terminal and said second conductive terminal to modify at least one of said at least one electrically modifiable conductive pathway through said nanotube fabric.

22. The device of claim 21, wherein said protective insulator is selected from the list consisting of Si, SiN, $SiO_2$, $Al_2O_3$, and TEOS.

23. The device of claim 21, wherein said relatively high resistance corresponds to a first state of said nanotube memory device and said relatively low resistance corresponds to a second state of said nanotube memory device, said first state and said second state being nonvolatile.

24. The device of claim 23, wherein said control circuitry is further configured to apply a third voltage difference between said first conductive terminal and said second conductive terminal so as to determine said state of said nanotube memory device.

* * * * *